United States Patent
Scaramucci et al.

(10) Patent No.: US 11,522,512 B2
(45) Date of Patent: Dec. 6, 2022

(54) ELECTROMAGNETIC INTERFERENCE FILTER SYSTEM AND METHOD

(71) Applicant: GCI Technologies, Inc., Plano, TX (US)

(72) Inventors: Ciro Scaramucci, Florence (IT); Javier Haro Ramirez, Plano, TX (US); Norman Dean Gray, Allen, TX (US); Michael Joseph Beauchamp, McKinney, TX (US)

( * ) Notice: Subject to any disclaimer, the term of this patent is extended or adjusted under 35 U.S.C. 154(b) by 210 days.

(21) Appl. No.: 17/137,669

(22) Filed: Dec. 30, 2020

(65) Prior Publication Data
US 2022/0209734 A1    Jun. 30, 2022

(51) Int. Cl.
  *H03H 7/01*    (2006.01)
  *H03H 1/00*    (2006.01)

(52) U.S. Cl.
  CPC ............ *H03H 7/0115* (2013.01); *H03H 7/17* (2013.01); *H03H 1/0007* (2013.01)

(58) Field of Classification Search
  CPC ................. H03H 7/0115; H03H 1/0007
  USPC ........................................... 333/185
  See application file for complete search history.

(56) References Cited

U.S. PATENT DOCUMENTS

| | | | |
|---|---|---|---|
| 6,498,546 B1 * | 12/2002 | Lau | H02G 5/00 333/184 |
| 11,025,045 B2 * | 6/2021 | Lindenberger | H01F 3/12 |
| 2004/0239055 A1 * | 12/2004 | Bender | H03H 7/0115 280/5.5 |

* cited by examiner

*Primary Examiner* — Rakesh B Patel
(74) *Attorney, Agent, or Firm* — Kevin Mark Klughart

(57) ABSTRACT

An electromagnetic interference filter (EIF) system/method configured to maximize filter performance associated with EIF interconnects is disclosed. The disclosed system eliminates the use of conventional printed circuit board (PCB) interconnects and associated electrical connection terminals by attaching EIF filter capacitors and other components directly to power supply bus bars using a mechanical design and plastic encapsulating cover (PEC) that reduces parasitic inductances between the various EIF components while maximizing series inductance between +BUS/+CON connections and −BUS/−CON connections respectively through a permeable inductor core (PIC). The system/method may be applied to a variety of EIF applications including those associated with electric vehicles and the like.

19 Claims, 128 Drawing Sheets

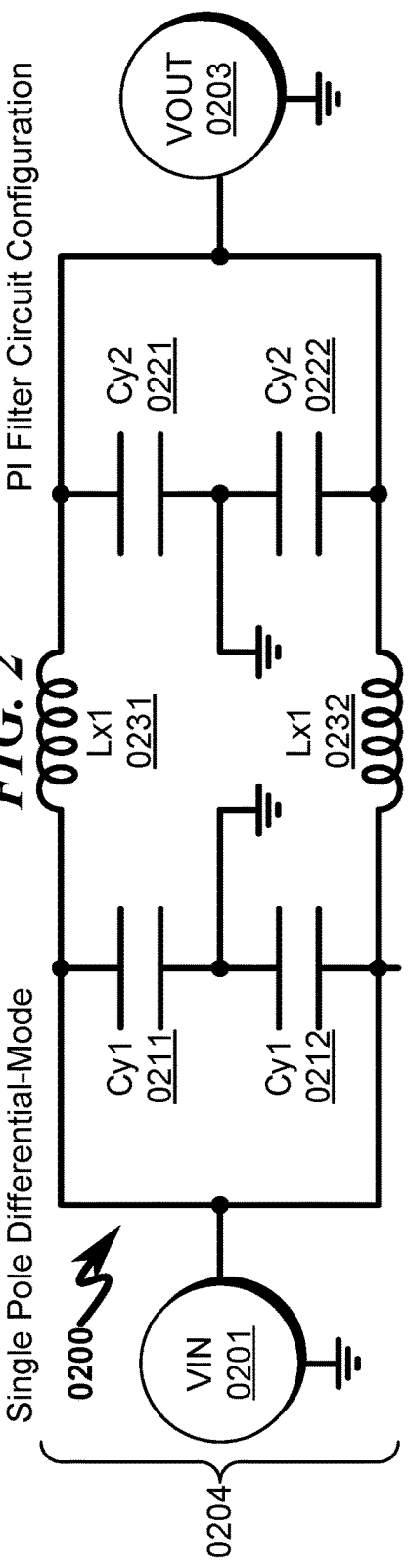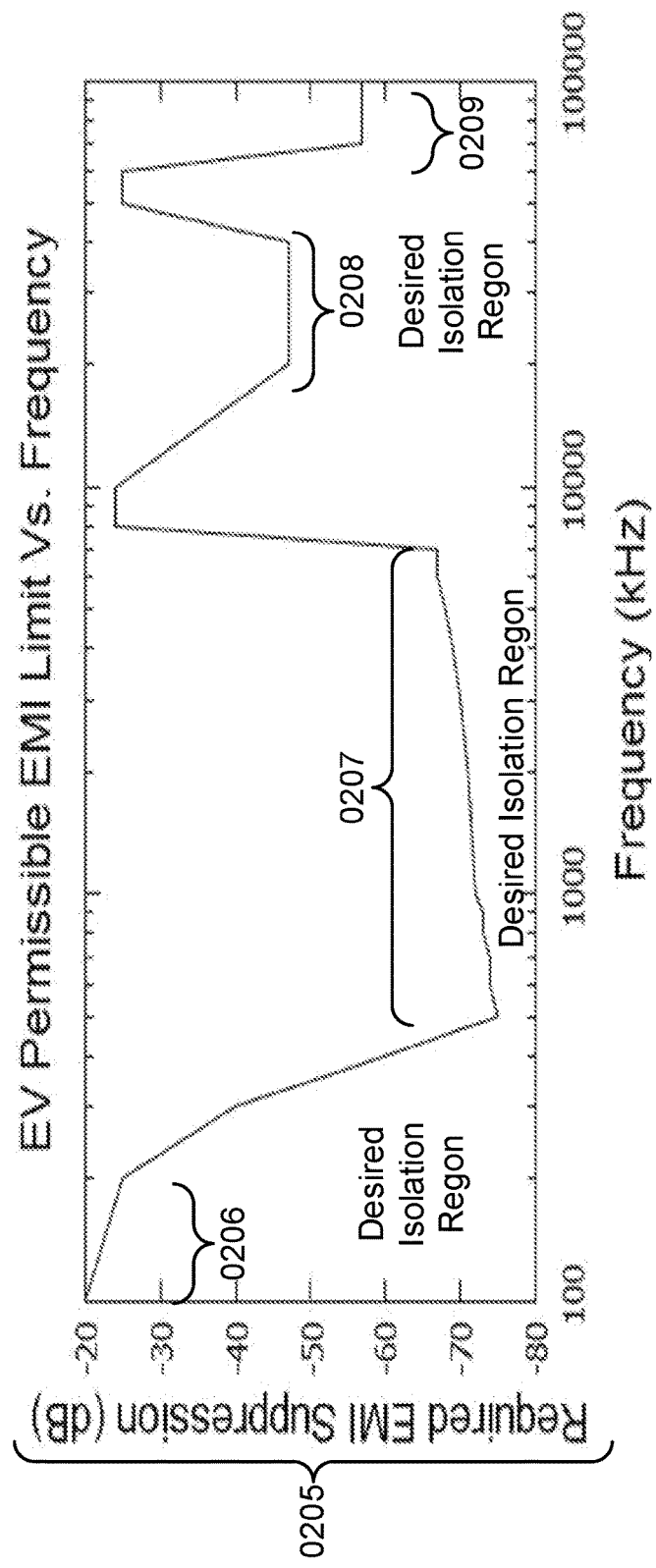
FIG. 2

Differential-Mode PI Filter Circuit Configuration

Permeability vs. Frequency

6700

FIG. 79
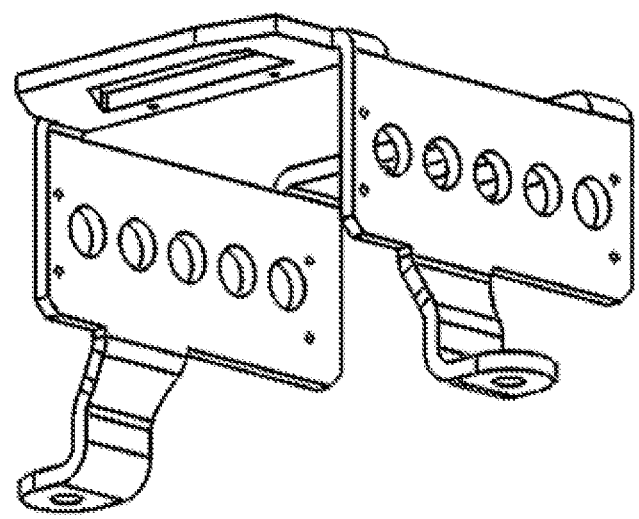
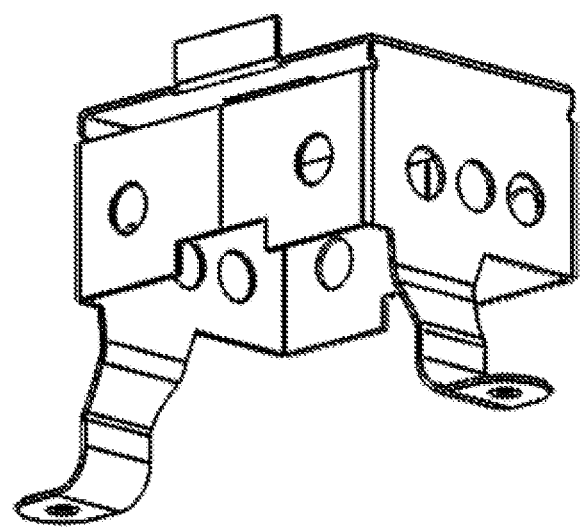

11500

12100

ELECTROMAGNETIC INTERFERENCE FILTER SYSTEM AND METHOD

CROSS REFERENCE TO RELATED APPLICATIONS

Not Applicable

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention relates to a system and method for implementing an electromagnetic interference (EMI) filter, herein also described as an EIF. Without loss of generality in the scope of invention claims, the present invention may be in many circumstances advantageously applied to implementing an EIF within an electric vehicle (EV) electrical system.

BACKGROUND AND PRIOR ART

System Application Context (0100)

The present invention application context may be best understood by inspection of FIG. 1 (0100) that depicts a typical electric vehicle (EV) application in which an electromagnetic interference filter (EIF) (0110) is placed between a rechargeable battery pack (RBP) (0120) and a motor drive inverter (MDI) (0130) for the purposes of supplying controlled power to an electric drive motor (EDM) (0140). Within this scenario a digital computer monitoring/control (CMC) (0150) is also typically included to monitor and control the power flow from the RBP (0120) through the EIF (0110), MDI (0130), and the EDM (0140).

The purpose of the EIF (0110) in this application context is to control the transmission and/or radiation of electromagnetic interference (EMI) typically generated by the motor drive inverter (MDI) (0130) and/or electric drive motor (EDM) (0140). The MDI (0130) is typically configured as a digitally switched power inverter that may incorporate fast rising edge waveforms of high current that necessarily incorporate a high degree of harmonic frequencies that if unsuppressed will radiate through the air and cause unwanted electromagnetic interference with devices such as radios, telephones, and other sensitive electronics. Furthermore, the Federal Communications Commission (FCC) regulates the emission of electromagnetic interference (EMI) and thus any EV application must adhere to these regulations.

EMI Filter Configuration and Suppression Goals (0200)-(0300)

Typical Filter Configuration (0204)

Implementation of a typical EIF filter may take the form of an impedance network (0204) as generally depicted in FIG. 2 (0200). The purpose of this impedance network is to suppress high frequency EMI signals from the VIN node (0201) to/from the VOUT node (0203) and thus AC isolate the VIN node (0201) and the VOUT node (0203) while allowing DC current to flow freely from the VIN node (0201) to/from the VOUT node (0203). Thus, this network acts as a low pass filter. It should be noted that the reactive components of this filter network are never ideal and routinely incorporate parasitic resistances within the inductors and capacitors as well as parasitic inductance in the capacitors and parasitic capacitance in the inductors. All of these non-idealities act in concert to reduce the effective low pass and high frequency rejection characteristics of the filter.

Here it can be seen that the VIN (0201) node is electrically coupled to the VOUT (0203) node via the use of a first capacitor network (0211, 0212) and a second capacitor network (0221, 0222) electrically coupled together via a first inductor (0231) and a second inductor (0232). The selection of component values for the capacitors (0211, 0212, 0221, 0222) and inductors (0231, 0232) partially determines the EMI suppression characteristics of the filter network. However, parasitic inductances associated with the non-ideal characteristics of the capacitors (0211, 0212, 0221, 0222) and interconnect associated with their actual connection to the electrical network may significantly decrease the performance of the filtering network.

EV EMI Suppression Requirements (0205)

A typical graph (0205) depicting the required EMI suppression characteristics required for an EV application is generally depicted in FIG. 2 (0200). The required EMI suppression as depicted here may also be described as a required INSERTION LOSS associated with any EIF used to suppress the EMI. This represents the MINIMUM ATTENUATION that the EIF should possess for a given RF frequency at interest. Here it can be seen that the required EMI suppression varies based on frequency for this application. For example, at low frequencies (0206) the required EMI suppression might only be 20 dB-30 dB, whereas within the AM broadcast band (0207) the requirements might be 70 dB or more, within the 12 MHz-14 MHz band (0208) in excess of 45 dB, and within the FM broadcast band (0209) the required suppression might be in excess of 50 dB. These EMI suppression characteristics vary with frequency based on a combination of FCC regulatory requirements as well as the necessity to limit EMI within the EV to allow proper operation of AM/FM radios and other consumer electronics that are contained within the EV as standard equipment.

Equivalent EMI Filter Configurations (0300)

To illustrate this behavior FIG. 3 (0300) depicts the equivalent PI filter model associated with the filter schematic of FIG. 3 (0300). Here it can be seen that the capacitors (0311, 0312, 0321, 0322) and inductors (0331, 0332) have been lumped together to form the equivalent PI model parameters as shown with a first lumped capacitor (0313, 0323).

Additionally, parasitic inductances associated with the non-ideal characteristics of the capacitors (0313, 0323) and their interconnection (0314, 0315, 0324, 0325) to the filter network are shown to indicate that the EFFECTIVE capacitance of the lumped capacitor networks (0313, 0323) may be significantly diminished by virtue of the series inductances associated with these capacitor interconnects. Note that any parasitic inductance (0314, 0315, 0324, 0325) associated with the capacitor (0313, 0323) interconnect will directly diminish the effective capacitance of the EMI filter and thus degrade the high frequency EMI suppression characteristics of the EIF. It should be noted that for each parasitic inductance (0314, 0315, 0324, 0325) associated with the capacitor (0313, 0323) interconnect there will also be a parasitic resistance. These resistances are not shown but are assumed to be associated with connection interconnects and the depicted parasitic inductances (0314, 0315, 0324, 0325).

BRIEF SUMMARY OF THE INVENTION

The present invention pertains to a system and method wherein an EIF network is mechanically constructed to minimize parasitic capacitor-related inductances and thus improve the EMI filtering characteristics of the EIF.

This is accomplished by integrating the BUS+/BUS− connections with the INC+/INC− inductor conductors and CON+/CON− terminal output connections such that the placement of filtering capacitors can directly mate with the BUS+/BUS− and the CON+/CON− while still permitting the INC+/INC− to traverse through an permeable inductor core (PIC) to form series inductors between the BUS+/CON+ and BUS−/CON− connections to the EIF.

BRIEF DESCRIPTION OF THE DRAWINGS

For a fuller understanding of the advantages provided by the invention, reference should be made to the following detailed description together with the accompanying drawings wherein:

FIG. 2 illustrates a typical EMI filter network used to implement an EIF function within an electric vehicle (EV) and a plot of a typical electric vehicle (EV) permissible EMI limits vs. frequency;

FIG. 79 illustrates a rear left bottom perspective assembly view of a grounding support assembly (GSA) depicting the grounding support bracket (GSB), grounding support conductor (GSC), and grounding support insulator (GSI) that may be useful in some preferred exemplary system embodiments;

FIG. 119 illustrates a front top perspective view of a preferred exemplary system embodiment of the present invention with plastic encapsulating cover (PEC) suppressed;

FIG. 120 illustrates a rear top perspective view of a preferred exemplary system embodiment of the present invention with plastic encapsulating cover (PEC) suppressed;

FIG. 121 illustrates a front right top perspective view of a preferred exemplary system embodiment of the present invention with plastic encapsulating cover (PEC) suppressed;

FIG. 122 illustrates a rear right top perspective view of a preferred exemplary system embodiment of the present invention with plastic encapsulating cover (PEC) suppressed;

FIG. 123 illustrates a rear left top perspective view of a preferred exemplary system embodiment of the present invention with plastic encapsulating cover (PEC) suppressed;

FIG. 124 illustrates a front left top perspective view of a preferred exemplary system embodiment of the present invention with plastic encapsulating cover (PEC) suppressed;

FIG. 125 illustrates a front right bottom perspective view of a preferred exemplary system embodiment of the present invention with plastic encapsulating cover (PEC) suppressed;

FIG. 126 illustrates a rear right bottom perspective view of a preferred exemplary system embodiment of the present invention with plastic encapsulating cover (PEC) suppressed;

FIG. 127 illustrates a rear left bottom perspective view of a preferred exemplary system embodiment of the present invention with plastic encapsulating cover (PEC) suppressed; and FIG. 128 illustrates a front left bottom perspective view of a preferred exemplary system embodiment of the present invention with plastic encapsulating cover (PEC) suppressed.

DESCRIPTION OF THE PRESENTLY PREFERRED EXEMPLARY EMBODIMENTS

Figure 1:
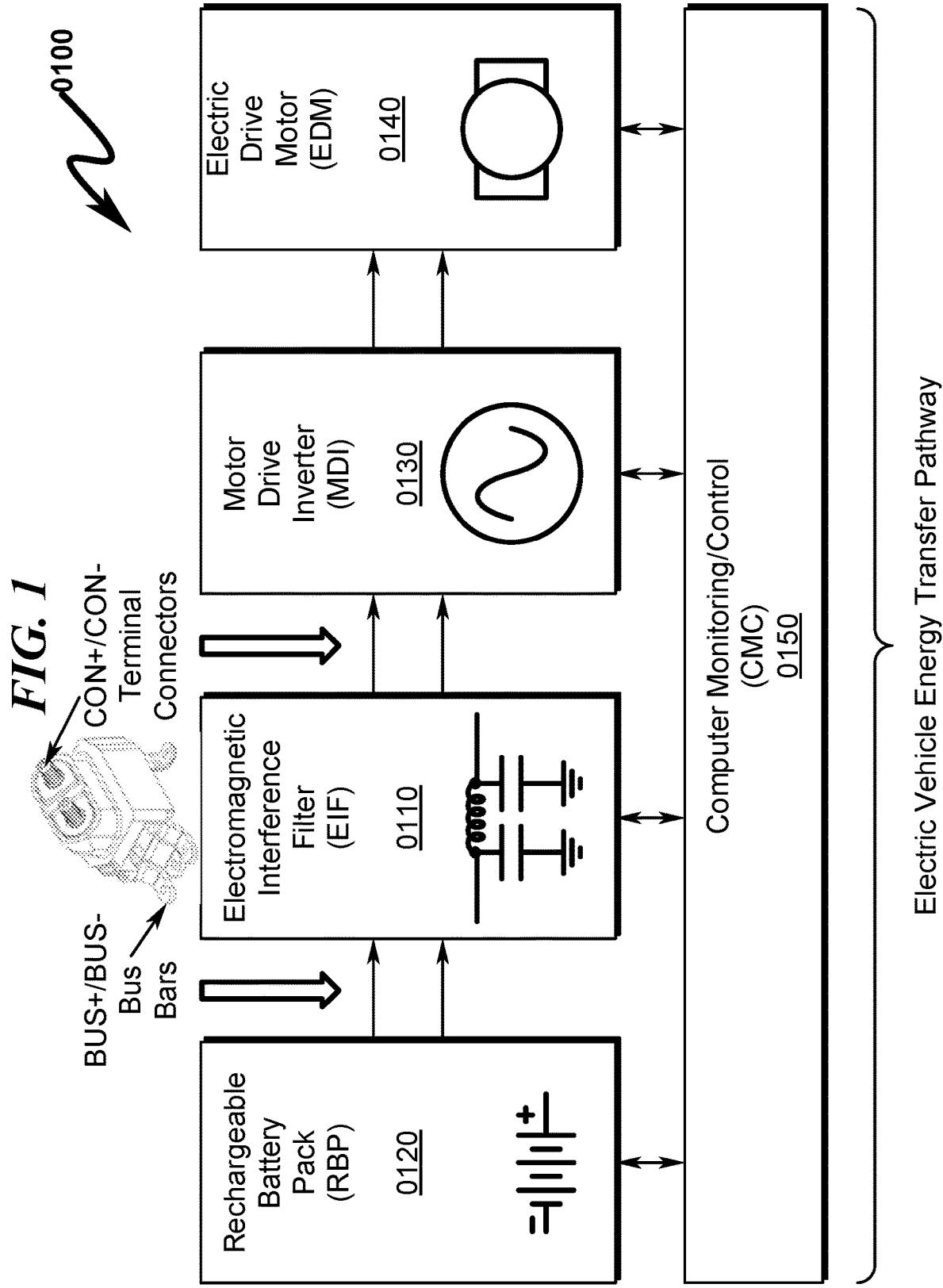
FIG. 1 illustrates a block diagram depicting various components of a preferred exemplary system embodiment of the present invention.
Figure 3:
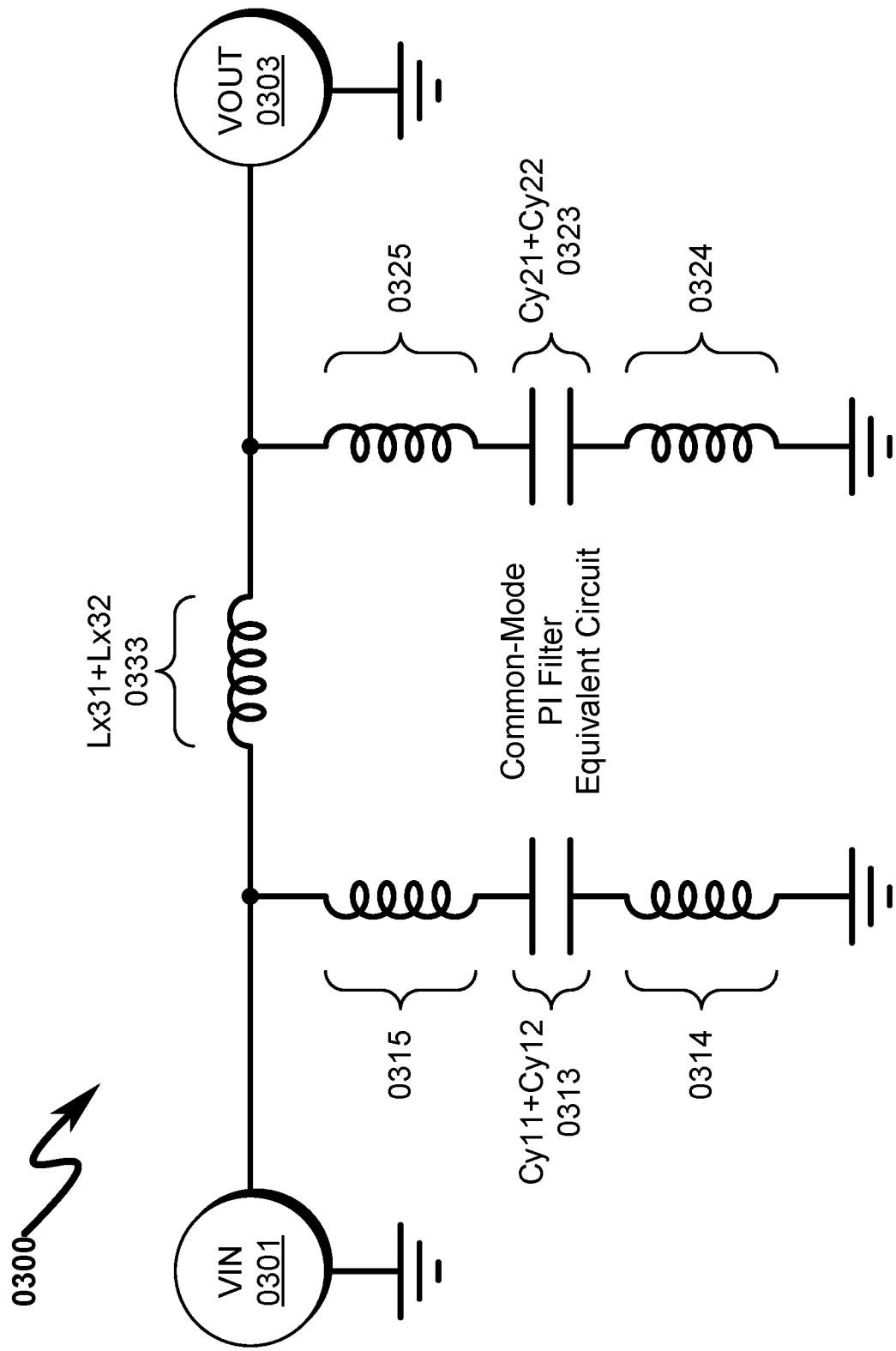
FIG. 3 illustrates an equivalent PI filter network associated with the typical EMI filter network depicted in FIG. 3.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of an ELECTROMAGNETIC INTERFERENCE FILTER SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Filter Topology Not Limitive

While the present invention is presented in the form of a differential-mode PI filter network, the present invention is also amenable to a common-mode PI network in which only half of the system components are provided, allowing only for a BUS+/INC+/CON+/GND configuration or alternatively a BUS−/INC−/CON−/GND configuration. Thus, the present invention is not limited to the differential-mode PI filter network as depicted herein in the drawings. One skilled in the art will recognize that the EIF presented herein may be reduced in component count to readily affect an equivalent common-mode PI EIF network.

Component Values Not Limitive

The reactive components illustrated in the various EIF configurations described herein are exemplary and may vary widely based on application context. Furthermore, while in many circumstances the capacitor and/or inductor component values may be matched to have equivalent values, this is not a limitation of the present invention.

Permeable Inductor Core (PIC) not Limitive

The present invention anticipates that the permeable inductor core (PIC) may vary widely based on application context. However, many preferred invention embodiments may incorporate a high permeability material (typically of ferrite composition) optimized for EMI-suppression filters around 1 MHz such as the material Model 3N5 available from FERROXCUBE (a YAGEO company), El Paso, Tex. 915-599-2328 (www.ferroxcube.com). Typical operational characteristics of this material are provided in the graphs provided herein but these while these graphs may represent performance of some preferred exemplary embodiments, they do not limit the scope of the present invention.

Mechanical Coupling Not Limitive

The various components comprising the present invention may be mechanically coupled together using a wide variety of methodologies. However, many preferred invention embodiments make use of roll pins or similar fasteners to mechanically couple the various system components. Presentation of this type of mechanical fastener is not limitive of the invention scope, as other types of fasteners including rivets, pop rivets, screws, soldering, welding, laser welding, epoxy encapsulation, plastic encapsulation, and/or spring loading, and the like may be used to accomplish the required mechanical coupling between the various components.

Encapsulation Not Limitive

The present invention makes use of insulating encapsulation for the capacitors and also a plastic encapsulating cover (PEC) that serves to protect internal components while providing mechanical stability for components contained within the apparatus. These encapsulations may take the form of epoxy/plastic encapsulation as would normally be associated with integrated circuits or other forms of injection molding without loss of generality in the teachings of the present invention.

System Overview (0400)-(0600)

Figure 4:
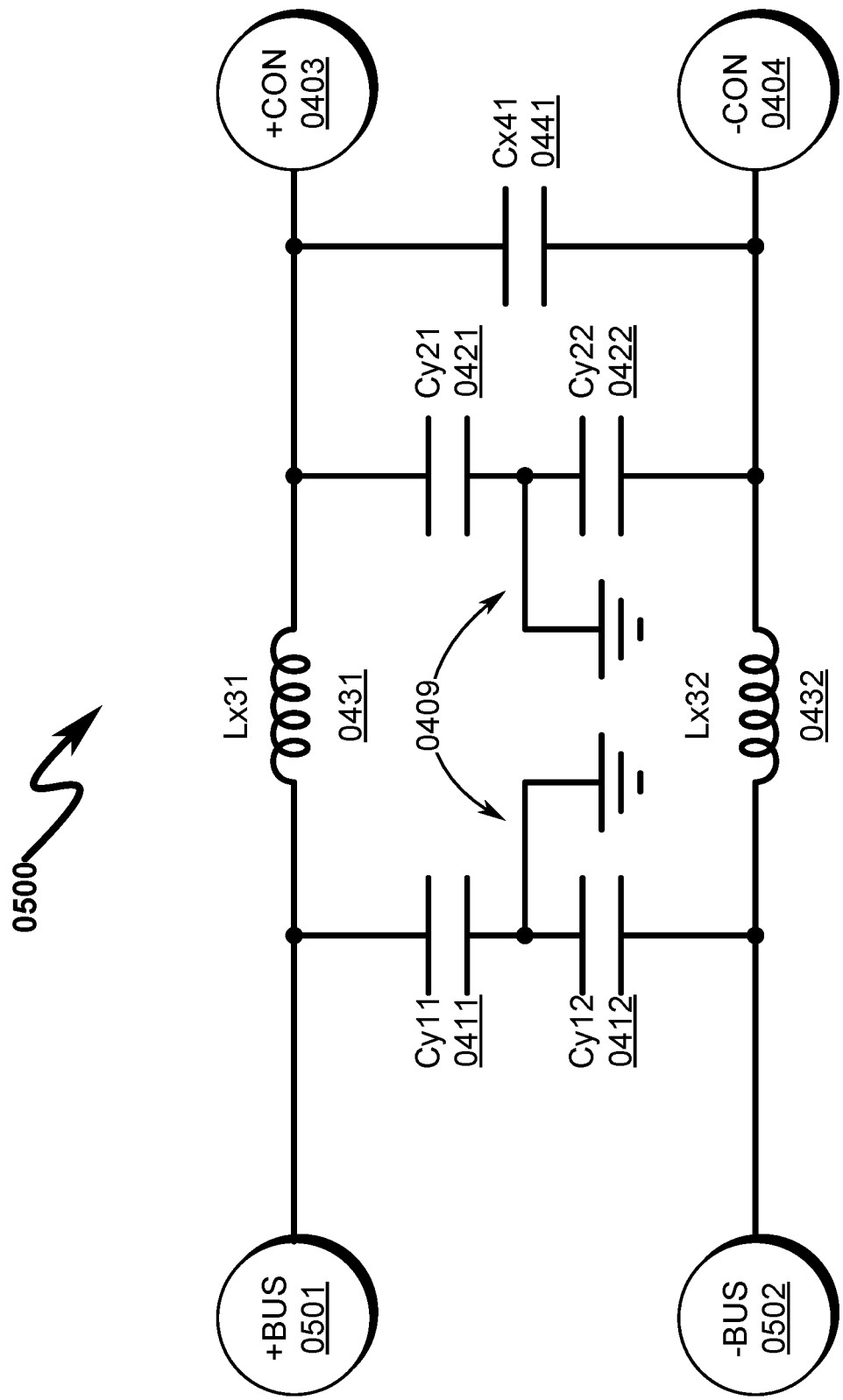
FIG. 4 illustrates an exemplary present invention EMI filter network configured for use in an EV application with BUS input and CON output connections noted.

An overview of the present invention system is generally depicted by the schematic of FIG. 4 (0400) in which the EIF is configured in fully differential-mode PI filter allowing connection between a +BUS (0401)/−BUS (0402) power bus and +CON (0403)/−CON (0404) terminal connections. This filter configuration utilizes bus filter capacitors (BFC) Cy11/Cy12 (0411, 0412), series inductors Lx31/Lx32 (0431, 0432), and output terminal capacitors (OTC) Cy21/Cy22 (0421, 0422) in conjunction with an output filtering capacitor (OFC) Cx41 (0441).

Figure 5:
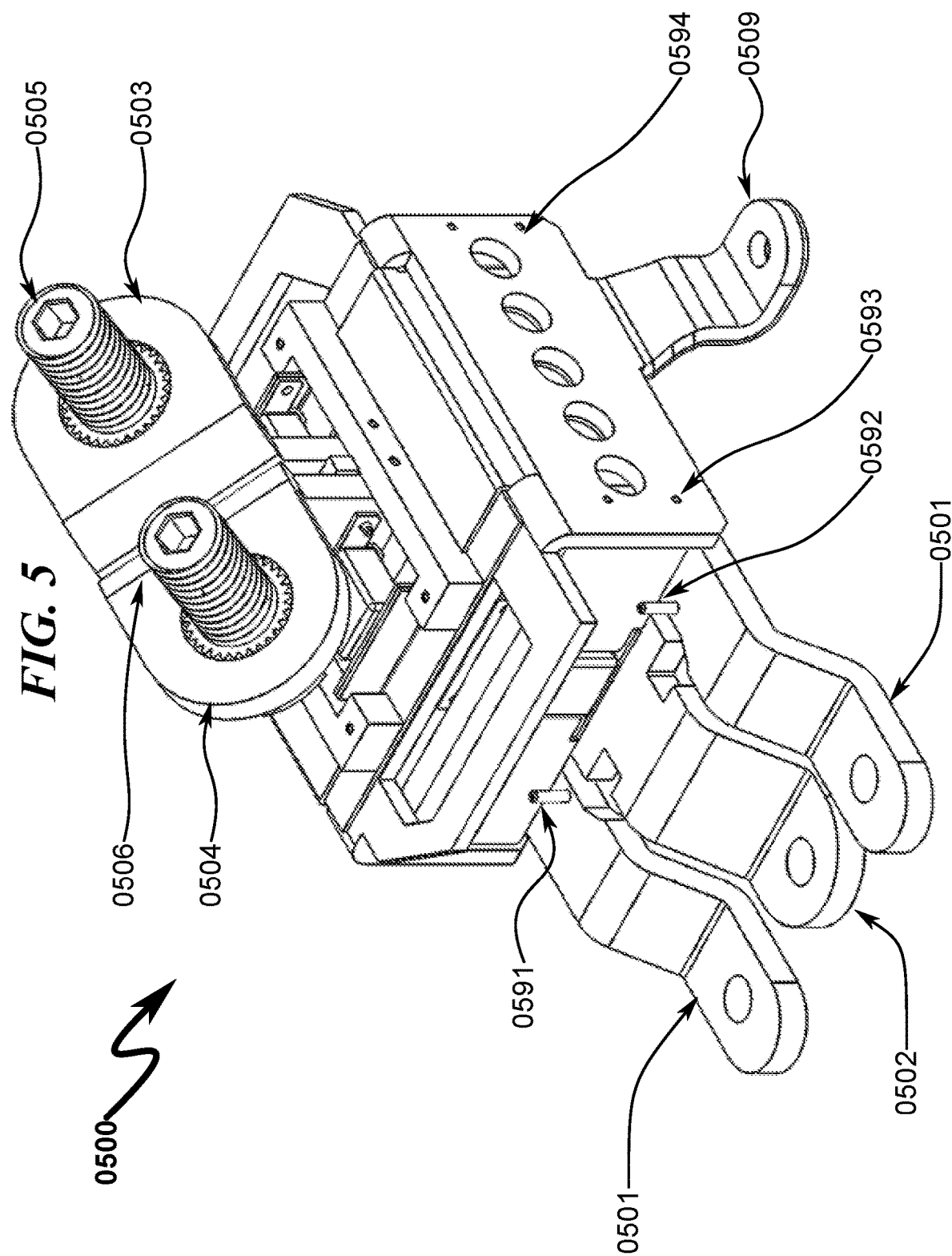
FIG. 5 illustrates a front top left perspective view of a preferred exemplary present invention EFI system embodiment with major components denoted and plastic encapsulating cover (PEC) removed.
Figure 6:
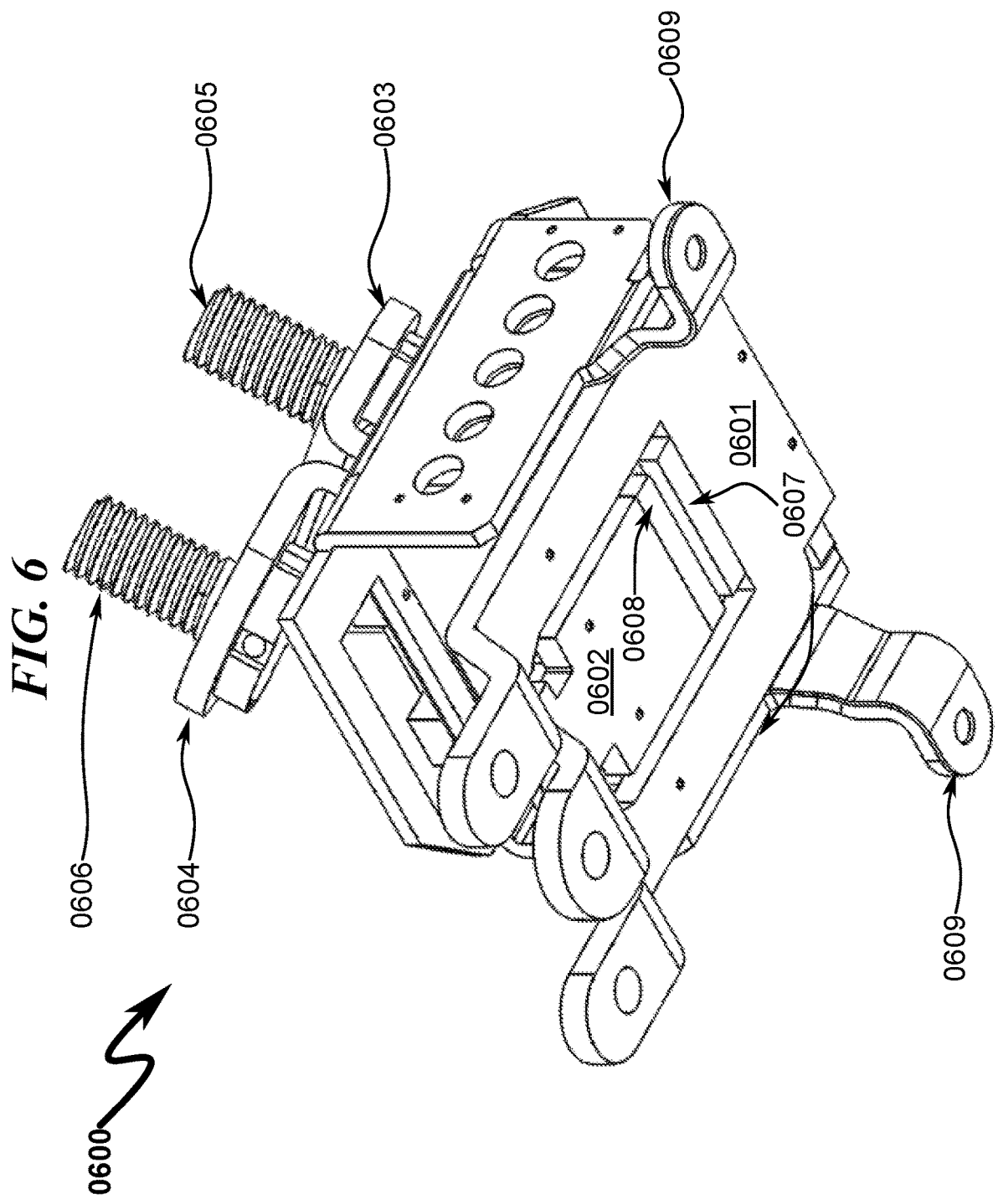
FIG. 6 illustrates a front top right perspective view of a preferred exemplary present invention EFI system embodiment with major components denoted and plastic encapsulating cover (PEC) removed.
Figure 7:
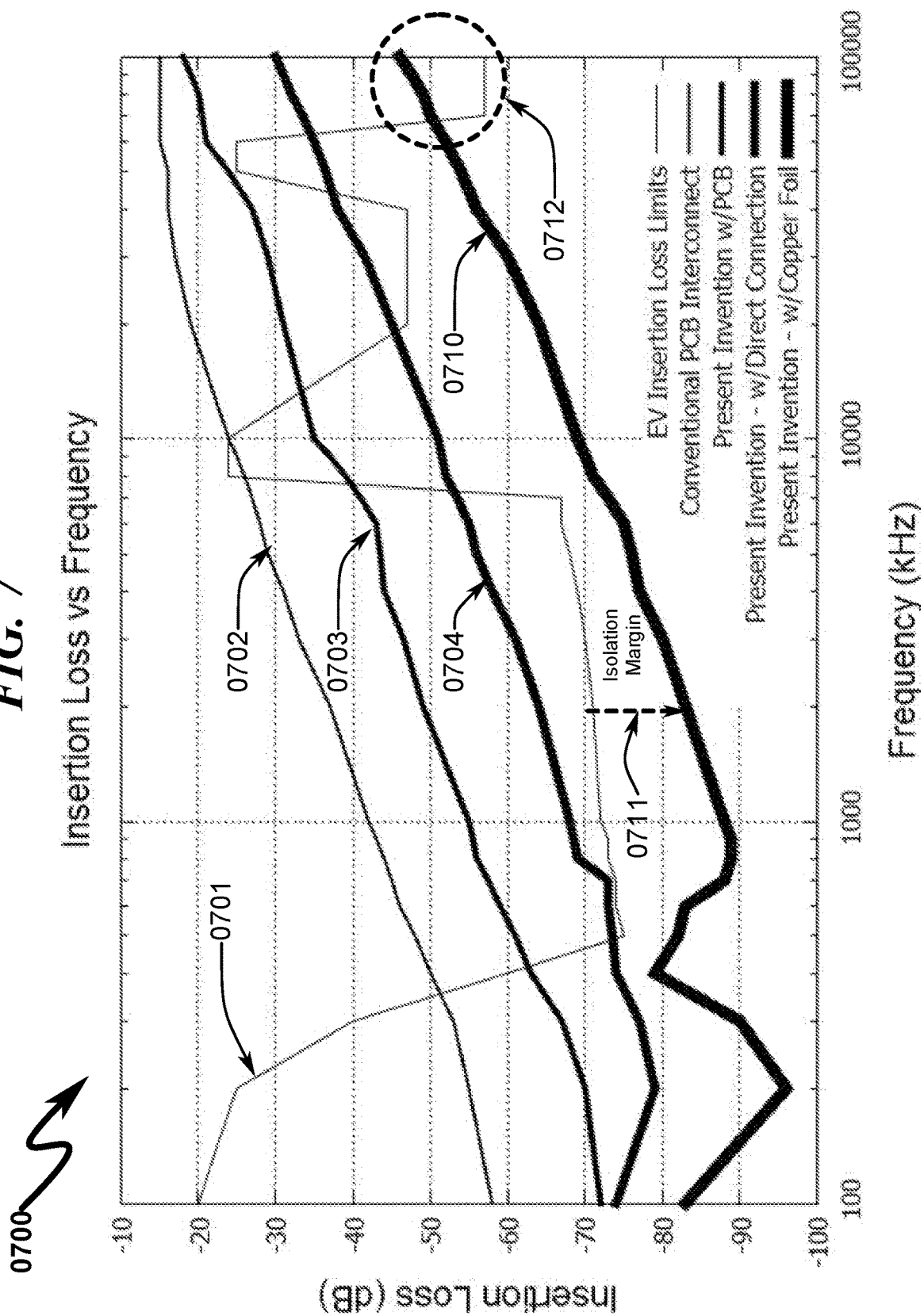
FIG. 7 illustrates plots of a typical electric vehicle (EV) permissible EMI limit vs. frequency as compared with the performance of various prior art construction alternatives and the isolation margin performance of the present invention.

The system depicted in FIG. 4 (0400) may be mechanically implemented in a variety of application contexts, with a preferred exemplary mechanical embodiment depicted in FIG. 5 (0500)-FIG. 6 (0600). Here it can be seen that the correlations between the +BUS (0401, 0501, 0601), −BUS (0402, 0502, 0602), +CON (0403, 0503, 0603), and −CON (0404, 0504, 0604) are identified with the +BUS (0401, 0501, 0601) implemented using two connection straps.

The +BUS (0401, 0501, 0601) and +CON (0403, 0503, 0603) are electromechanically coupled with an inductor conductor (+INC) (0607) while the −BUS (0402, 0502, 0602) and −CON (0404, 0504, 0604) are electromechanically coupled with a corresponding inductor conductor (−INC) (0608).

Additionally, it can be seen that provisions for CON terminal connection studs (0505, 0506, 0605, 0606) are provided to allow the connection of wiring to the +CON (0403, 0503, 0603), and −CON (0404, 0504, 0604) terminal connections. Mechanical stabilization of the filter to the EV ground frame or other electrical return path reference is provided by one or more grounding support brackets (GSB) (0409, 0509, 0609).

Within the mechanical construction detail provided herein, the use of roll pins (0591, 0592) or the like is depicted as the preferred mechanical coupling methodology, although many preferred invention embodiments may use other fastening means. The use of roll pins or other fastening means within this context will generally be depicted in the drawings by the depiction of cylindrical voids (0593, 0594) within the various invention elements. The number and placement of these fasteners will by necessity be application specific and is not limited by the presented coupling points indicated in the drawings.

By inspecting the differential-mode PI filter of FIG. 4 (0400) it can be seen that single-pole common-mode variants of the filter network can be constructed by eliminating half of the components. For example BUS+/INC+/CON+/GND configuration filter can be constructed by eliminating the −BUS/−CON connections and the Cy12/Lx32/Cy22 components and eliminating or tying Cx41 to ground. Alternatively a BUS−/INC−/CON−/GND configuration can be constructed by eliminating the +BUS/+CON connections and the Cy11/Lx31/Cy21 components and eliminating or tying Cx41 to ground. Both of these common-mode variants are anticipated by the present invention.

Performance Comparison (0700)

The present invention as implemented in the exemplary embodiment depicted in FIG. 4 (0400)-FIG. 6 (0700) has been characterized and the performance depicted in comparison with desired EV EIF characteristics and various other traditionally constructed EIF configurations. Here it can be seen that the EV EIF desired isolation insertion loss characteristic (0701) is compared with a conventional EIF utilizing printed circuit board (PCB) interconnects (0702) between the various inductor/capacitor components of the filter. From these measured results it can be seen that the use of traditional prior art PCB interconnects in this application would not meet most of the desired RF isolation required within an EV application context. Furthermore, the use of mechanical interconnect structures as proffered by the present invention while still using PCB as the interconnection methodology (0703) is still insufficient to meet the desired RF isolation requirements of the EIF within the EV application context. Elimination of traditional PCB interconnects as depicted by the graph (0704) somewhat improves the EIF isolation characteristics but still does not meet a large portion of the desired EV isolation characteristic (0701).

However, as can be seen by the final graph (0710), the use of the mechanical structure taught by the present invention in conjunction with a direct copper foil interconnect between the components of the EIF and utilization of a ground support conductor (GSC) copper foil underlayment for the ground support assembly (GSA) provides an isolation characteristic that is largely compliant with the desired EV isolation limits (0701) and provides good isolation margin (0711) across most of the RF frequency spectrum. From the measured performance, there is only a small portion of the spectrum (0712) in which the measured isolation deviates from the desired EV isolation characteristic (0701). Thus, as taught and constructed, the present invention permits an electromagnetic interference filter (EIF) to be constructed that meets the majority of desired isolation performance within the context of an EV electrical system without the need for additional filtering components or power loss associated with additional EIF networks.

Method Overview (0800)

Figure 8:
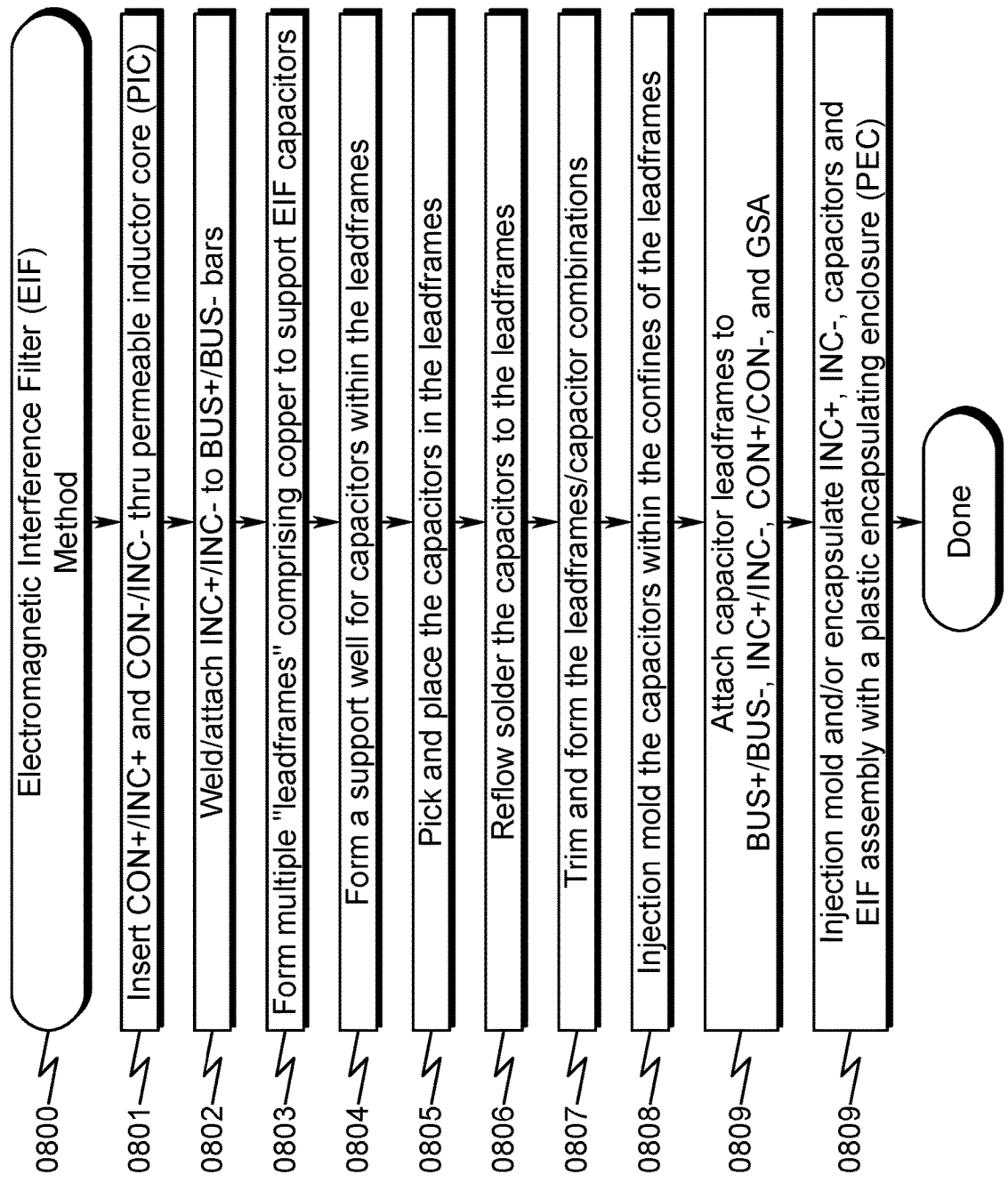
FIG. 8 illustrates a flowchart depicting various steps of a preferred exemplary method embodiment of the present invention.

The present invention may incorporate a manufacturing method that allows assembly of various components in a specific configuration so as to minimize unwanted circuit parasitics and improve isolation characteristics of the EIF while maintaining a high degree of mechanical stability and resistance to harsh environmental conditions. While details of this method are presented elsewhere herein and described in detail in the accompanying drawings, as depicted in FIG. 8 (0800) the present invention method may be broadly generalized as an electromagnetic interference filter (EIF) method comprising:

(1) insert CON+/INC+ and CON−/INC− thru permeable inductor core (PIC) (0801);
(2) weld or otherwise mechanically attaching INC+/INC− to BUS+/BUS− bars (0802);
(3) form multiple "leadframes" comprising copper or other conductive material to support EIF filter capacitors (0803);
(4) form a support well for capacitors within the leadframes (0804);
(5) pick and place the capacitors in the leadframes (0805);
(6) reflow solder the capacitors to the leadframes (0806);
(7) trim and form the leadframes/capacitor combinations (0807);
(8) injection mold the capacitors within the confines of the leadframes (0807);
(9) attach capacitor leadframes to BUS+/BUS−, INC+/INC−, and CON+/CON− connections and the ground support assembly (GSA) (0809); and
(10) injection mold and/or encapsulate the INC+, INC−, capacitors and EIF assembly with a plastic encapsulating enclosure (PEC) to form an integrated mechanical assembly (0810).

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

Figure 9:
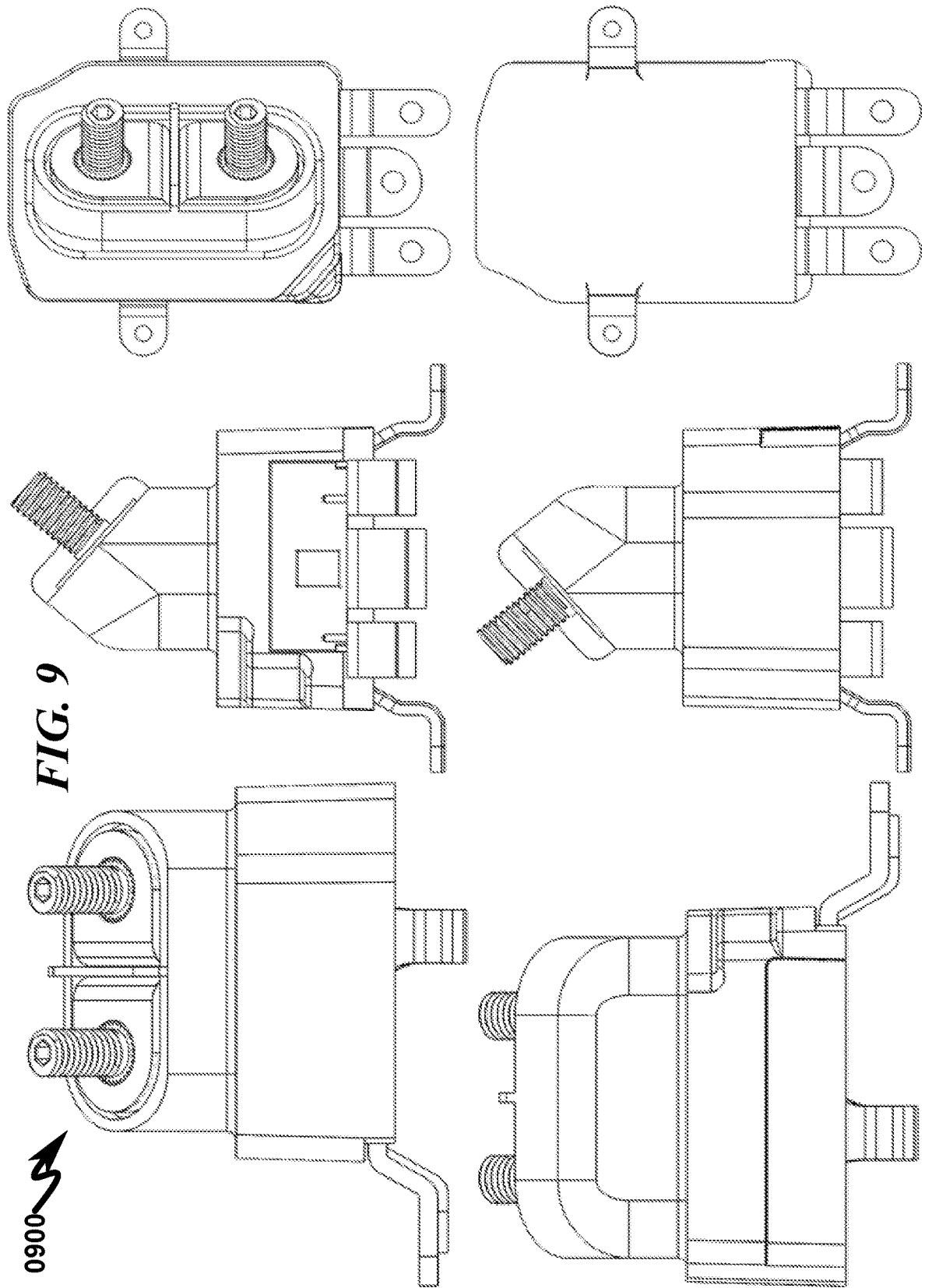
FIG. 9 illustrates front, rear, left side, right side, top, and bottom views of a preferred exemplary system embodiment of the present invention.
Figure 10:
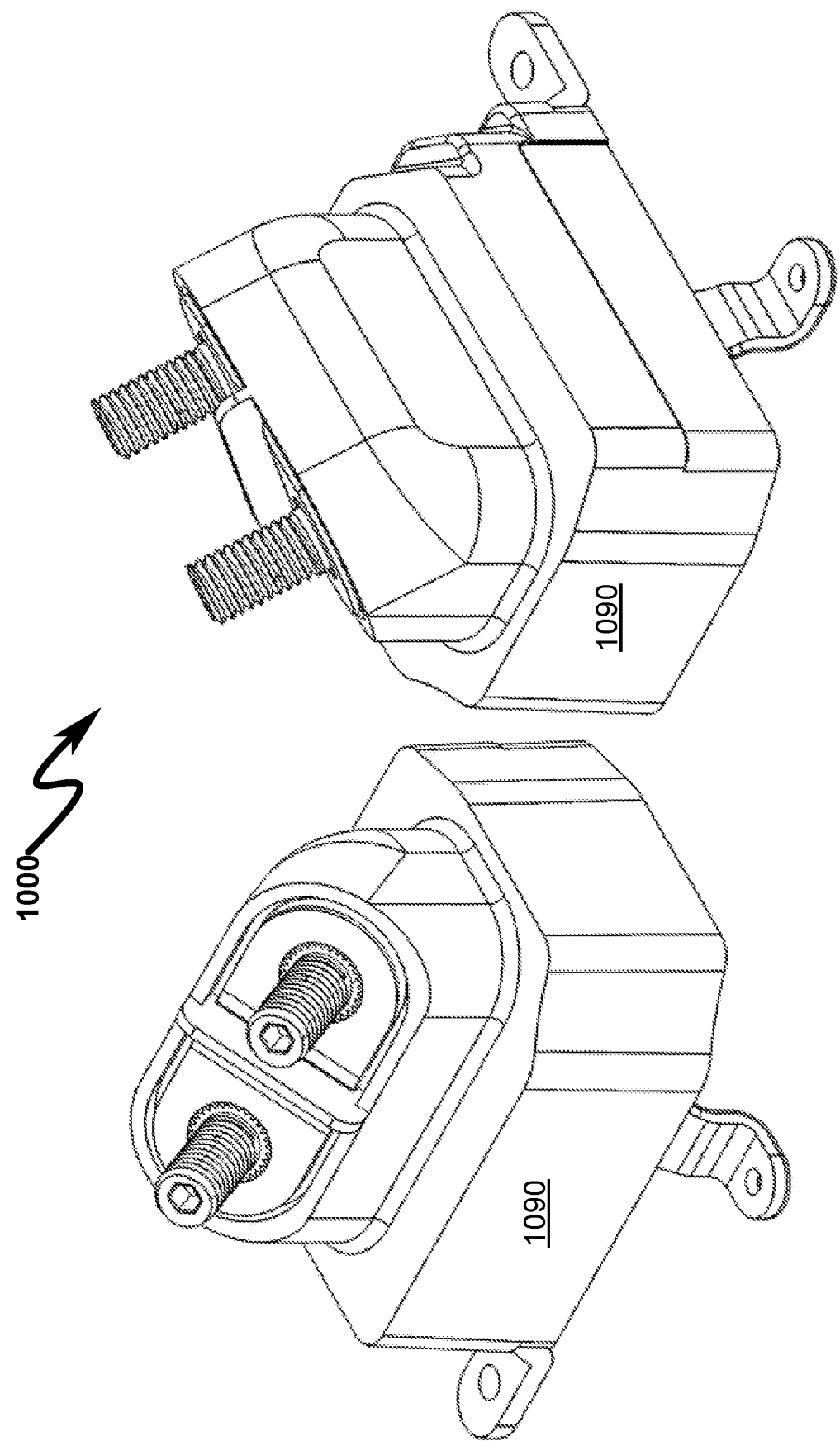
FIG. 10 illustrates front right top and rear right top perspective detail views a preferred exemplary system embodiment of the present invention.
Figure 11:
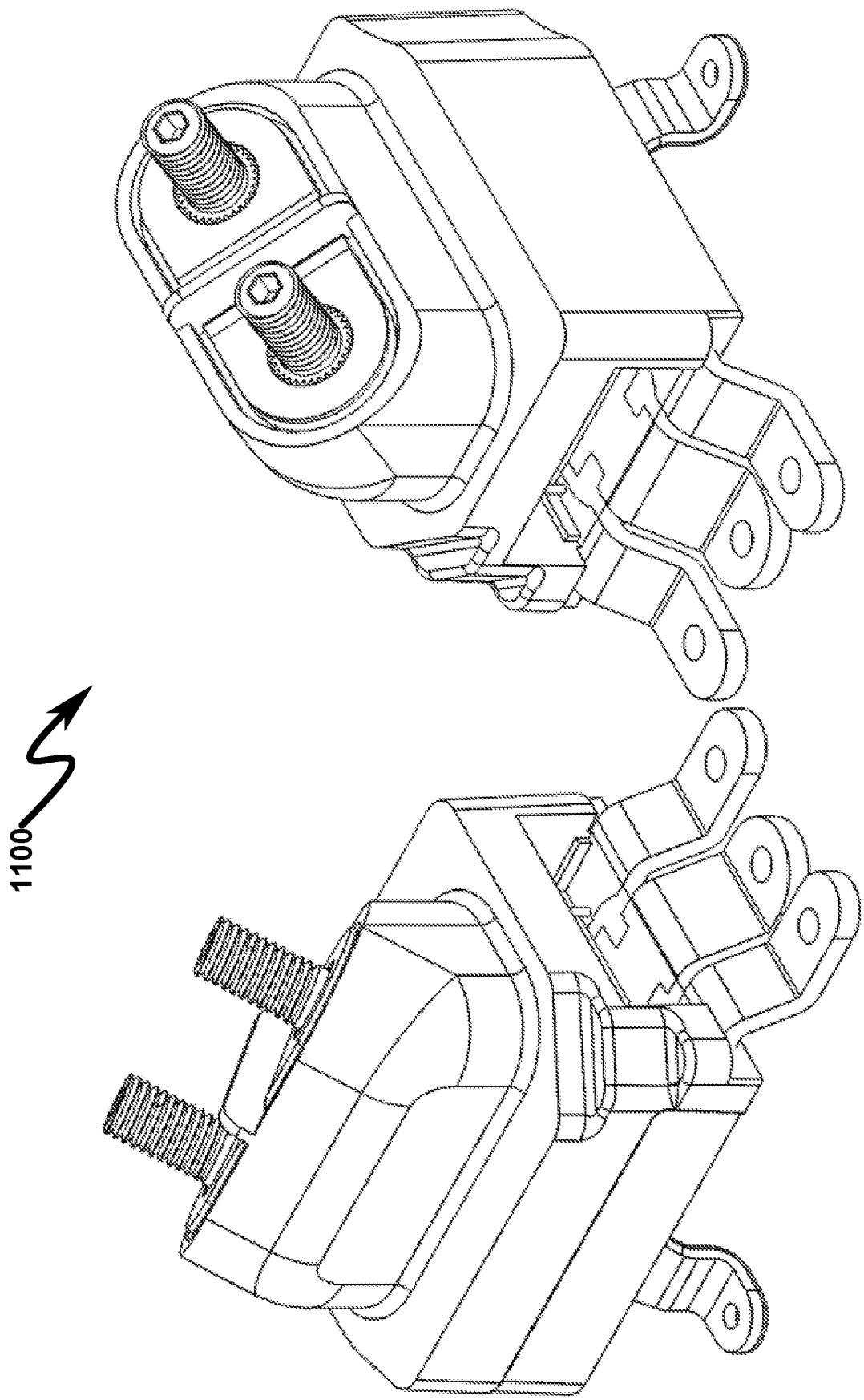
FIG. 11 illustrates rear left top and front left top perspective detail views a preferred exemplary system embodiment of the present invention.
Figure 12:
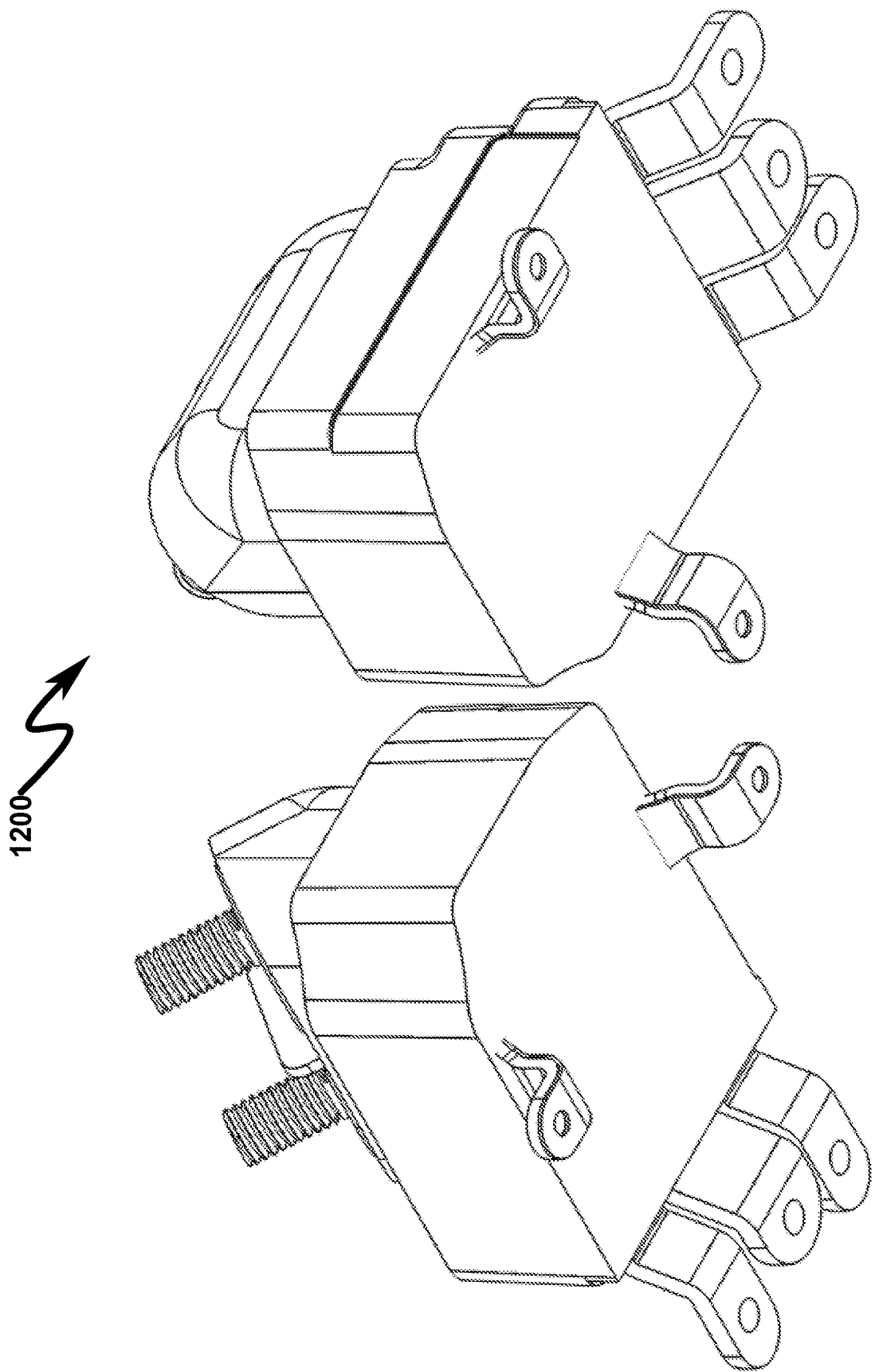
FIG. 12 illustrates front right bottom and rear right bottom perspective detail views a preferred exemplary system embodiment of the present invention.
Figure 13:
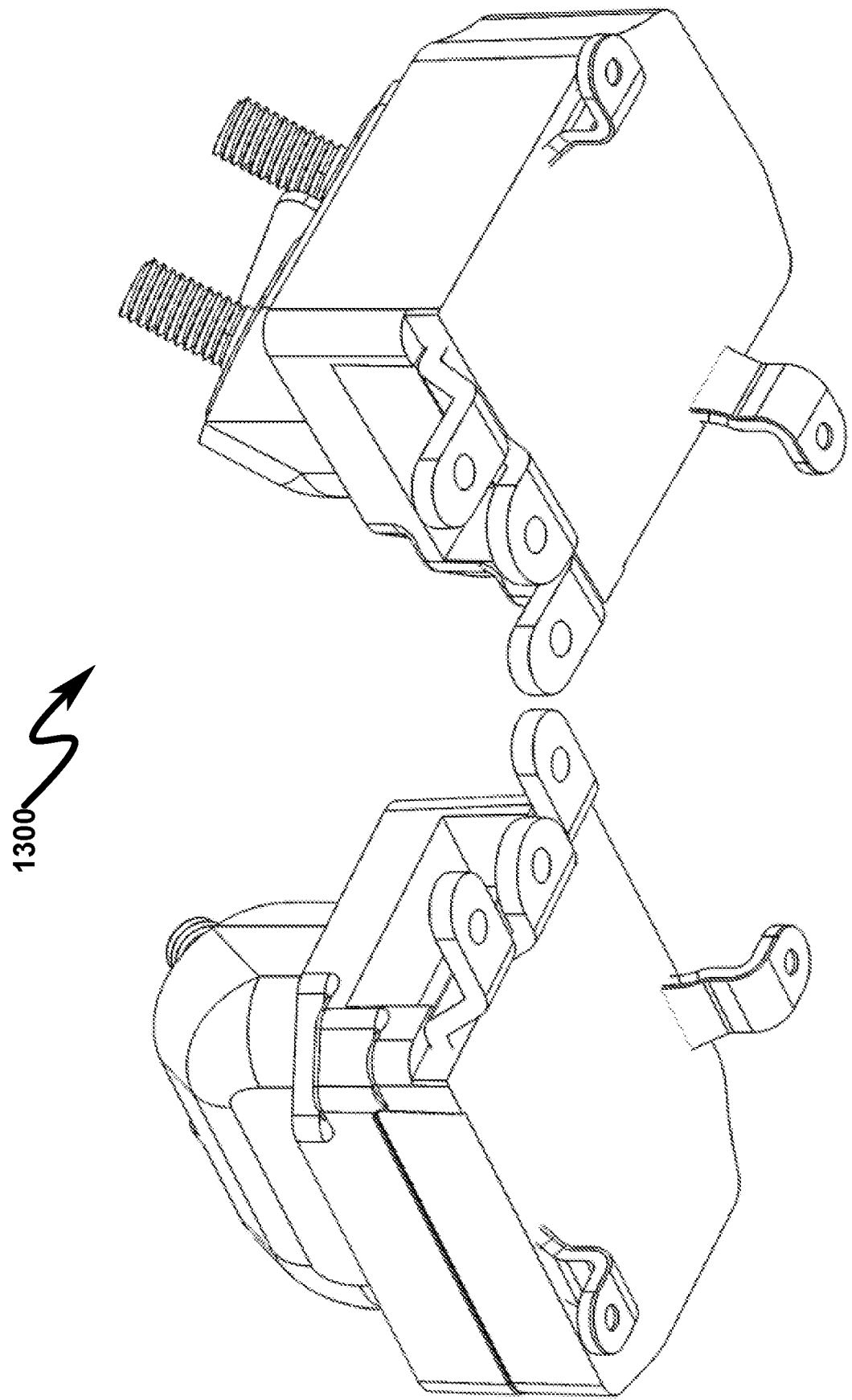
FIG. 13 illustrates rear left bottom and front left bottom perspective detail views a preferred exemplary system embodiment of the present invention.
Figure 14:
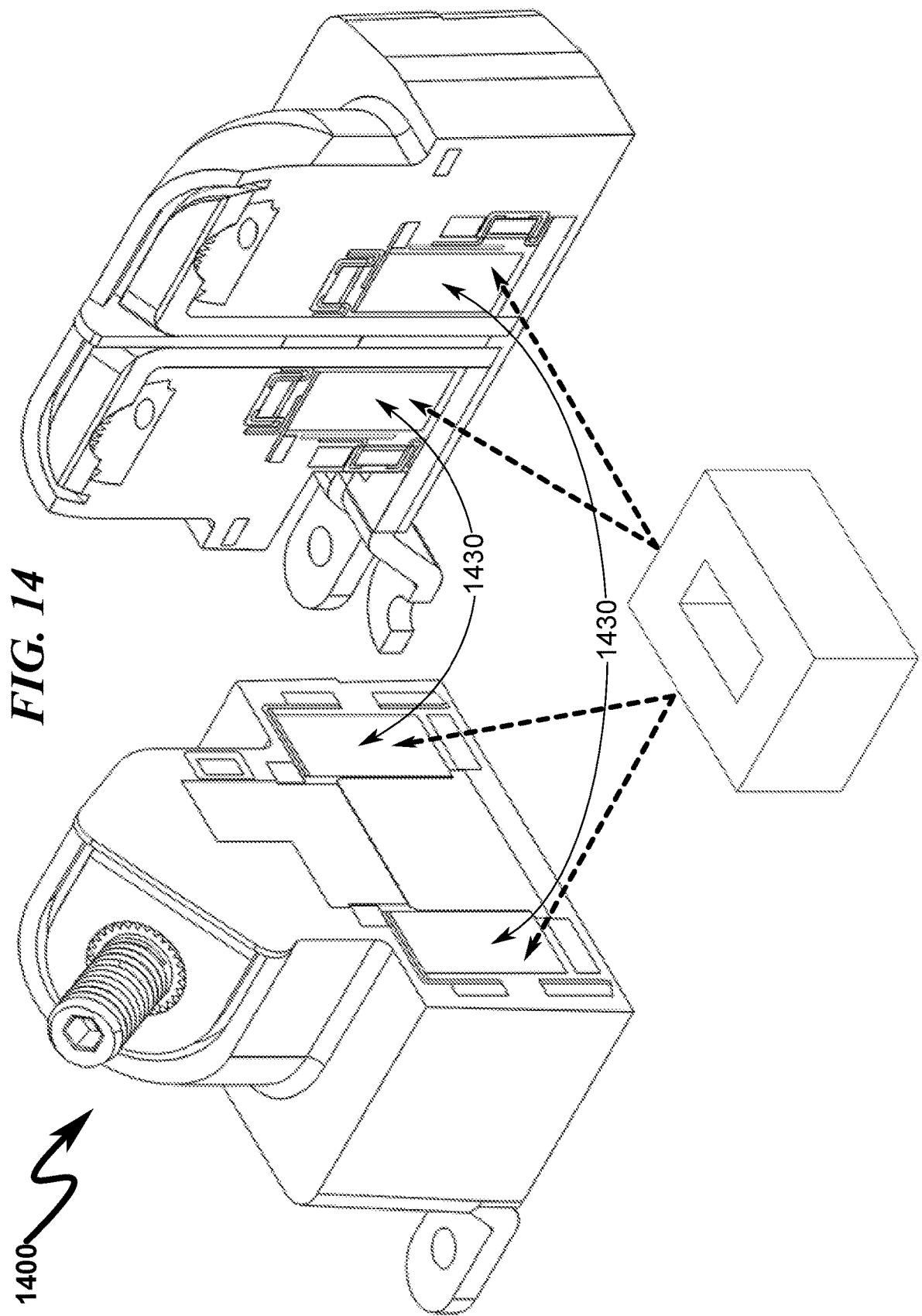
FIG. 14 illustrates right side and front side perspective detail section views a preferred exemplary system embodiment of the present invention detailing placement of the permeable inductor core (PIC) and isolation detail of the permeable inductor core (PIC)
Figure 24:
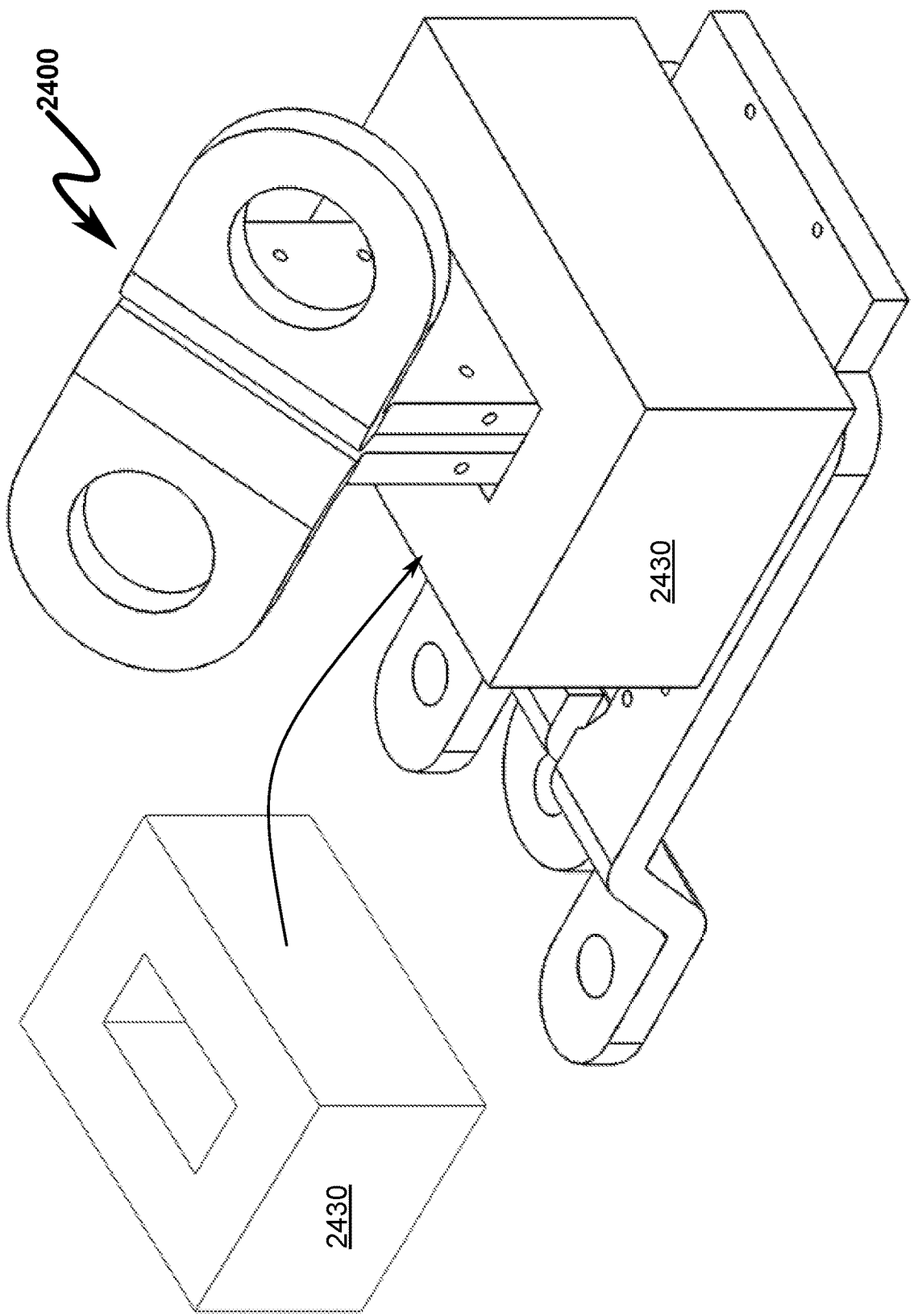
FIG. 24 illustrates a front right top perspective detail view of a preferred exemplary invention system embodiment inductor configuration and BUS+, BUS−, CON+, CON− connections with permeable inductor core (PIC) depicted and also shown in isolation detail.
Figure 25:
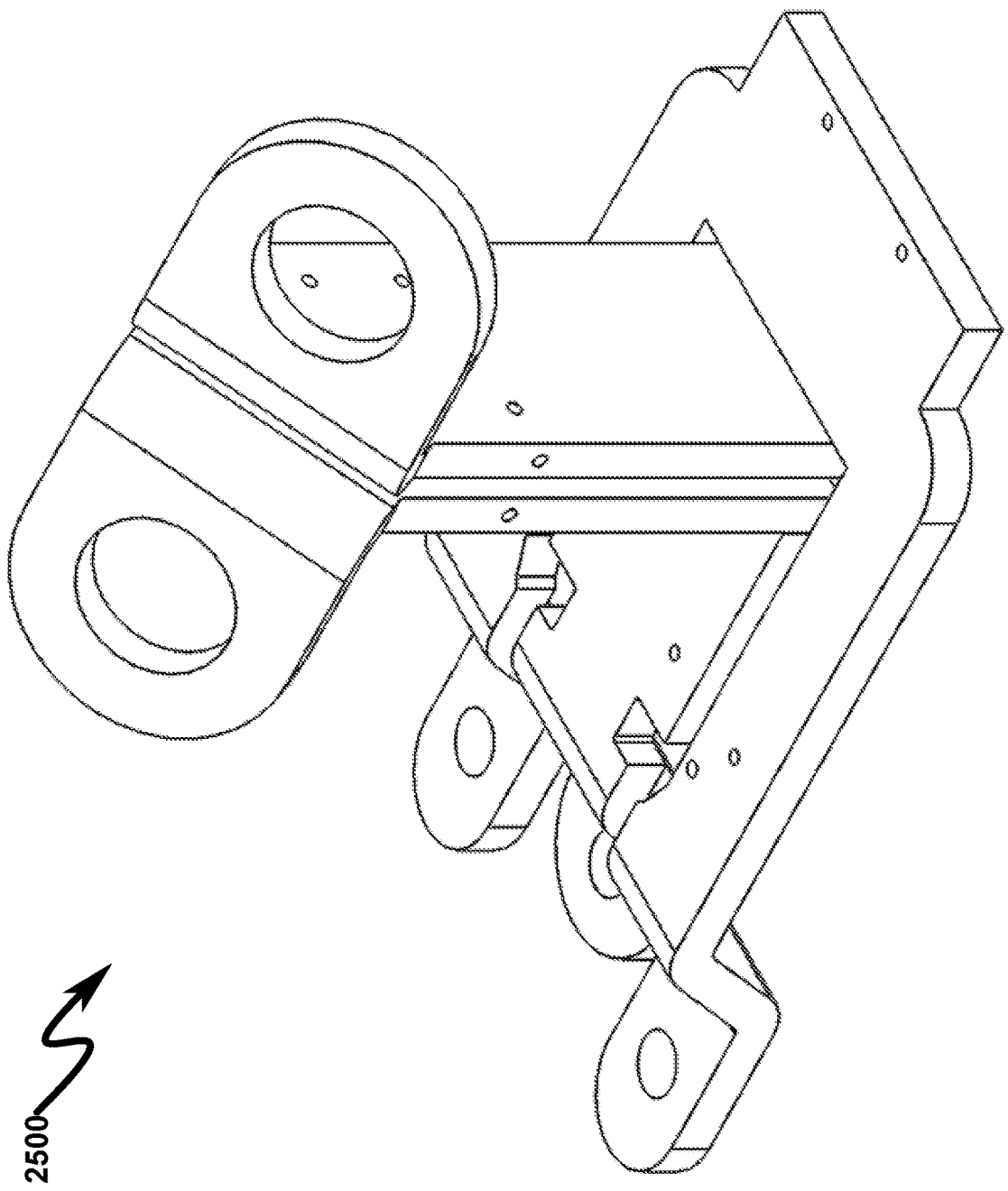
FIG. 25 illustrates a front right top perspective detail view of a preferred exemplary system embodiment of the present invention inductor configuration and BUS+, BUS−, CON+, CON− connections with permeable inductor core (PIC) suppressed.
Figure 26:
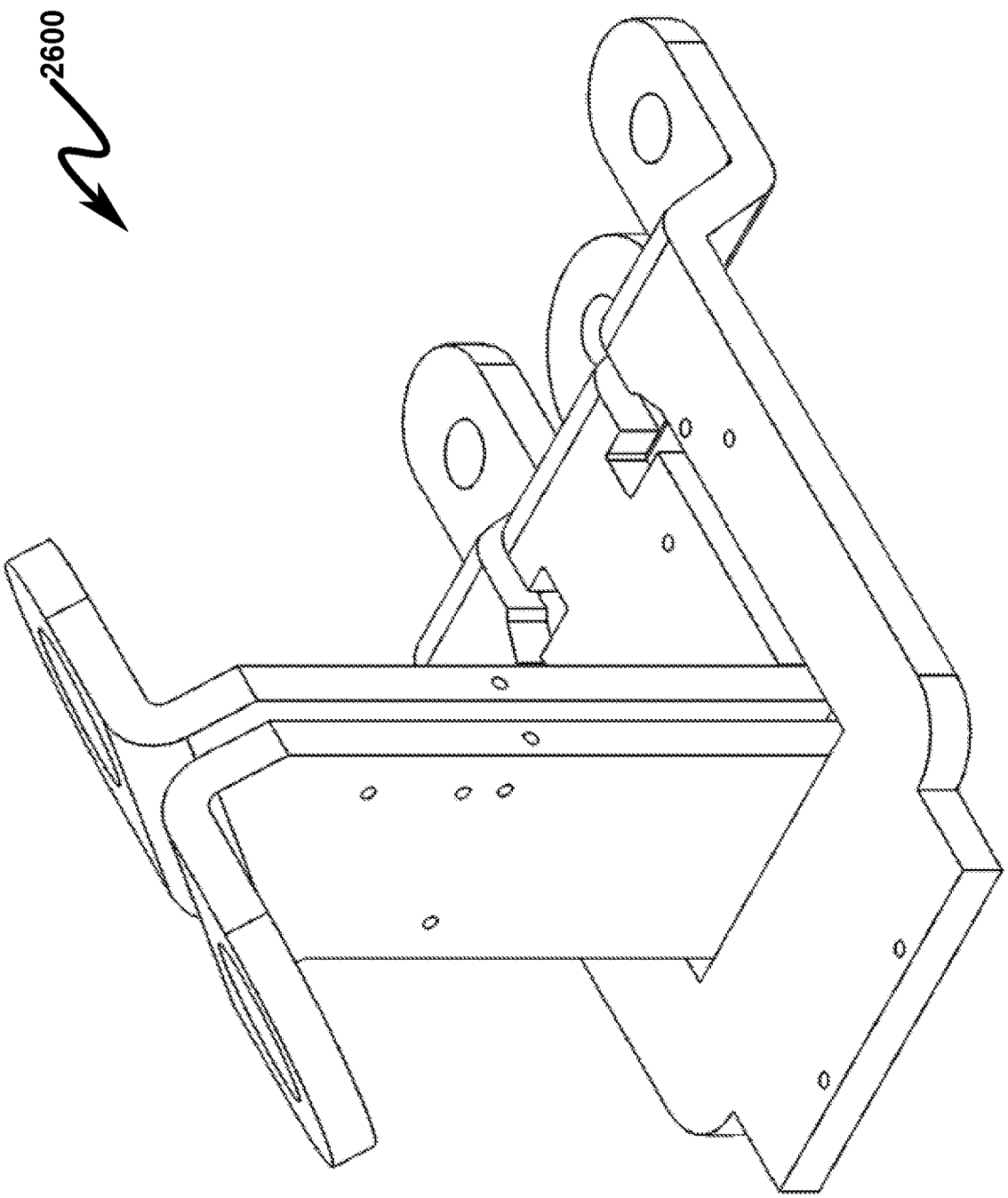
FIG. 26 illustrates a rear right top perspective detail view of a preferred exemplary system embodiment of the present invention inductor configuration and BUS+, BUS−, CON+, CON− connections with permeable inductor core (PIC) suppressed.
Figure 27:
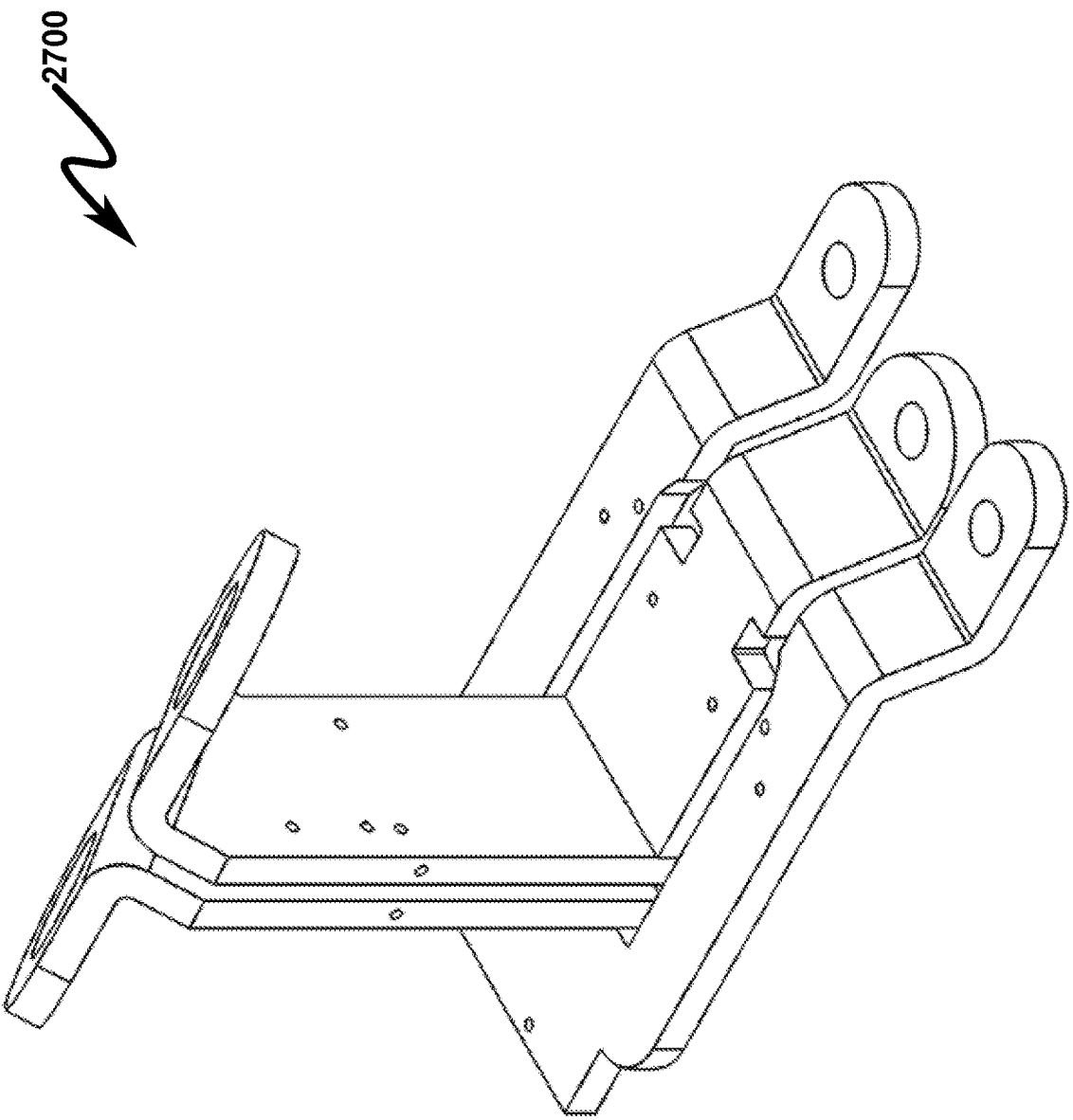
FIG. 27 illustrates a rear left top perspective detail view of a preferred exemplary system embodiment of the present invention inductor configuration and BUS+, BUS−, CON+, CON− connections with permeable inductor core (PIC) suppressed.
Figure 28:
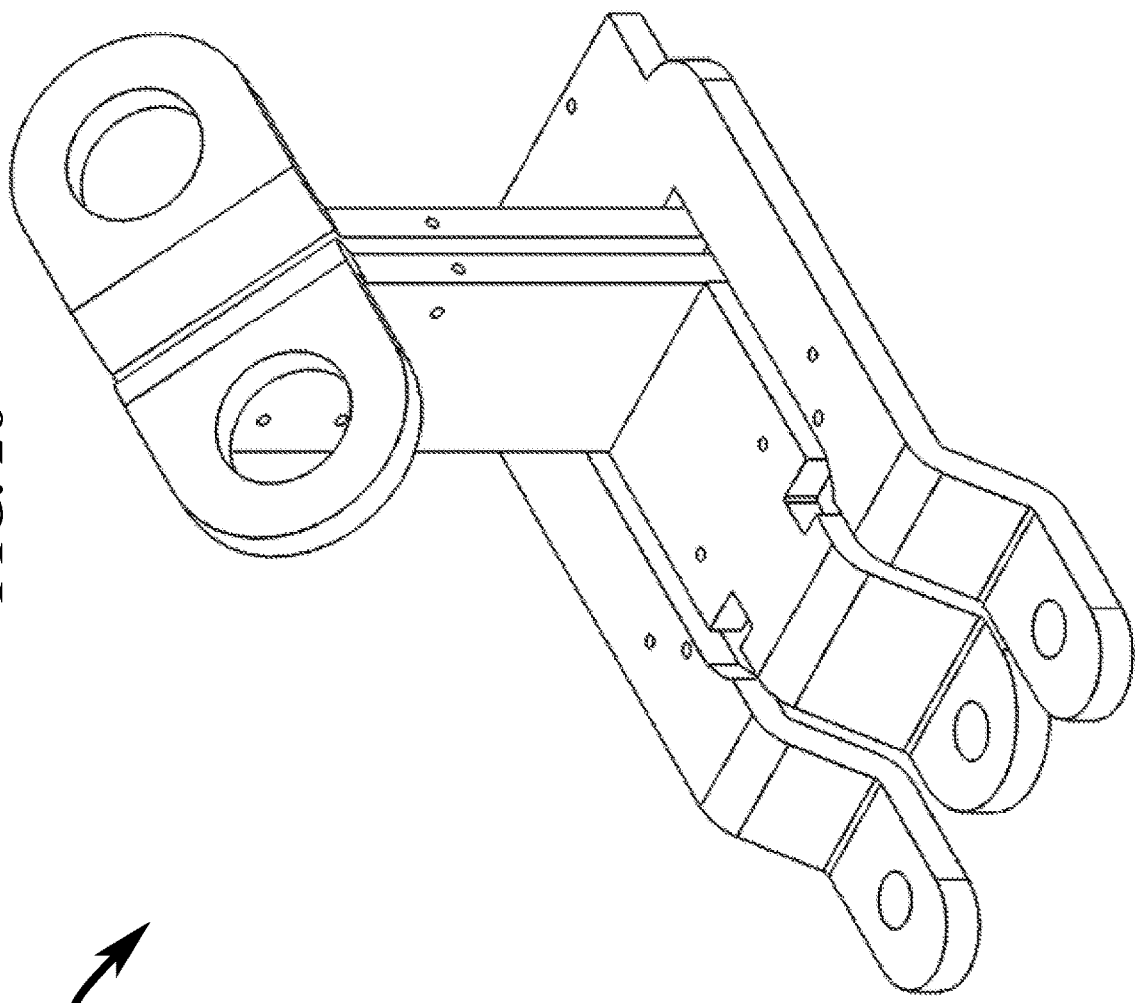
FIG. 28 illustrates a front left top perspective detail view of a preferred exemplary system embodiment of the present invention inductor configuration and BUS+, BUS−, CON+, CON− connections with permeable inductor core (PIC) suppressed.
Figure 29:
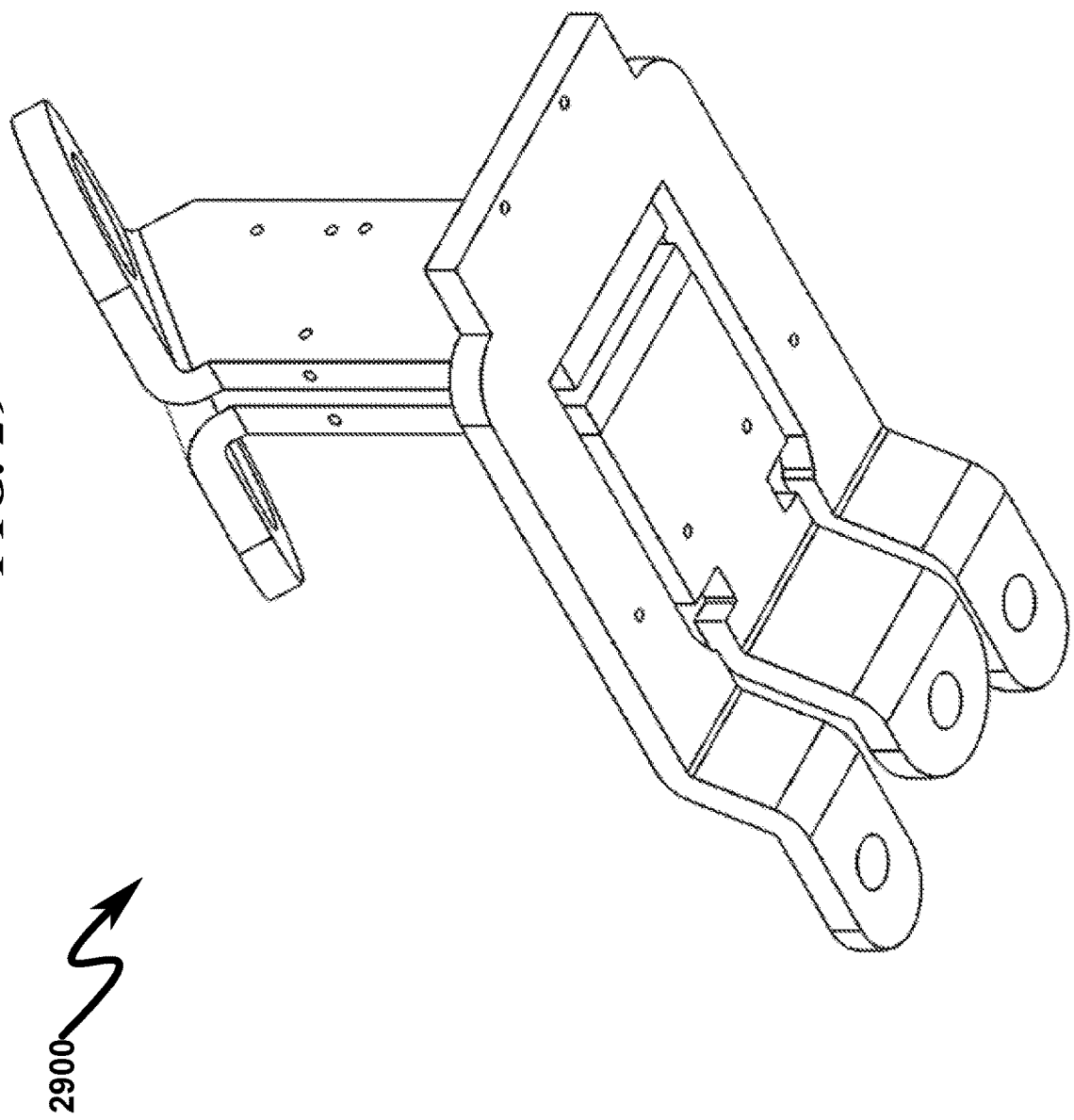
FIG. 29 illustrates a front right bottom perspective detail view of a preferred exemplary system embodiment of the present invention inductor configuration and BUS+, BUS−, CON+, CON− connections with permeable inductor core (PIC) suppressed.
Figure 30:
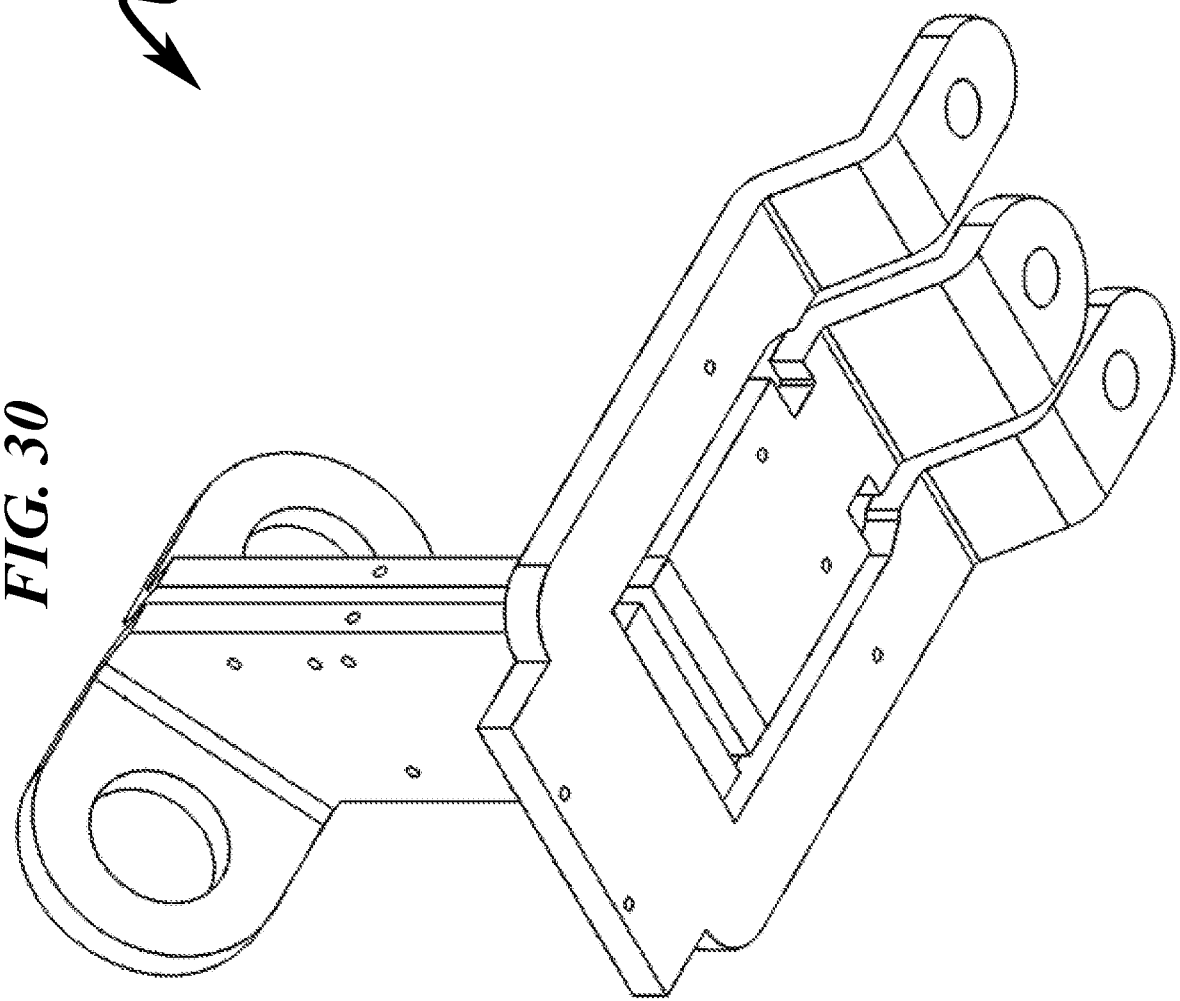
FIG. 30 illustrates a rear right bottom perspective detail view of a preferred exemplary system embodiment of the present invention inductor configuration and BUS+, BUS−, CON+, CON− connections with permeable inductor core (PIC) suppressed.
Figure 31:
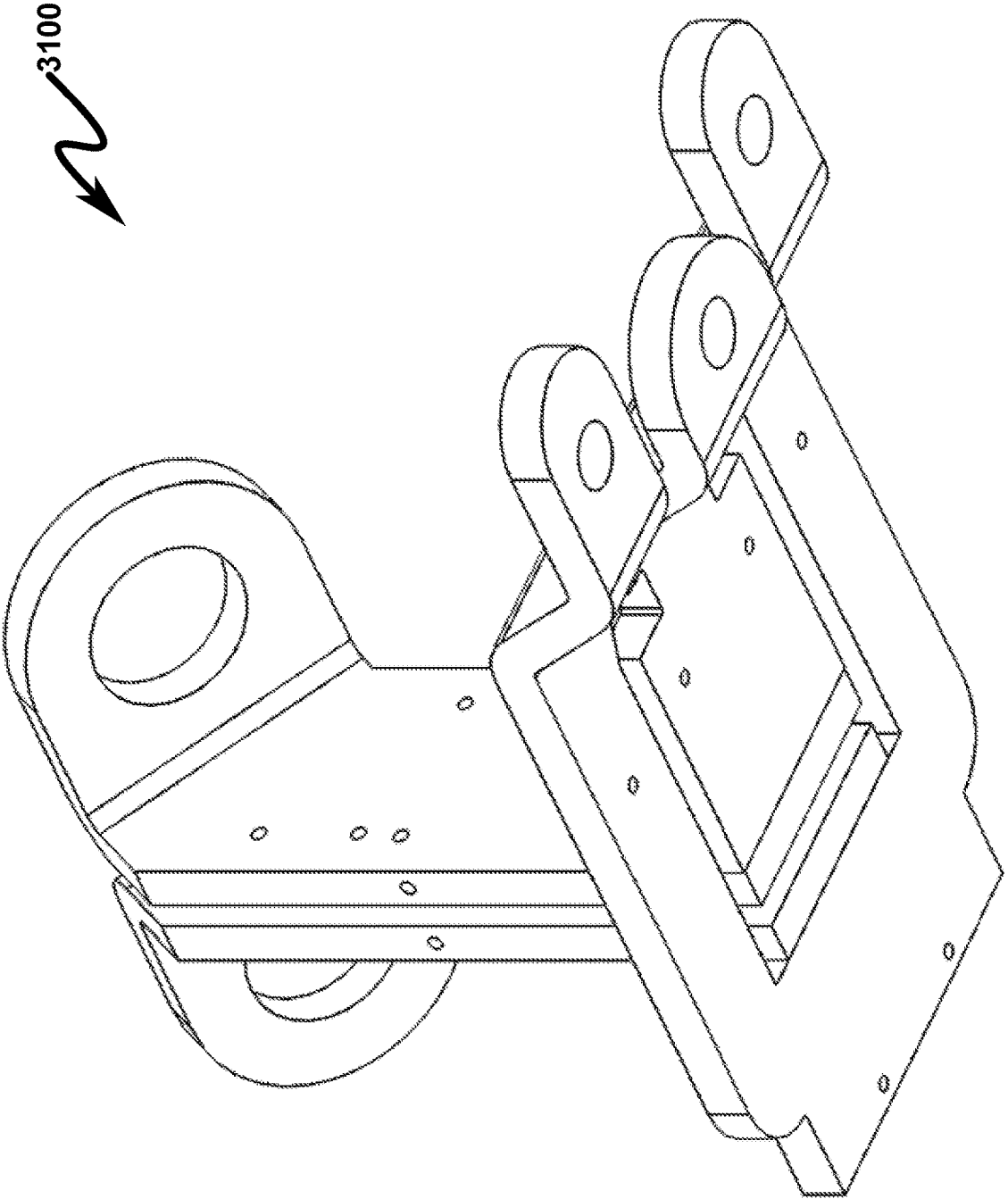
FIG. 31 illustrates a rear left bottom perspective detail view of a preferred exemplary system embodiment of the present invention inductor configuration and BUS+, BUS−, CON+, CON− connections with permeable inductor core (PIC) suppressed.
Figure 64:
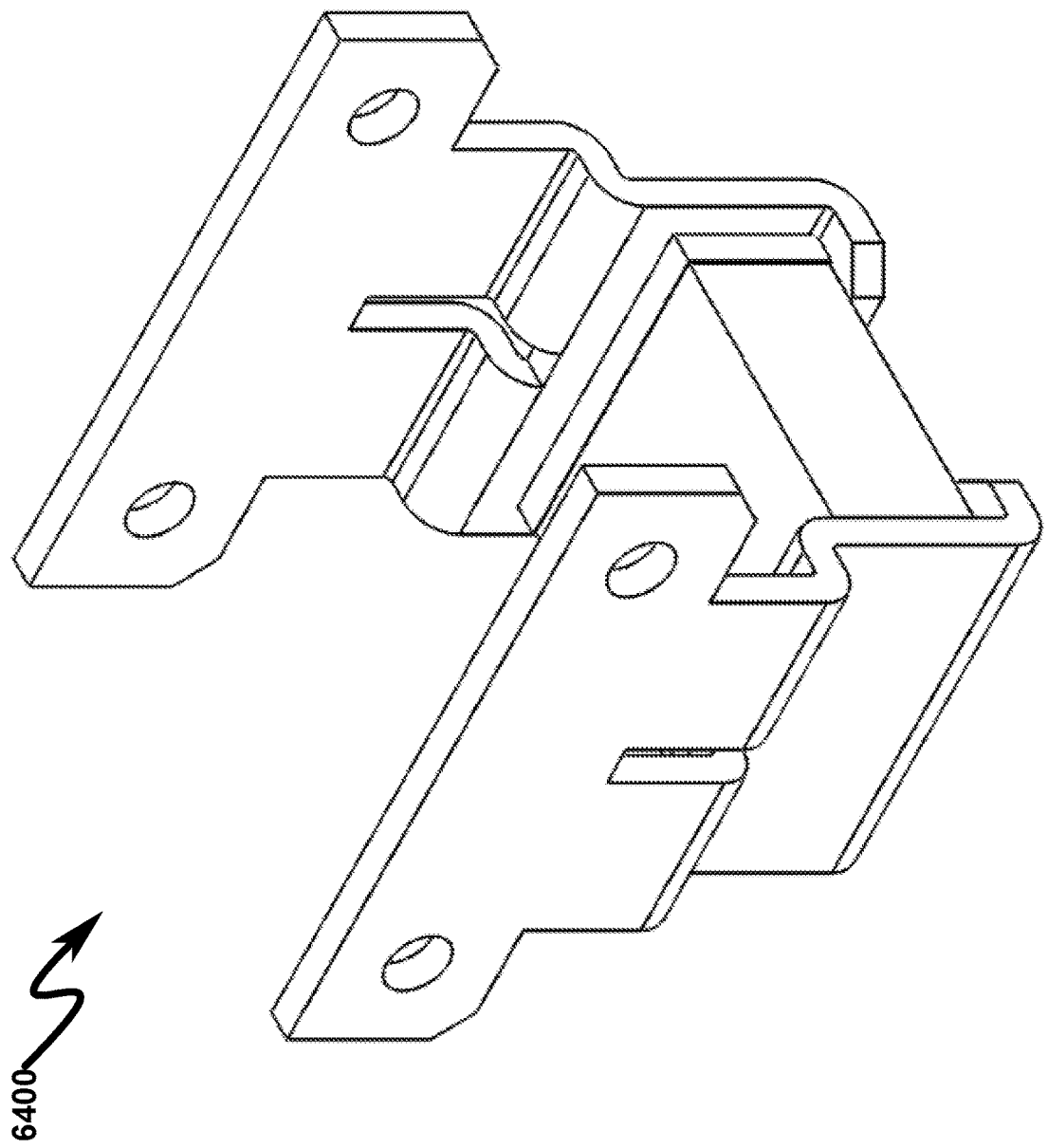
FIG. 64 illustrates a front left top perspective view of a third capacitor construction with component over-molding suppressed that may be useful in some preferred exemplary system embodiments.

Details of the plastic encapsulating enclosure (PEC) that allows formation an integrated EIF mechanical assembly is generally depicted in FIG. 9 (0900)-FIG. 13 (1300). Details of the relationship between the permeable inductor core (PEC) and BUS+/BUS−, INC+/INC−, CON+/CON−, and PEC elements is generally depicted in FIG. 14 (1400)-FIG. 24 (2400). Details of the attachment relationship between the BUS+/BUS− and INC+/INC−, and CON+/CON− elements is generally depicted in FIG. 25 (2500)-FIG. 32 (3200). Details of the placement of the capacitor assemblies in the overall EIF is generally depicted in FIG. 33 (3300)-FIG. 40 (4000). Details of leadframe formation and capacitor attachment therein with and without capacitor encapsulation are generally depicted in FIG. 41 (4100)-FIG. 64 (6400).

Construction Overview (0900)-(1300)

A general view of a preferred exemplary system embodiment of the present invention is generally depicted in FIG. 9 (0900)-FIG. 13 (1300) wherein the depicted embodiment is encapsulated in a plastic encapsulating cover (PEC) (1090) that serves to protect internal components while providing mechanical stability for components contained within the apparatus. The PEC is typically formed as a final injection molding process that completely covers and impregnates all voids within the EIF and thus provides protection from the harsh elements of the environment but also provides additional mechanical stability between individual components that make up the EIF.

Permeable Inductor Core (PIC) (1400)-(1600)

Figure 15:
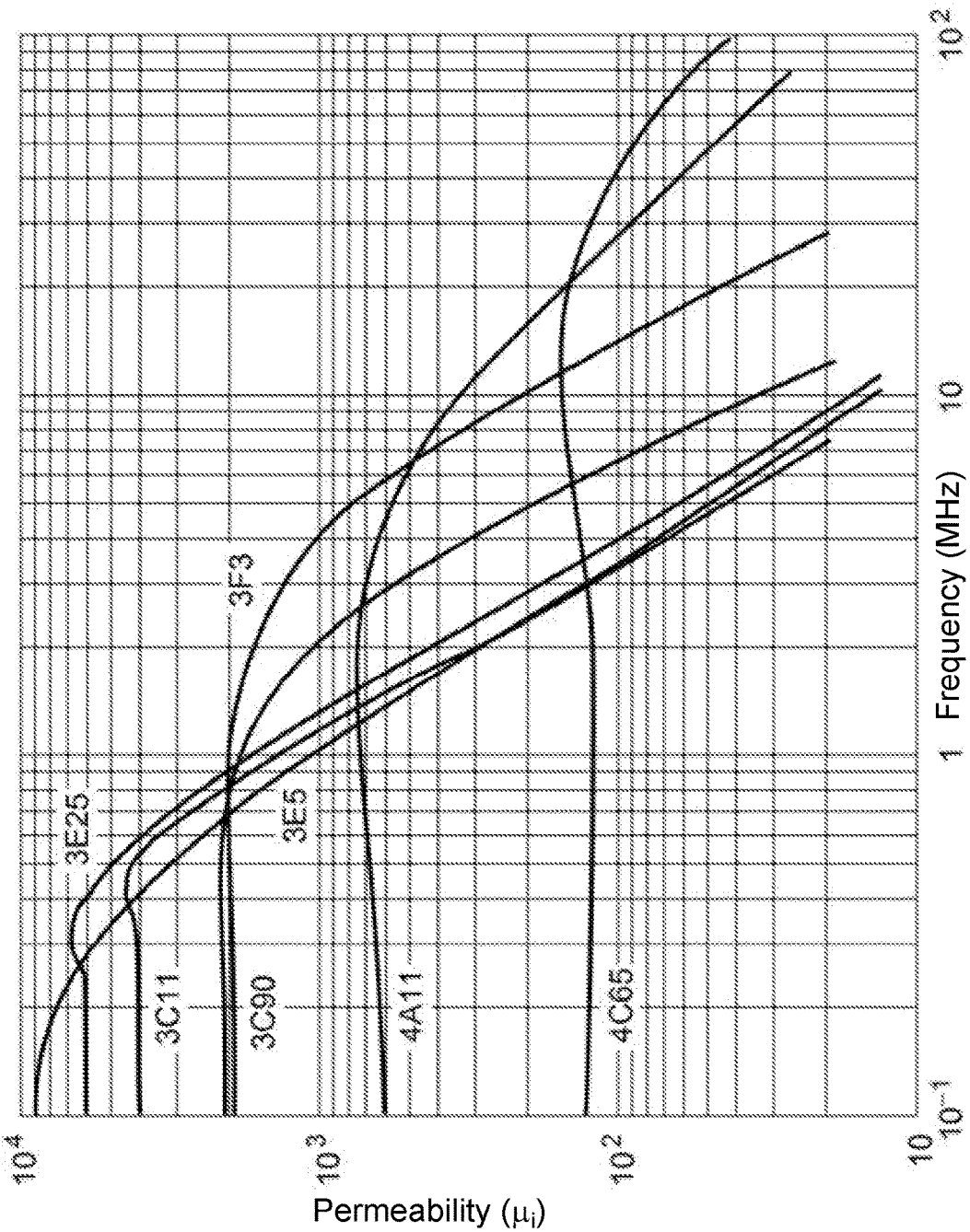
FIG. 15 illustrates a graph depicting the permeability vs. frequency of various PIC materials that may be useful in implementing the present invention.
Figure 16:
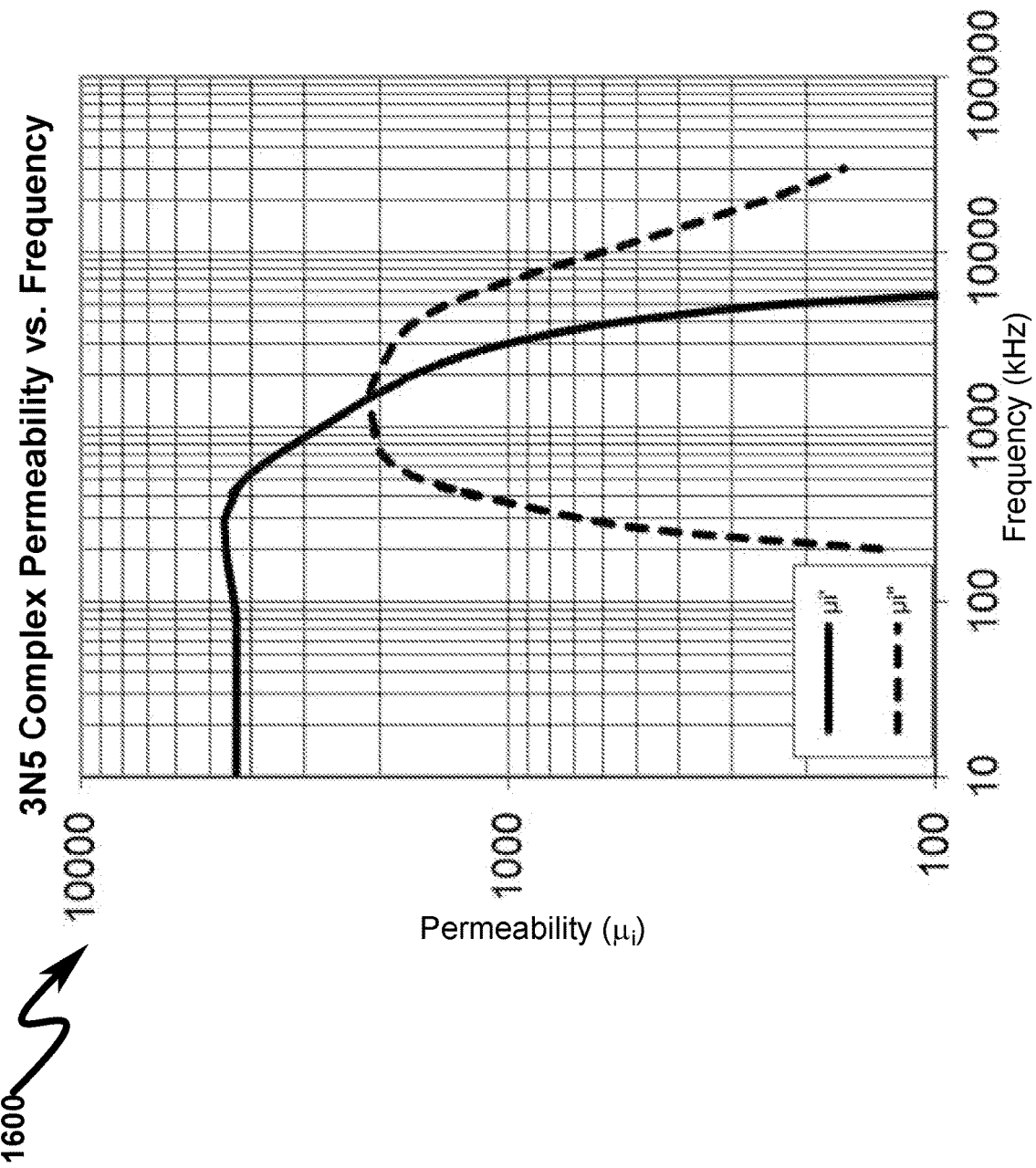
FIG. 16 illustrates a graph depicting the permeability vs. frequency of model 3N5 PIC material that may be useful in implementing the present invention.

Within the context of the present invention the use of a magnetically permeable inductor core (PIC) is used to form one or more inductor elements that server to suppress RF frequencies. The section views of FIG. 14 (1400) illustrate the position of the PIC (1430) within the context of a preferred exemplary invention embodiment as well as a general preferred form of the PIC that may have many configurations. While a wide variety of PIC materials may be utilized in this context, the performance of some preferred PIC materials is generally depicted in the graph of FIG. 15 (1500), with a preferred 3N5 material permeability performance depicted in FIG. 16 (1600).

BUS/INC/CON and Inductor Detail (1700)-(3200)

Figure 17:
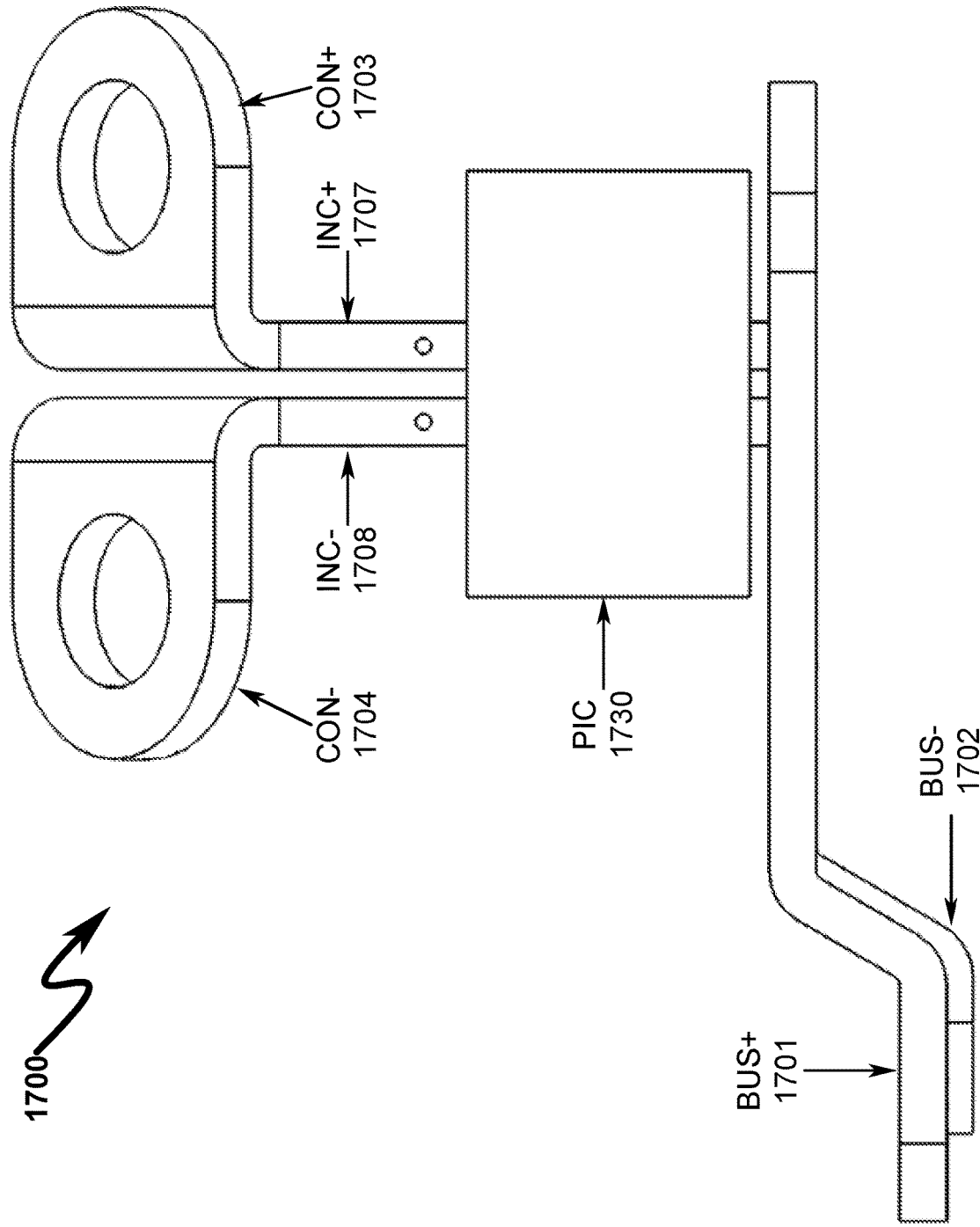
FIG. 17 illustrates a front detail view of a preferred exemplary invention system embodiment inductor configuration and BUS+, BUS−, CON+, CON− connections.
Figure 18:
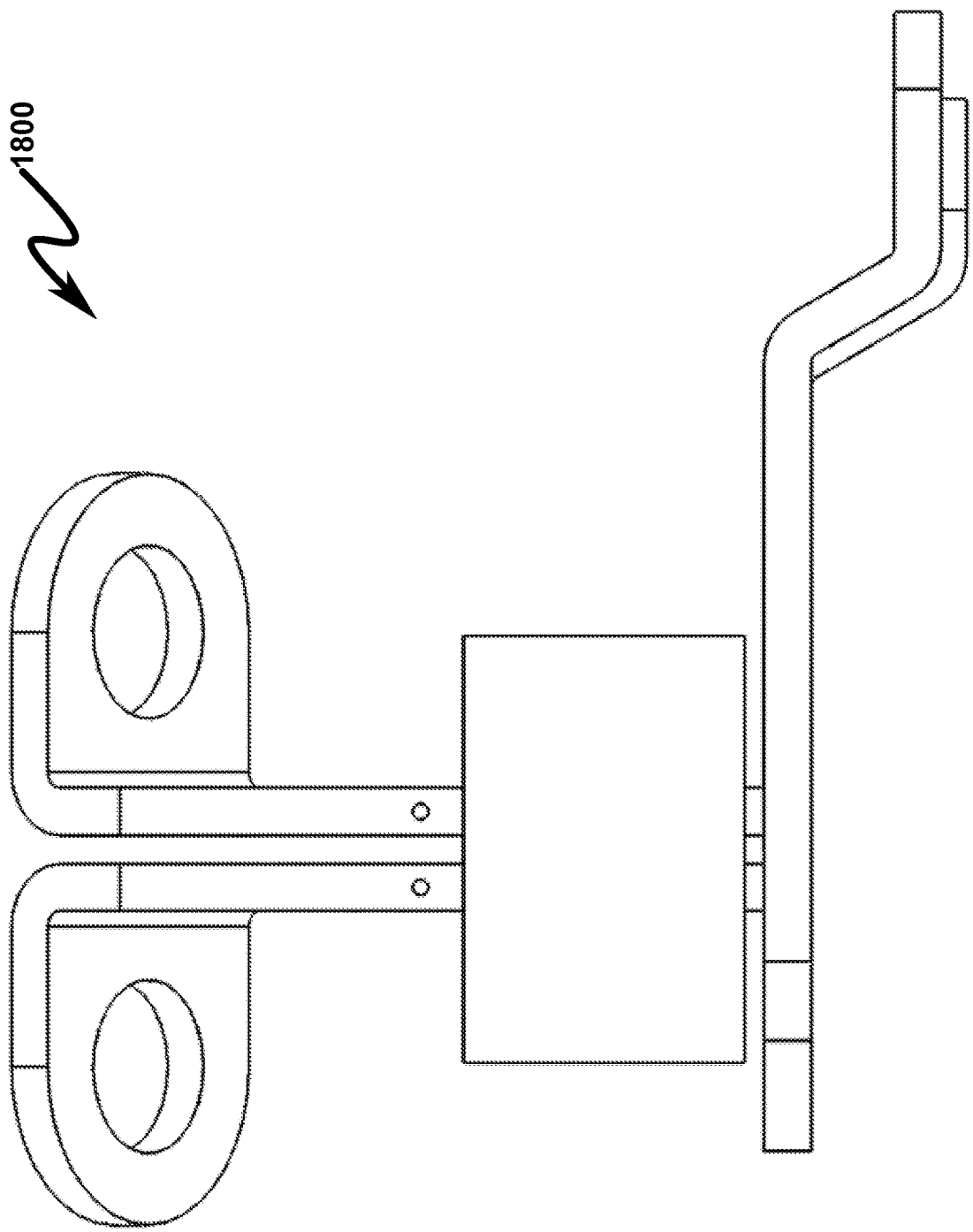
FIG. 18 illustrates a rear detail view of a preferred exemplary invention system embodiment inductor configuration and BUS+, BUS−, CON+, CON− connections.
Figure 19:
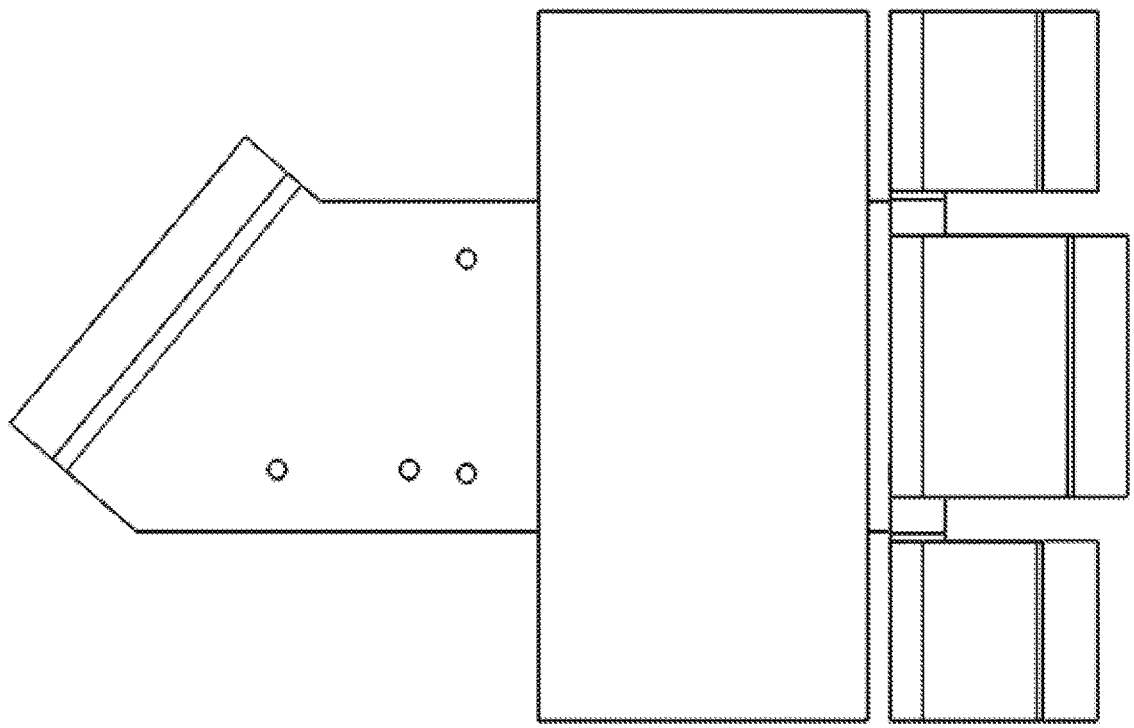
FIG. 19 illustrates a left side detail view of a preferred exemplary invention system embodiment inductor configuration and BUS+, BUS−, CON+, CON− connections.
Figure 20:
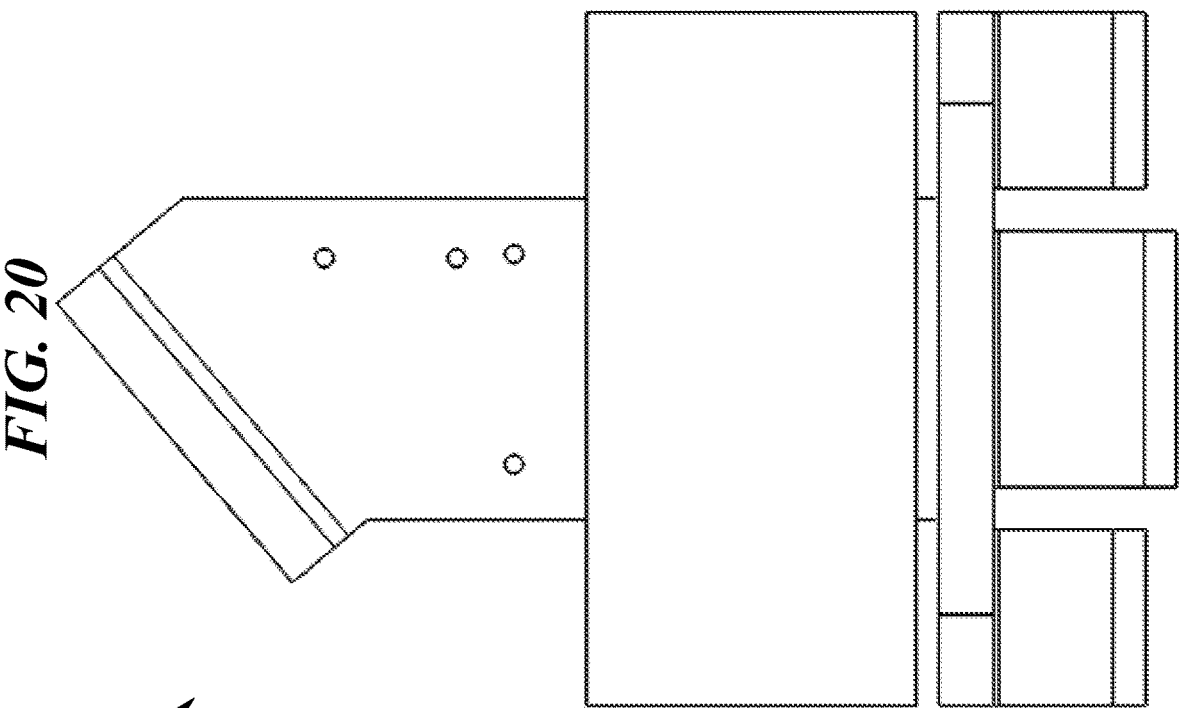
FIG. 20 illustrates a right side detail view of a preferred exemplary invention system embodiment inductor configuration and BUS+, BUS−, CON+, CON− connections.
Figure 21:
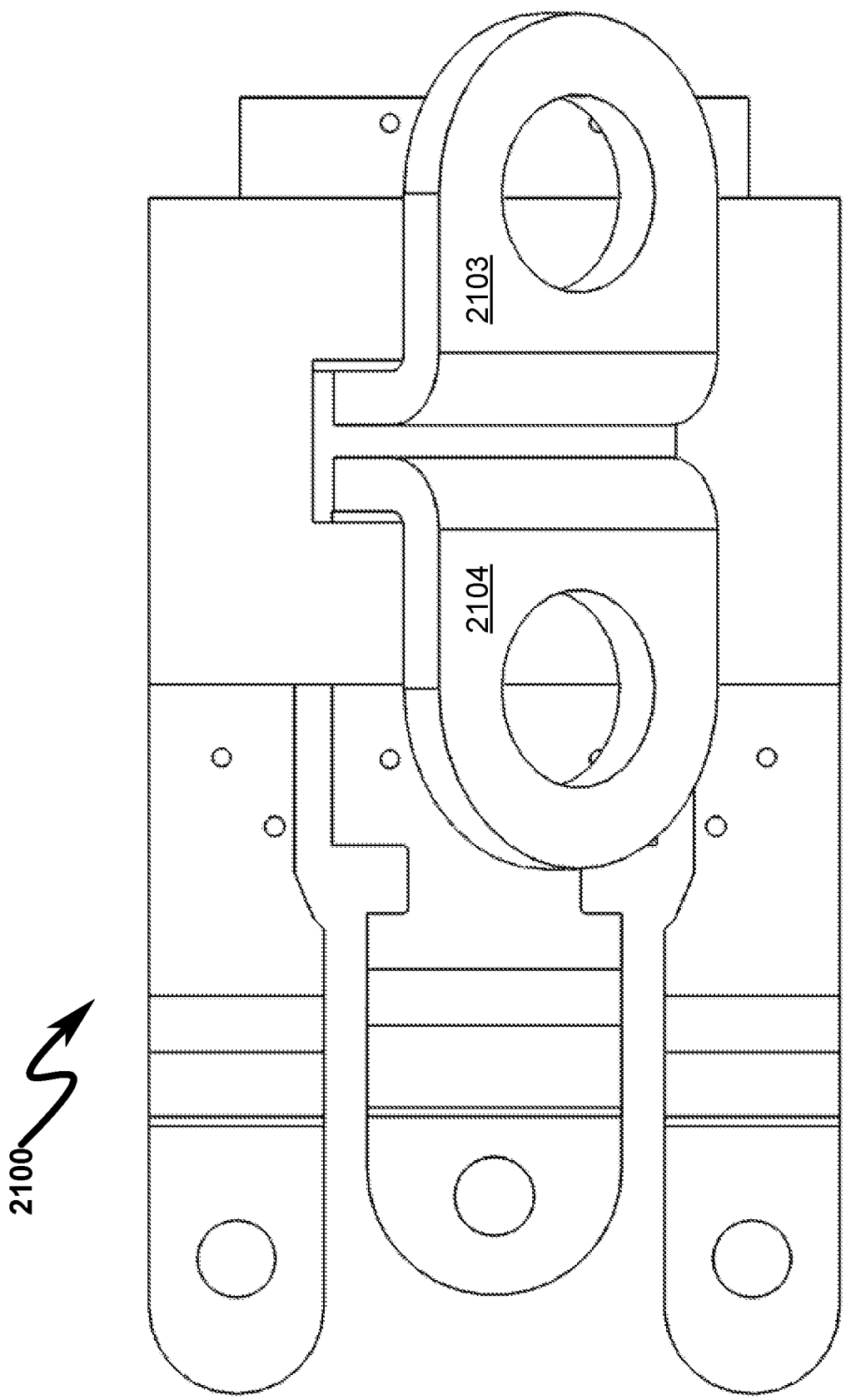
FIG. 21 illustrates a top detail view of a preferred exemplary invention system embodiment inductor configuration and BUS+, BUS−, CON+, CON− connections.
Figure 22:
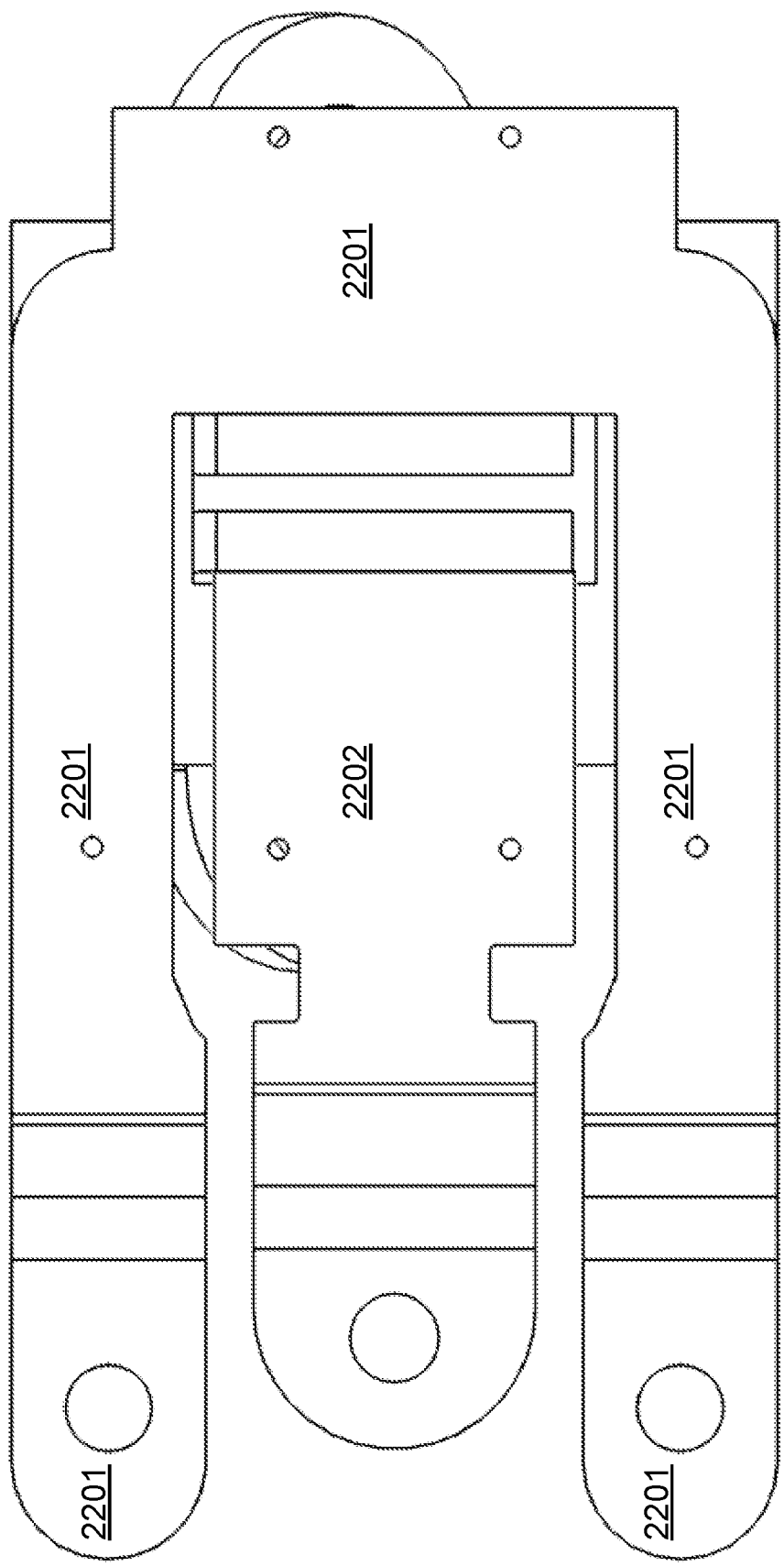
FIG. 22 illustrates a bottom detail view of a preferred exemplary invention system embodiment inductor configuration and BUS+, BUS−, CON+, CON− connections.
Figure 23:
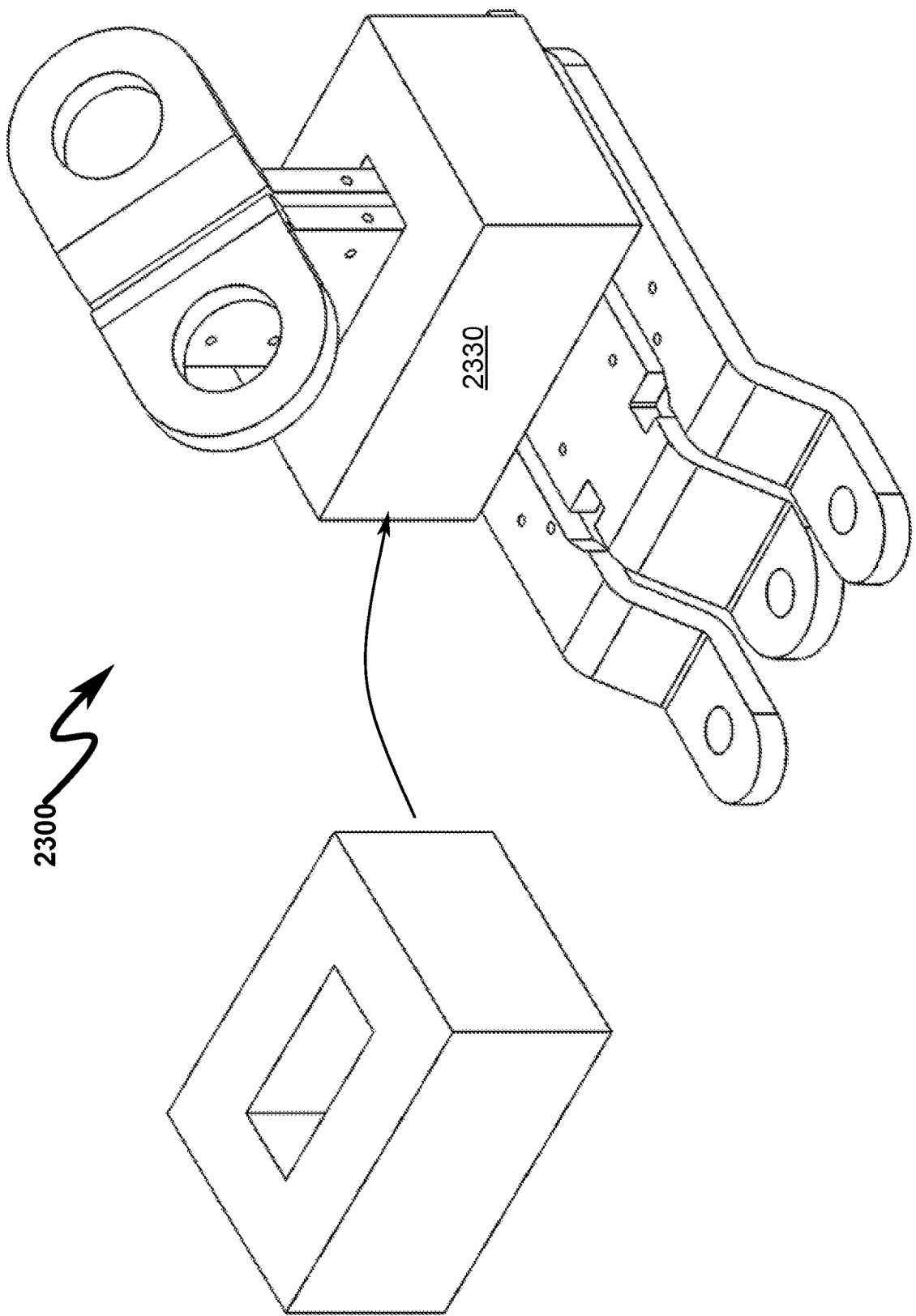
FIG. 23 illustrates a front left top perspective detail view of a preferred exemplary invention system embodiment inductor configuration and BUS+, BUS−, CON+, CON− connections with permeable inductor core (PIC) depicted and also shown in isolation detail.
Figure 32:
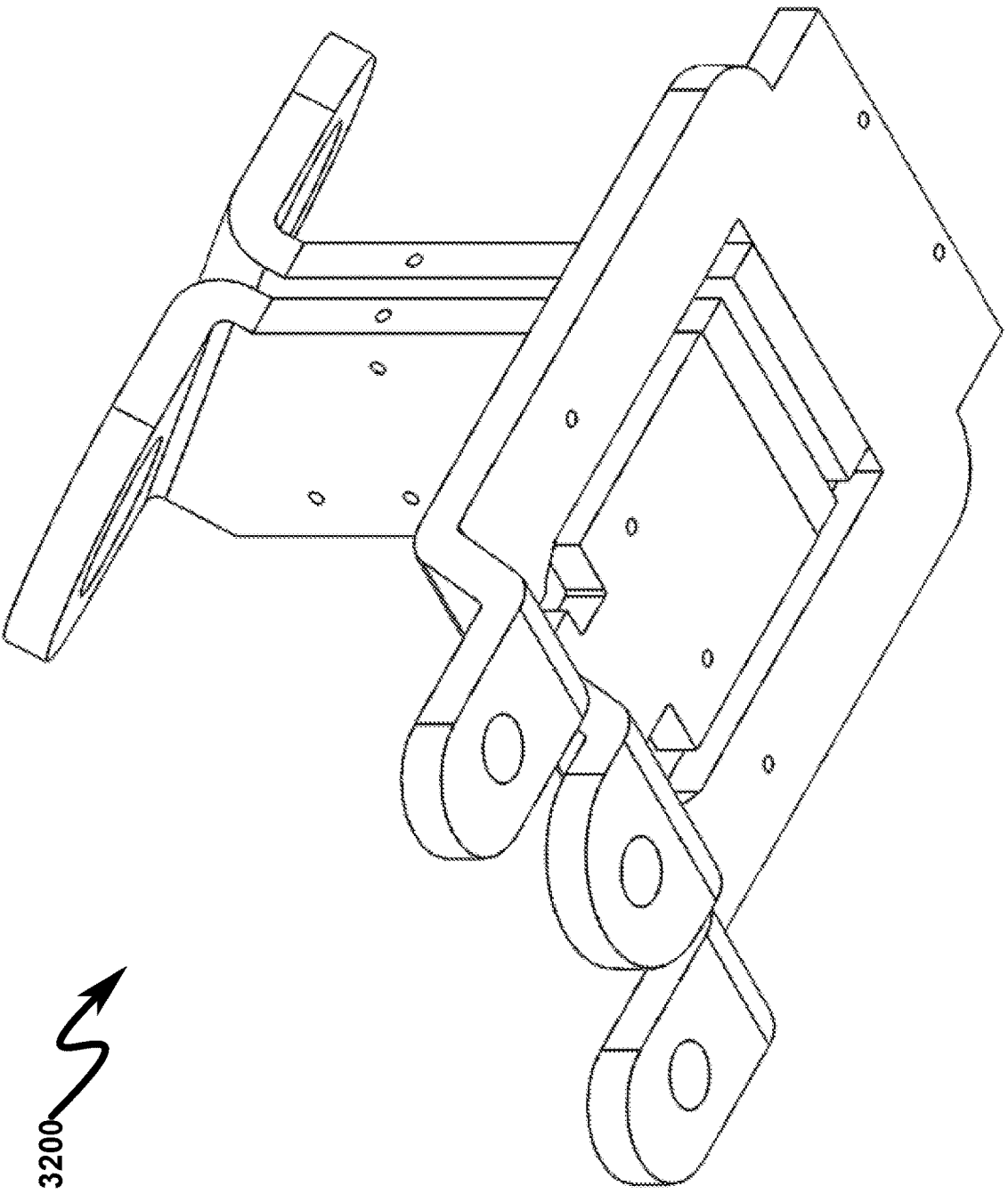
FIG. 32 illustrates a front left bottom perspective detail view of a preferred exemplary system embodiment of the present invention inductor configuration and BUS+, BUS−, CON+, CON− connections with permeable inductor core (PIC) suppressed.
Figure 33:
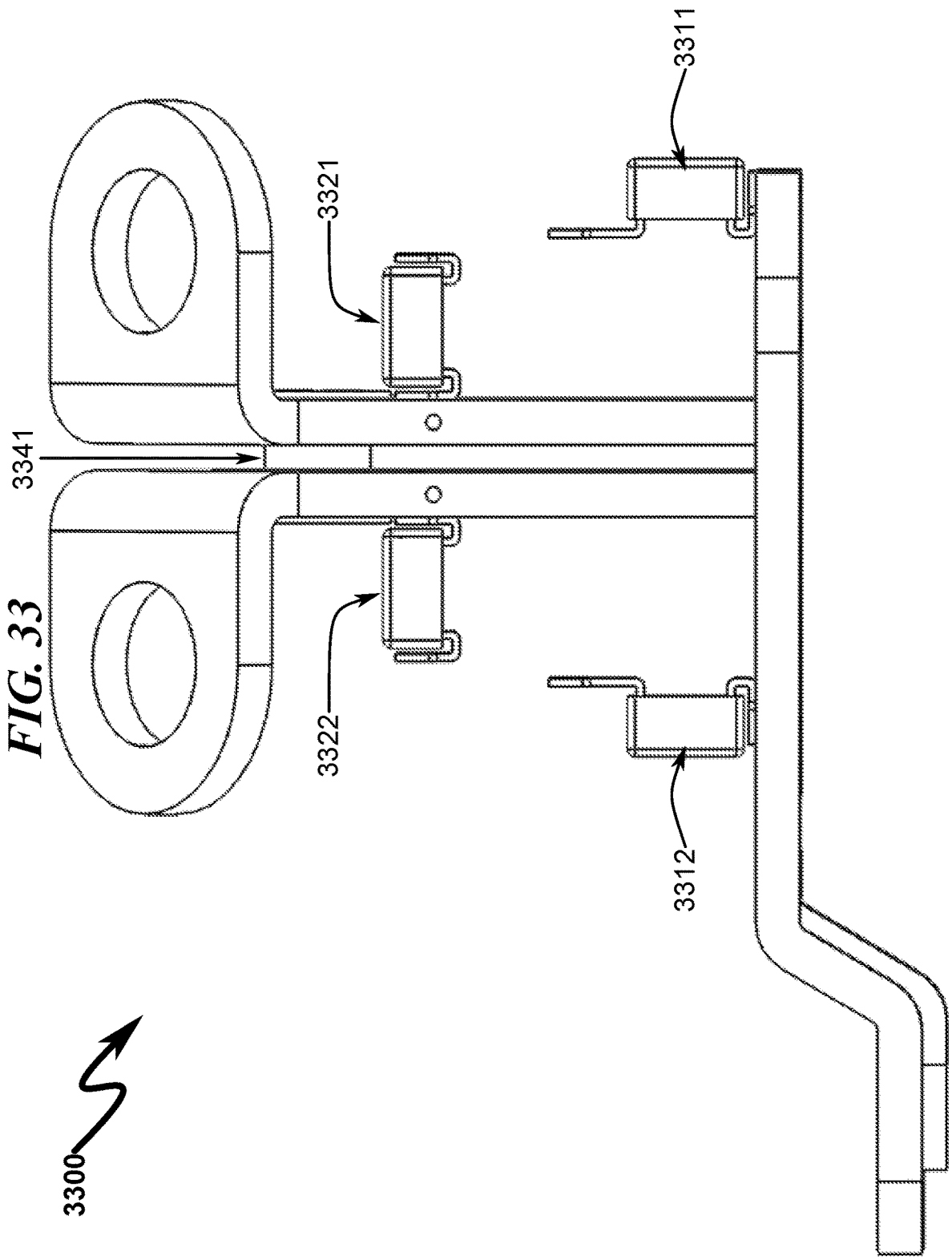
FIG. 33 illustrates a front detail view of a preferred exemplary invention system embodiment capacitor connections.
Figure 34:
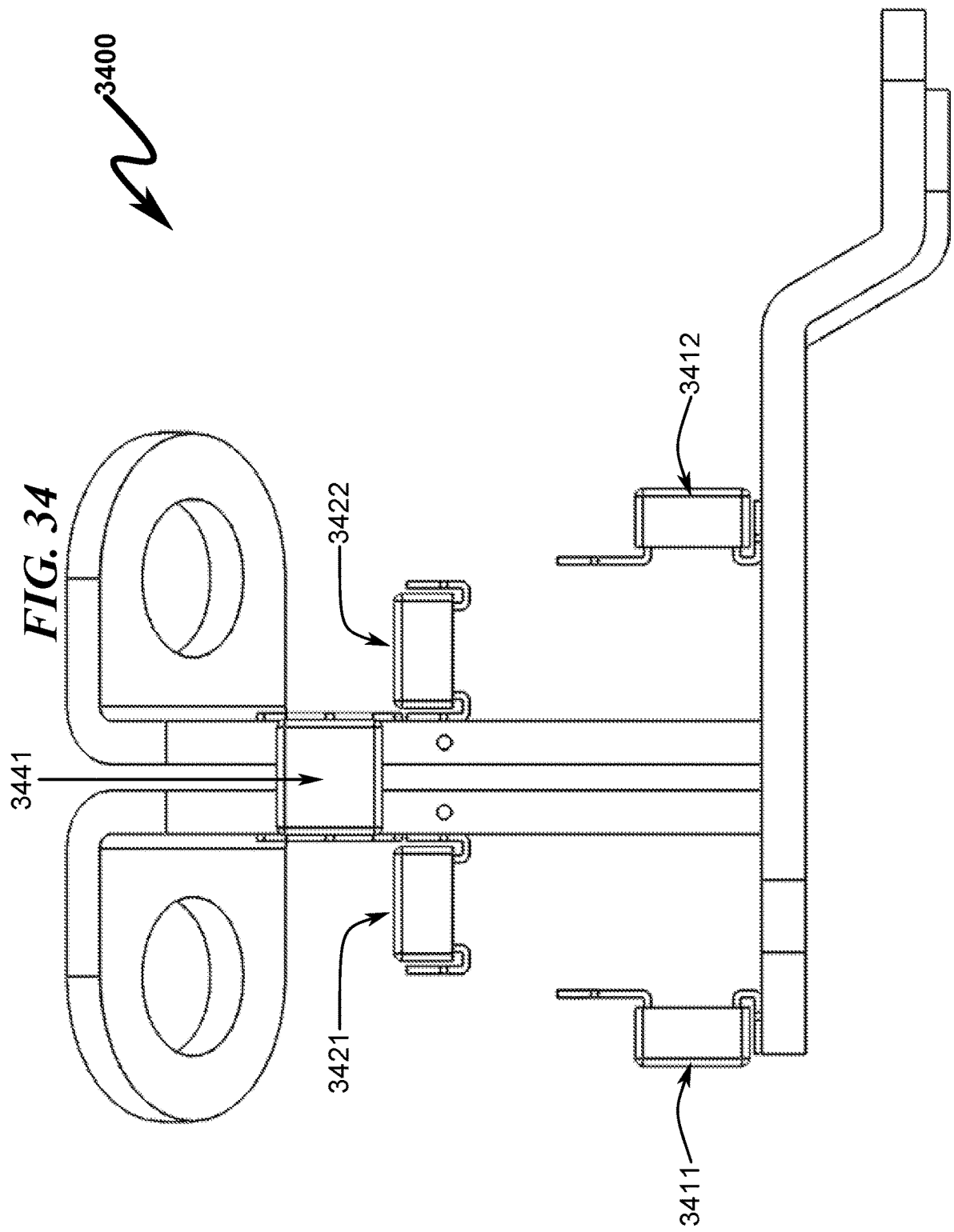
FIG. 34 illustrates a rear detail view of a preferred exemplary invention system embodiment capacitor connections.
Figure 35:
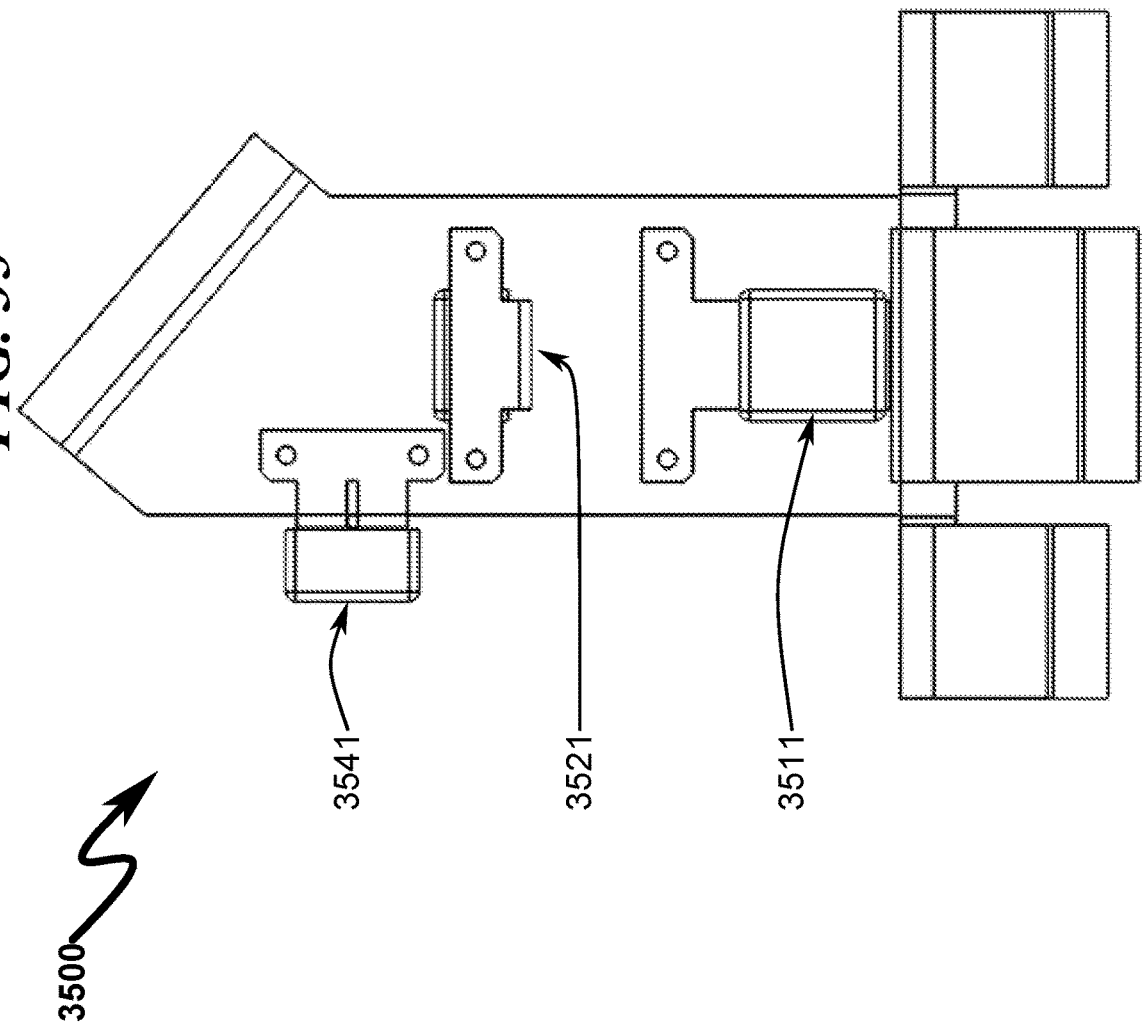
FIG. 35 illustrates a left side detail view of a preferred exemplary invention system embodiment capacitor connections.
Figure 36:
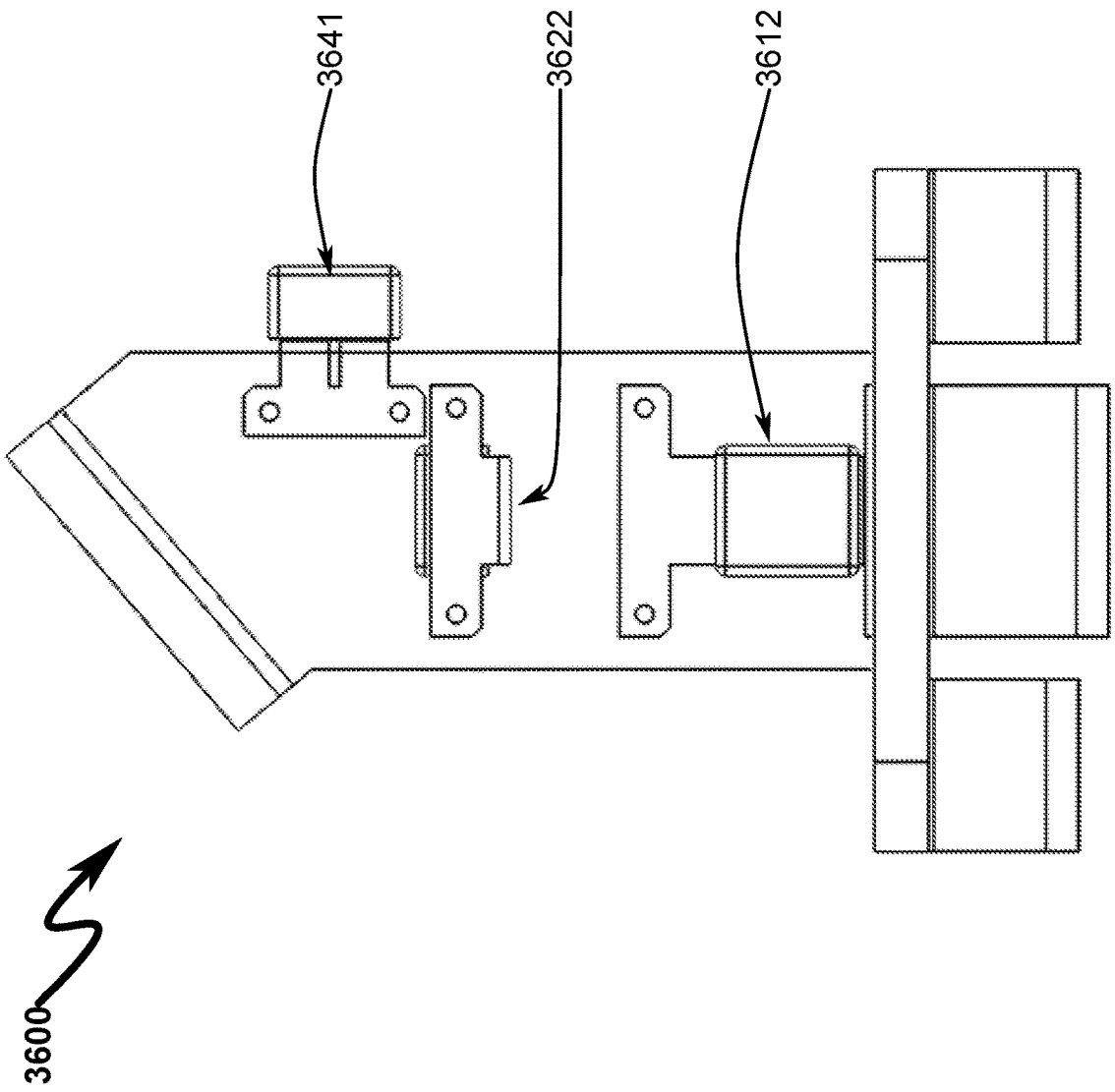
FIG. 36 illustrates a right side detail view of a preferred exemplary invention system embodiment capacitor connections.
Figure 37:
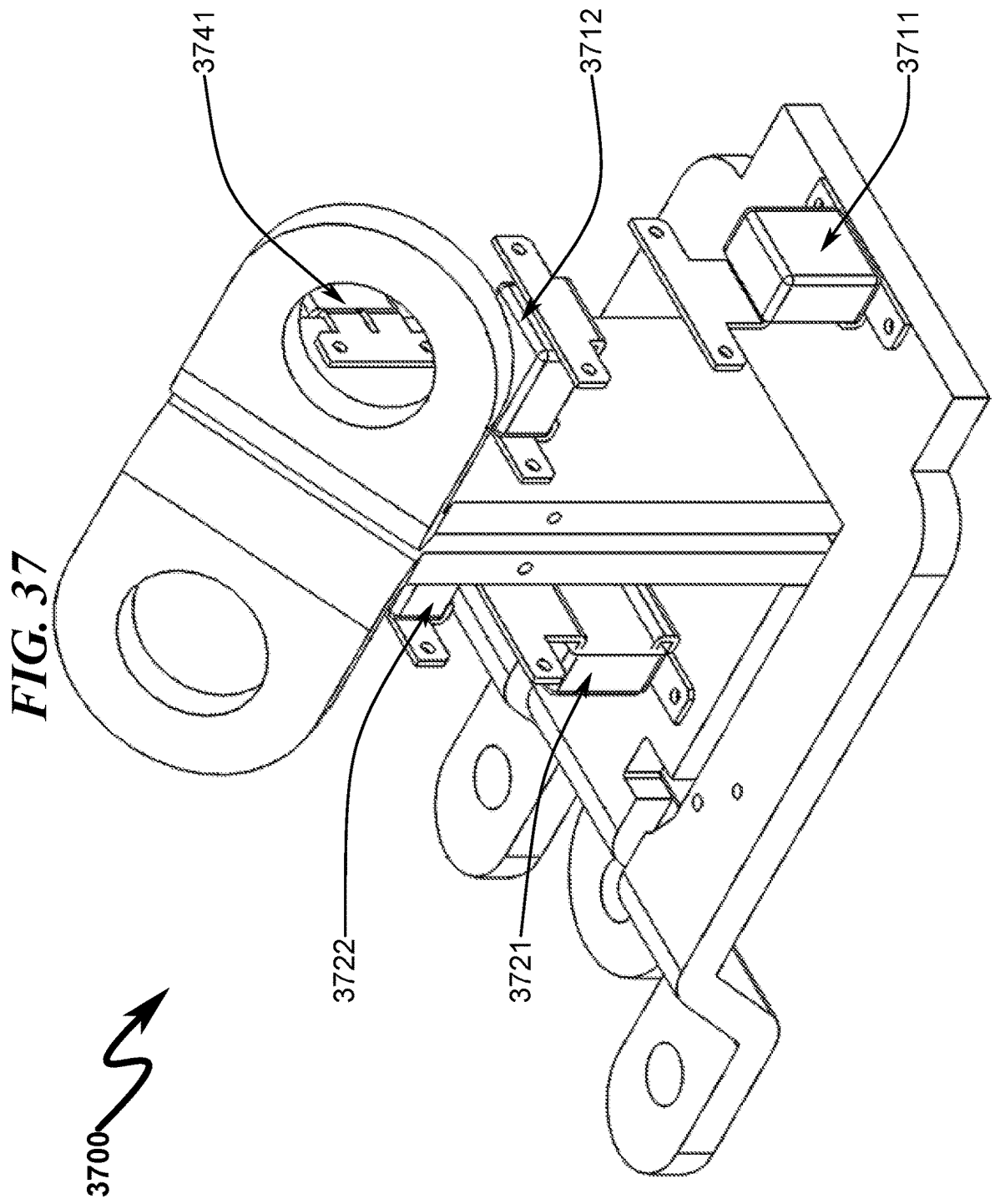
FIG. 37 illustrates a front right top perspective detail view of a preferred exemplary system embodiment of the present invention capacitor connections.
Figure 38:
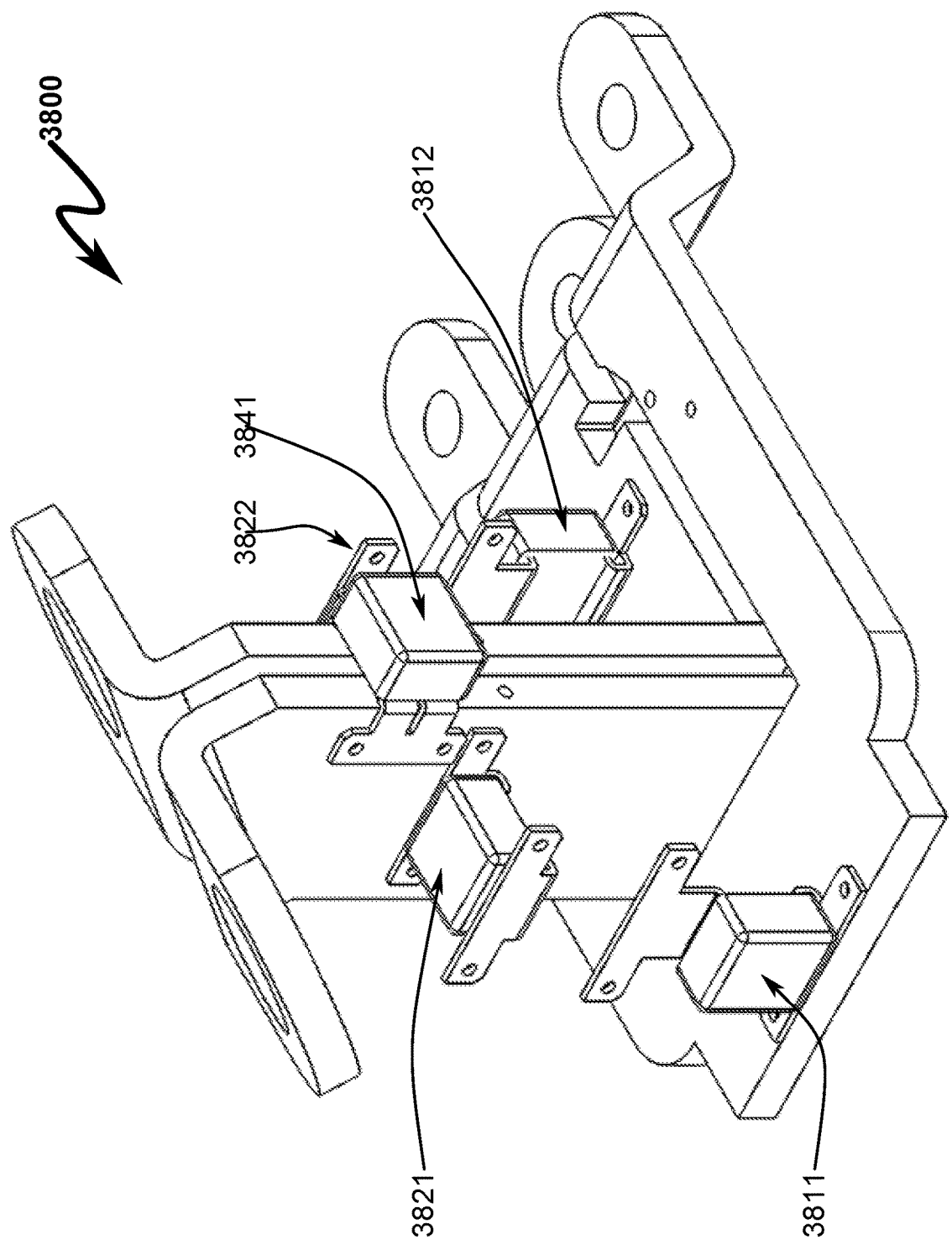
FIG. 38 illustrates a rear right top perspective detail view of a preferred exemplary system embodiment of the present invention capacitor connections.
Figure 39:
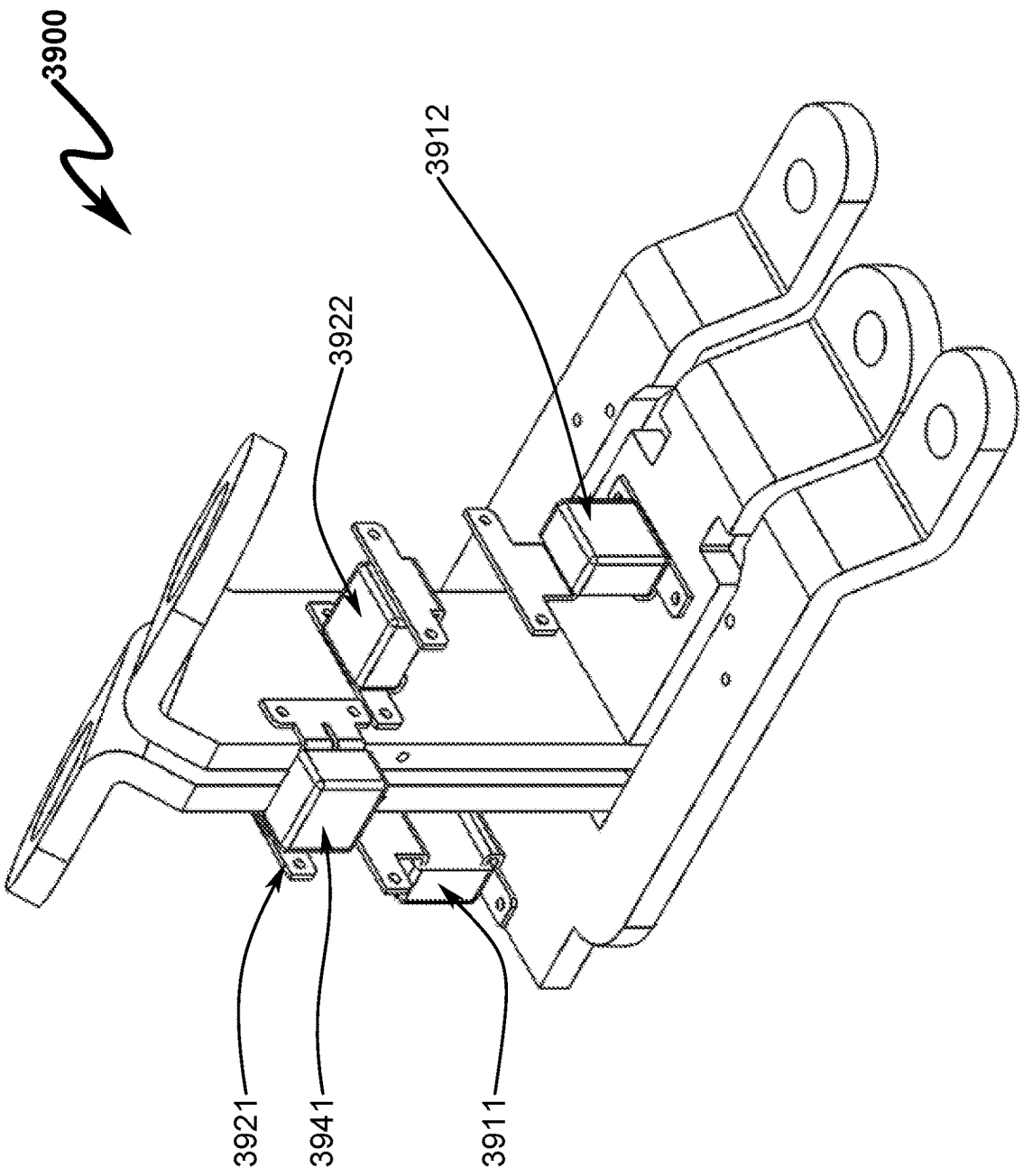
FIG. 39 illustrates a rear left top perspective detail view of a preferred exemplary system embodiment of the present invention capacitor connections.

Mechanical detail of the BUS+, BUS−, CON+, CON−, INC+, INC−, and permeable inductor core (PIC) is presented in FIG. 17 (1700)-FIG. 32 (2400). FIG. 17 (1700)-FIG. 24 (2400) present these system components including the ferromagnetic permeable inductor core (PIC) (2330, 2430) as shown in isolation in FIG. 23 (2300) and FIG. 24 (2400).

Referencing FIG. 17 (1700)-FIG. 32 (3200), it can be seen that the +BUS (1701, 2201)/−BUS (1702, 2202) power bus and +CON (1703, 2103)/−CON (1704, 2104) terminal connections are depicted in the various views along with the inductor conductors +INC (1707)/−INC (1708) and permeable inductor core (PIC) (1730, 2330, 2430).

Mechanical detail of the BUS+, BUS−, CON+, CON−, INC+, INC−, with permeable inductor core (PIC) suppressed is presented in FIG. 25 (2500)-FIG. 32 (3200) so as to present additional detail of the construction of the inductor and related BUS/INC/CON elements of the invention.

As depicted in the diagrams, the CON+, CON−, INC+, INC−elements may be formed using a single piece of electrically conductive material (preferably copper or a copper alloy) with these element mechanically and electrically coupled to the BUS+/BUS− elements via use of roll pins or other mechanical fasteners.

Capacitor Placement Detail (3300)-(4000)

Figure 40:
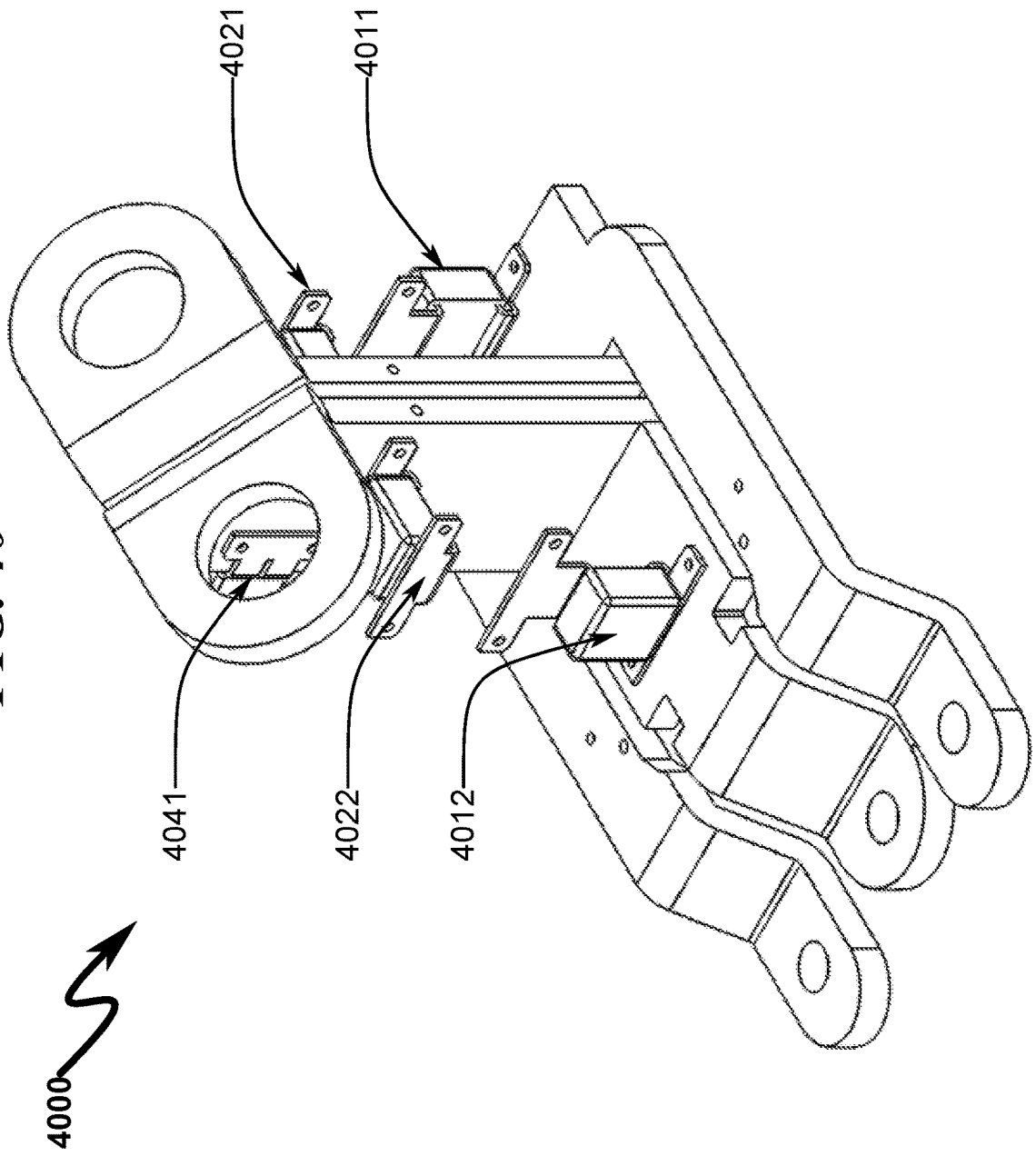
FIG. 40 illustrates a front left top perspective detail view of a preferred exemplary system embodiment of the present invention capacitor connections.
Figure 41:
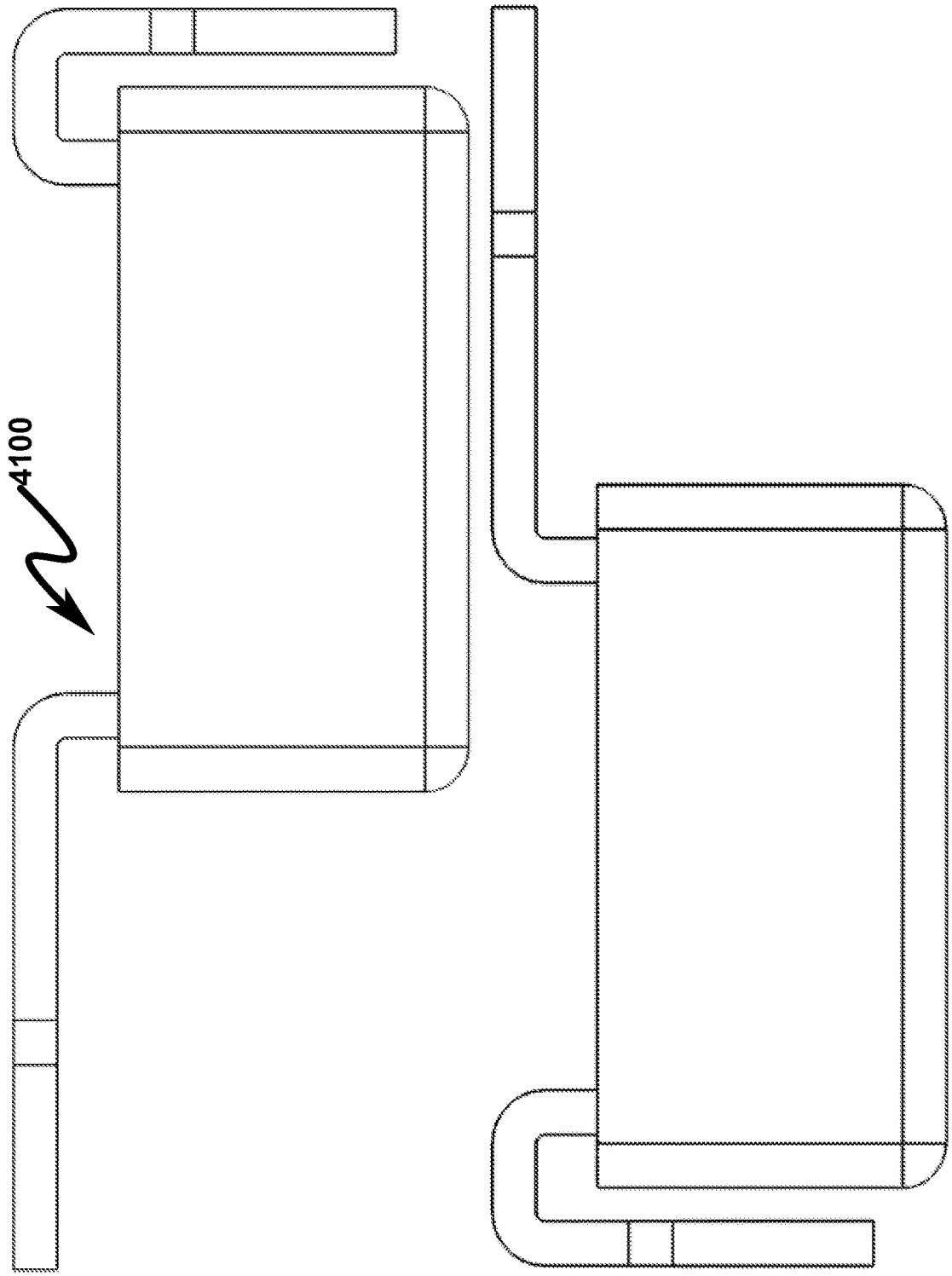
FIG. 41 illustrates front and rear views of a first capacitor construction that may be useful in some preferred exemplary system embodiments.
Figure 42:
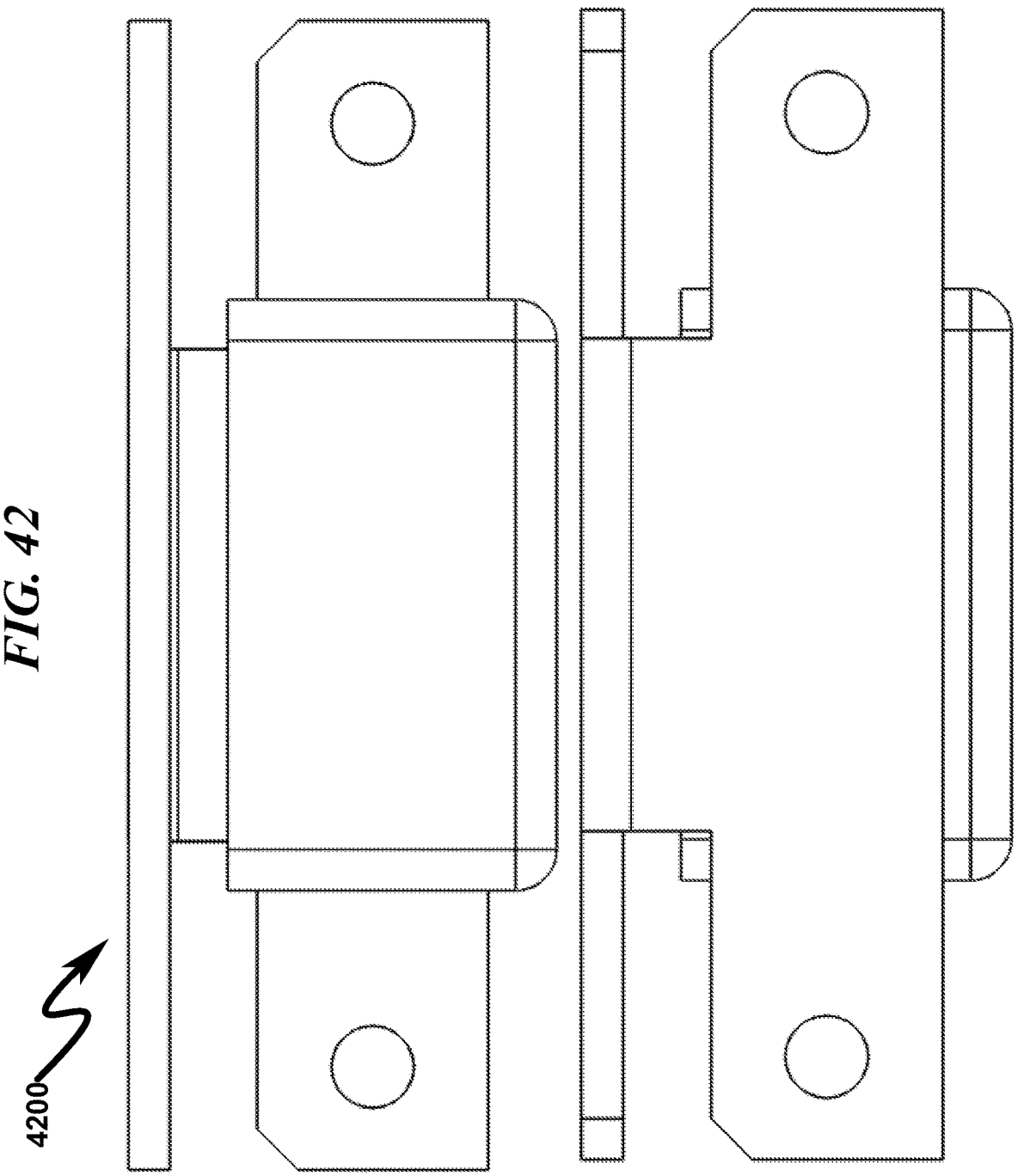
FIG. 42 illustrates left side and right side views of a first capacitor construction that may be useful in some preferred exemplary system embodiments.
Figure 43:
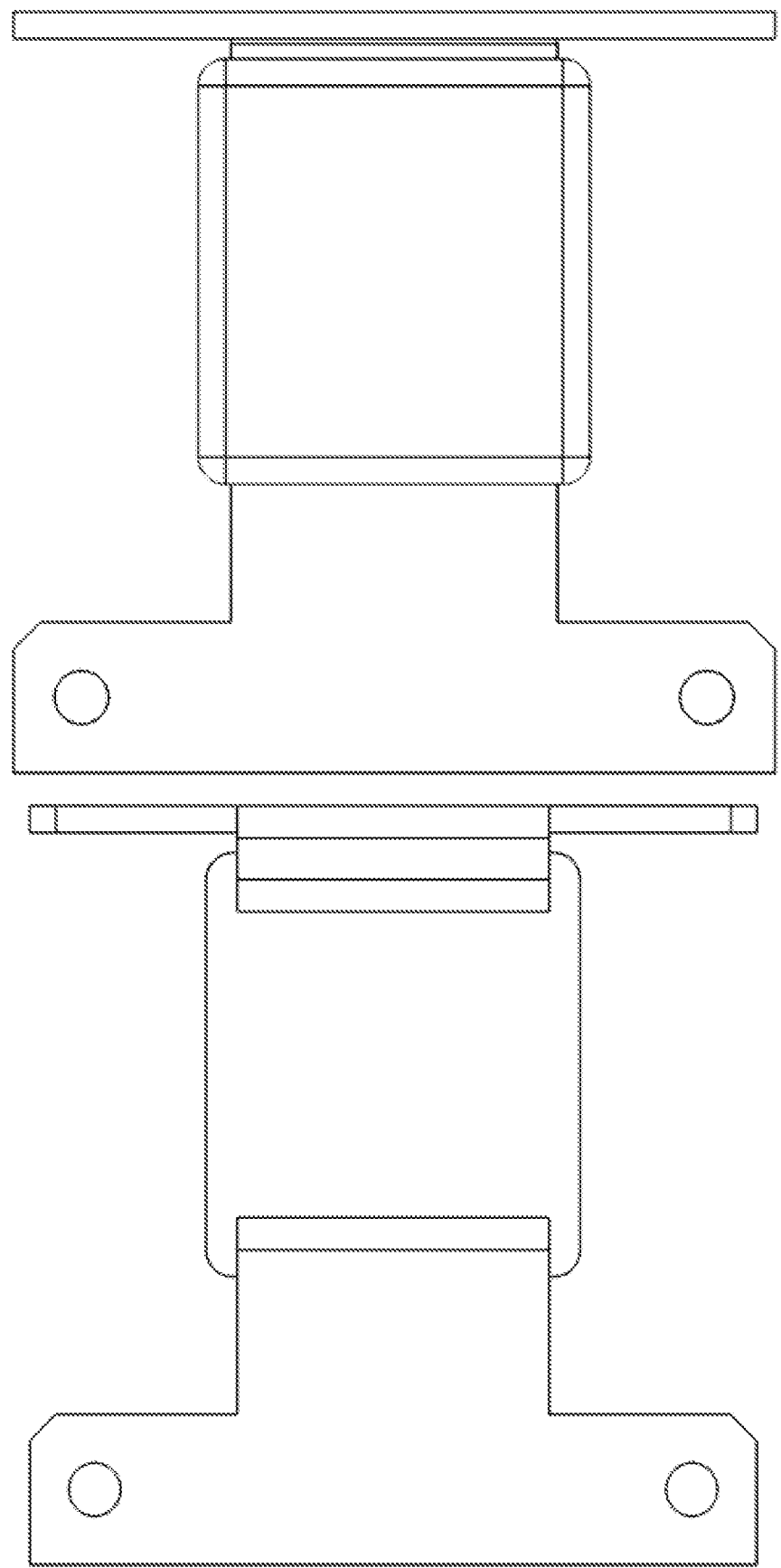
FIG. 43 illustrates top and bottom views of a first capacitor construction that may be useful in some preferred exemplary system embodiments.
Figure 44:
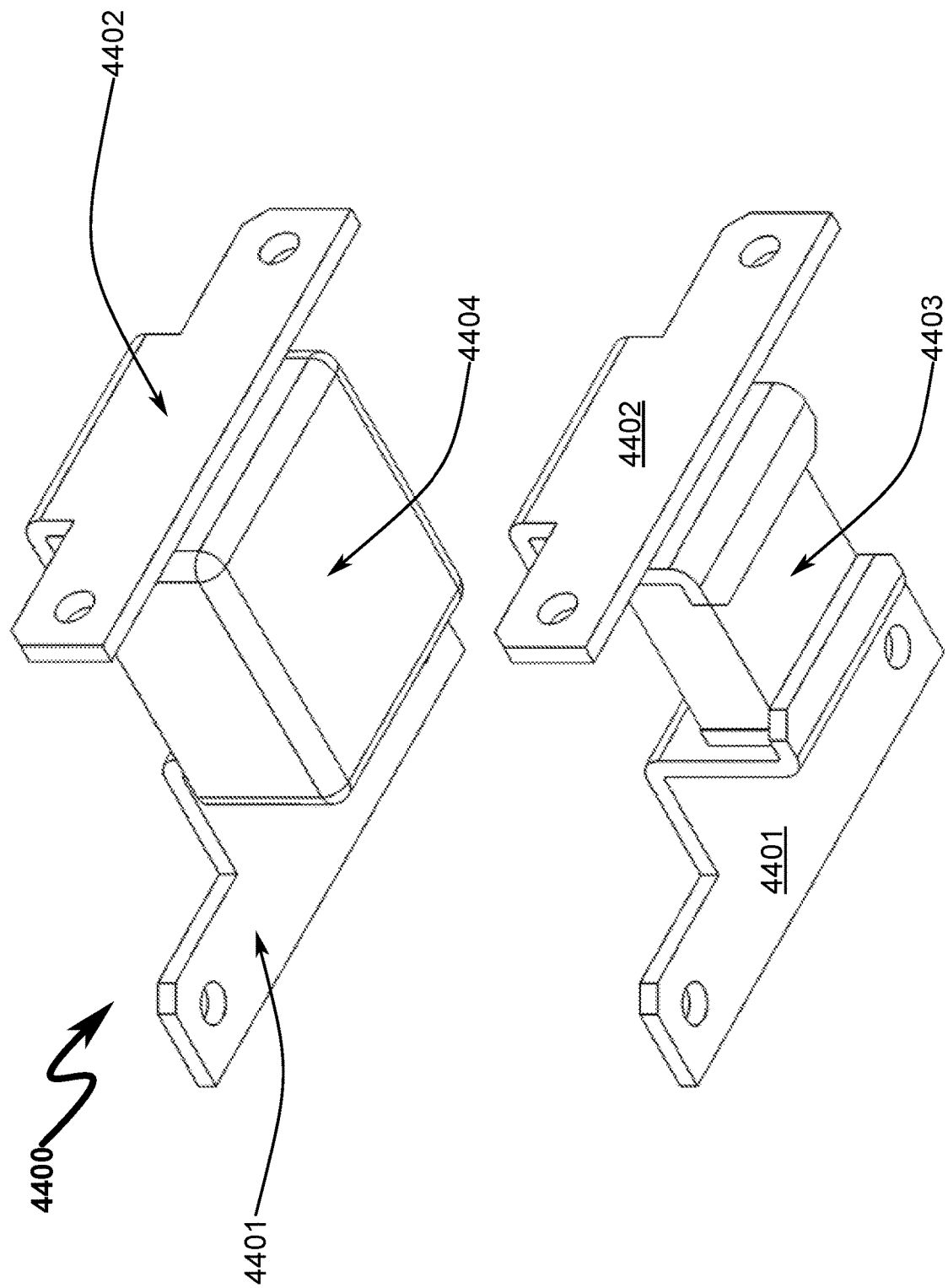
FIG. 44 illustrates bottom right side perspective views of a first capacitor construction with and without component over-molding that may be useful in some preferred exemplary system embodiments.
Figure 45:
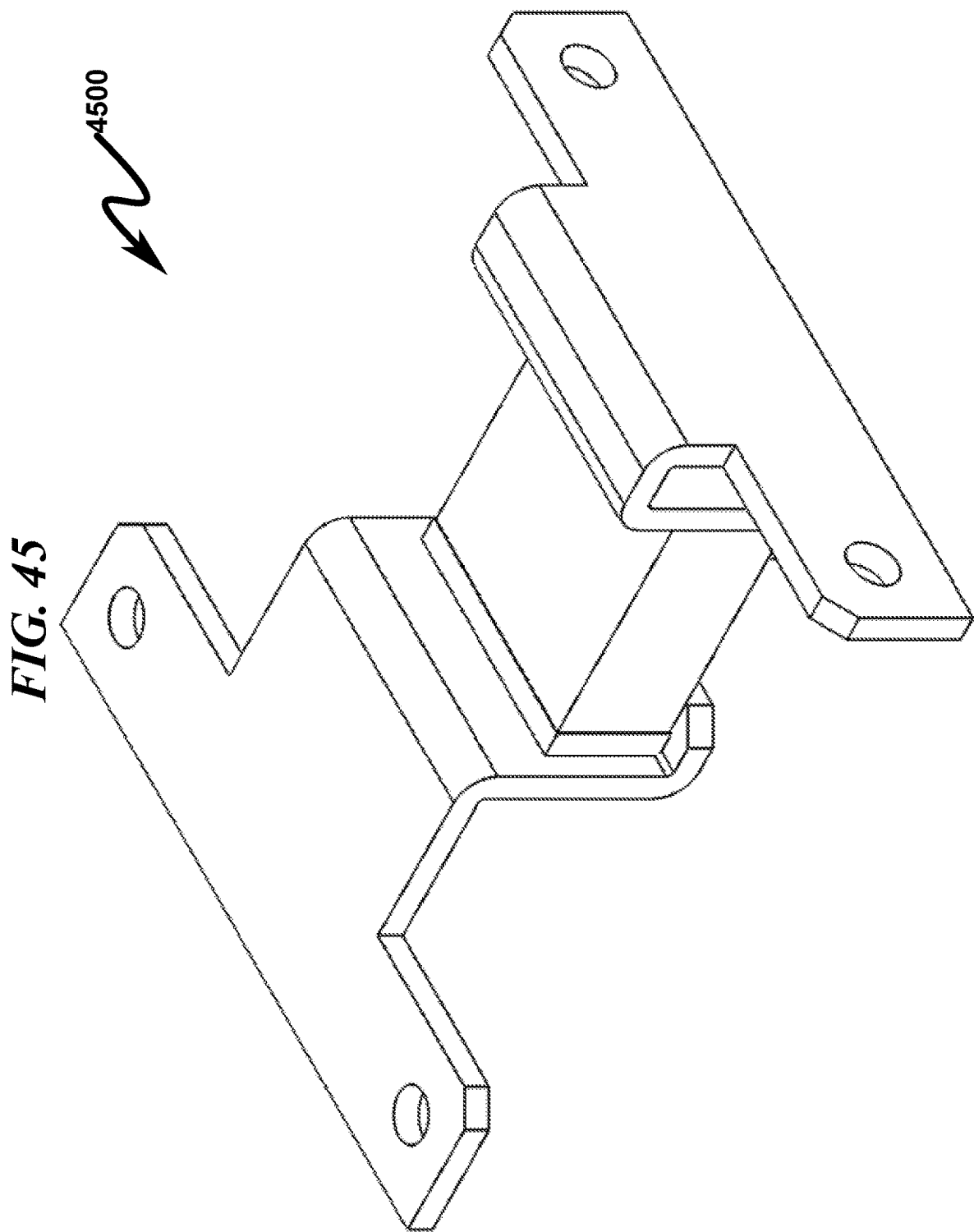
FIG. 45 illustrates a front right top perspective view of a first capacitor construction with component over-molding suppressed that may be useful in some preferred exemplary system embodiments.
Figure 46:
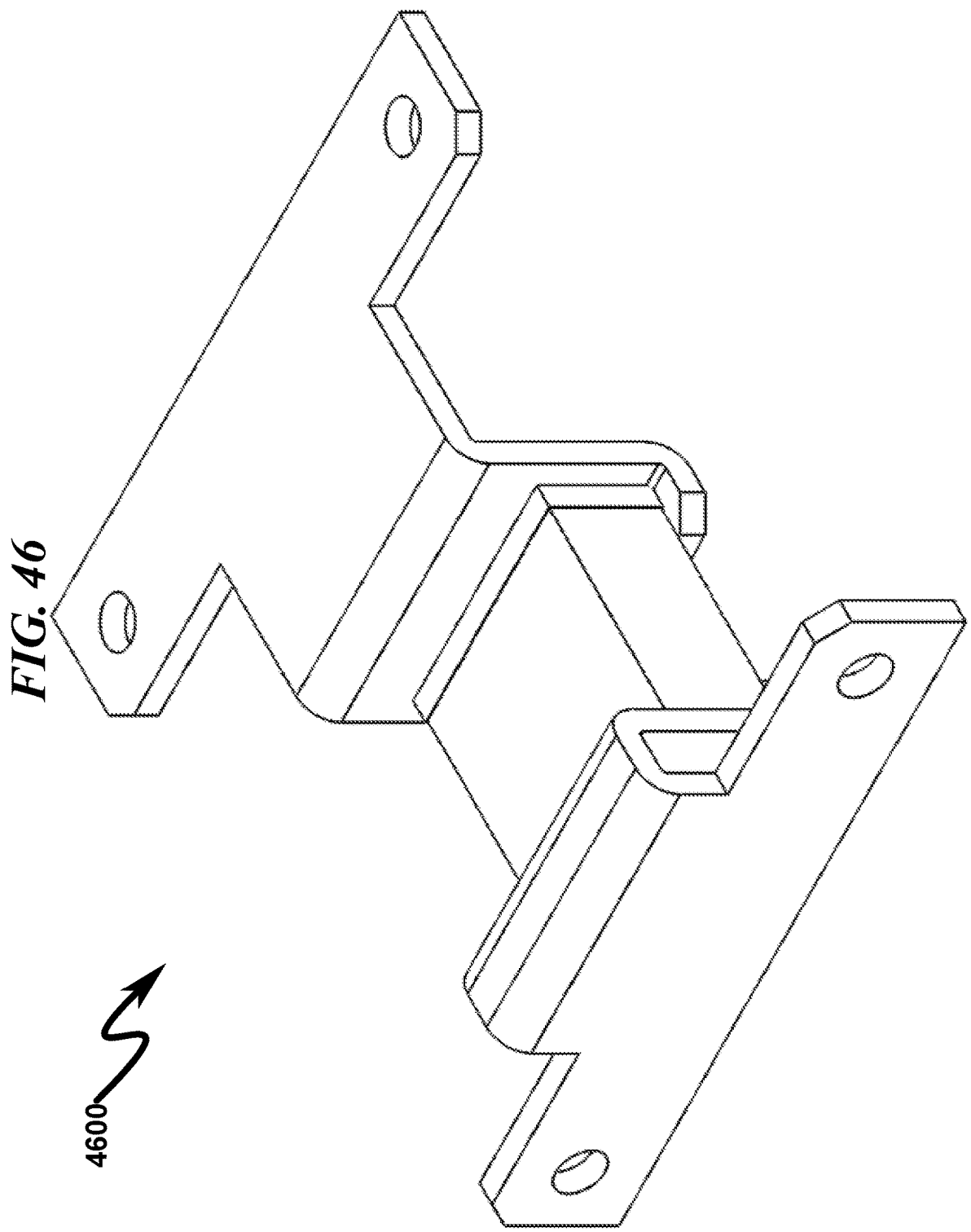
FIG. 46 illustrates a rear right top perspective view of a first capacitor construction with component over-molding suppressed that may be useful in some preferred exemplary system embodiments.
Figure 47:
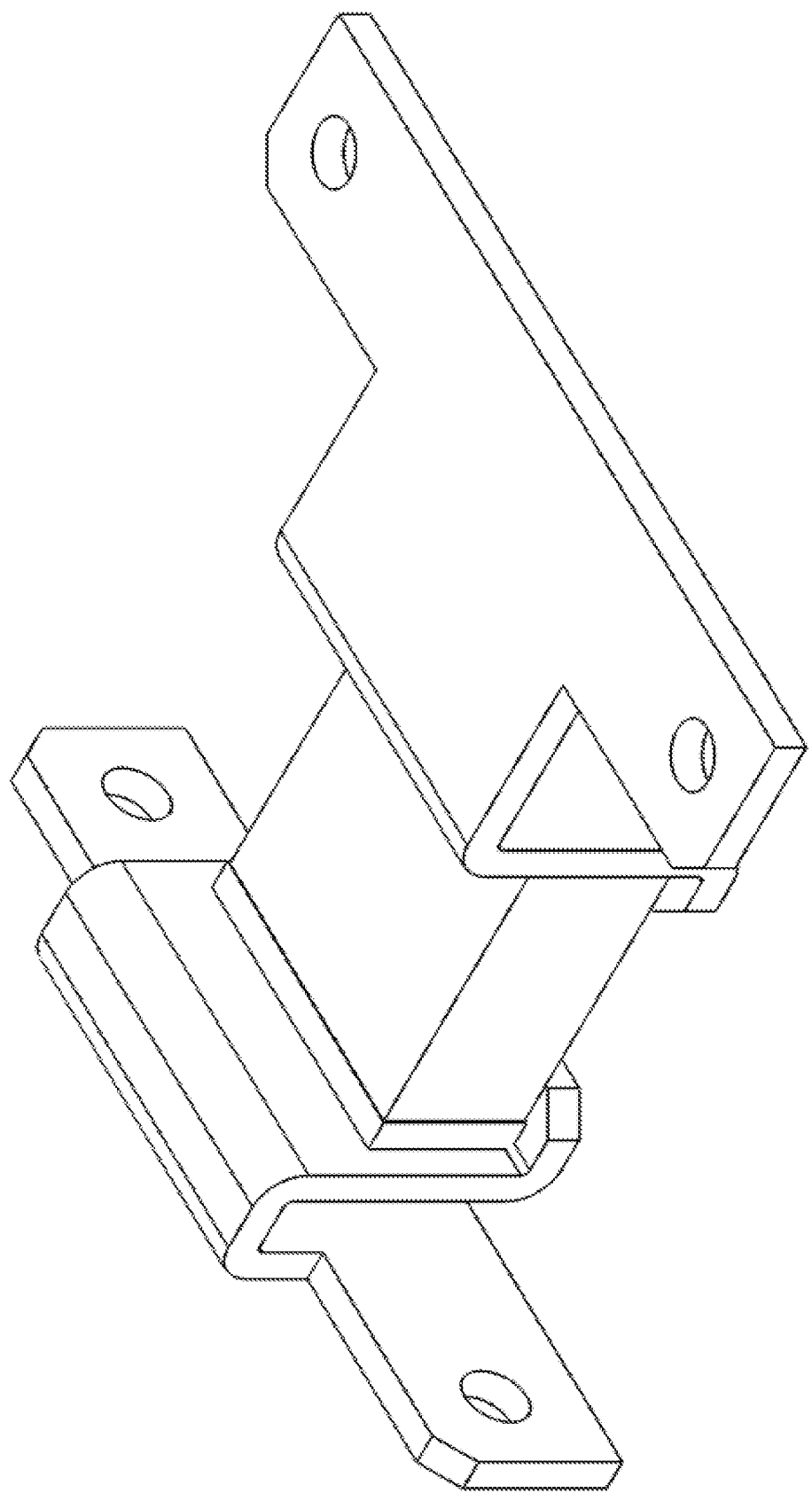
FIG. 47 illustrates a rear left top perspective view of a first capacitor construction with component over-molding suppressed that may be useful in some preferred exemplary system embodiments.

FIG. 33 (3300)-FIG. 40 (4000) present detail views of the capacitor placement and connections to the BUS+, BUS−, CON+, CON− conductors and the relationship between the capacitors and the INC+, INC− elements of the inductor conductors. As can be seen from the diagrams, the Cy11 capacitor (3311, 3411, 3511, 3711, 3811, 3911, 4011) is tied to the BUS+ input bus, the Cy12 capacitor (3312, 3412, 3612, 3712, 3812, 3912, 4012) is tied to the BUS− input bus, the Cy21 capacitor (3321, 3421, 3521, 3721, 3821, 3921, 4021) is tied to the CON+ terminal, the Cy22 capacitor (3322, 3422, 3622, 3722, 3822, 3922, 4022) is tied to the CON− terminal, and the Cy41 capacitor (3341, 3441, 3541, 3641, 3741, 3841, 3941, 4041) is tied between the CON+ and CON− terminals.

Each of the Cy capacitors (Cy11, Cy12, Cy21, Cy22) presented in these diagrams is illustrated as having one terminal connection tied to one of the BUS+, BUS−, CON+, or CON− connections with the other terminal not illustrated as connected. These non-illustrated connections are to the grounding support bracket (GSB) subelement of the grounding support assembly (GSA) that is illustrated in other drawings contained herein.

Capacitor Construction Detail (4100)-(6400)

Figure 48:
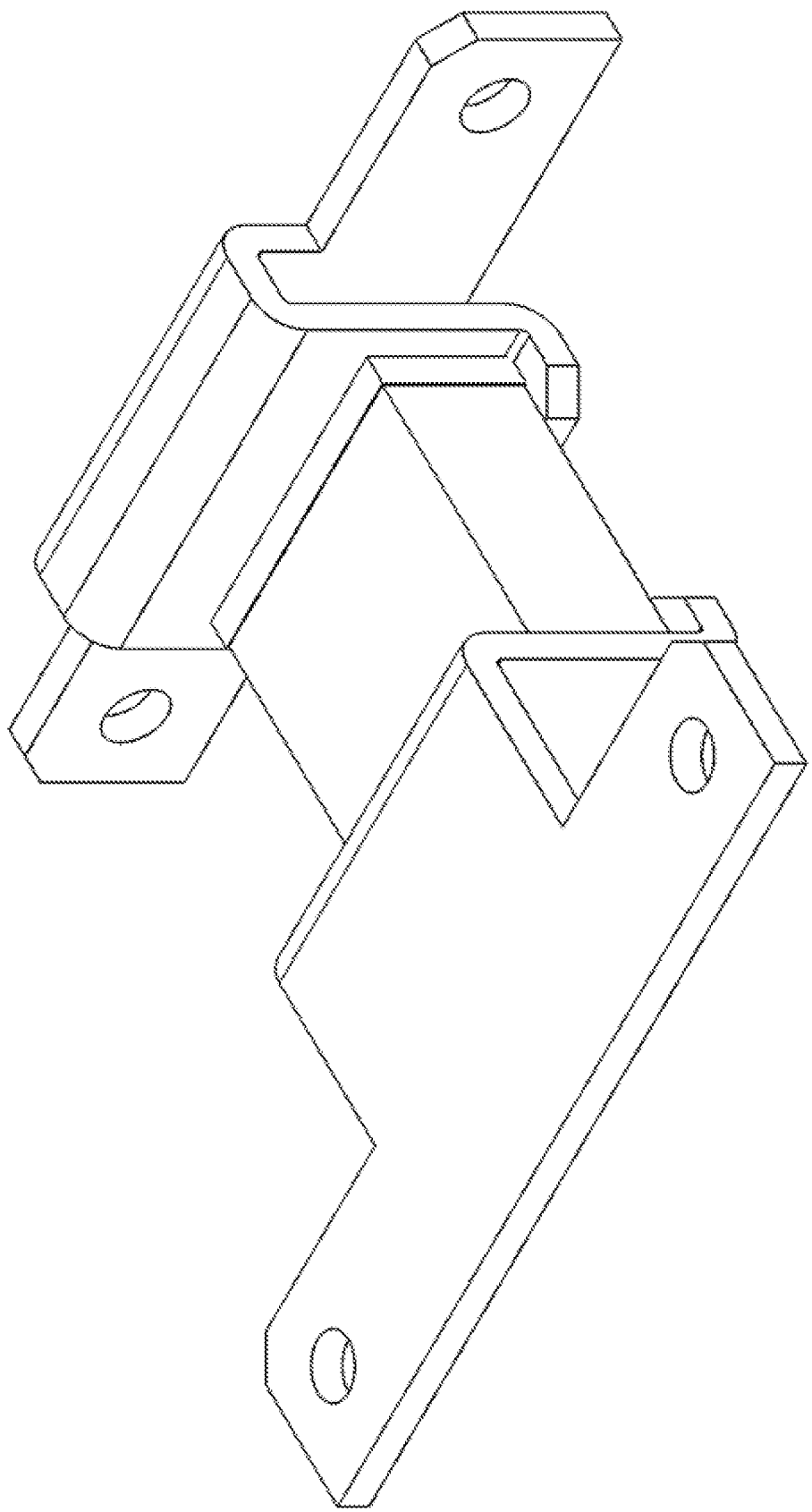
FIG. 48 illustrates a front left top perspective view of a first capacitor construction with component over-molding suppressed that may be useful in some preferred exemplary system embodiments.
Figure 49:
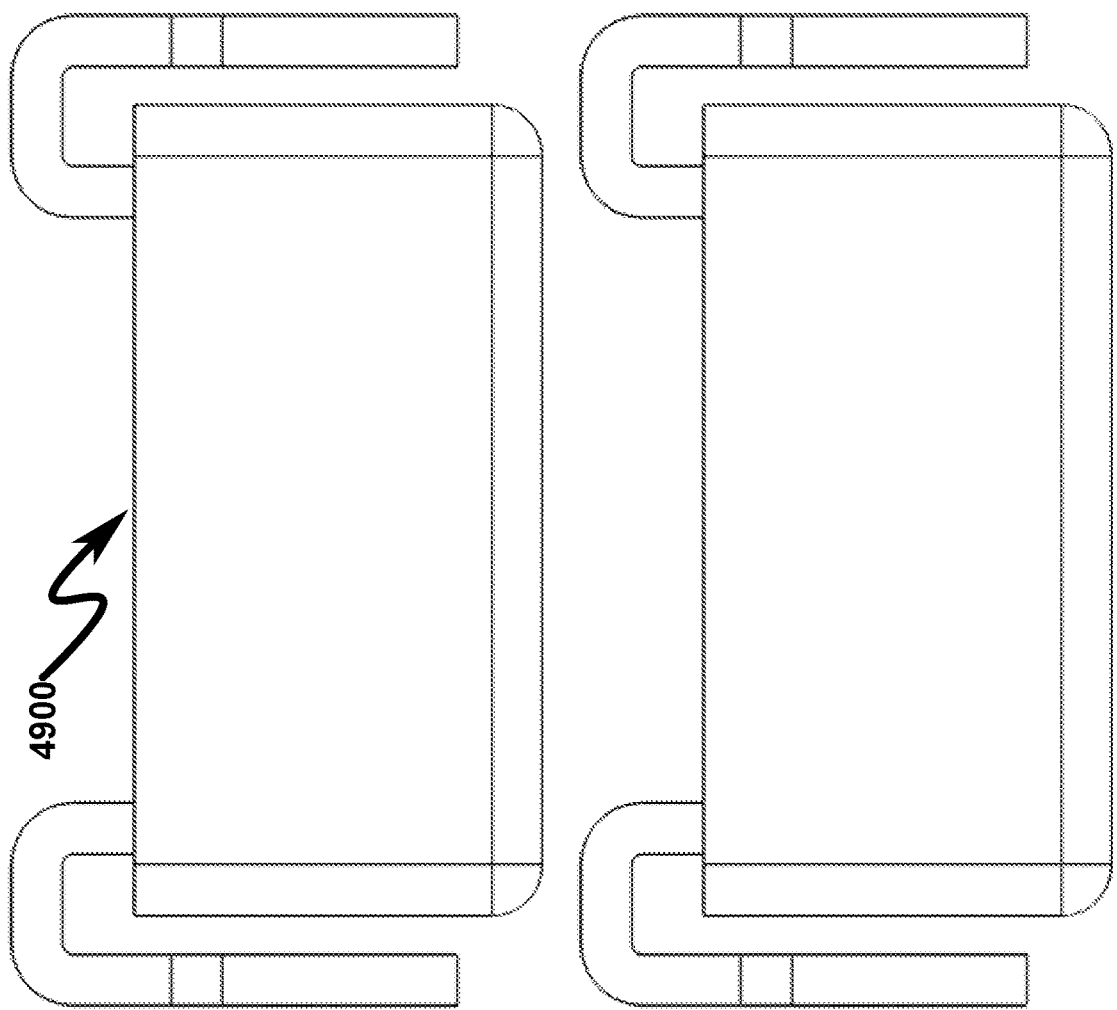
FIG. 49 illustrates front and rear views of a second capacitor construction that may be useful in some preferred exemplary system embodiments.
Figure 50:
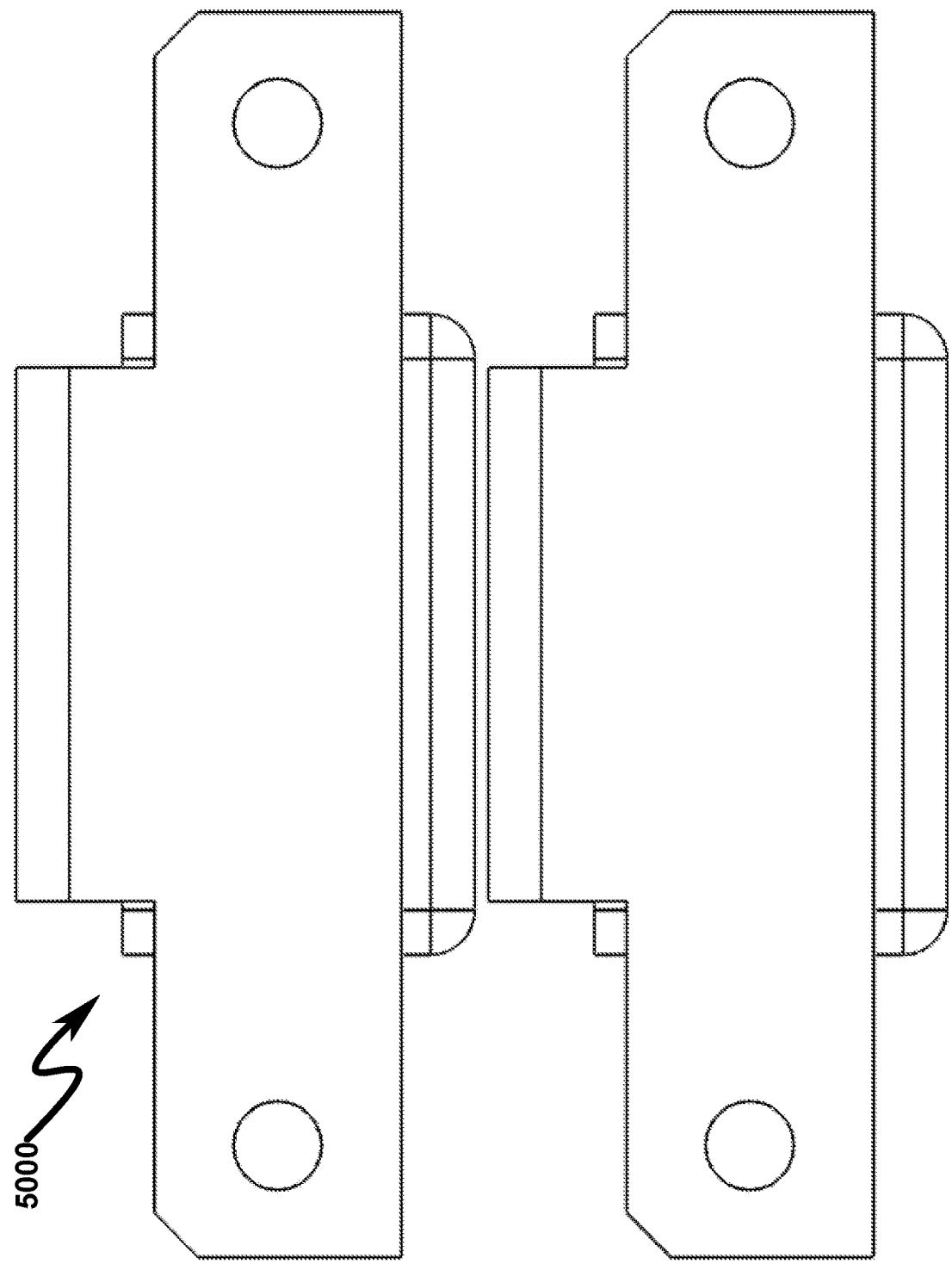
FIG. 50 illustrates left side and right side views of a second capacitor construction that may be useful in some preferred exemplary system embodiments.
Figure 51:
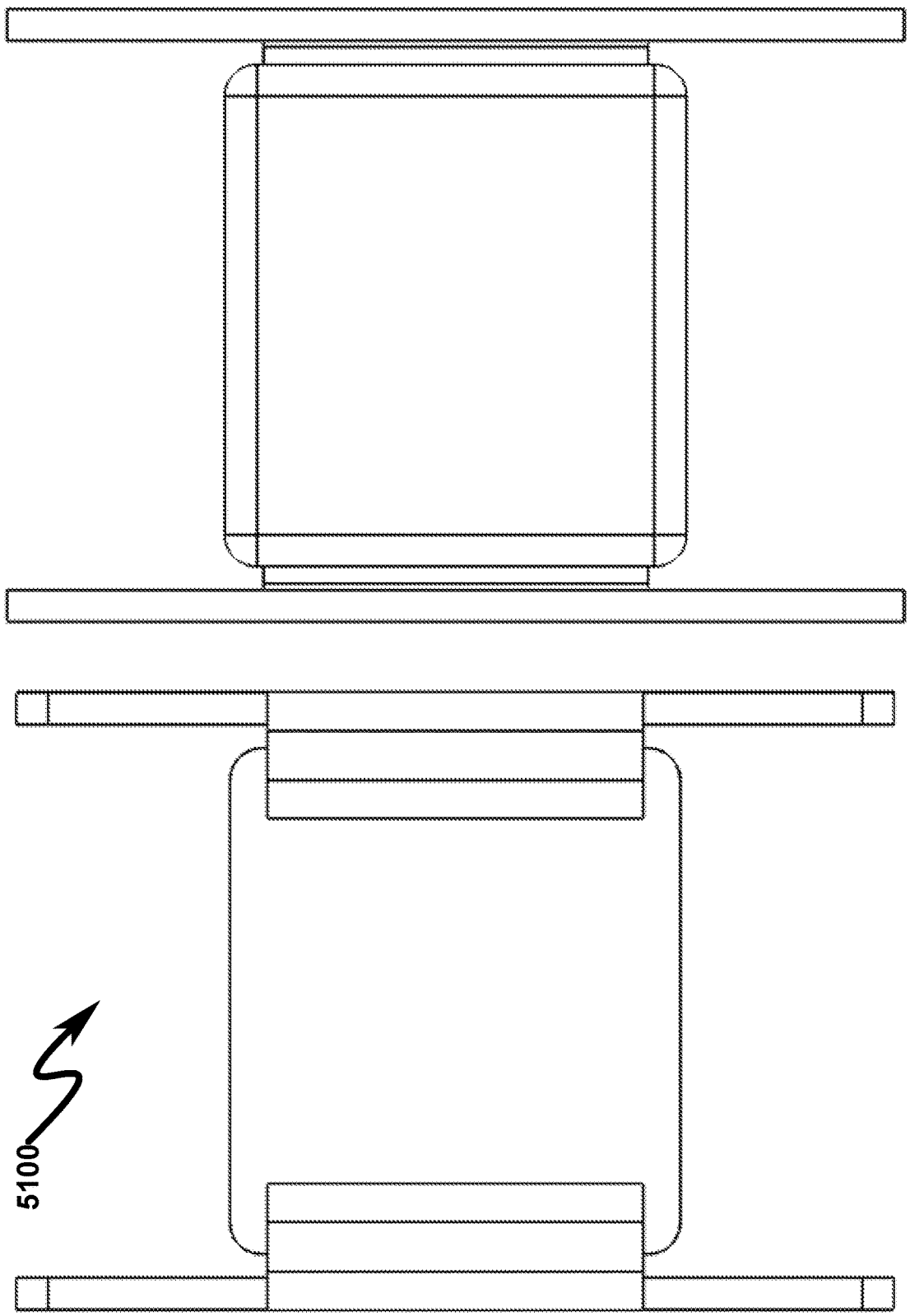
FIG. 51 illustrates top and bottom views of a second capacitor construction that may be useful in some preferred exemplary system embodiments.
Figure 52:
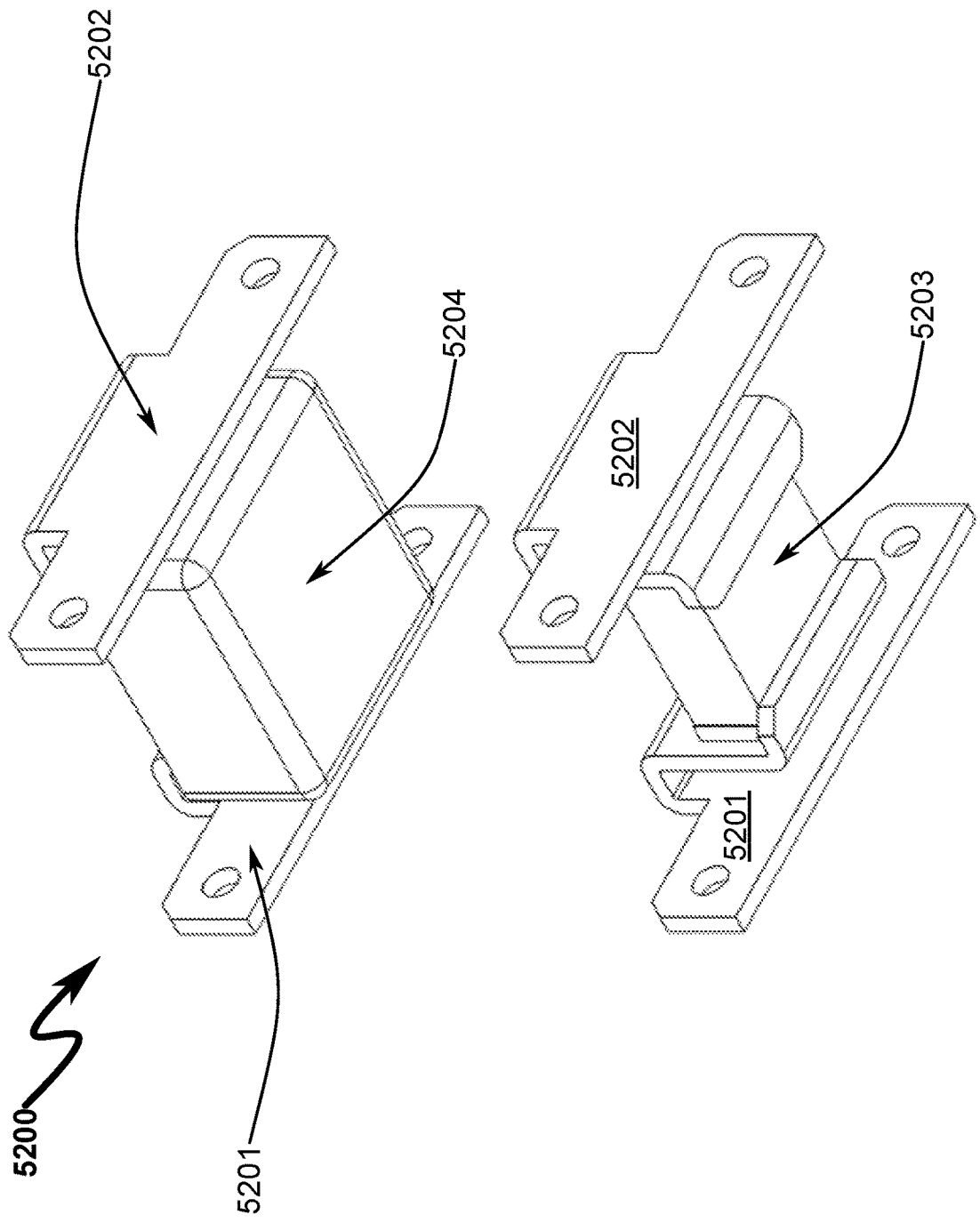
FIG. 52 illustrates bottom right side perspective views of a second capacitor construction with and without component over-molding that may be useful in some preferred exemplary system embodiments.
Figure 53:
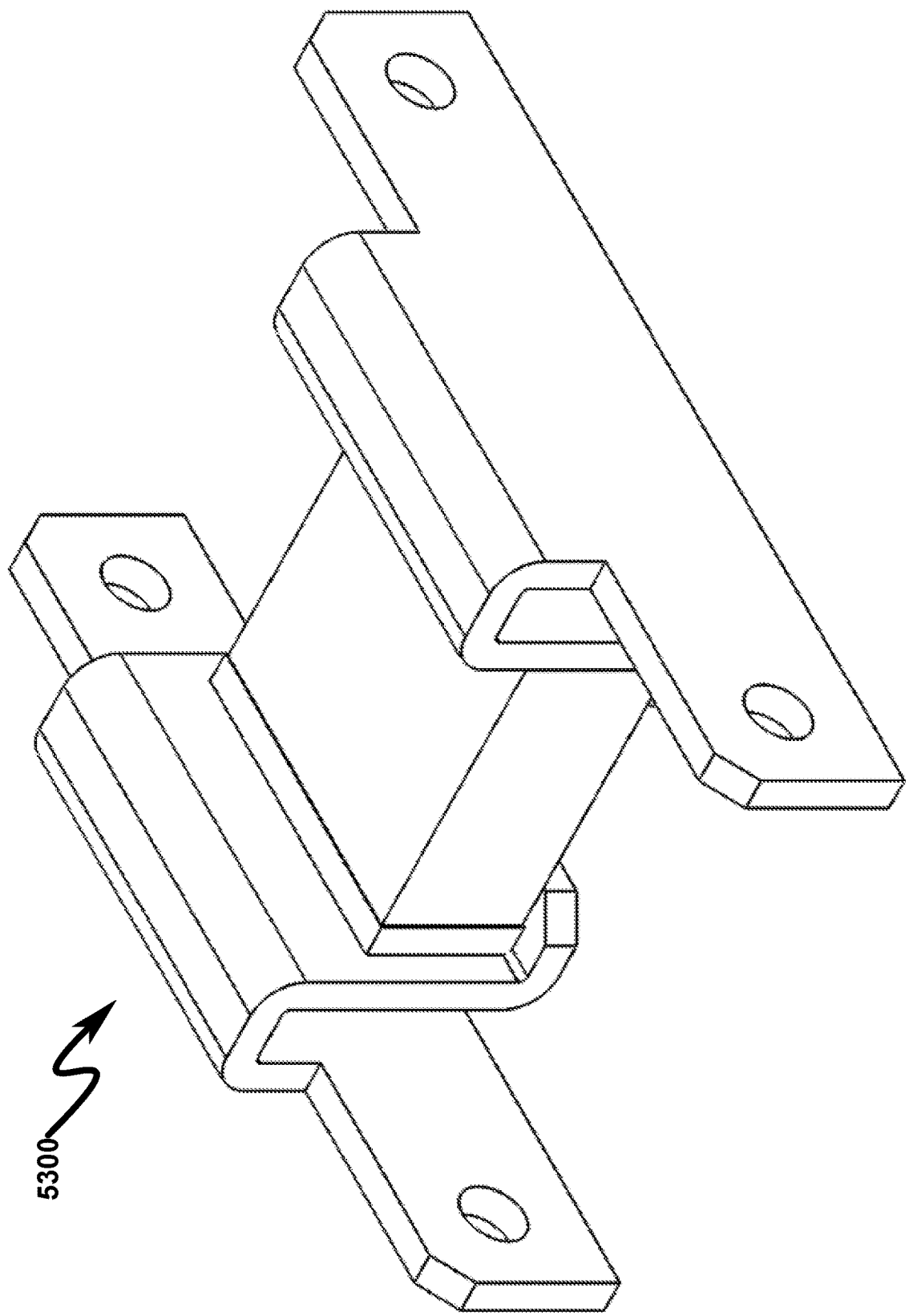
FIG. 53 illustrates a front right top perspective view of a second capacitor construction with component over-molding suppressed that may be useful in some preferred exemplary system embodiments.
Figure 54:
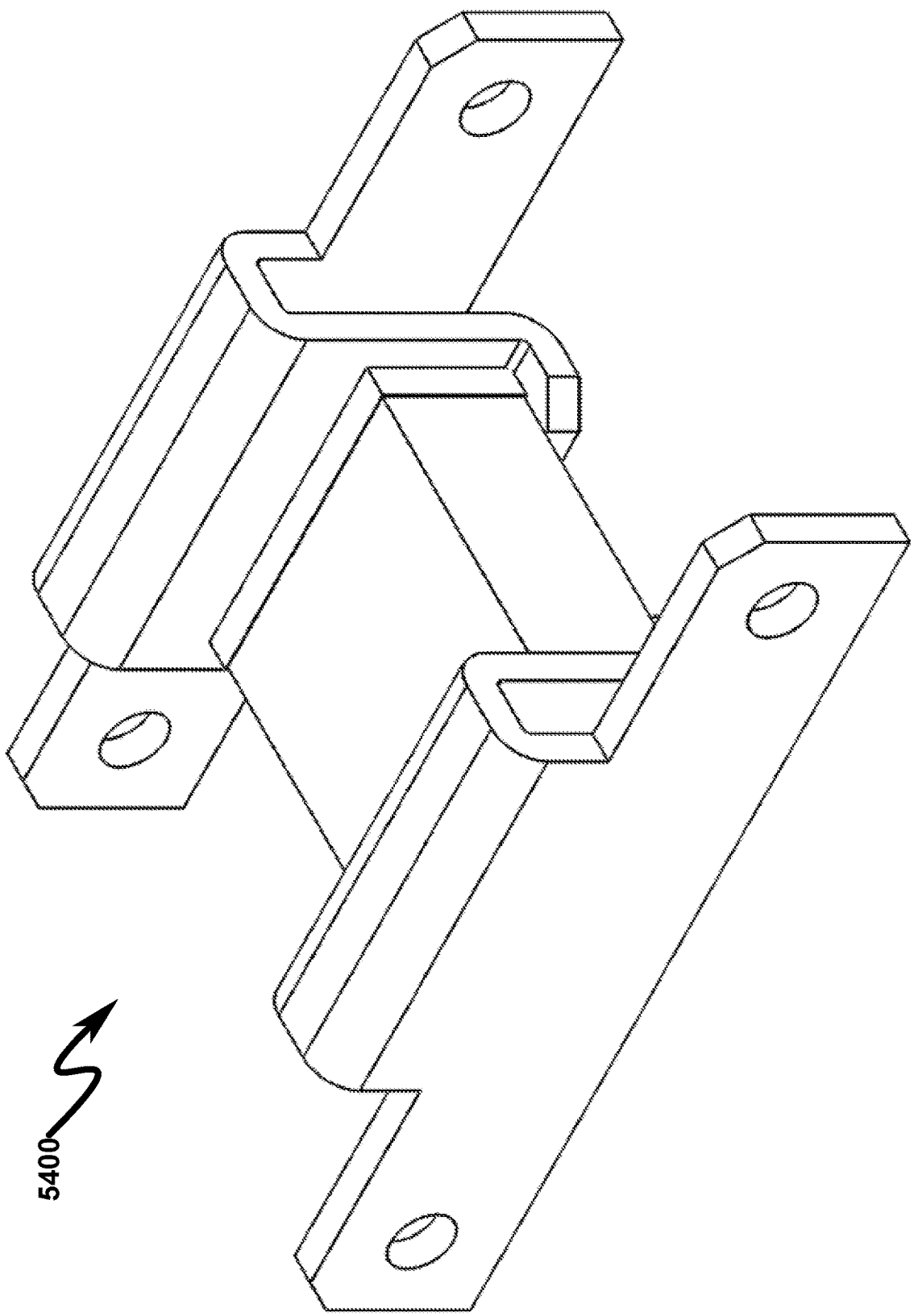
FIG. 54 illustrates a rear right top perspective view of a second capacitor construction with component over-molding suppressed that may be useful in some preferred exemplary system embodiments.
Figure 55:
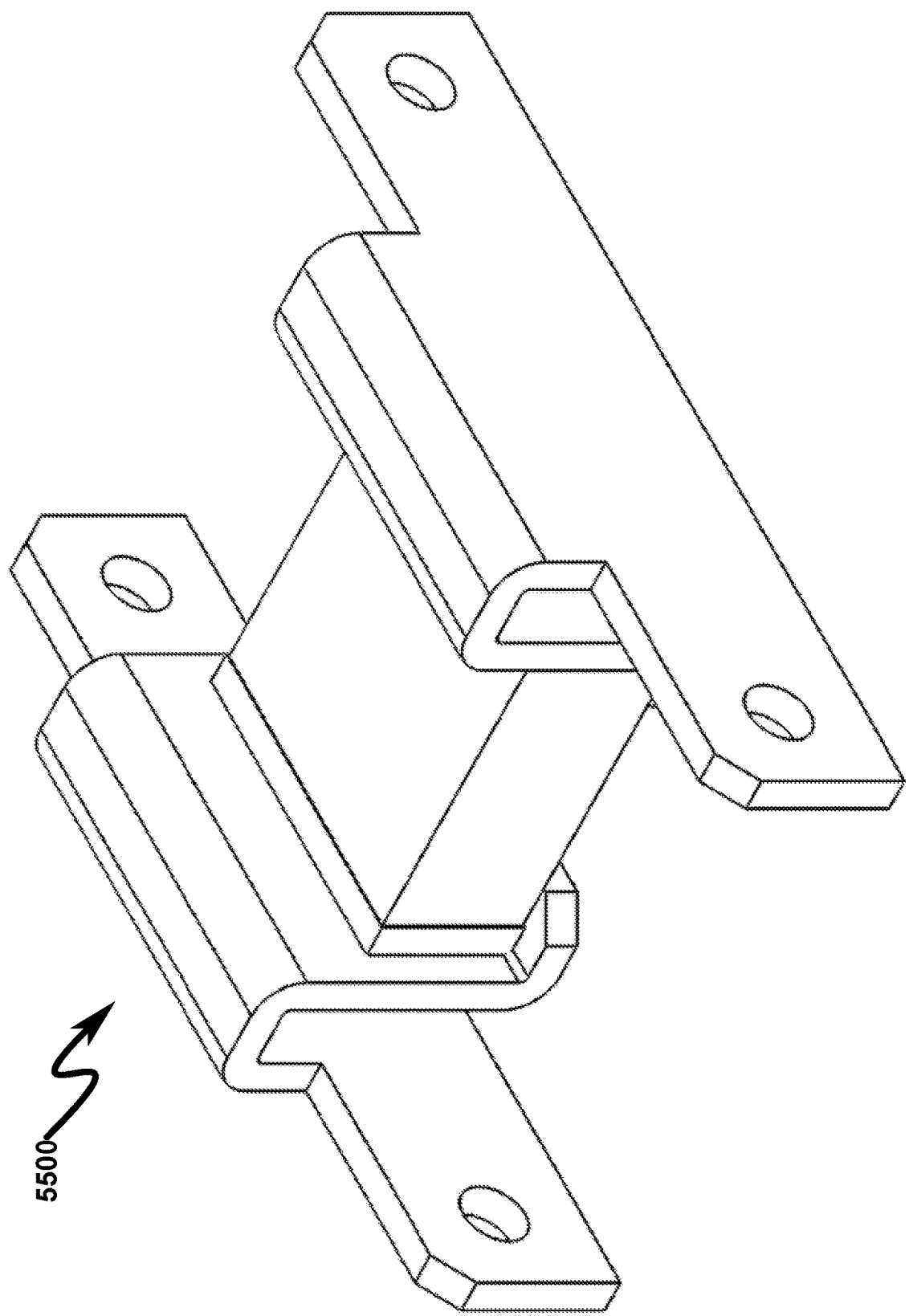
FIG. 55 illustrates a rear left top perspective view of a second capacitor construction with component over-molding suppressed that may be useful in some preferred exemplary system embodiments.
Figure 56:
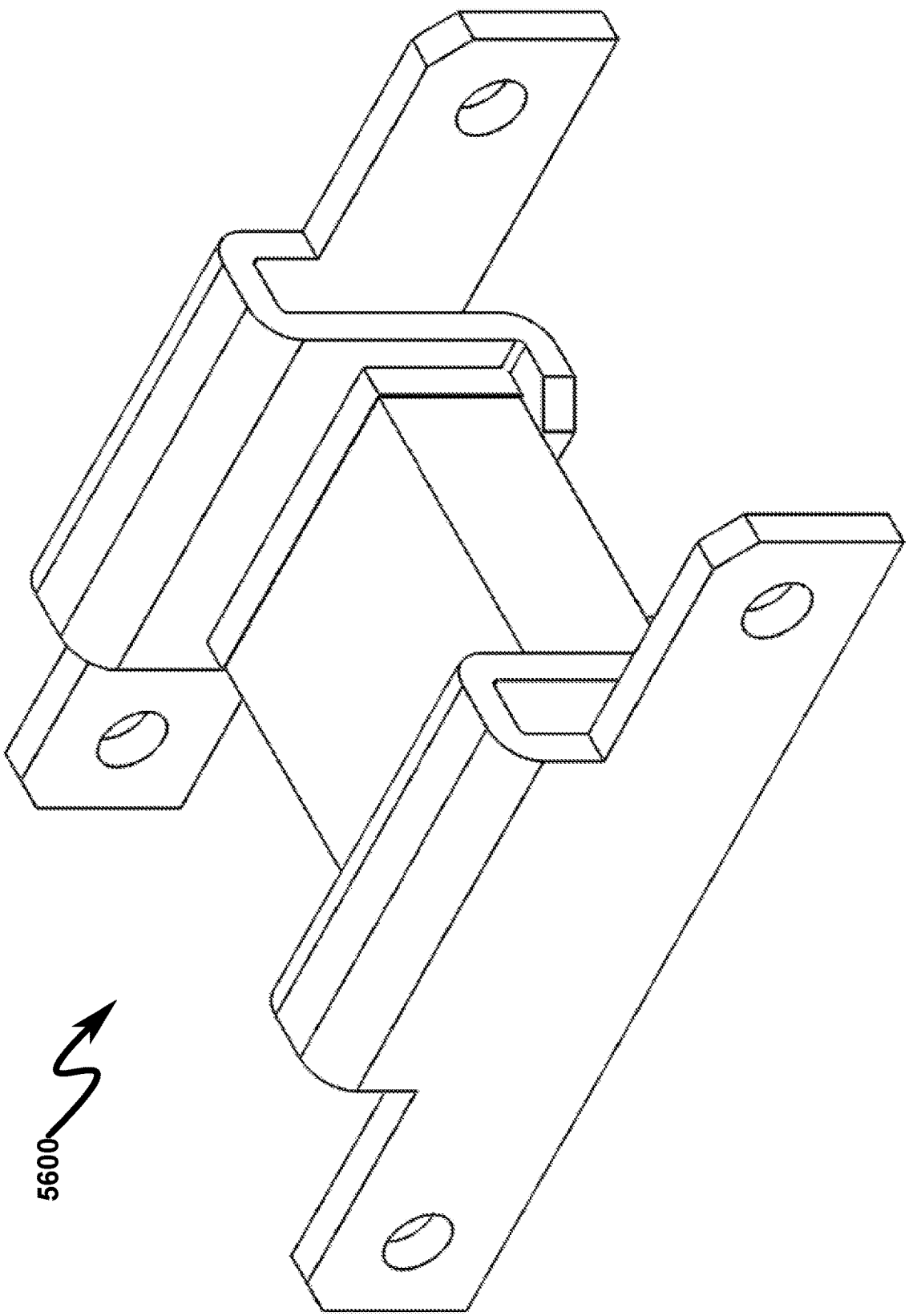
FIG. 56 illustrates a front left top perspective view of a second capacitor construction with component over-molding suppressed that may be useful in some preferred exemplary system embodiments.
Figure 57:
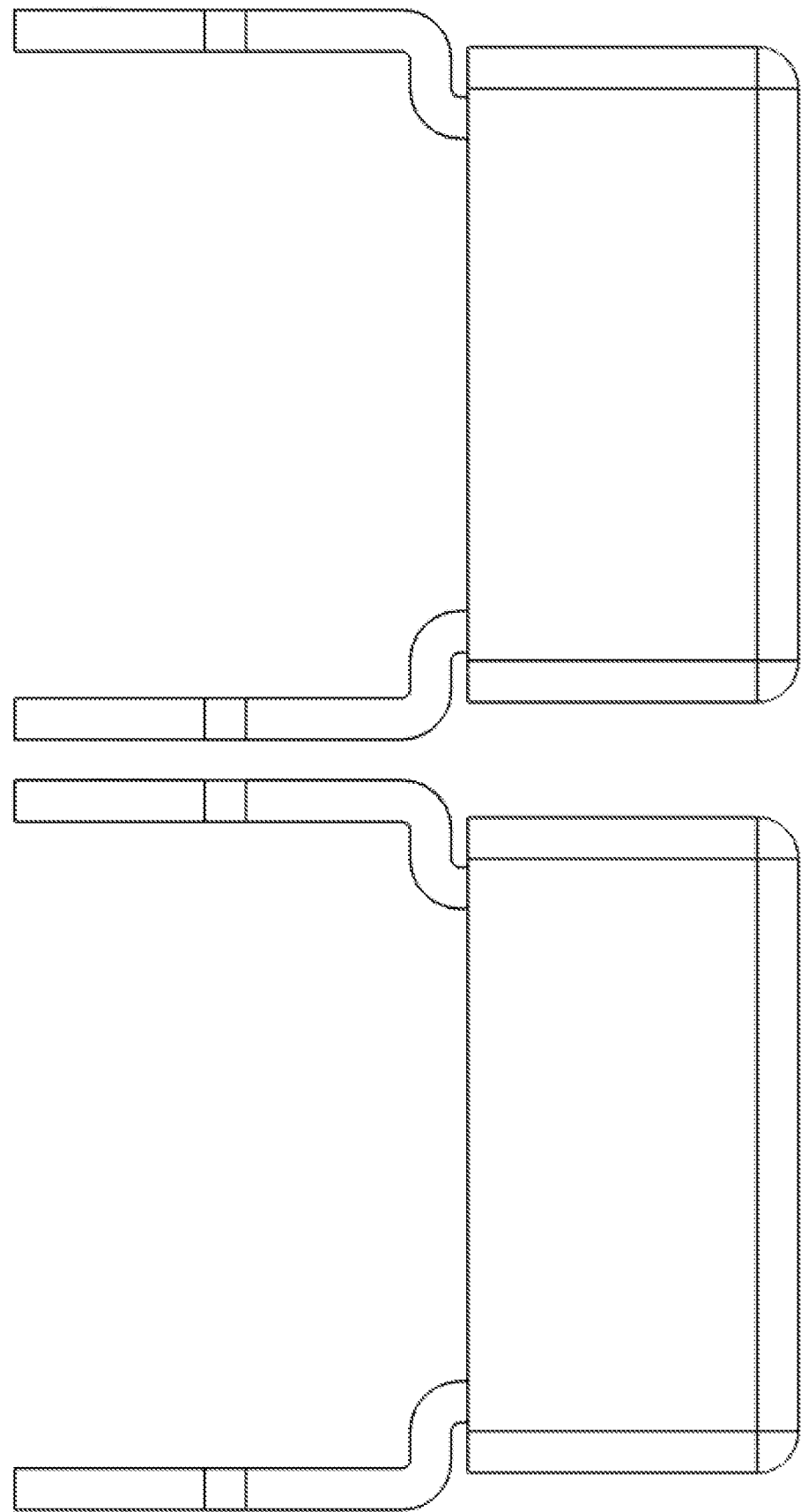
FIG. 57 illustrates front and rear views of a third capacitor construction that may be useful in some preferred exemplary system embodiments.
Figure 58:
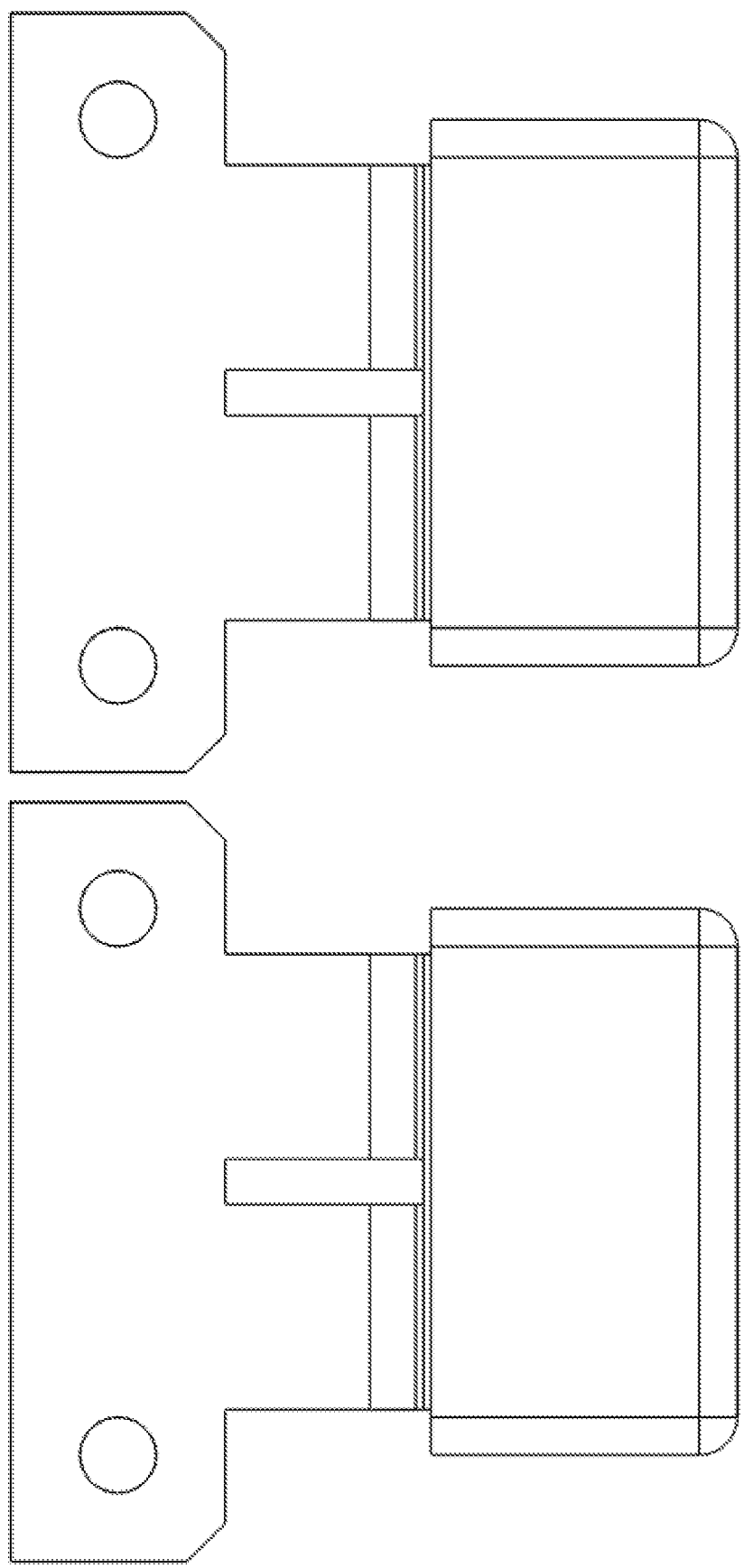
FIG. 58 illustrates left side and right side views of a third capacitor construction that may be useful in some preferred exemplary system embodiments.
Figure 59:
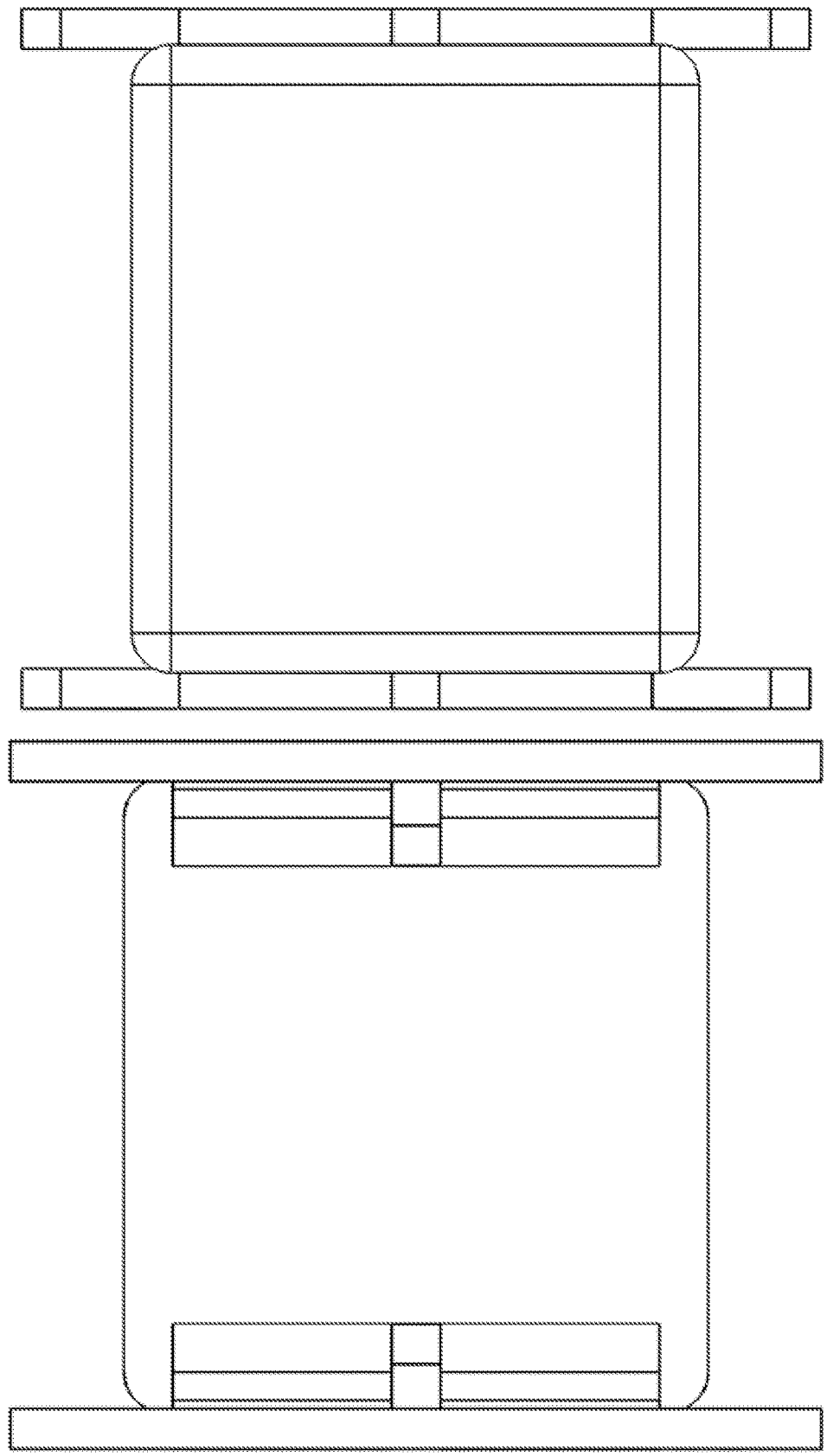
FIG. 59 illustrates top and bottom views of a third capacitor construction that may be useful in some preferred exemplary system embodiments.
Figure 60:
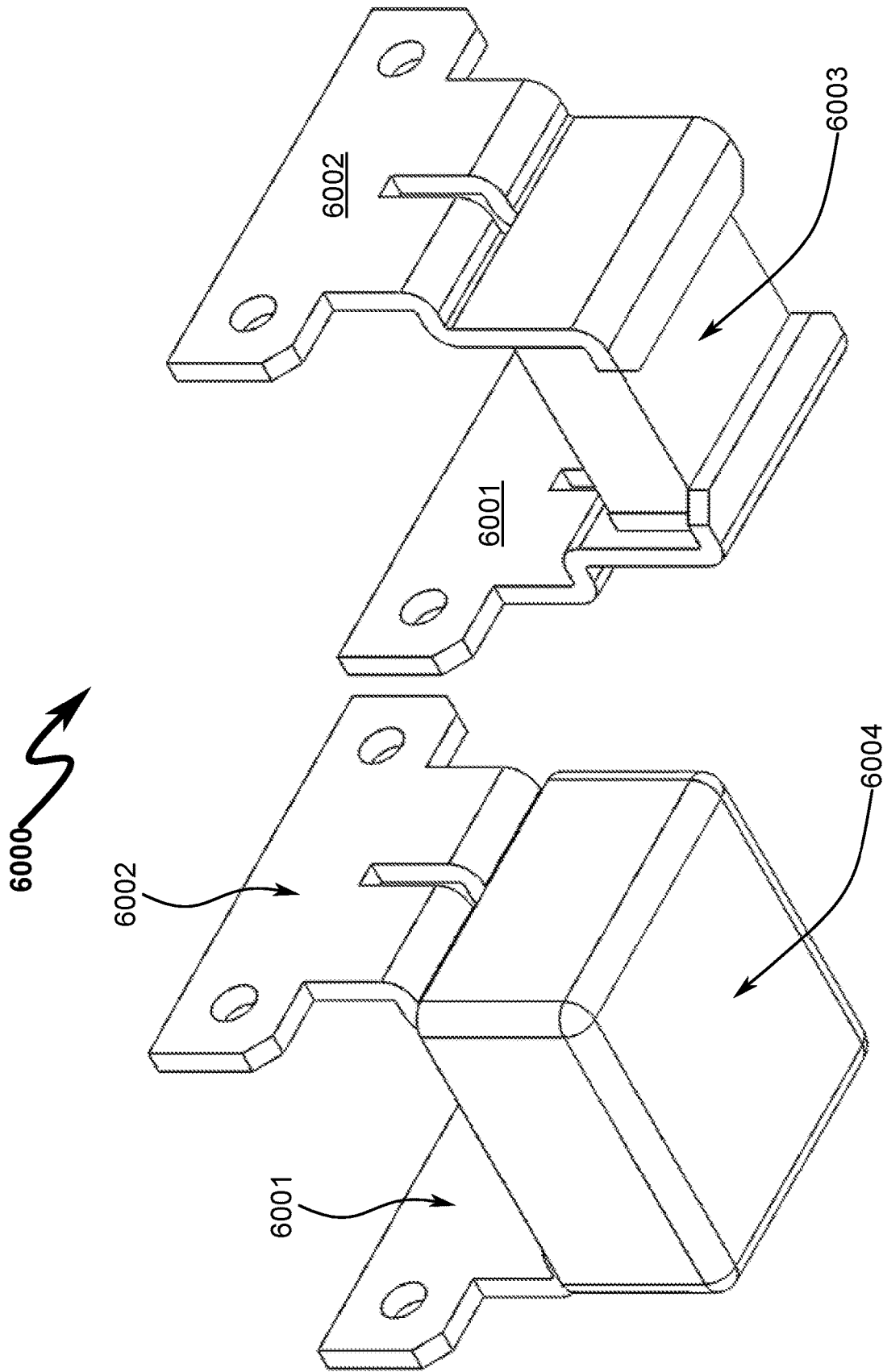
FIG. 60 illustrates bottom right side perspective views of a third capacitor construction with and without component over-molding that may be useful in some preferred exemplary system embodiments.
Figure 61:
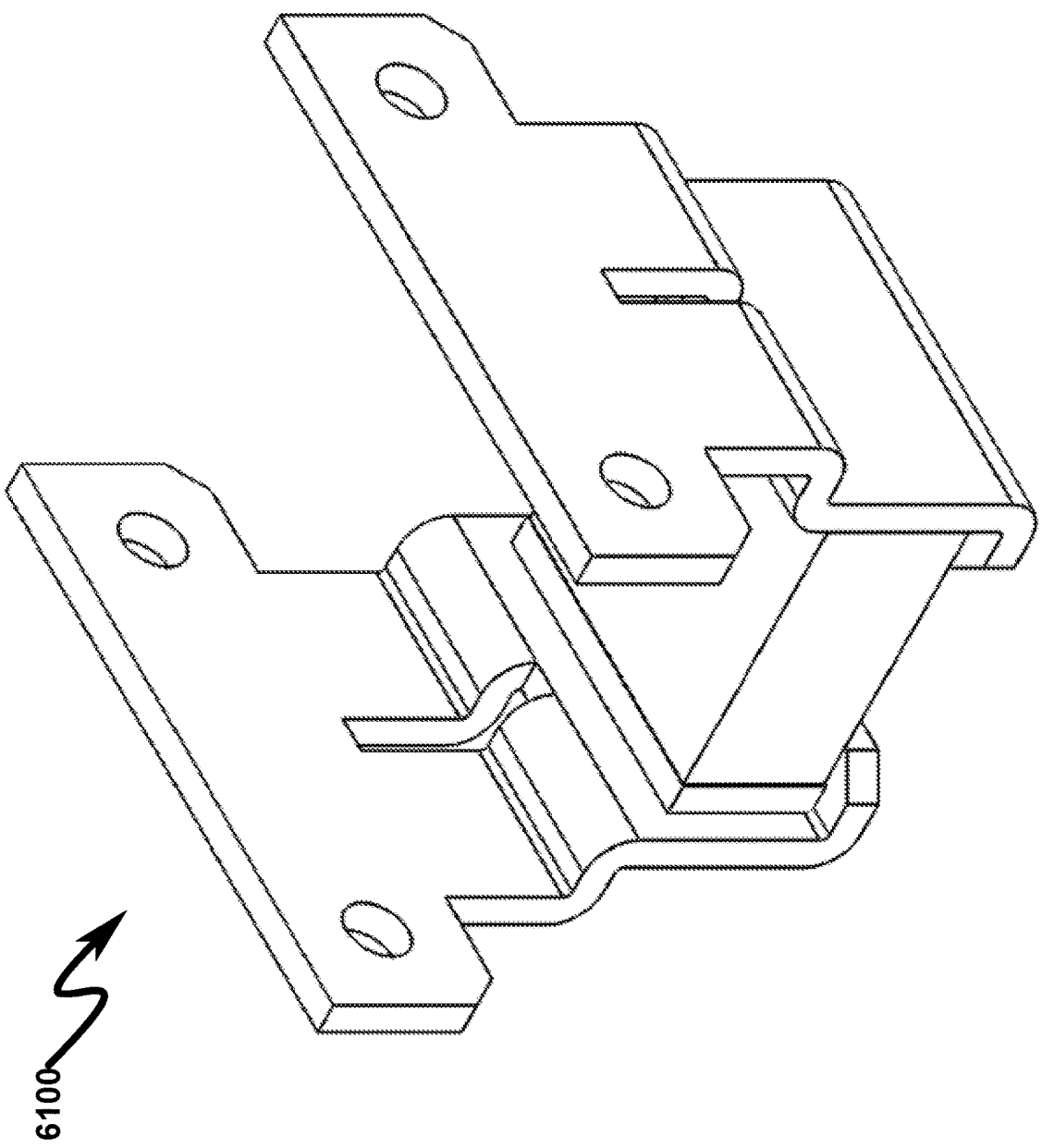
FIG. 61 illustrates a front right top perspective view of a third capacitor construction with component over-molding suppressed that may be useful in some preferred exemplary system embodiments.
Figure 62:
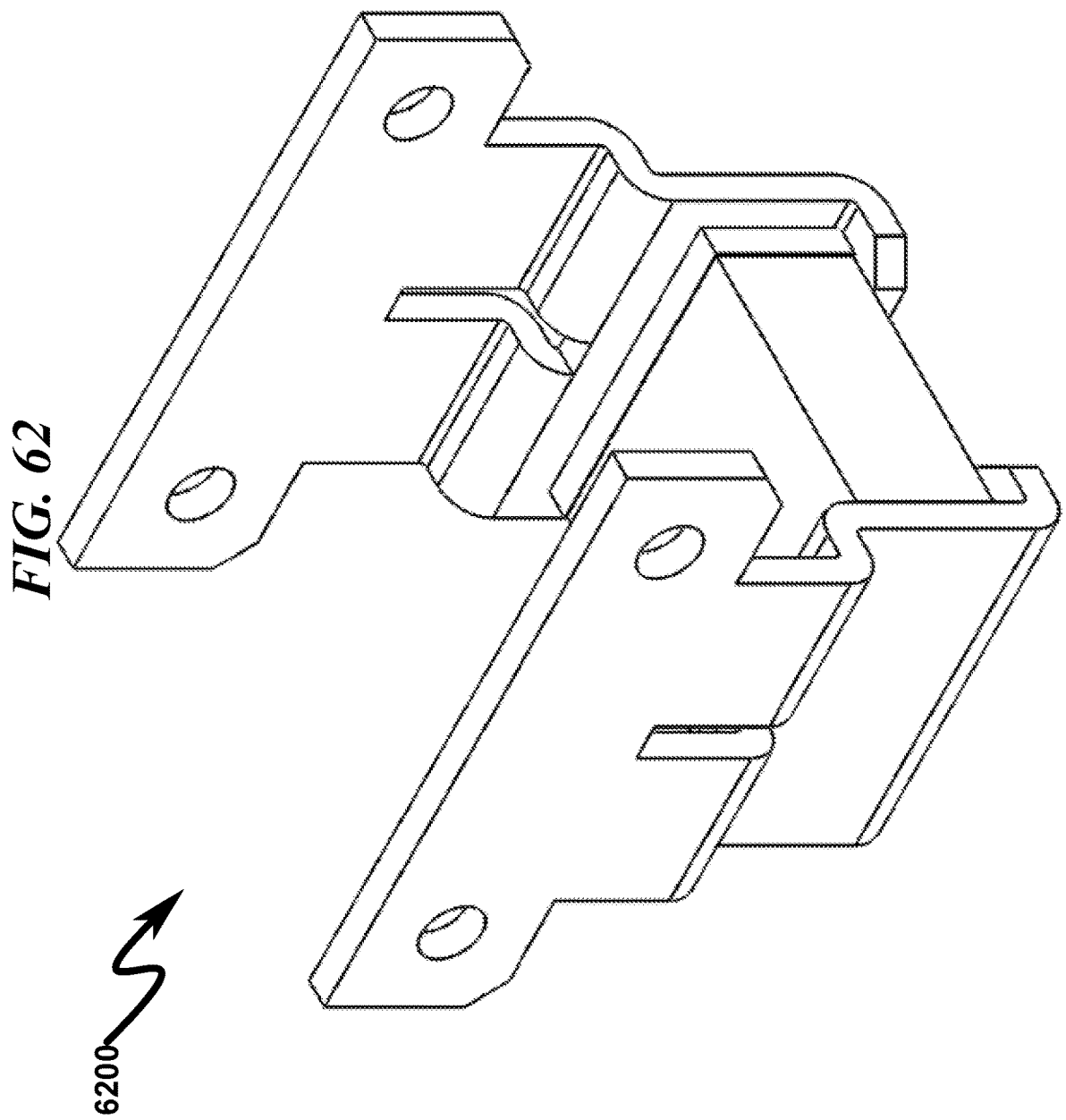
FIG. 62 illustrates a rear right top perspective view of a third capacitor construction with component over-molding suppressed that may be useful in some preferred exemplary system embodiments.
Figure 63:
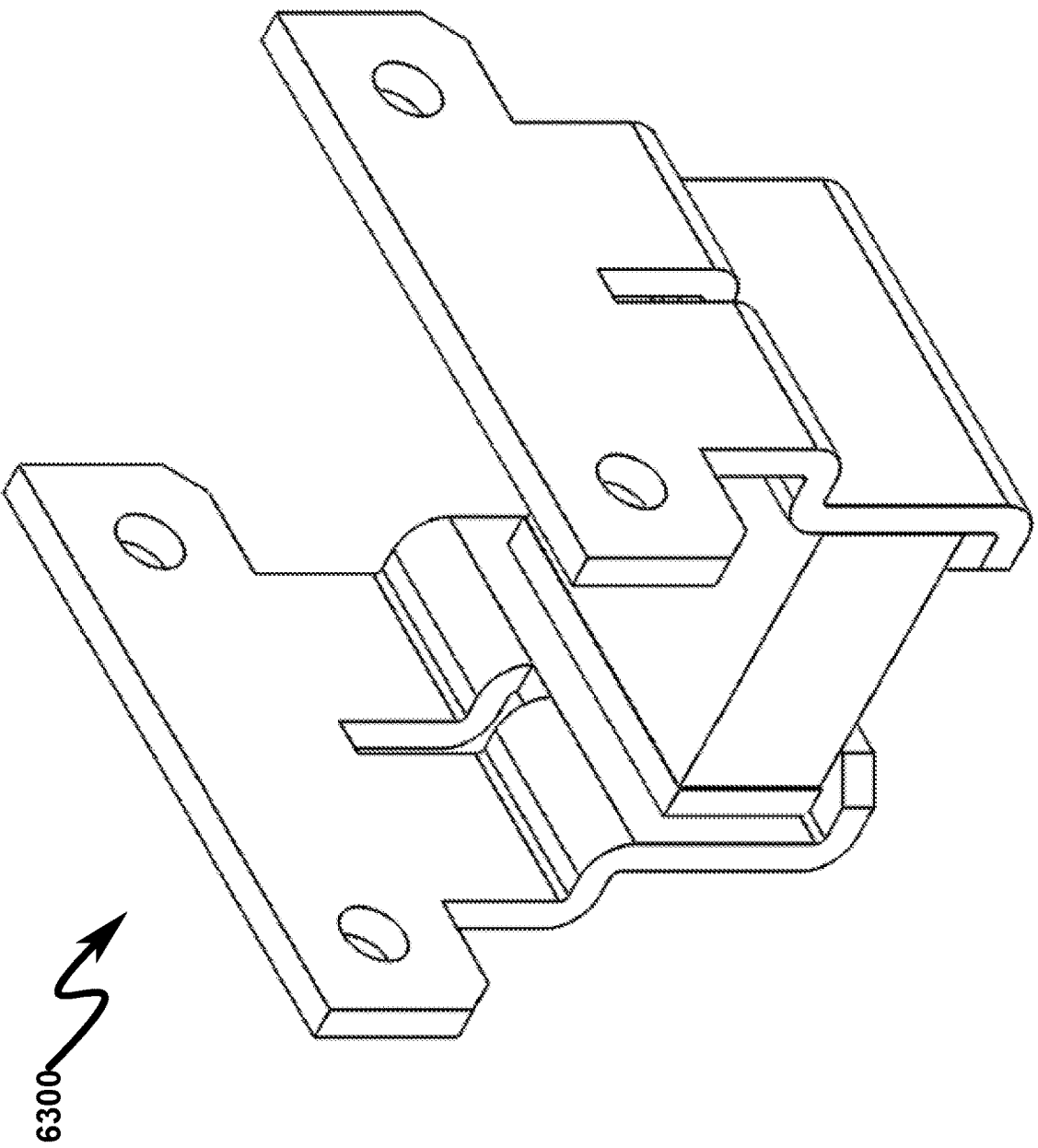
FIG. 63 illustrates a rear left top perspective view of a third capacitor construction with component over-molding suppressed that may be useful in some preferred exemplary system embodiments.

The capacitors utilized within the present invention must be electrically mated to the various BUS/CON/GND conductors in order to affect a functional EIF network. How this is done is critical to minimizing the parasitic inductance and resistance that are associated with any connection of a capacitor to an electric circuit. The methodologies used by the present invention to ensure minimal parasitic inductances/resistances within this application context are generally illustrated in FIG. 41 (4100)-FIG. 64 (6400) wherein three types of general capacitor configurations are illustrated. The first capacitor configuration illustrated in FIG. 41 (4100)-FIG. 48 (4800) is designed for mating to the BUS+/BUS− conductors. The second capacitor configuration illustrated in FIG. 49 (4900)-FIG. 56 (5600) is designed for mating to the CON+/CON− conductors. The third capacitor configuration illustrated in FIG. 56 (5600)-FIG. 64 (6400) is designed for mating between the CON+ and CON− conductors.

Each of the various capacitor combinations incorporates a first leadframe (4401, 5201, 6001), second leadframe (4402, 5202, 6002), monolithic capacitor (4403, 5203, 6003), and injection molded plastic overmold cover (POC) (4404, 5204, 6004).

Note that construction of these capacitors within this context involves injection molding of a MLCC capacitor that has been soldered to copper leadframes. The order of this process is as follows:
(1) Create two "leadframes" comprising copper to support the capacitor;
(2) Form a support well for the capacitor within the leadframes;
(3) Pick and place the capacitor in the leadframes;
(4) Reflow solder the capacitor to the leadframes;
(5) Trim and form the leadframes/capacitor combination; and
(6) Injection mold the capacitor within the confines of the leadframes to form a plastic overmold cover (POC).

An overarching plastic encapsulation cover (PEC) is designed to protect the capacitors during the final construction and provide a level of protection from expansion and contraction due to temperature cycle and additional protection against vibration stresses. All materials in this process will typically have a similar coefficient of thermal expansion (CTE), but the construction goal is a smaller cavity to aid in preventing solder movement which could impact the capacitors during the final plastic encapsulating cover (PEC) EIF encapsulation process.

Note that the EIF as described herein is designed to operate reliably in an electric vehicle (EV) electrical system. To this end, mechanical reliability is a key consideration in the construction of the EIF. As such, the POC provides individual mechanical stability within the construction of the individual filtering capacitors. The use of roll pins, soldering, and/or welding of the individual capacitor leadframes to other components within the EIF further stabilizes the individual capacitors. Finally, the PEC then secures all of the individual capacitors, bus bars, and permeable inductor core (PIC) within the confines of the overall EIF assembly.

Grounding Support Assembly (GSA) (6500)-(8000)

Figure 65:
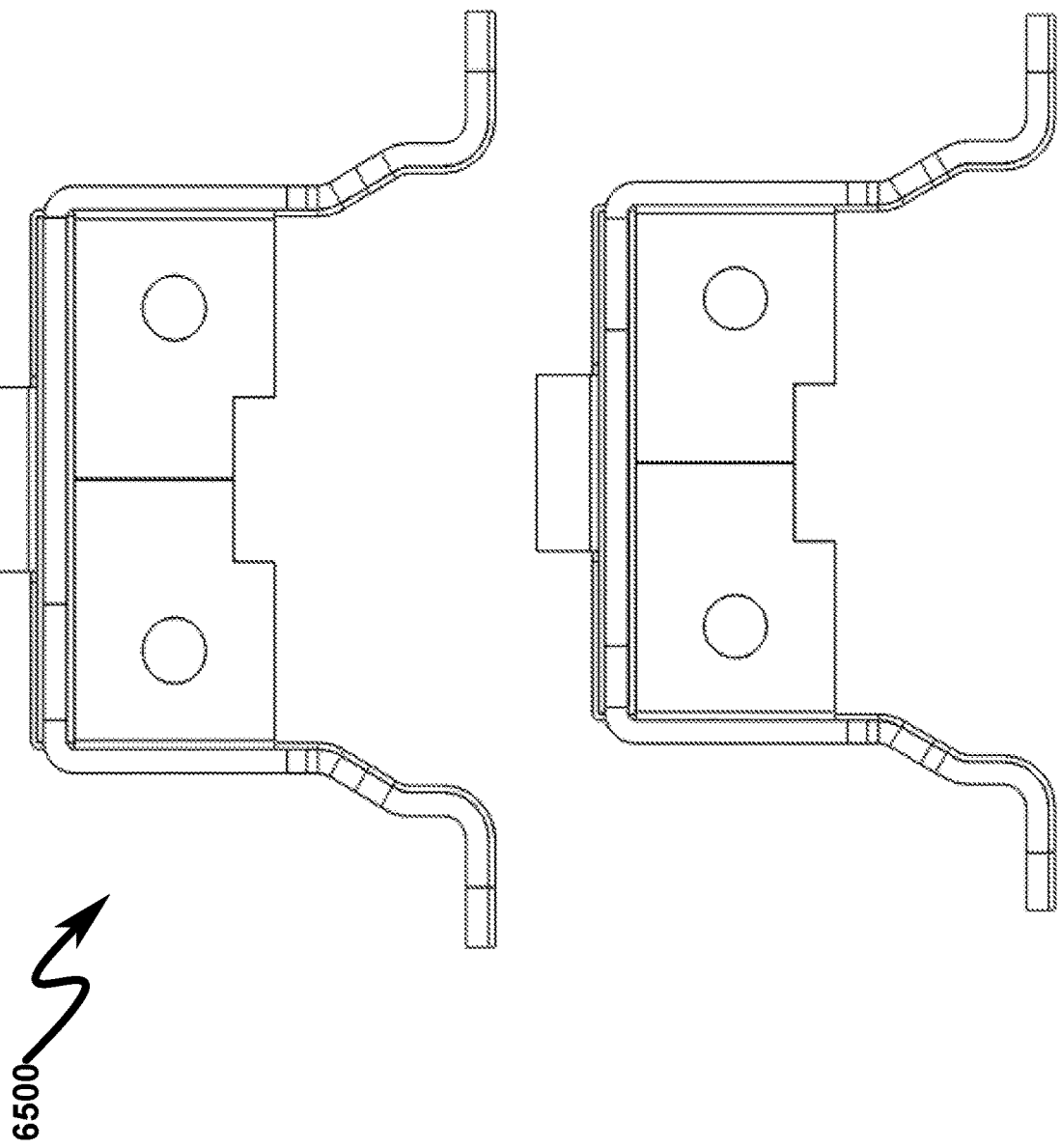
FIG. 65 illustrates front and rear views of a grounding support assembly (GSA) that may be useful in some preferred exemplary system embodiments.
Figure 66:
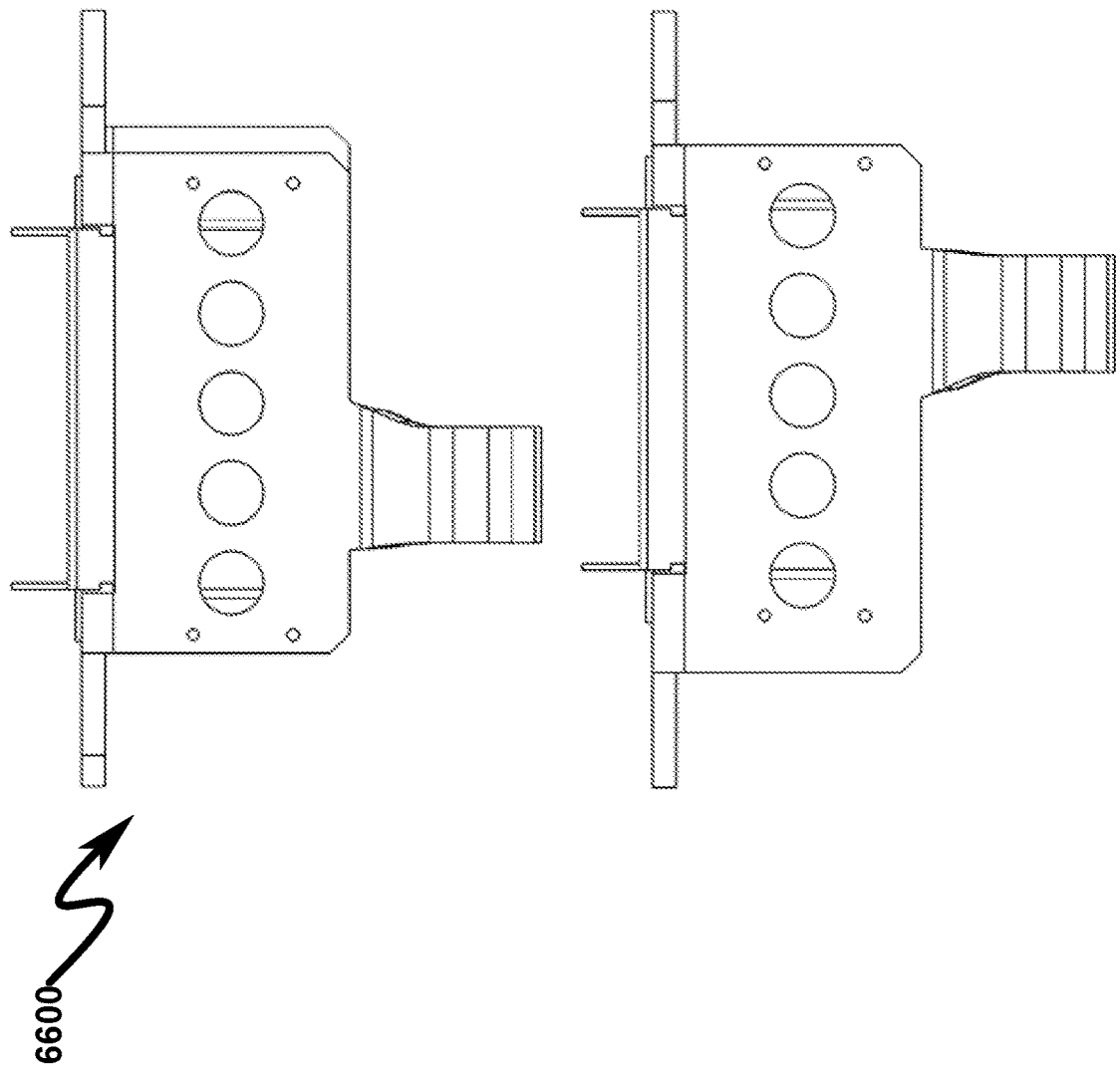
FIG. 66 illustrates left side and right side views of a grounding support assembly (GSA) that may be useful in some preferred exemplary system embodiments.
Figure 67:
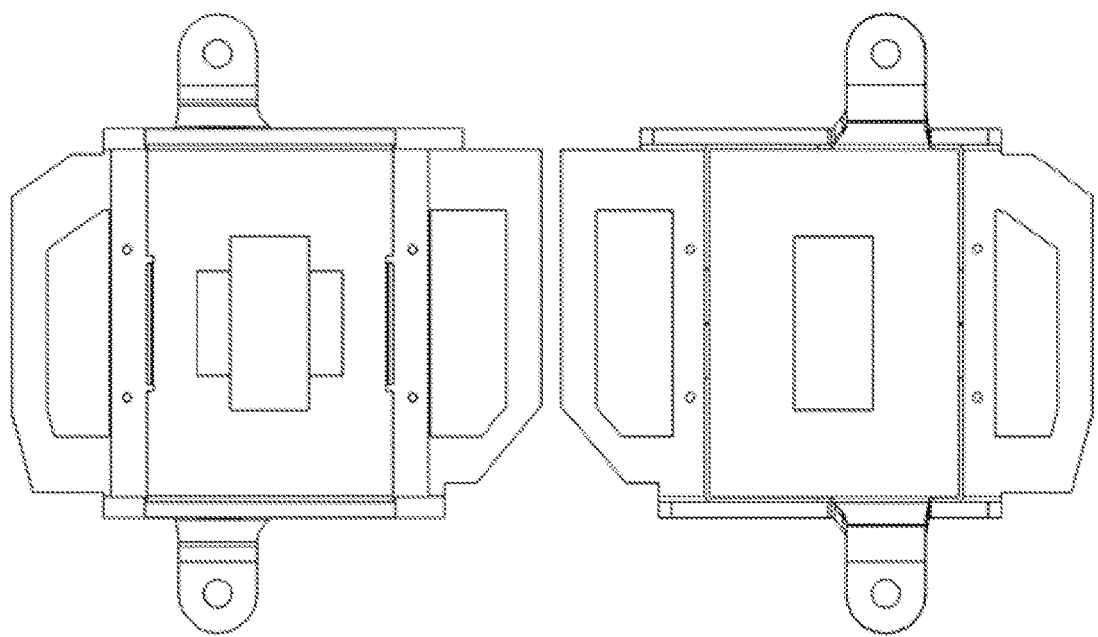
FIG. 67 illustrates top and bottom views of a grounding support assembly (GSA) that may be useful in some preferred exemplary system embodiments.
Figure 68:
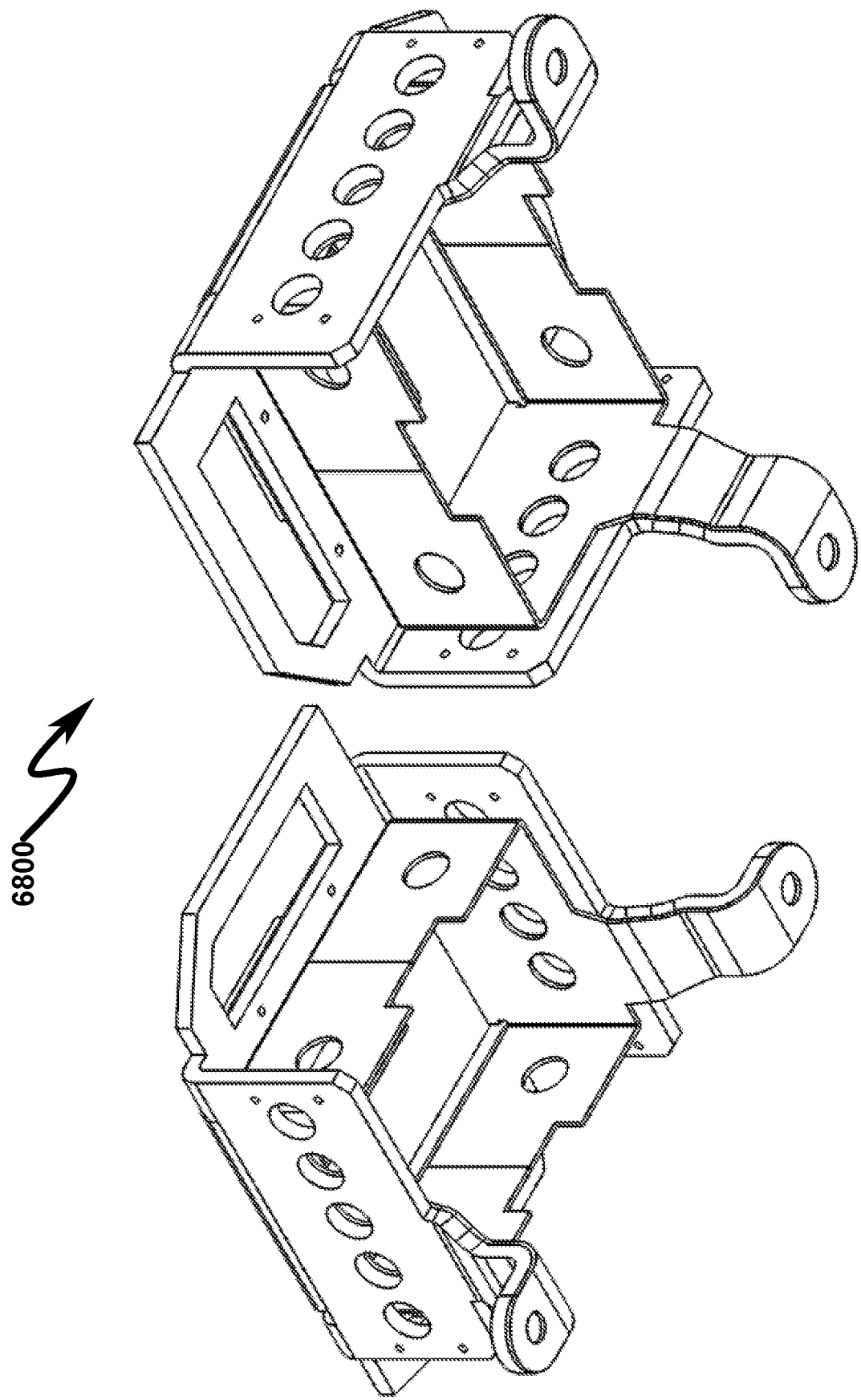
FIG. 68 illustrates bottom left and right side perspective views of a grounding support assembly (GSA) that may be useful in some preferred exemplary system embodiments.
Figure 69:
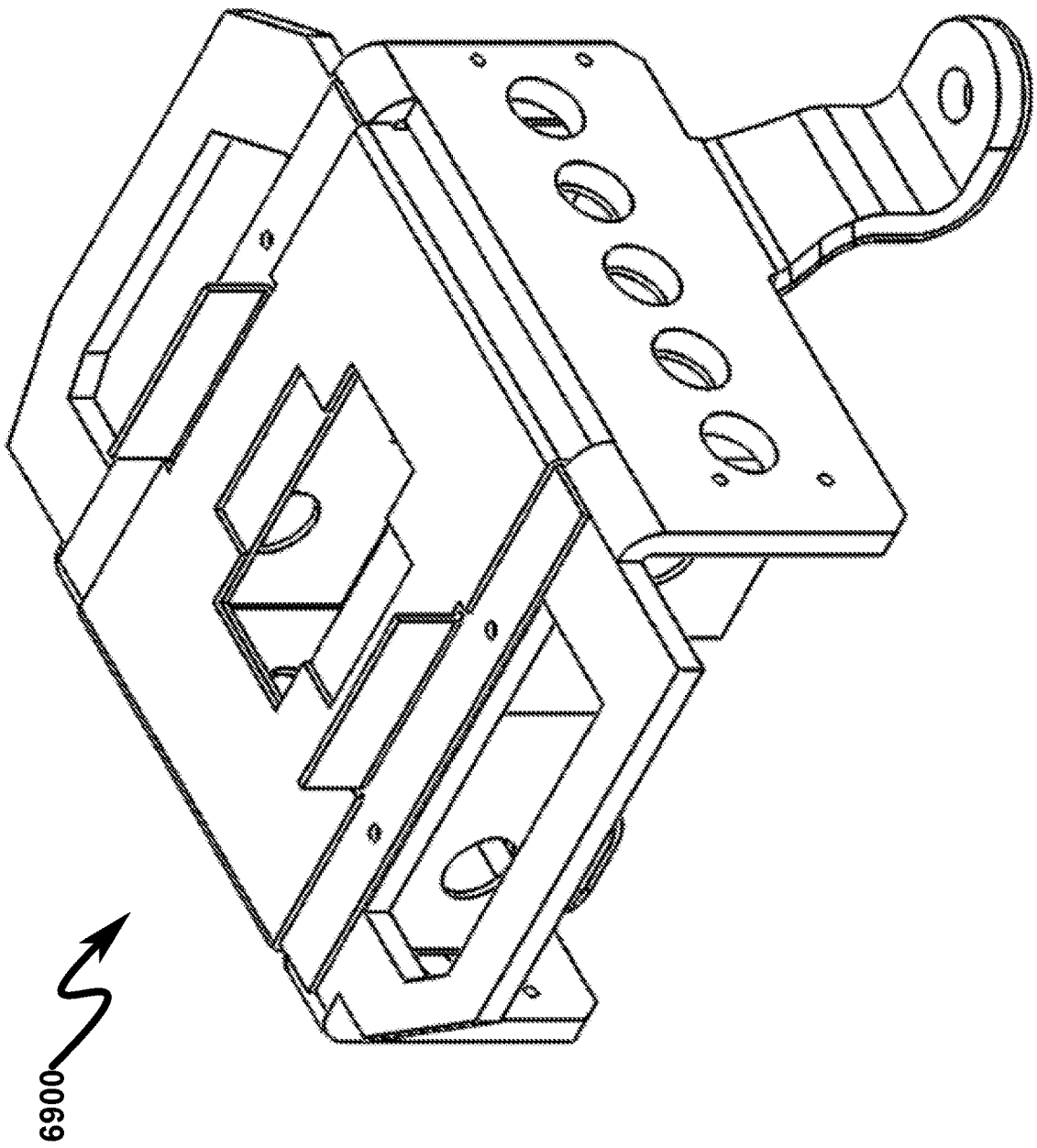
FIG. 69 illustrates a front right top perspective view of a grounding support assembly (GSA) that may be useful in some preferred exemplary system embodiments.
Figure 70:
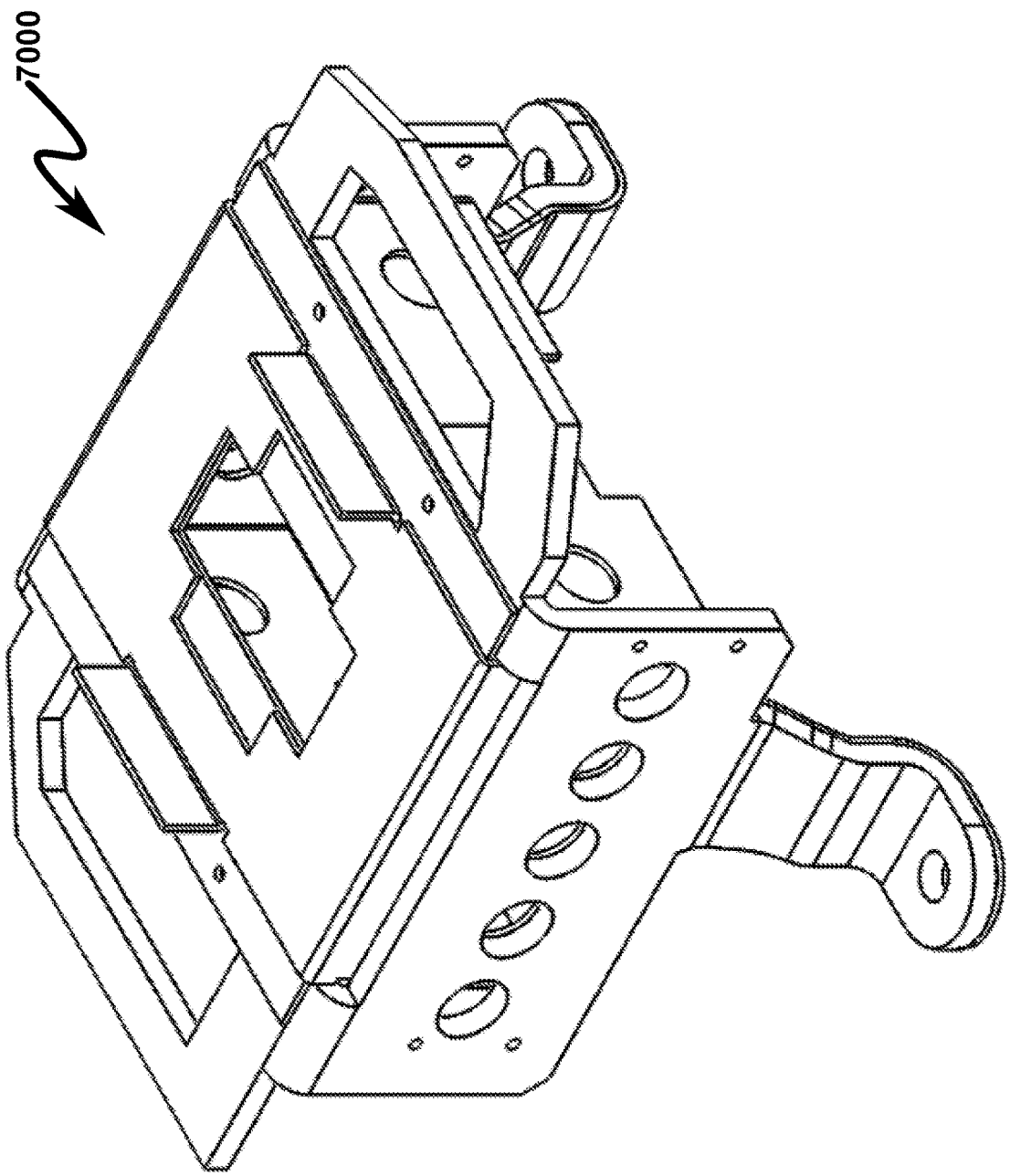
FIG. 70 illustrates a rear right top perspective view of a grounding support assembly (GSA) that may be useful in some preferred exemplary system embodiments.
Figure 71:
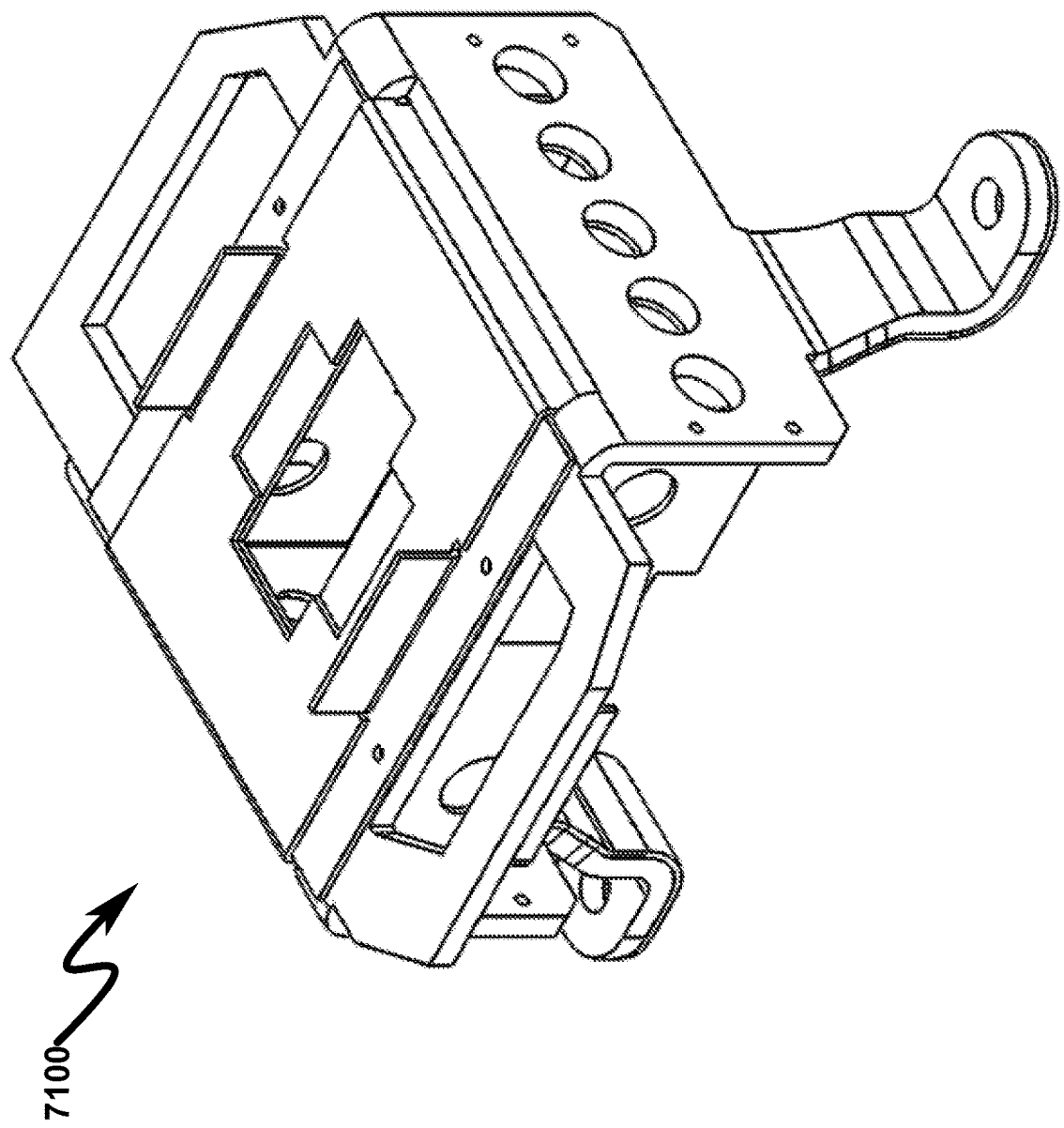
FIG. 71 illustrates a rear left top perspective view of a grounding support assembly (GSA) that may be useful in some preferred exemplary system embodiments.
Figure 72:
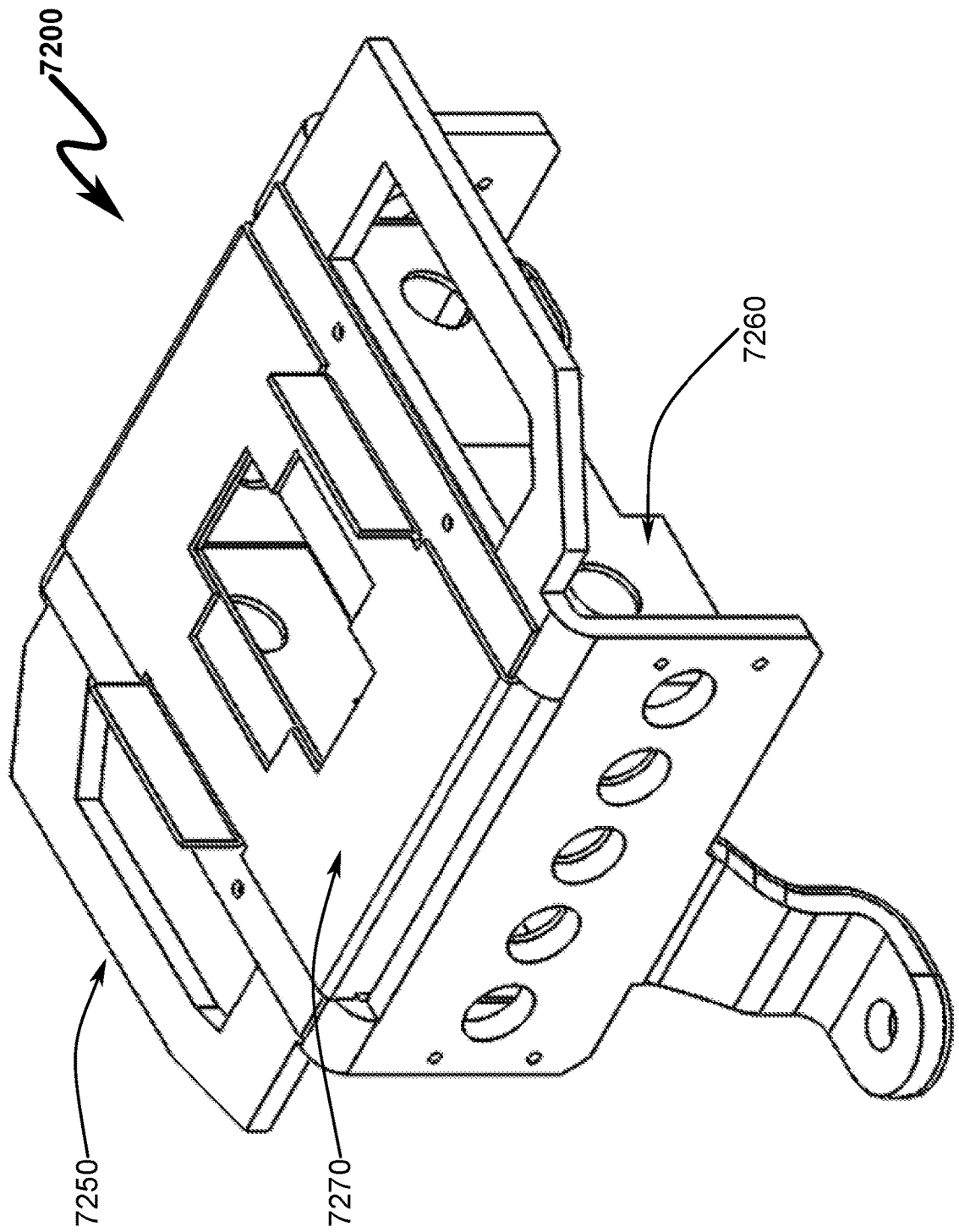
FIG. 72 illustrates a front left top perspective view of a grounding support assembly (GSA) that may be useful in some preferred exemplary system embodiments.
Figure 73:
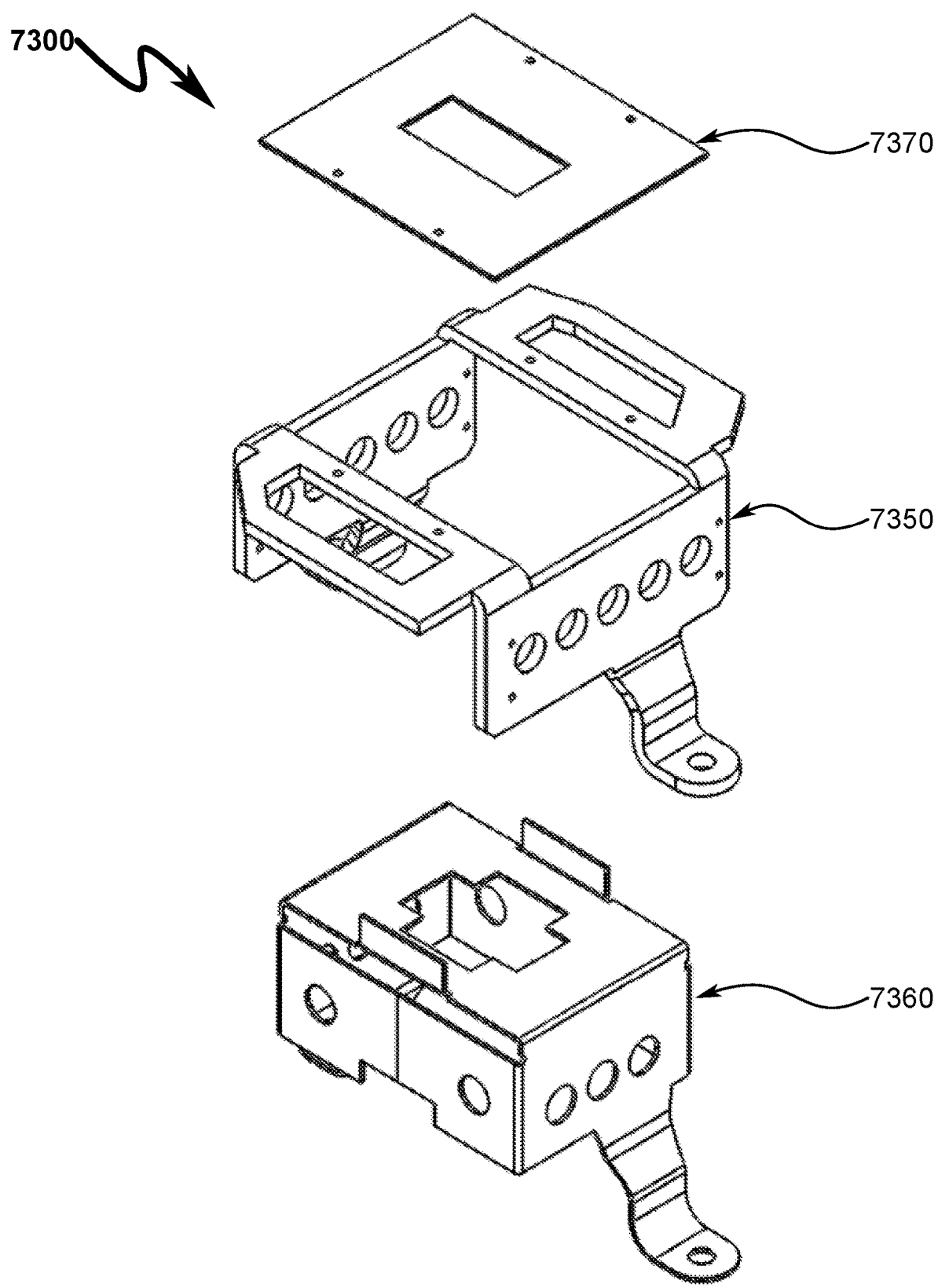
FIG. 73 illustrates a front right top perspective assembly view of a grounding support assembly (GSA) depicting the grounding support bracket (GSB), grounding support conductor (GSC), and grounding support insulator (GSI) that may be useful in some preferred exemplary system embodiments.
Figure 74:
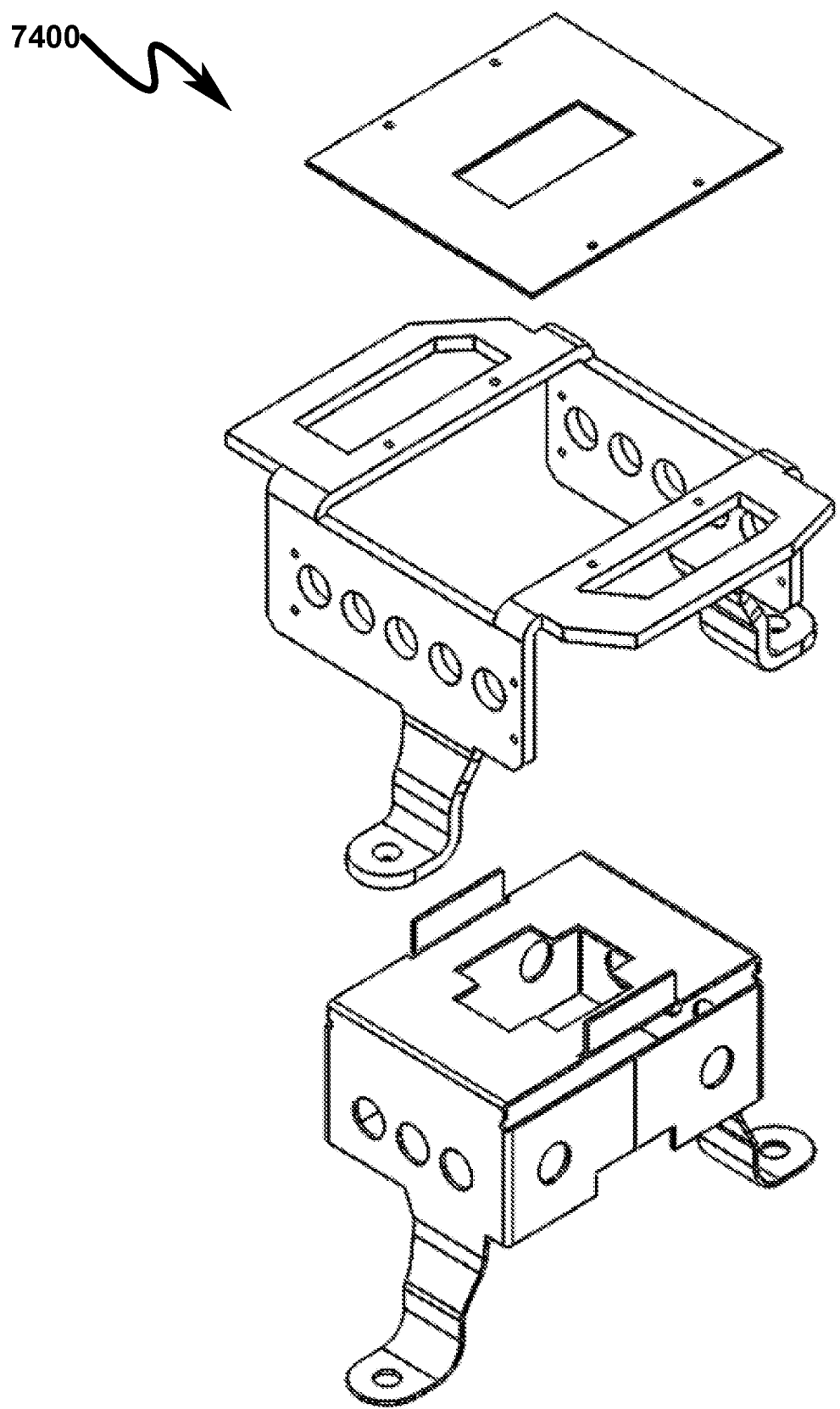
FIG. 74 illustrates a rear right top perspective assembly view of a grounding support assembly (GSA) depicting the grounding support bracket (GSB), grounding support conductor (GSC), and grounding support insulator (GSI) that may be useful in some preferred exemplary system embodiments.
Figure 75:
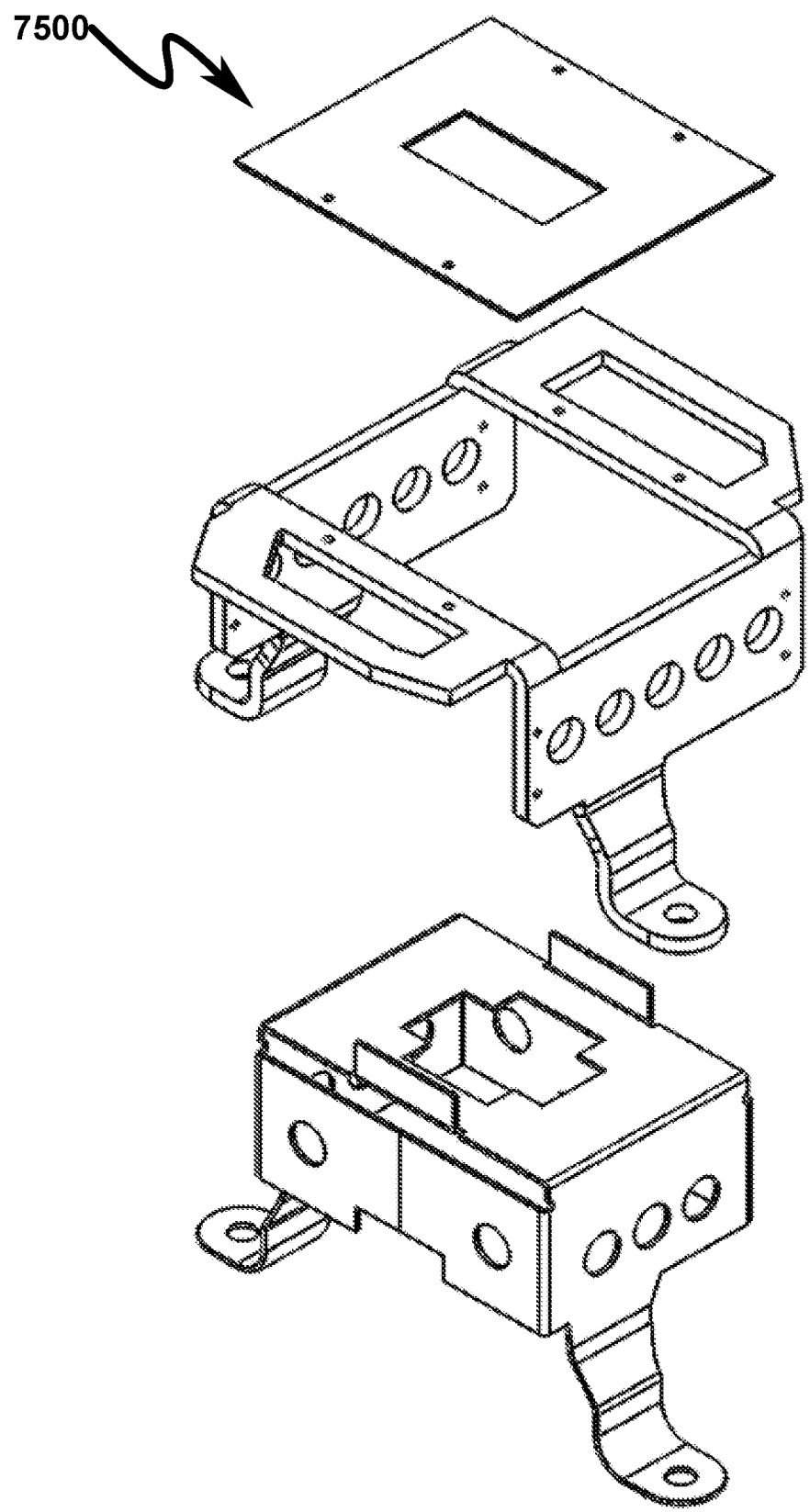
FIG. 75 illustrates a rear left top perspective assembly view of a grounding support assembly (GSA) depicting the grounding support bracket (GSB), grounding support conductor (GSC), and grounding support insulator (GSI) that may be useful in some preferred exemplary system embodiments.
Figure 76:
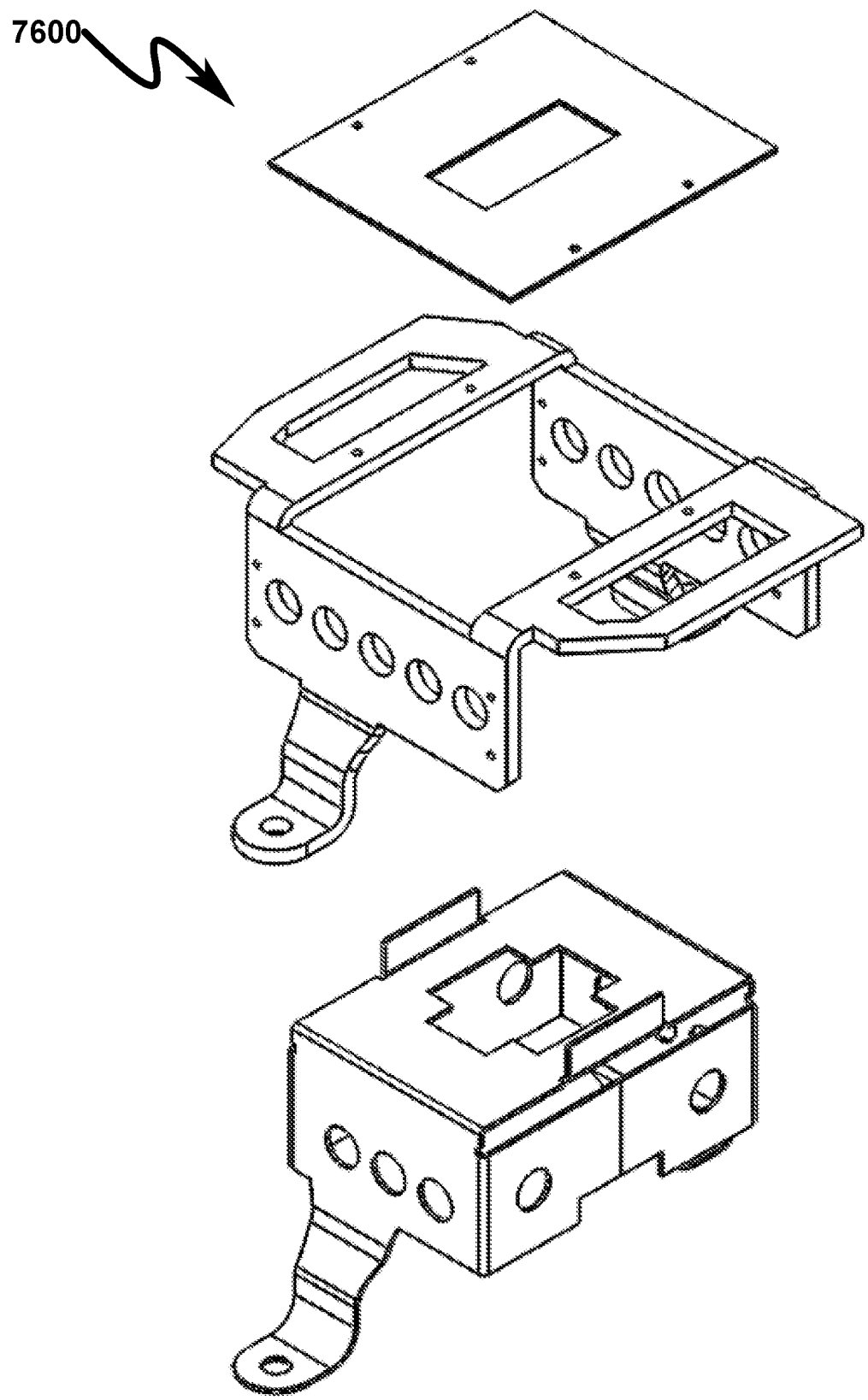
FIG. 76 illustrates a front left top perspective assembly view of a grounding support assembly (GSA) depicting the grounding support bracket (GSB), grounding support conductor (GSC), and grounding support insulator (GSI) that may be useful in some preferred exemplary system embodiments.
Figure 77:
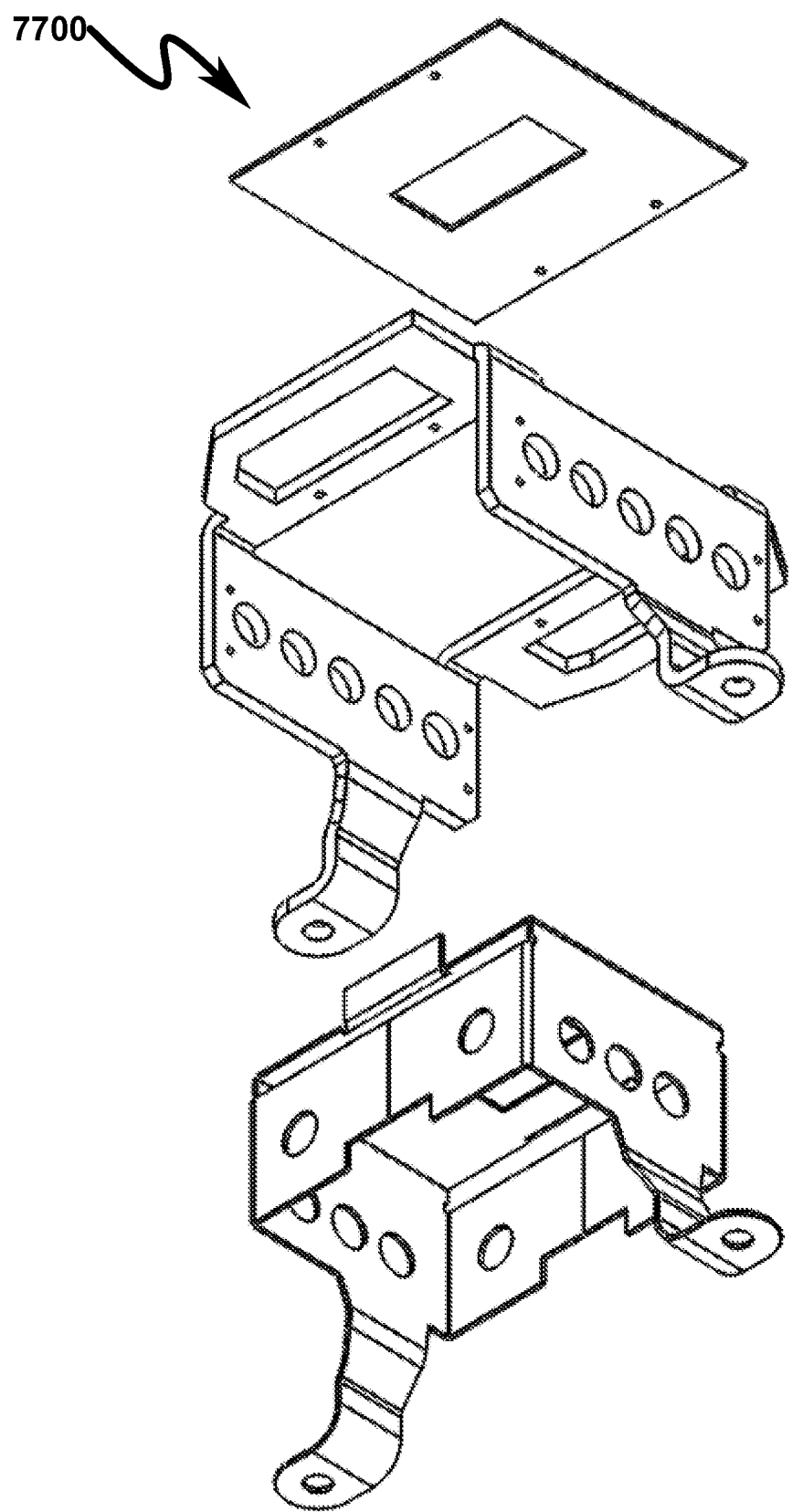
FIG. 77 illustrates a front right bottom perspective assembly view of a grounding support assembly (GSA) depicting the grounding support bracket (GSB), grounding support conductor (GSC), and grounding support insulator (GSI) that may be useful in some preferred exemplary system embodiments.
Figure 78:
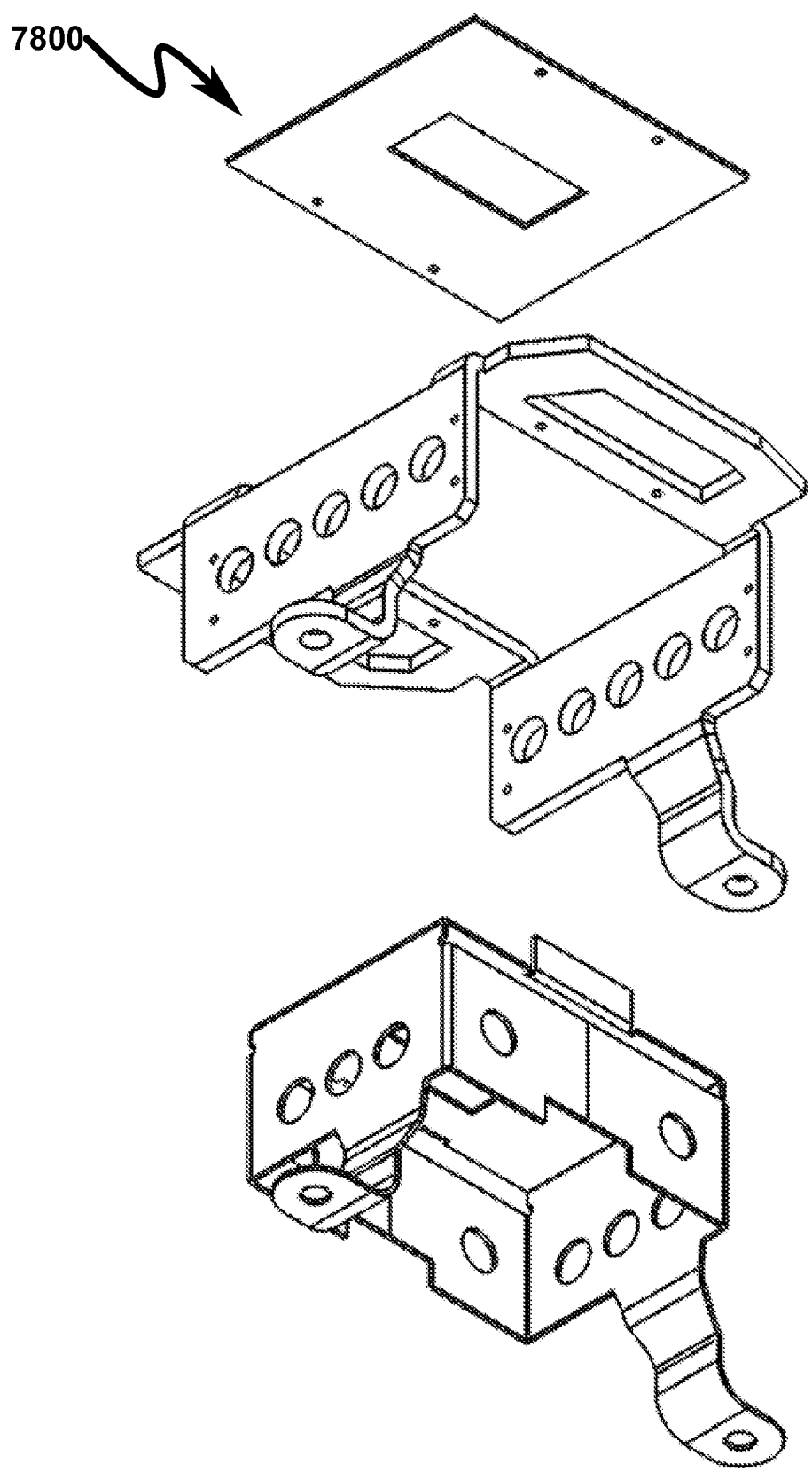
FIG. 78 illustrates a rear right bottom perspective assembly view of a grounding support assembly (GSA) depicting the grounding support bracket (GSB), grounding support conductor (GSC), and grounding support insulator (GSI) that may be useful in some preferred exemplary system embodiments.
Figure 88:
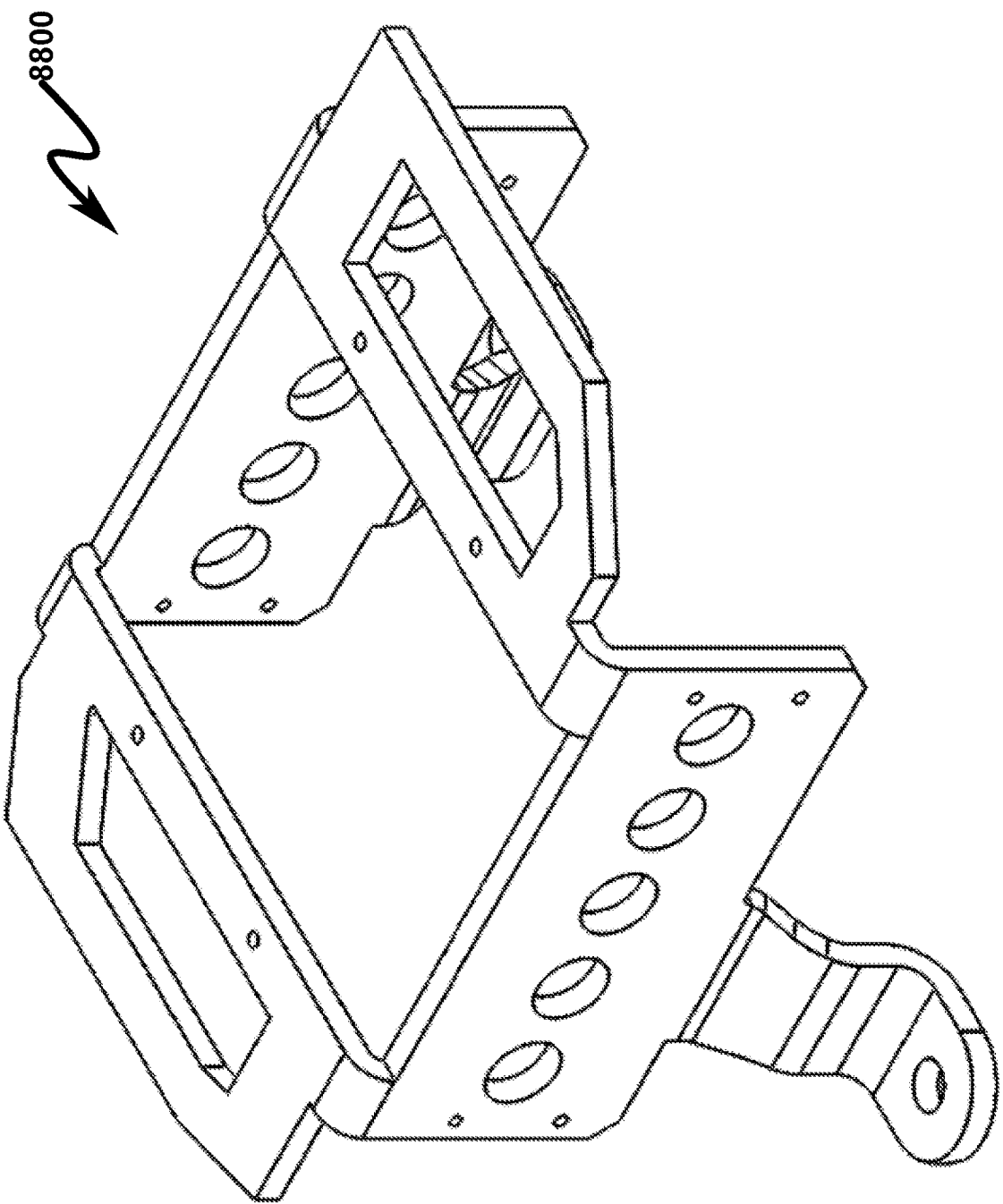
FIG. 88 illustrates a front left top perspective view of a grounding support bracket (GSB) that may be useful in some preferred exemplary system embodiments.

The BUS+/BUS−, CON+/CON−, INC+/INC−, and Cy/Cx capacitor networks described above are mechanically coupled to a grounding support assembly (GSA) that is generally depicted in FIG. 65 (6500)-FIG. 72 (7200) and the assembly views of FIG. 73 (7300)-FIG. 88 (8800). From these drawings it can be seen that the GSA is generally comprised of a grounding support bracket (GSB) (7250, 7350), grounding support conductor (GSC) (7260, 7360), and a grounding support insulator (GSI) (7270, 7370). Assembly views of the grounding support bracket (GSB) (7350), grounding support conductor (GSC) (7360), and grounding support insulator (GSI) (7370) are provided in FIG. 73 (7300)-FIG. 80 (8000)

Figure 81:
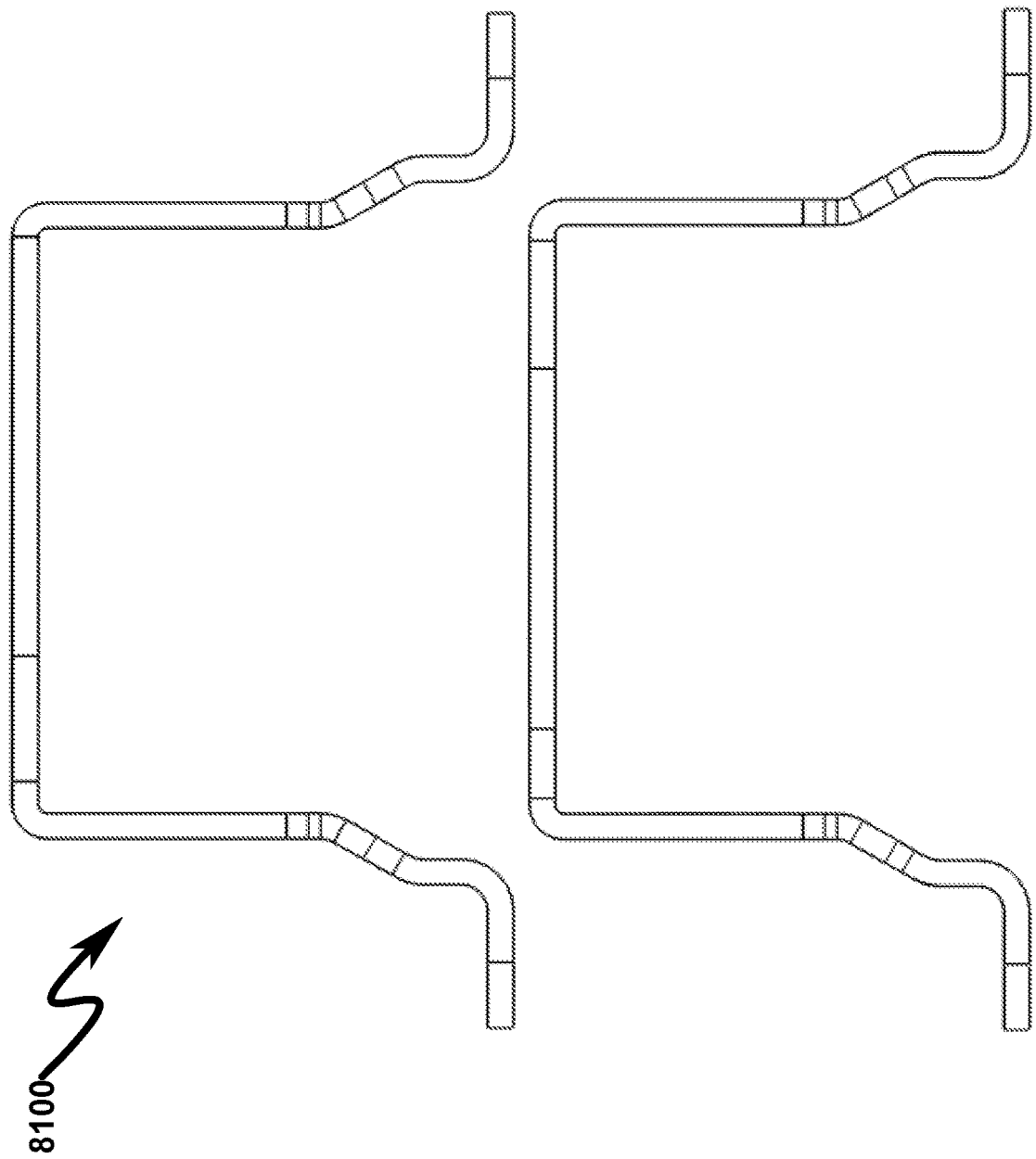
FIG. 81 illustrates front and rear views of a grounding support bracket (GSB) that may be useful in some preferred exemplary system embodiments.
Figure 82:
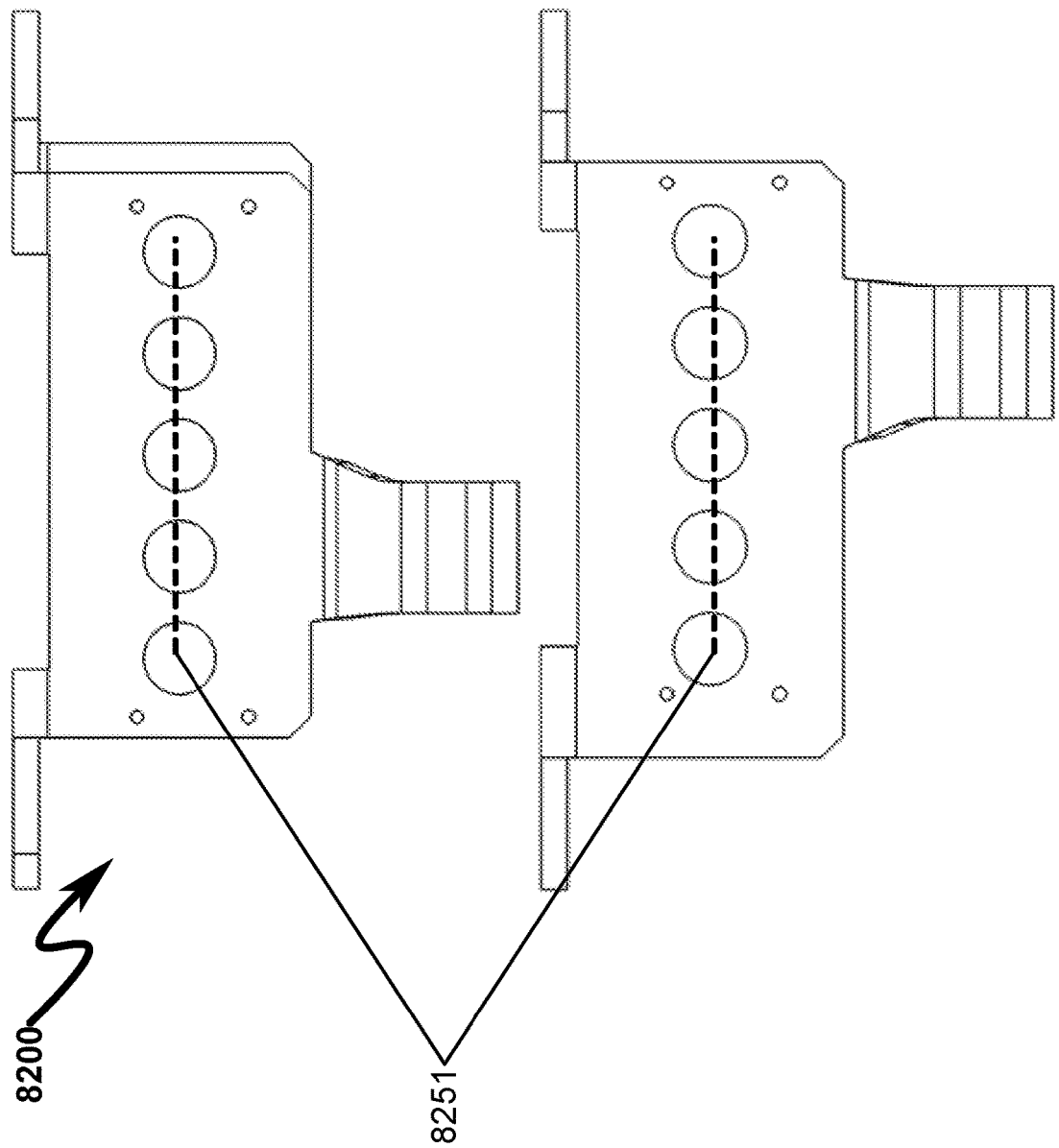
FIG. 82 illustrates left side and right side views of a grounding support bracket (GSB) that may be useful in some preferred exemplary system embodiments.
Figure 83:
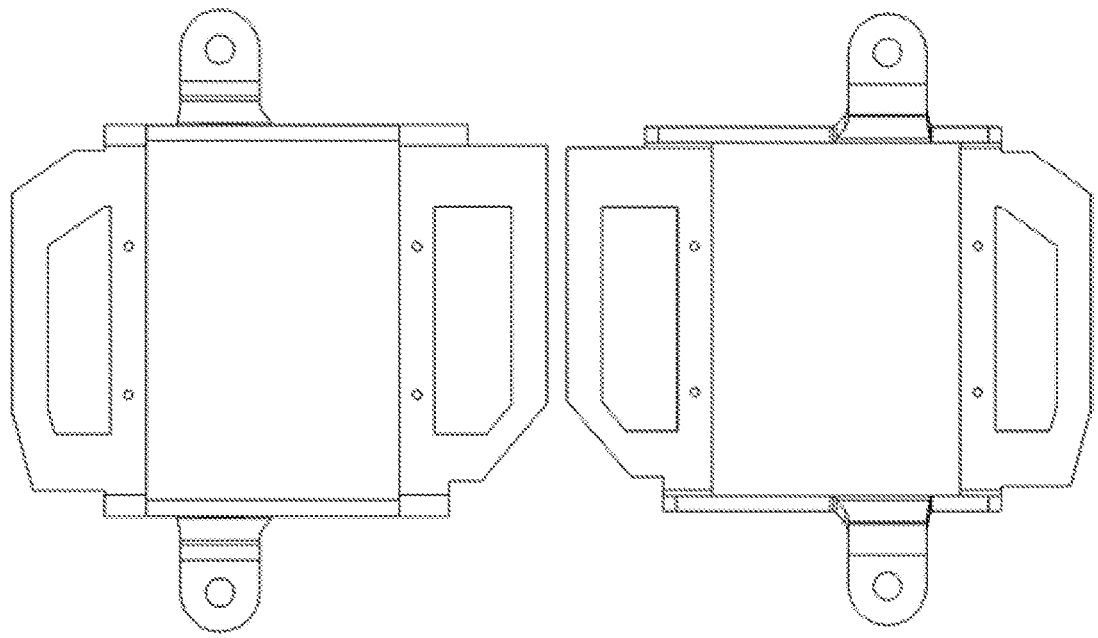
FIG. 83 illustrates top and bottom views of a grounding support bracket (GSB) that may be useful in some preferred exemplary system embodiments.
Figure 84:
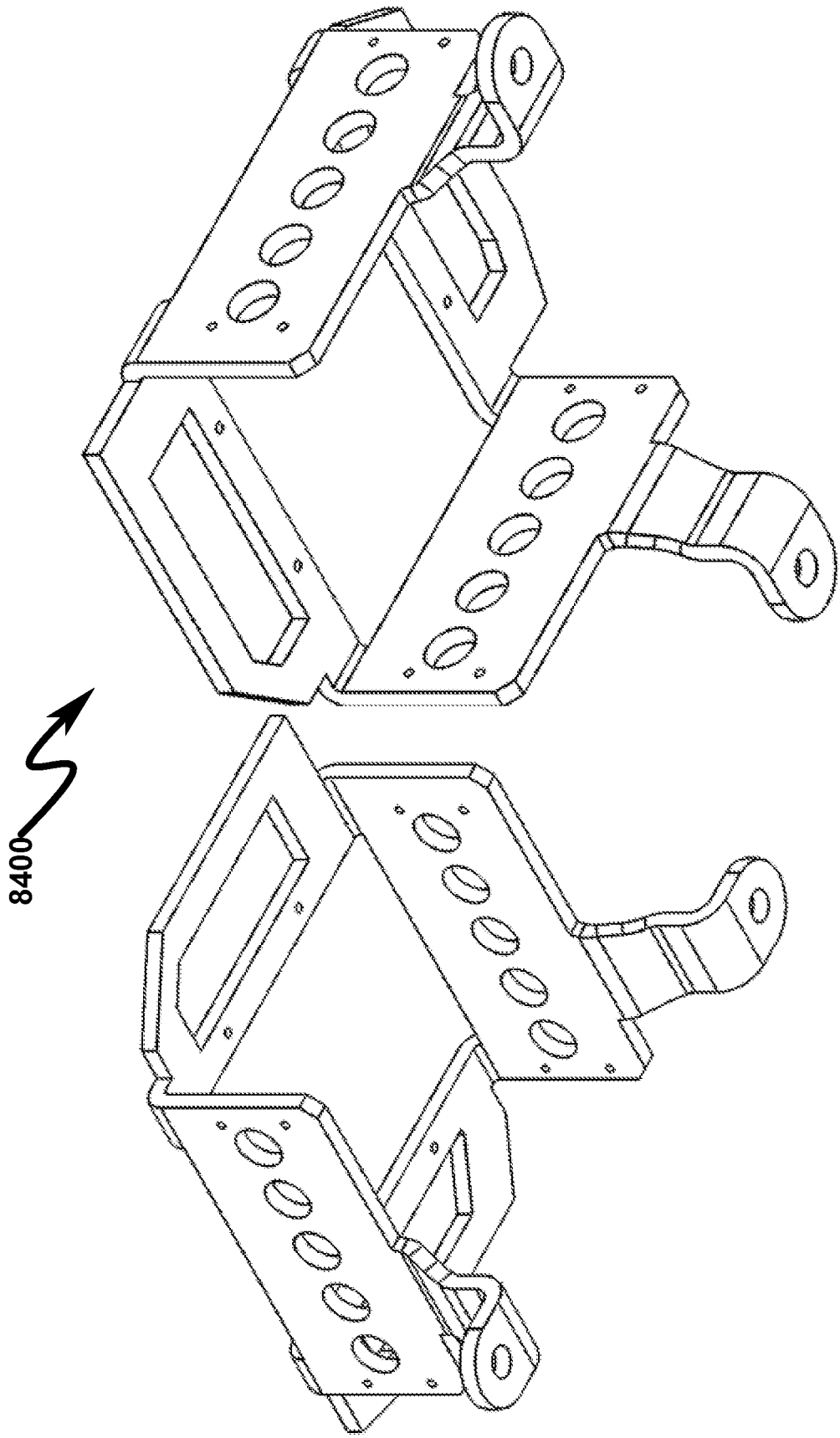
FIG. 84 illustrates bottom left and right side perspective views of a grounding support bracket (GSB) that may be useful in some preferred exemplary system embodiments.
Figure 85:
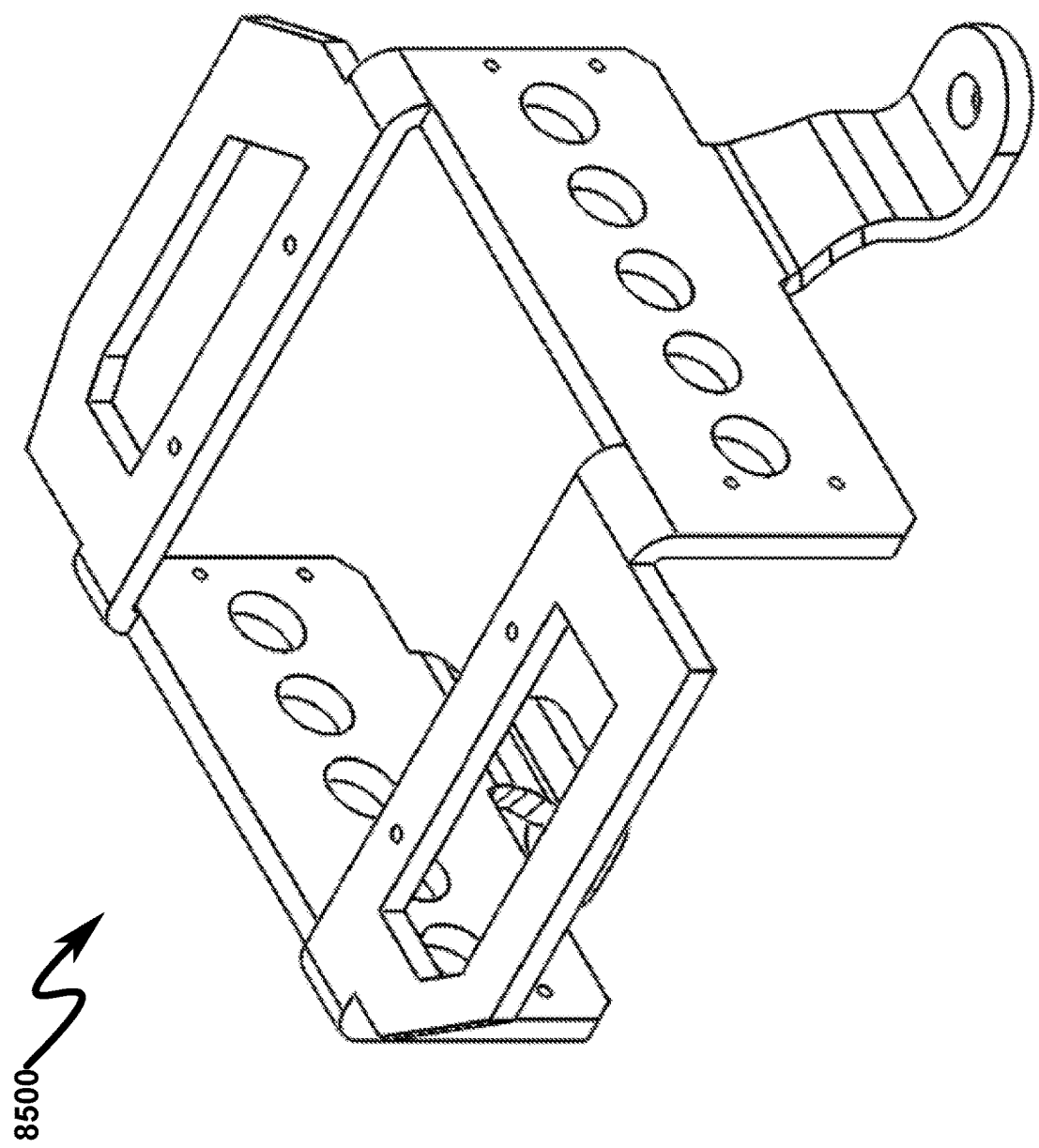
FIG. 85 illustrates a front right top perspective view of a grounding support bracket (GSB) that may be useful in some preferred exemplary system embodiments.
Figure 86:
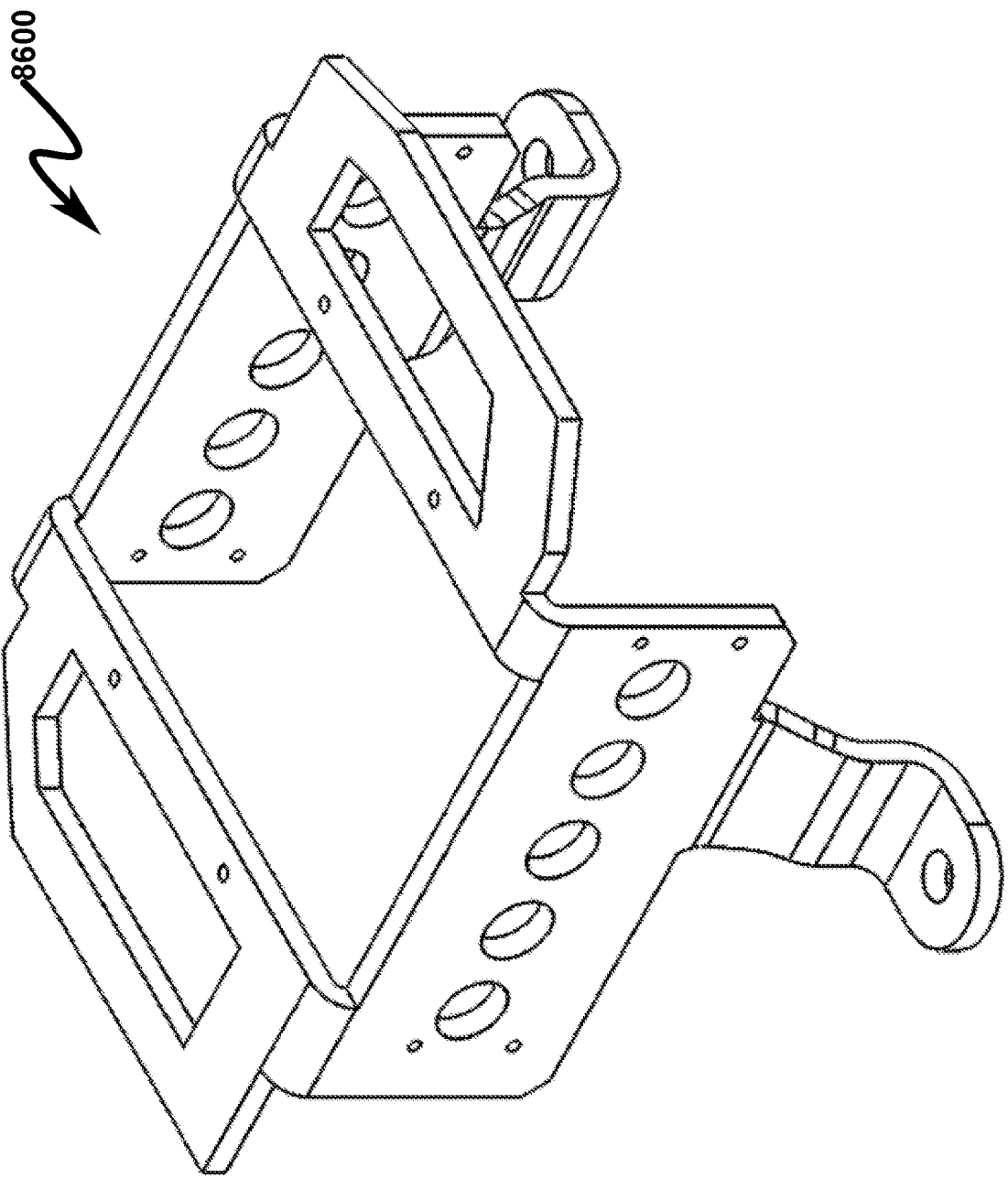
FIG. 86 illustrates a rear right top perspective view of a grounding support bracket (GSB) that may be useful in some preferred exemplary system embodiments.
Figure 87:
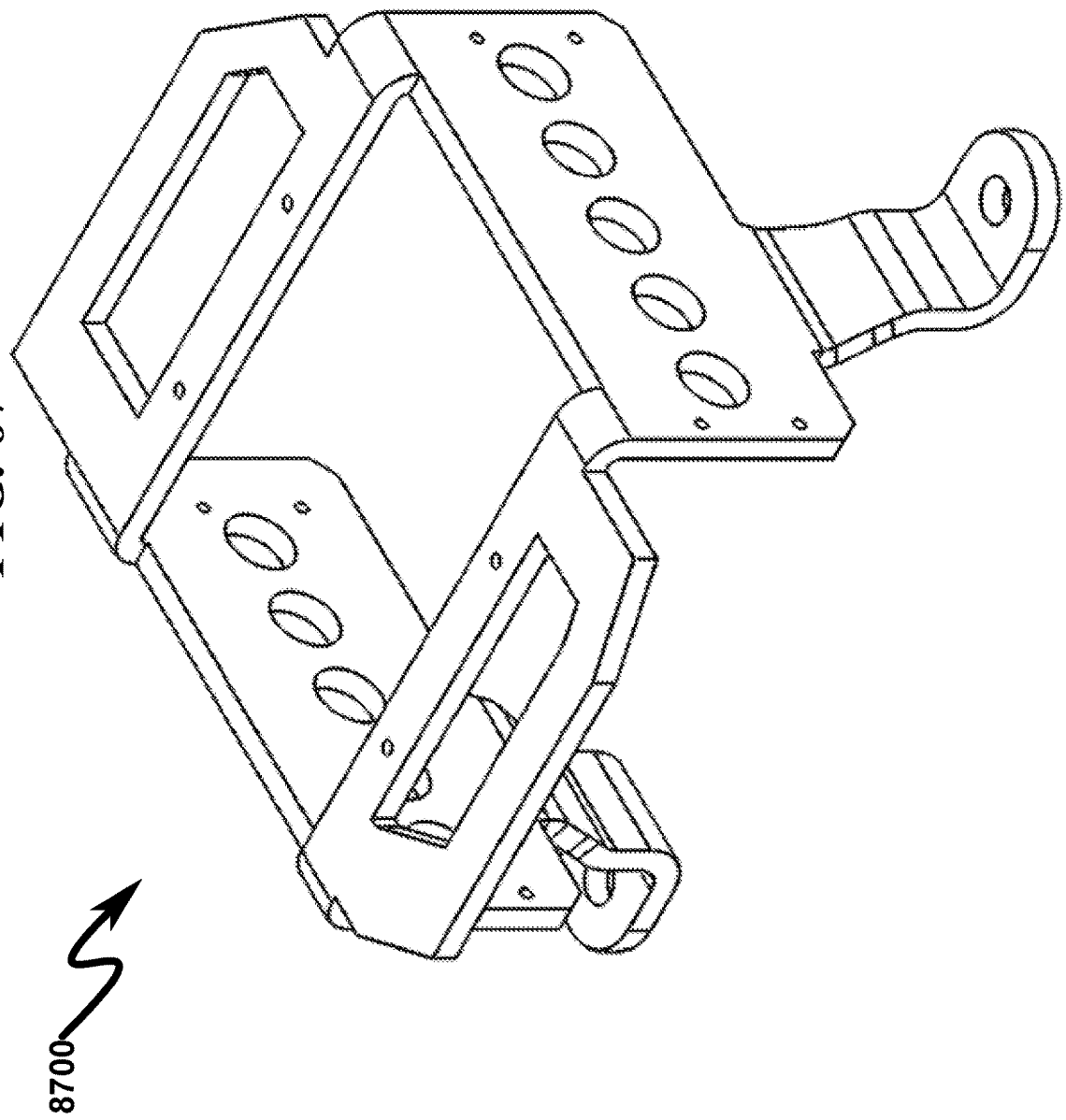
FIG. 87 illustrates a rear left top perspective view of a grounding support bracket (GSB) that may be useful in some preferred exemplary system embodiments.

FIG. 81 (8100)-FIG. 88 (8800) provide detailed views of the grounding support bracket (GSB). The GSB is typically fabricated from either carbon or stainless steel for rigidity and strength and formed using conventional sheet metal stamping and/or forming processes. Within this context the GSB typically incorporates a plurality of injection molding perforations (IMP) (8251, 8961, 9062) within its structure. These IMP (8251, 8961, 9062) allow the plastic or other material that is used to form the plastic encapsulating cover (PEC) to impregnate the ELECTROMAGNETIC INTERFERENCE FILTER SYSTEM AND METHOD structure of the GSB and provide additional mechanical support for the structure. Since the plastic encapsulating cover (PEC) injection molds the entire volume of the GSB, the mechanical support provided by the IMP (8251, 8961, 9062) serves to provide shock resistance as well as protection from harmful elements that may be present in the EV environment.

Figure 89:
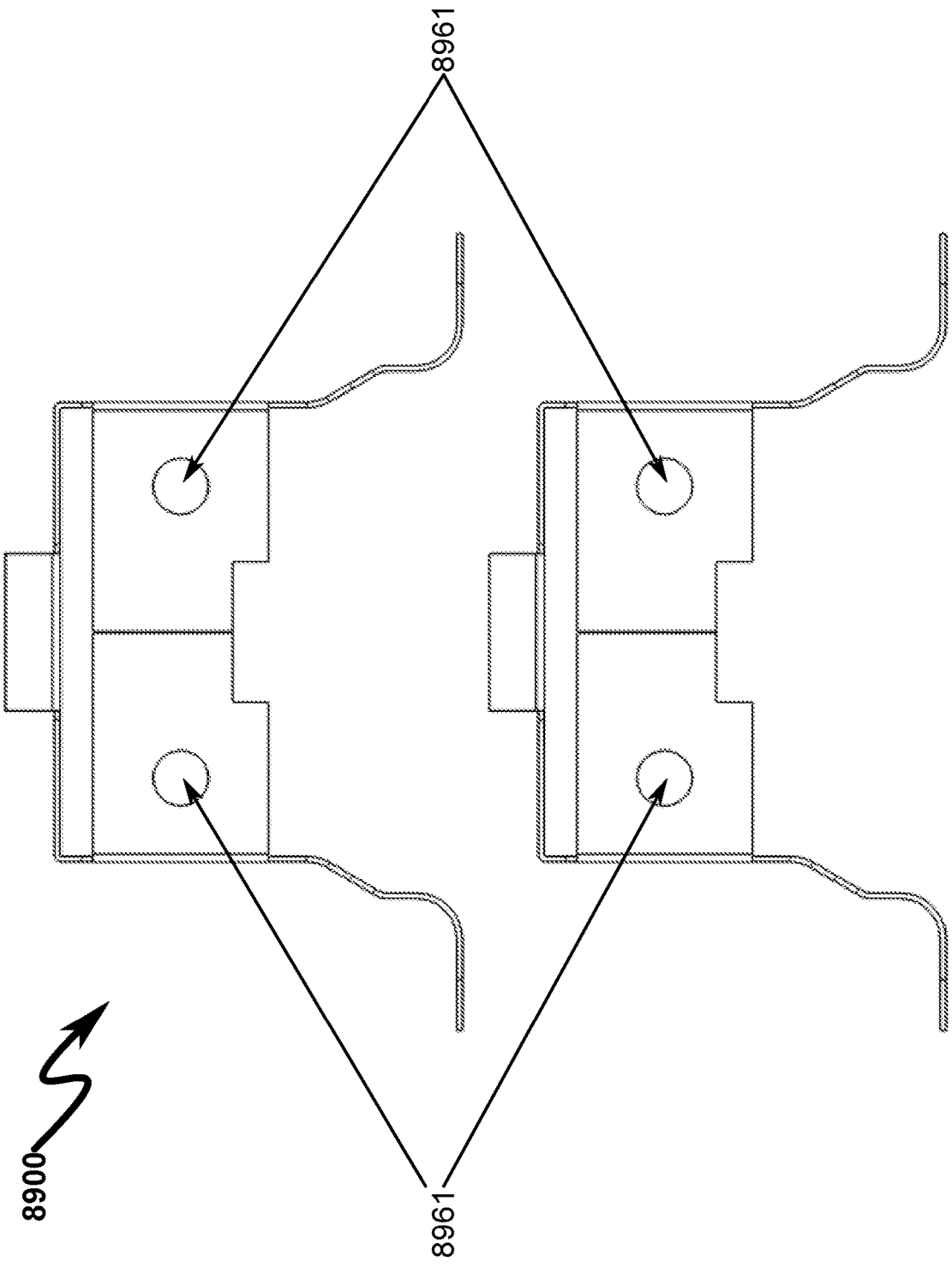
FIG. 89 illustrates front and rear views of a grounding support conductor (GSC) that may be useful in some preferred exemplary system embodiments.
Figure 90:
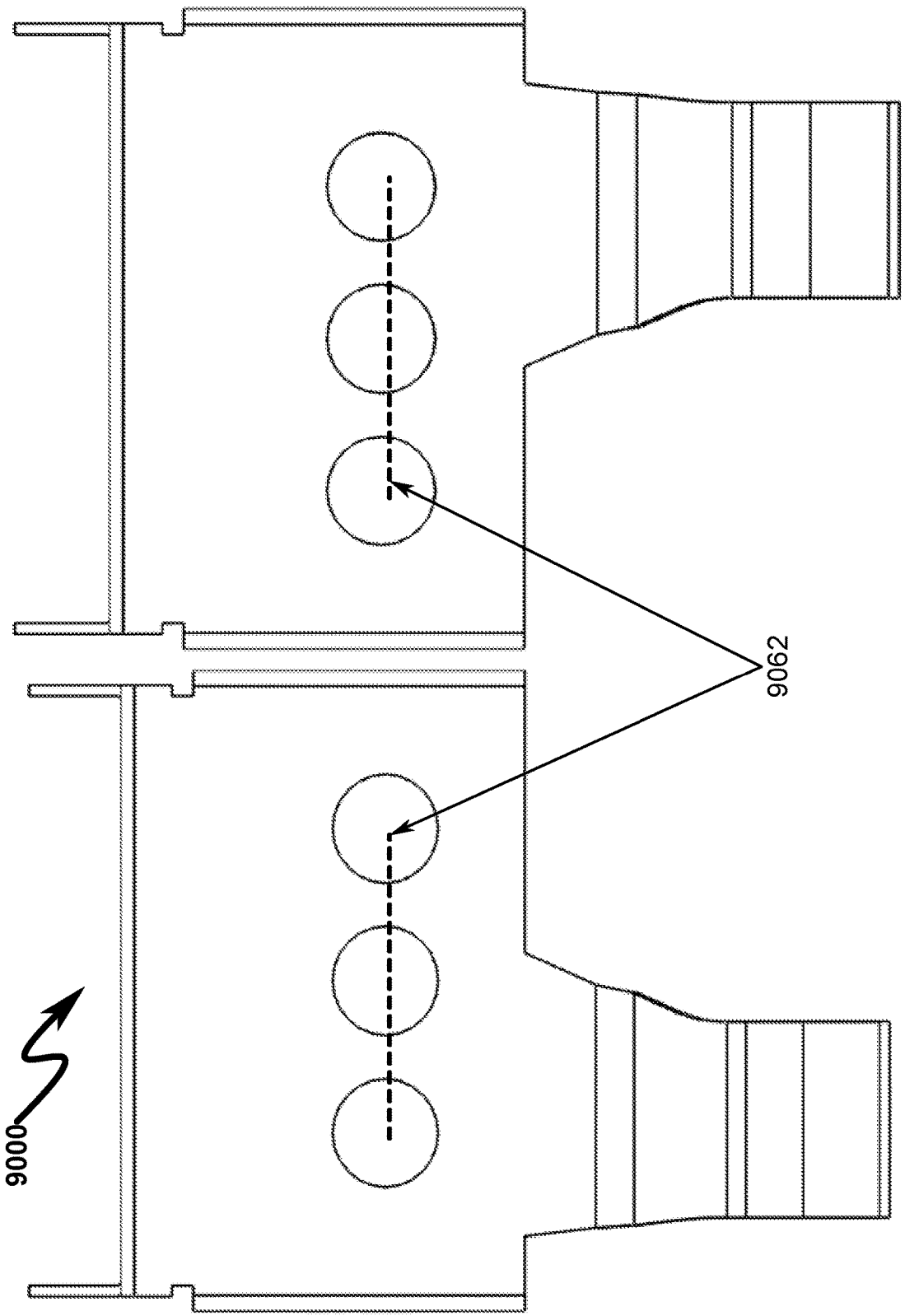
FIG. 90 illustrates left side and right side views of a grounding support conductor (GSC) that may be useful in some preferred exemplary system embodiments.
Figure 91:
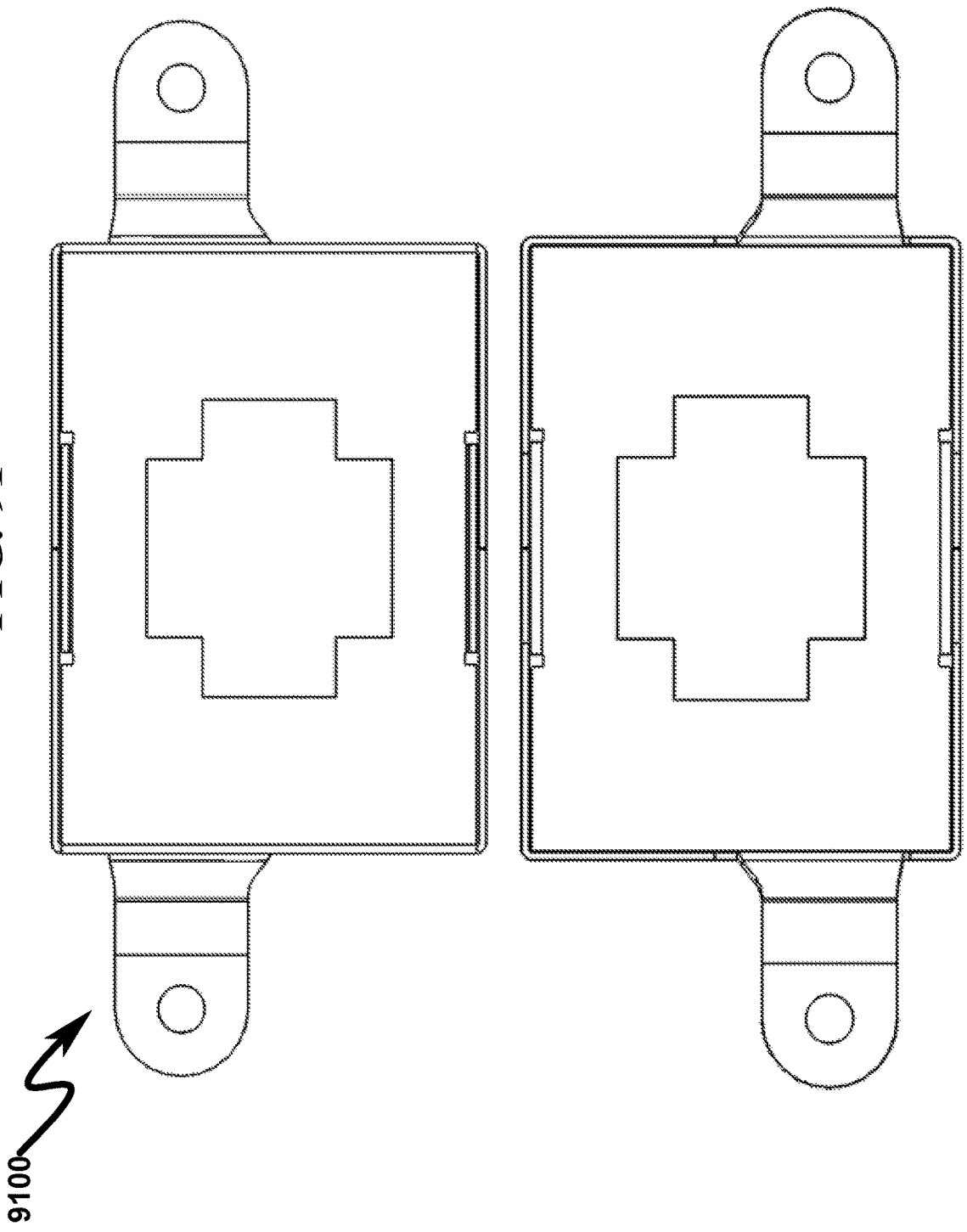
FIG. 91 illustrates top and bottom views of a grounding support conductor (GSC) that may be useful in some preferred exemplary system embodiments.
Figure 92:
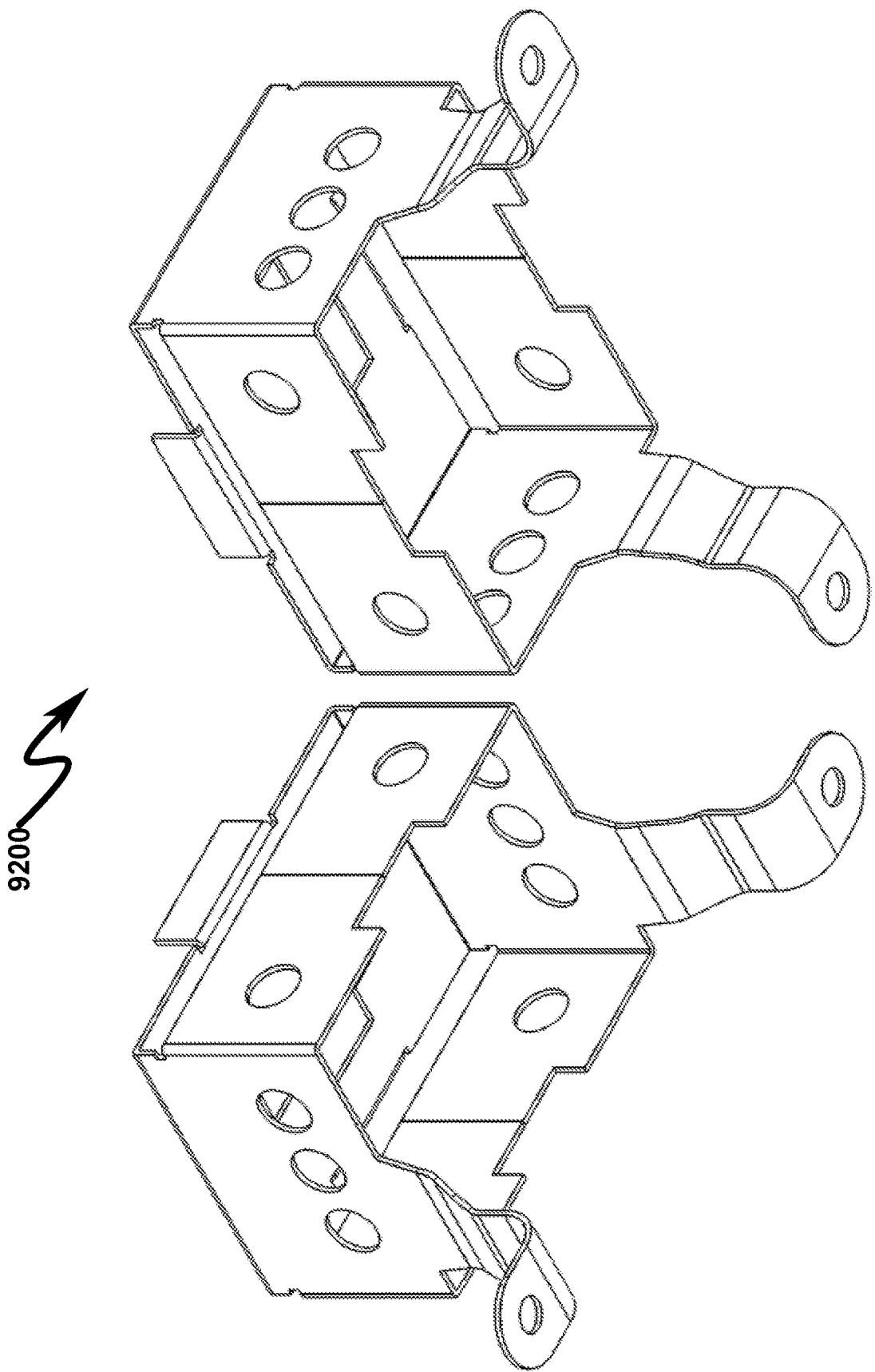
FIG. 92 illustrates bottom left and right side perspective views of a grounding support conductor (GSC) that may be useful in some preferred exemplary system embodiments.
Figure 93:
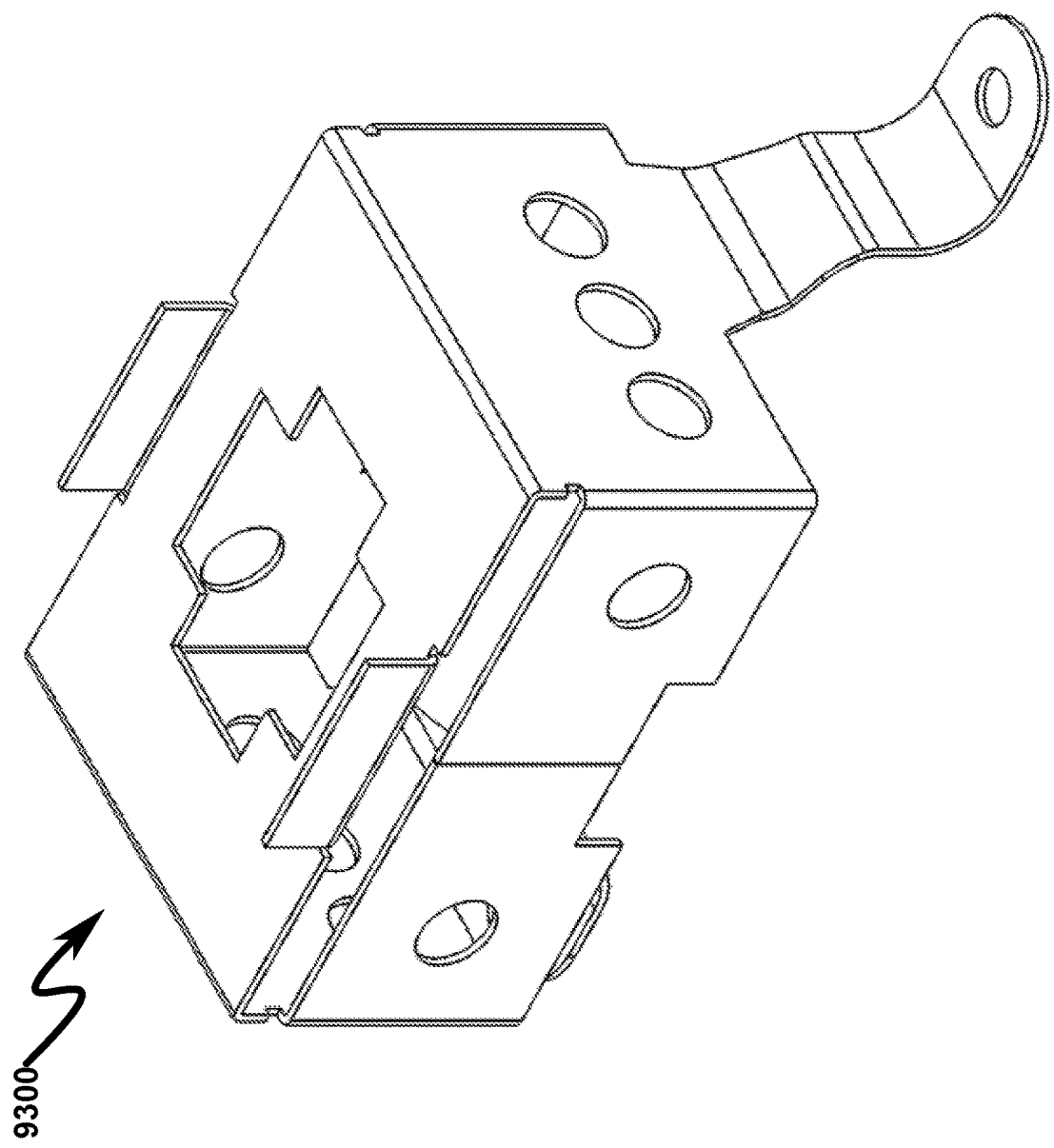
FIG. 93 illustrates a front right top perspective view of a grounding support conductor (GSC) that may be useful in some preferred exemplary system embodiments.
Figure 94:
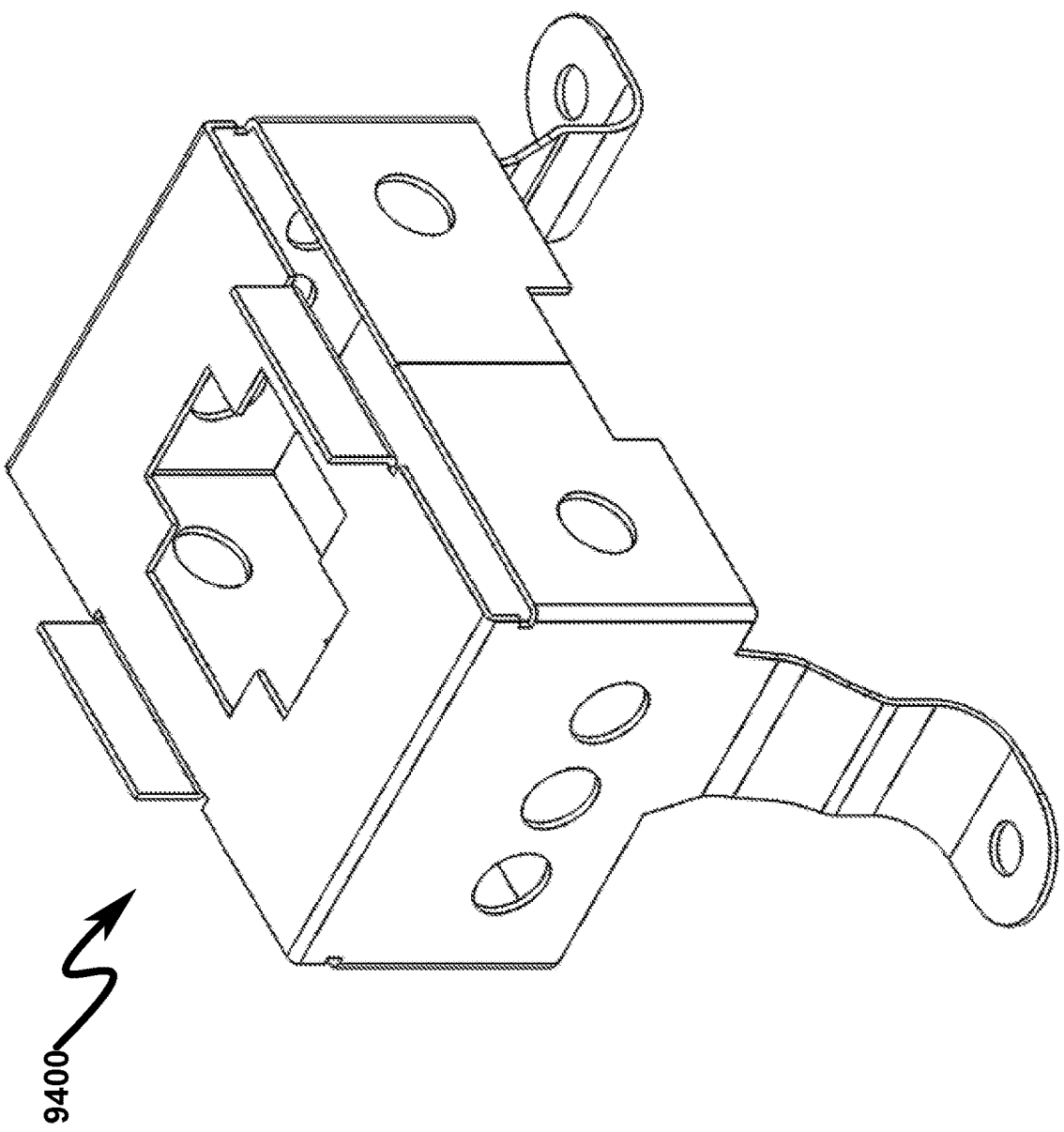
FIG. 94 illustrates a rear right top perspective view of a grounding support conductor (GSC) that may be useful in some preferred exemplary system embodiments.
Figure 95:
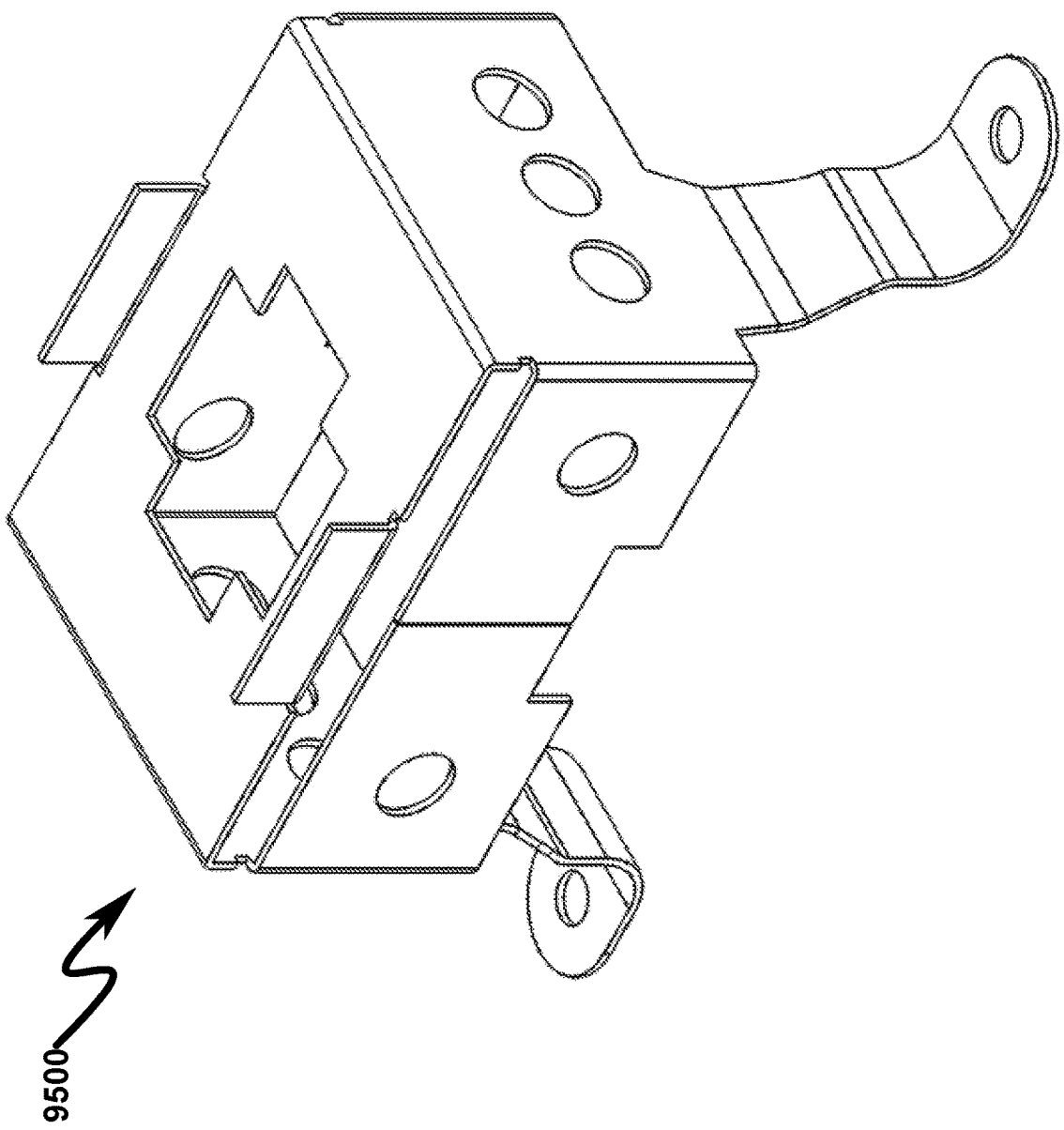
FIG. 95 illustrates a rear left top perspective view of a grounding support conductor (GSC) that may be useful in some preferred exemplary system embodiments.
Figure 96:
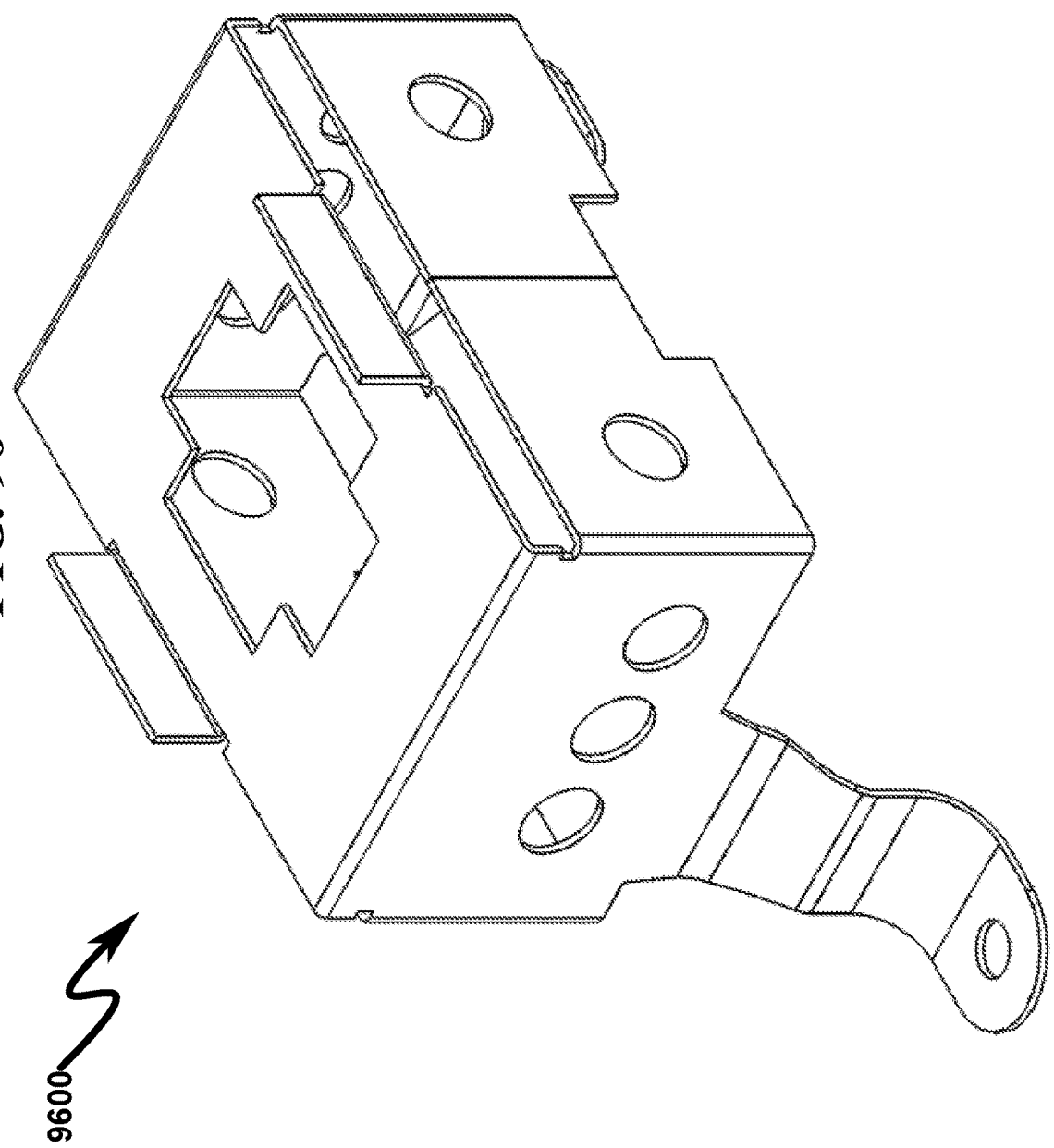
FIG. 96 illustrates a front left top perspective view of a grounding support conductor (GSC) that may be useful in some preferred exemplary system embodiments.

FIG. 89 (8900)-FIG. 96 (9600) provide detailed views of the grounding support conductor (GSC). The GSC is formed to conform to the underside of the GSB and also contains a plurality of injection molding perforations (IMP) (8251, 8961, 9062) that are provided to capture the plastic or other material that is used to form the plastic encapsulating cover (PEC) to impregnate the structure of the GSB and provide additional mechanical support for the structure. The GSC is fabricated from copper or another metallic material with high conductivity to allow a reduction in resistive and inductive parasitics that are normally associated with the steel fabrication of the GSB. Thus, the GSC provides an electrical bypass path for current to flow between various electrical components in the EIF to the EV ground reference while at the same time minimizing parasitics in the electrical circuit that would detrimentally impact the RF performance of the EIF.

Figure 80:
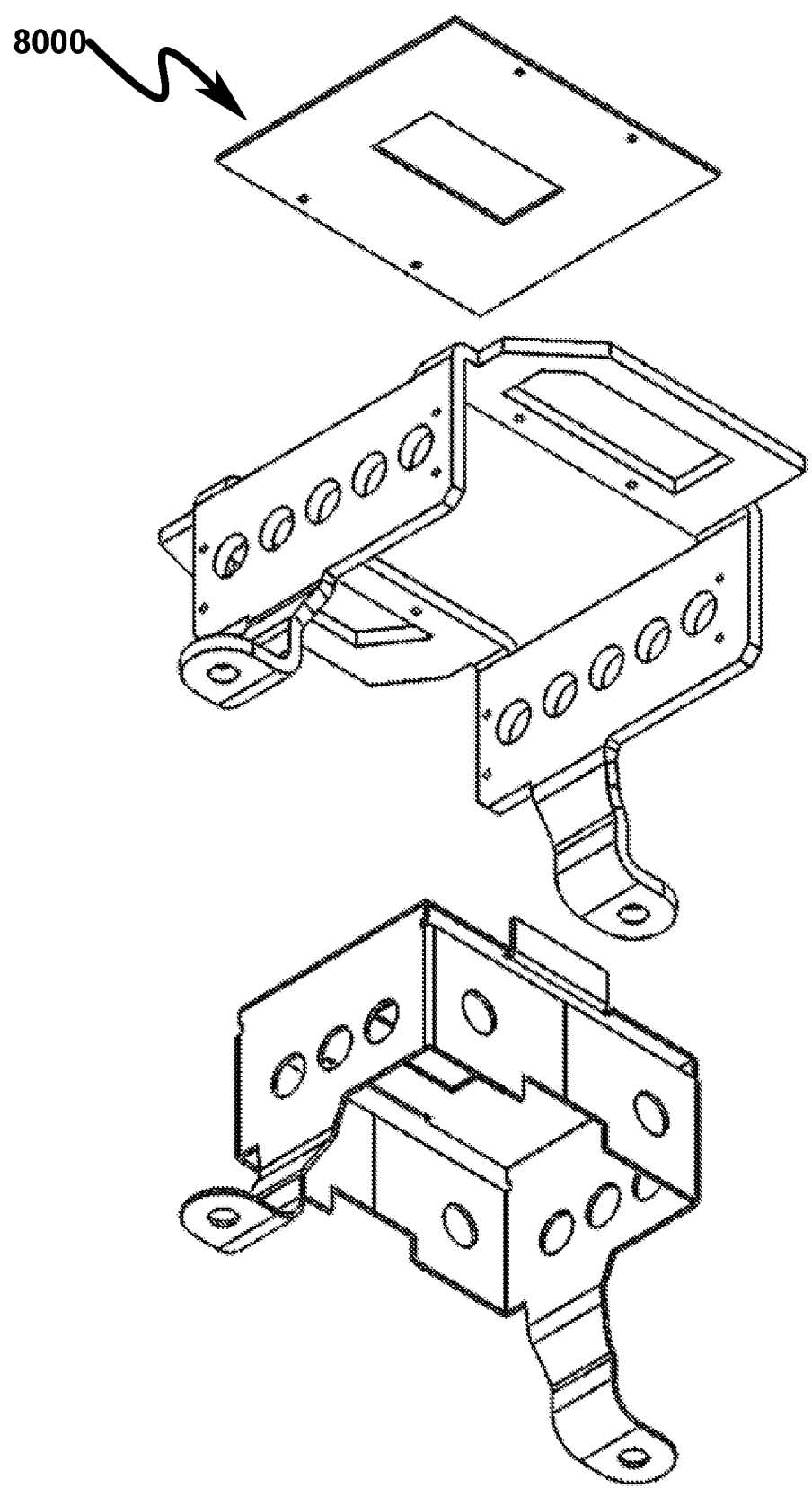
FIG. 80 illustrates a front left bottom perspective assembly view of a grounding support assembly (GSA) depicting the grounding support bracket (GSB), grounding support conductor (GSC), and grounding support insulator (GSI) that may be useful in some preferred exemplary system embodiments.

The assembly views of FIG. 73 (7300)-FIG. 80 (8000) provide detailed views of the grounding support insulator (GSI) that provides insulation between the GSA and the inductor core assembly (ICA). This and other insulators used within the EIF system depicted are generally fabricated using FR4 glass fiber material or like insulating materials but may also be formed using plastic or other insulating materials.

Exemplary Application Context (9700)-(11200)

Figure 97:
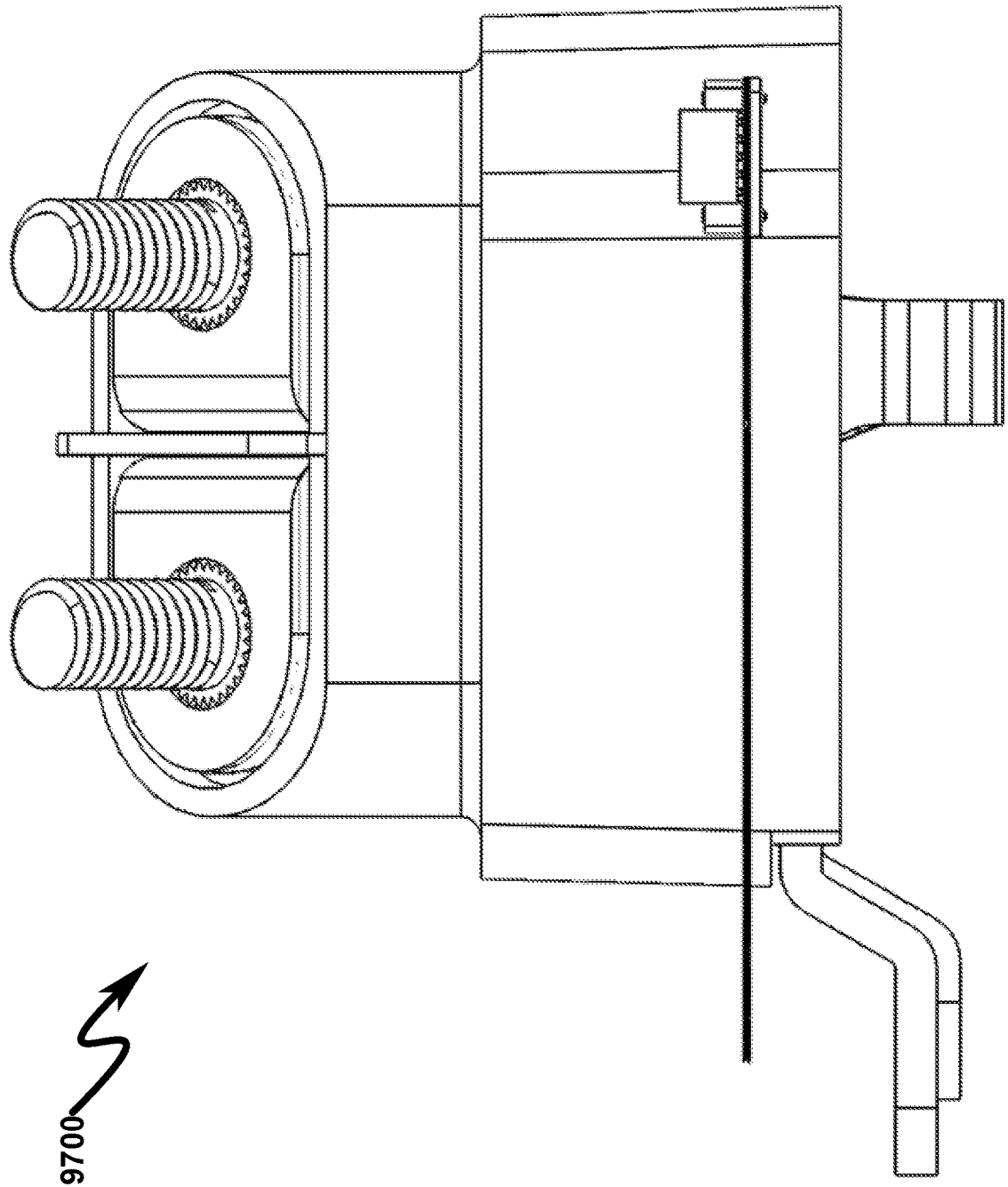
FIG. 97 illustrates a front view of a preferred exemplary system embodiment of the present invention in conjunction with an optional sensing cable.
Figure 98:
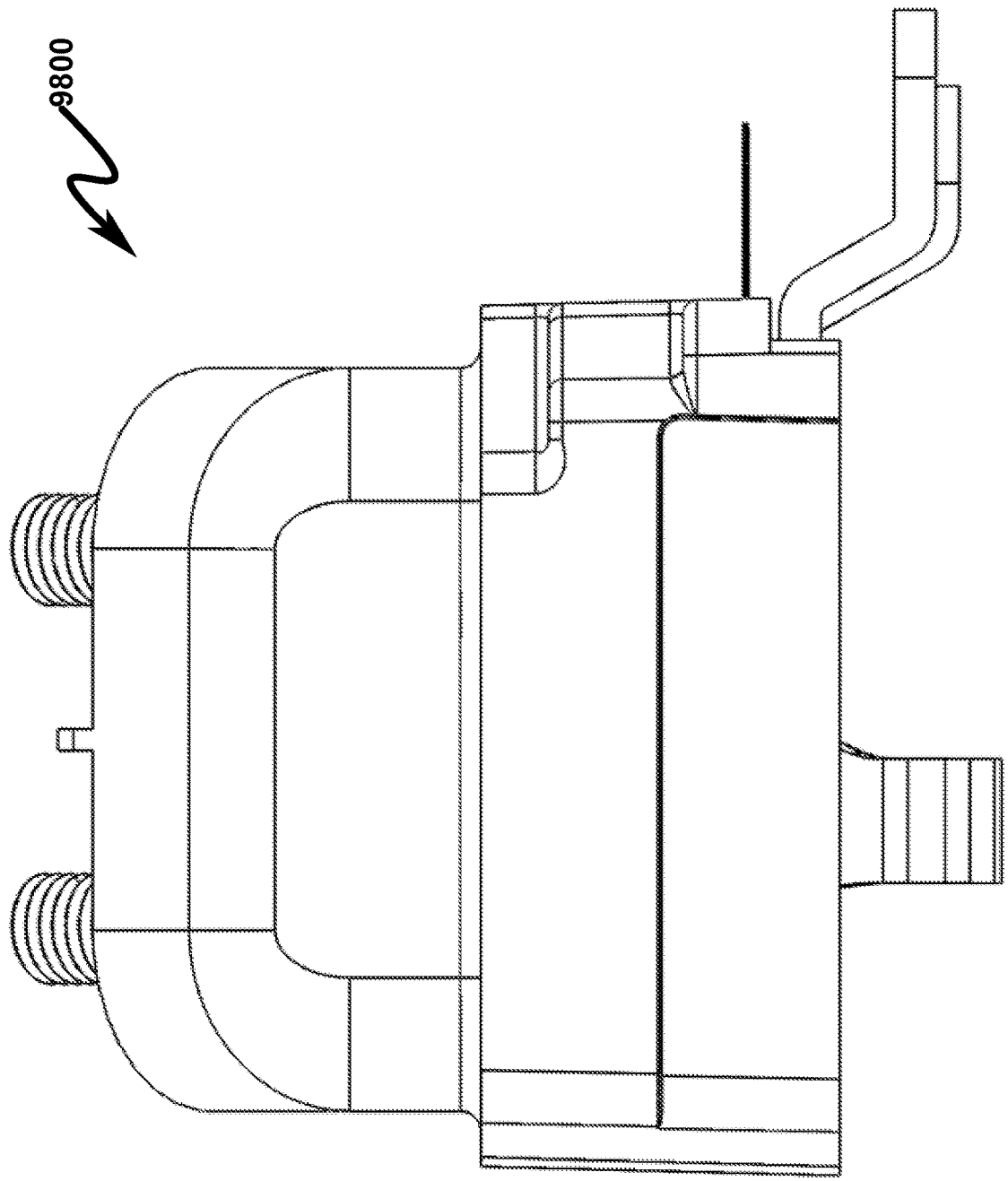
FIG. 98 illustrates a rear view of a preferred exemplary system embodiment of the present invention in conjunction with an optional sensing cable.
Figure 99:
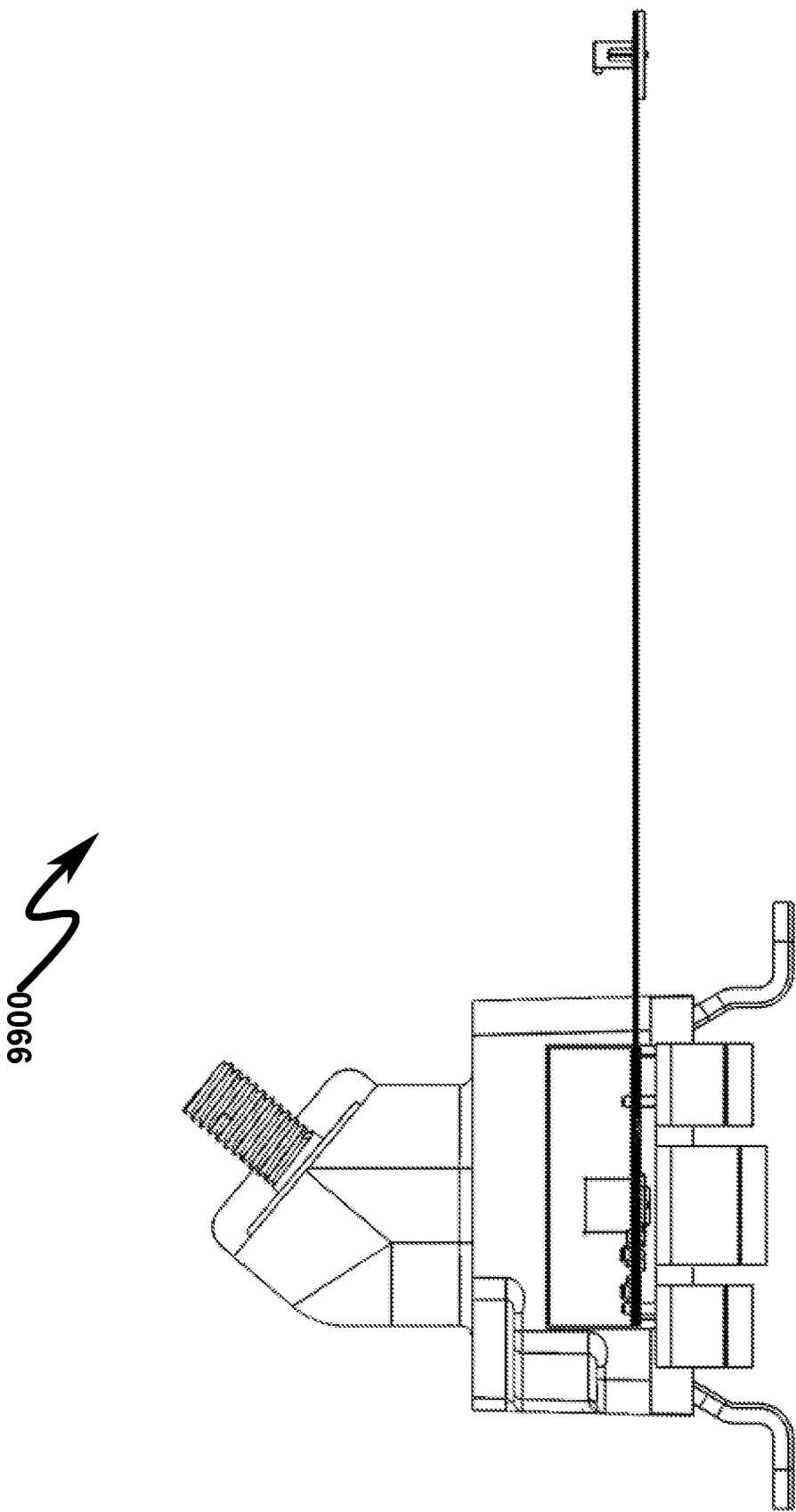
FIG. 99 illustrates a left side view of a preferred exemplary system embodiment of the present invention in conjunction with an optional sensing cable.
Figure 100:
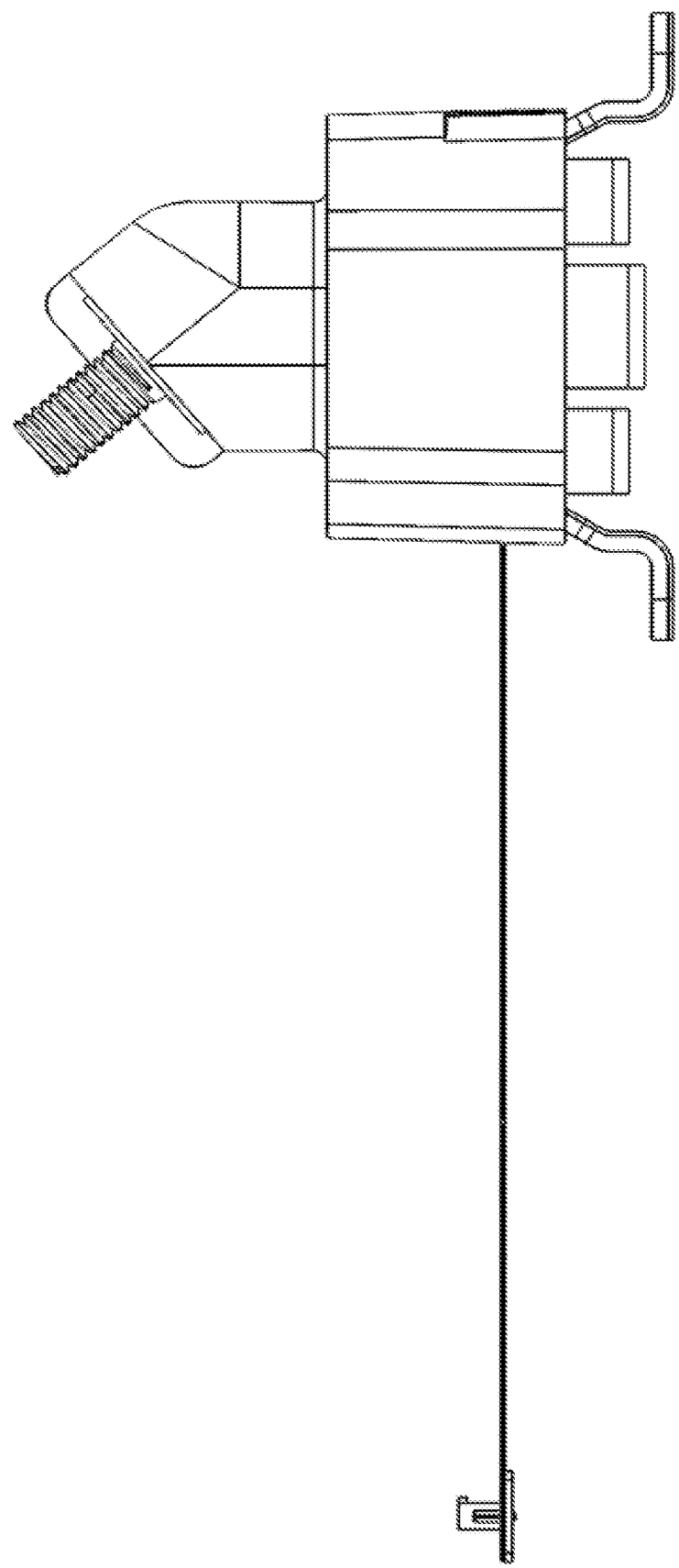
FIG. 100 illustrates a right side view of a preferred exemplary system embodiment of the present invention in conjunction with an optional sensing cable.
Figure 101:
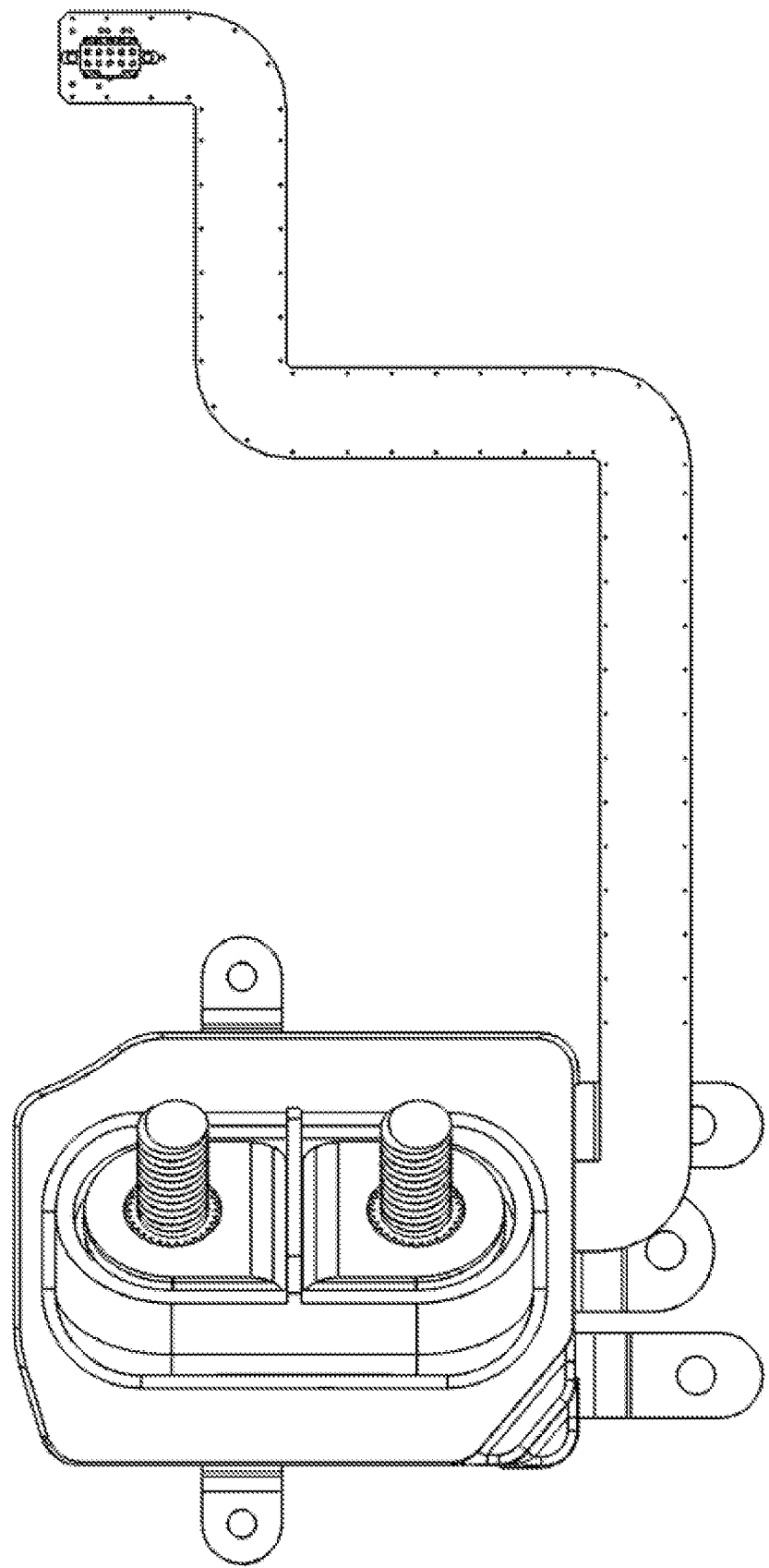
FIG. 101 illustrates a top view of a preferred exemplary system embodiment of the present invention in conjunction with an optional sensing cable.
Figure 102:
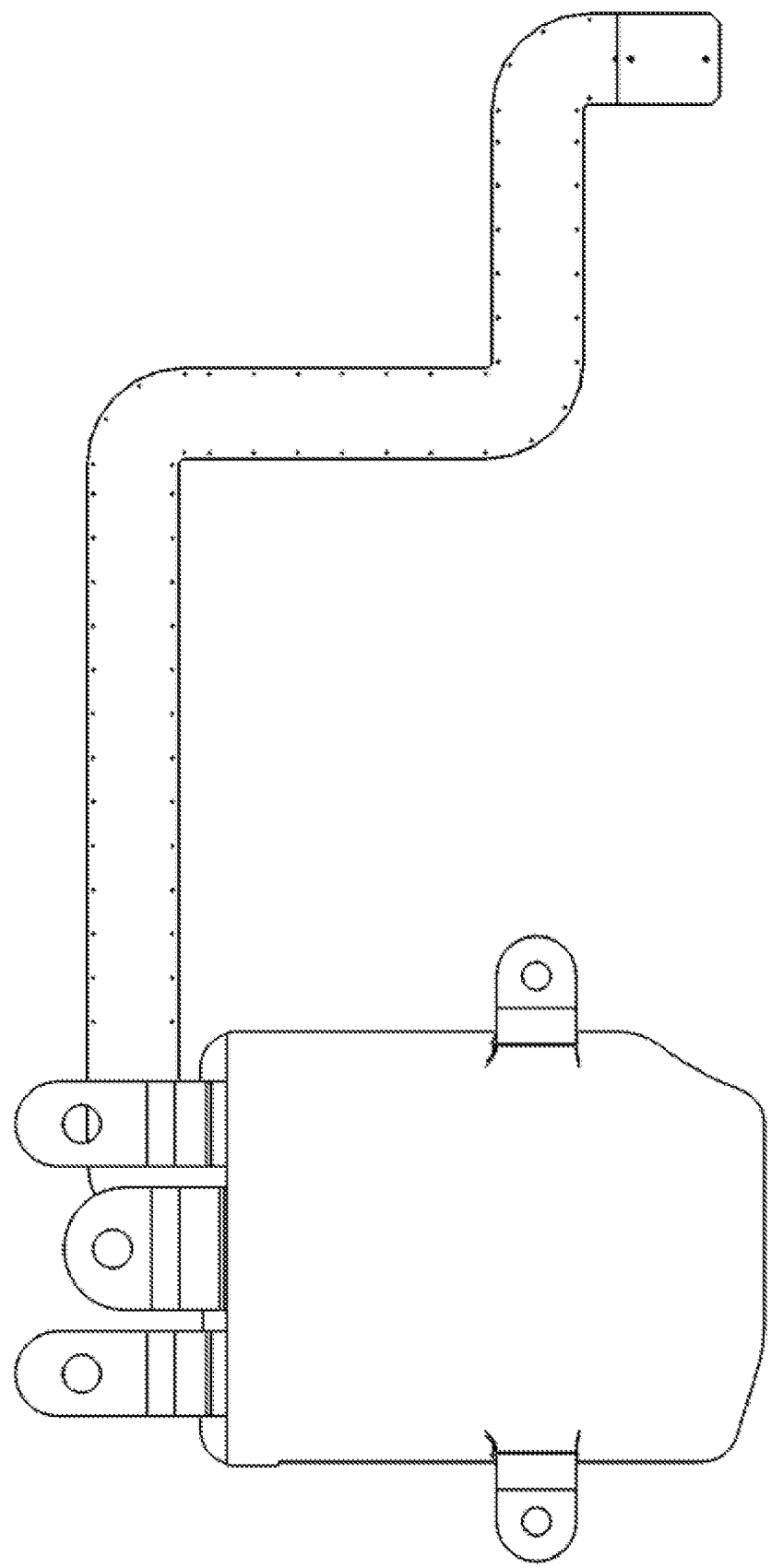
FIG. 102 illustrates a bottom view of a preferred exemplary system embodiment of the present invention in conjunction with an optional sensing cable.
Figure 103:
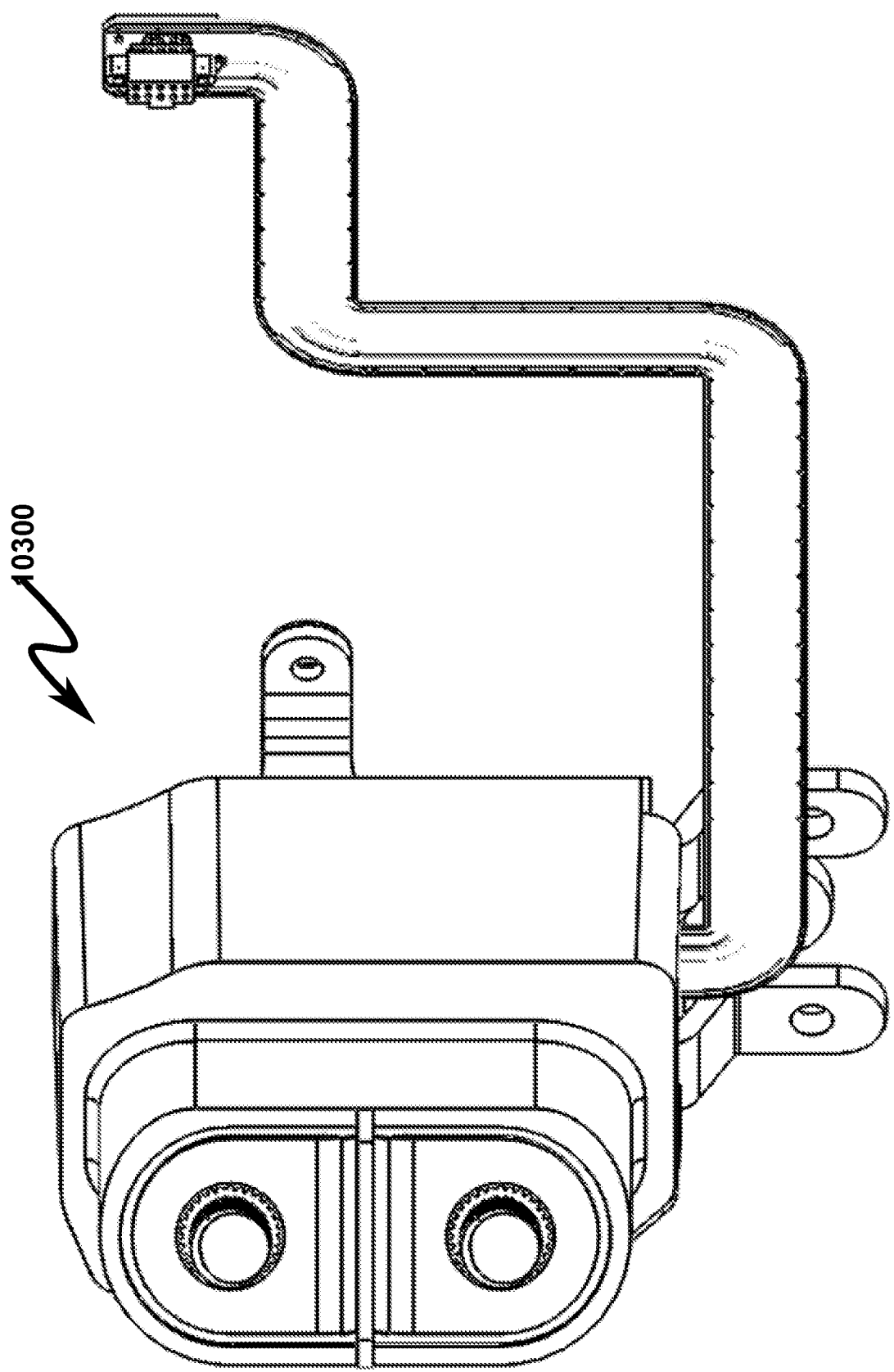
FIG. 103 illustrates a rear top perspective view of a preferred exemplary system embodiment of the present invention in conjunction with an optional sensing cable.
Figure 104:
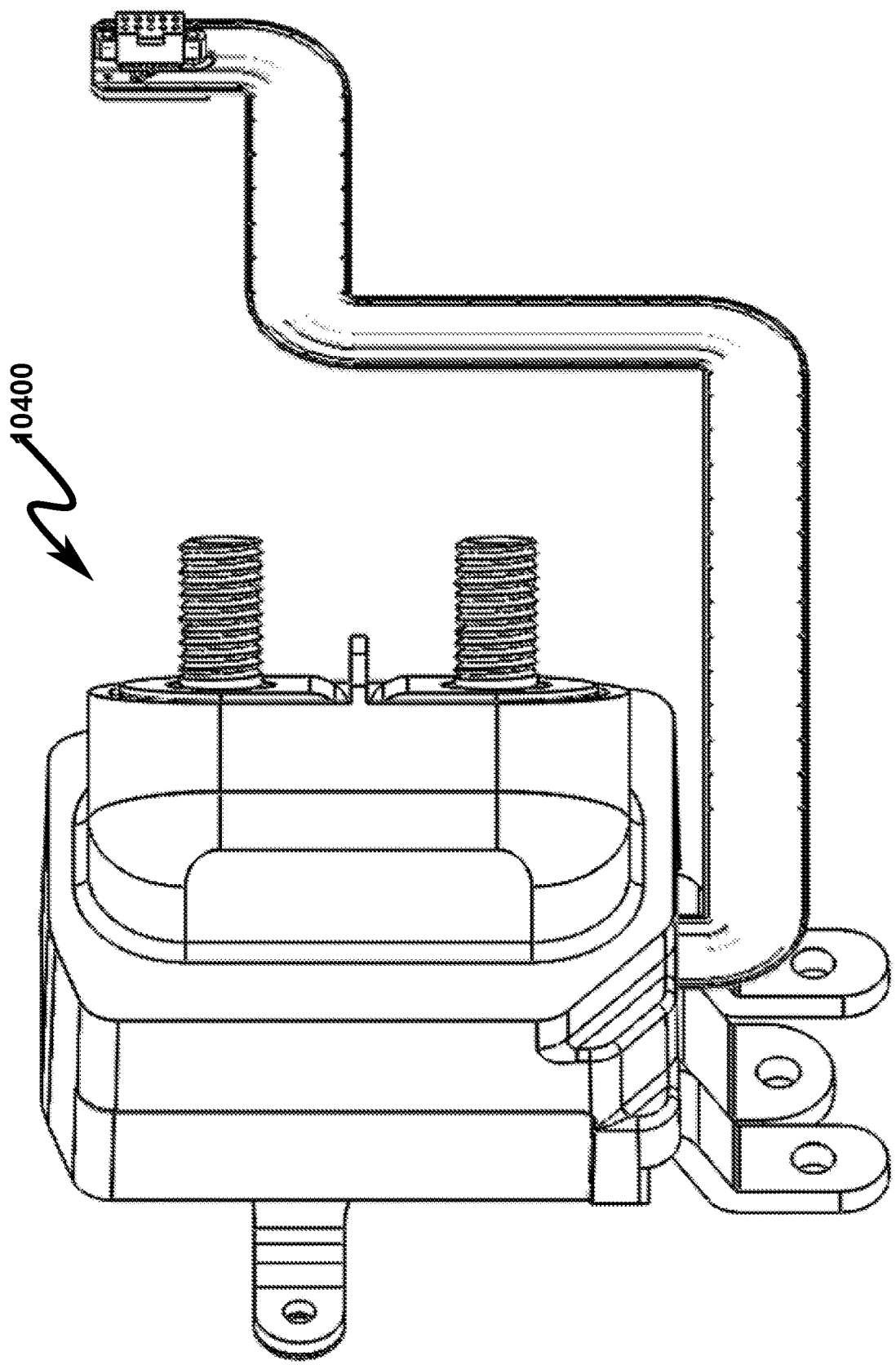
FIG. 104 illustrates a front top perspective view of a preferred exemplary system embodiment of the present invention in conjunction with an optional sensing cable.
Figure 105:
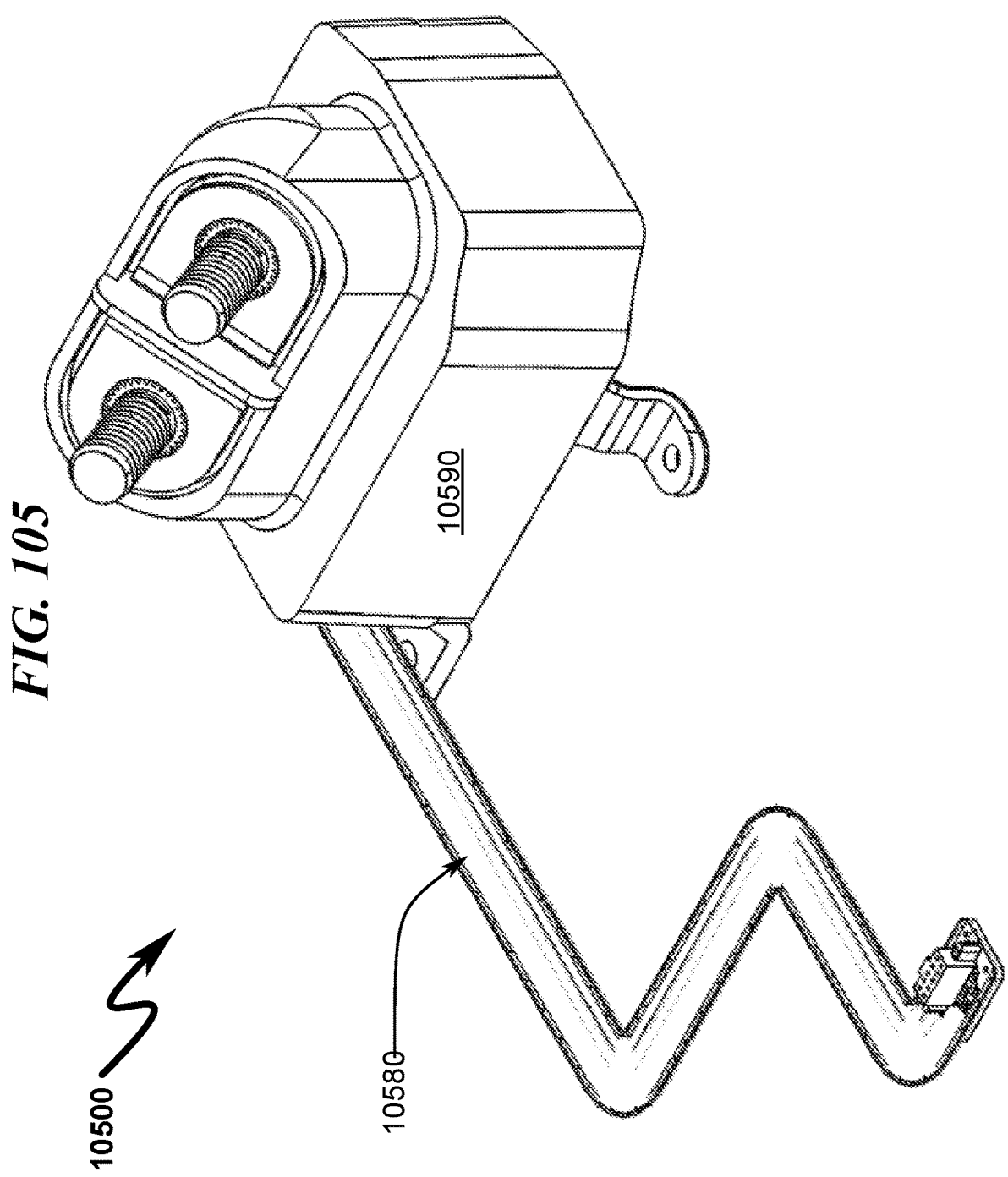
FIG. 105 illustrates a front right top perspective view of a preferred exemplary system embodiment of the present invention in conjunction with an optional sensing cable.
Figure 106:
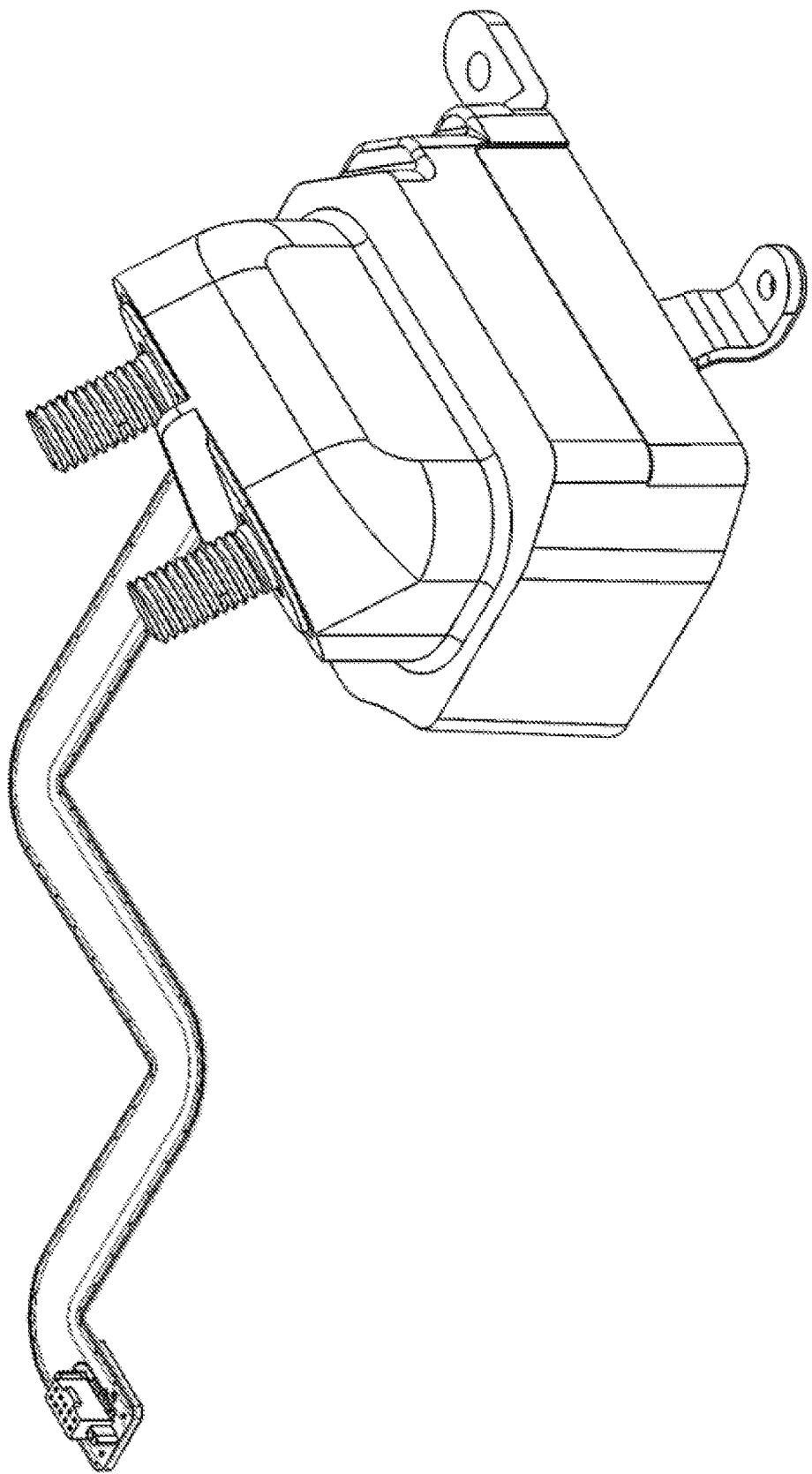
FIG. 106 illustrates a rear right top perspective view of a preferred exemplary system embodiment of the present invention in conjunction with an optional sensing cable.
Figure 107:
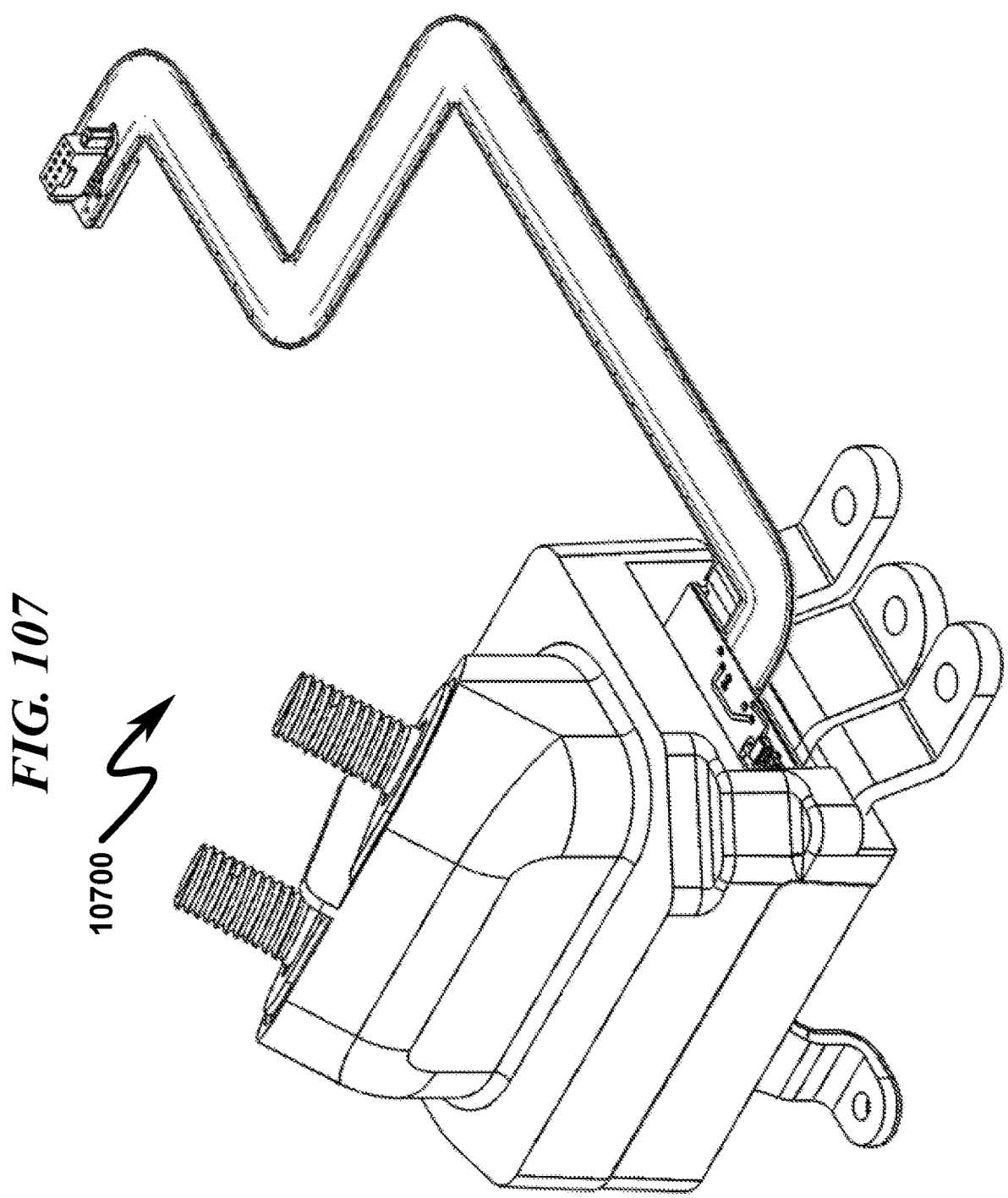
FIG. 107 illustrates a rear left top perspective view of a preferred exemplary system embodiment of the present invention in conjunction with an optional sensing cable.
Figure 108:
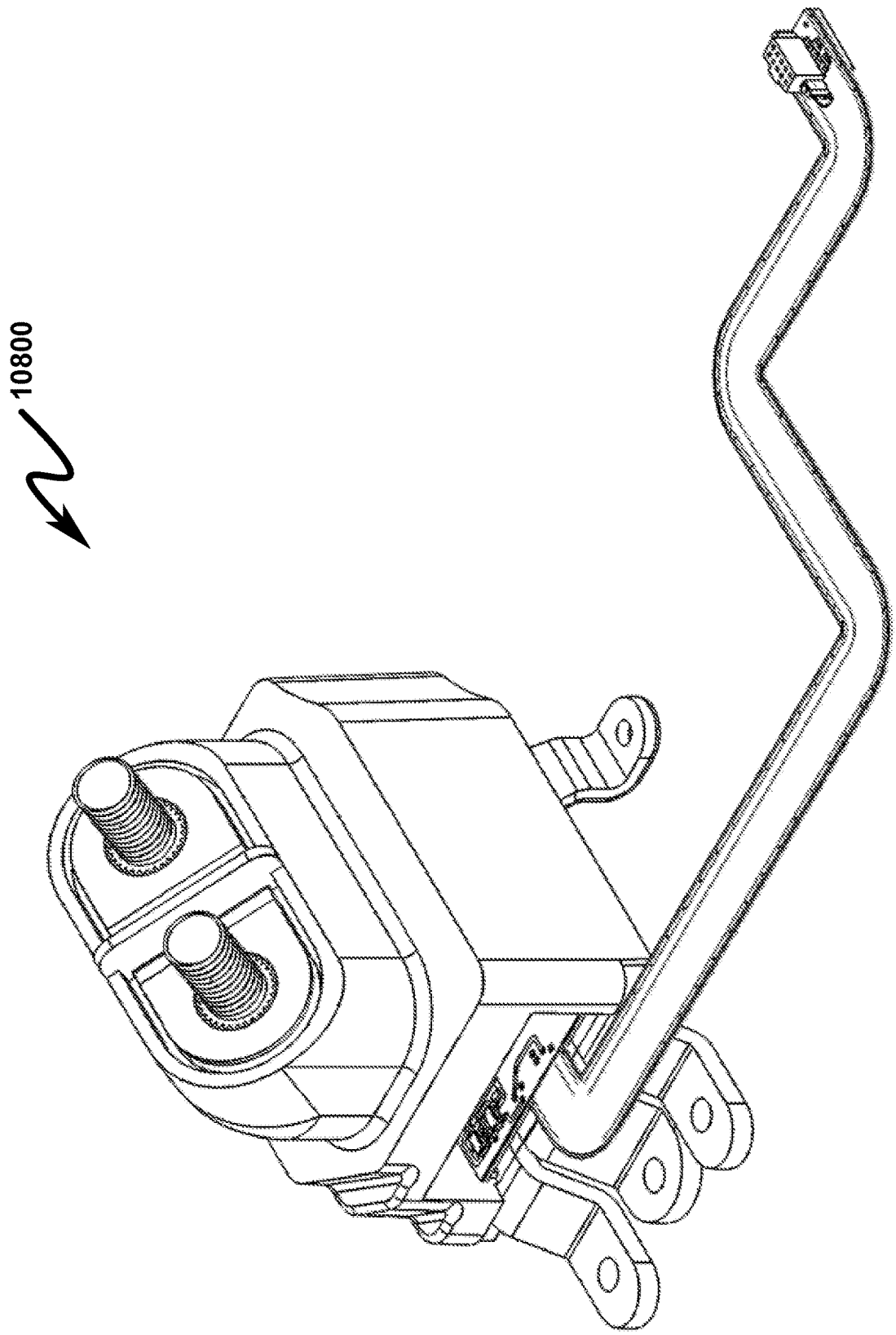
FIG. 108 illustrates a front left top perspective view of a preferred exemplary system embodiment of the present invention in conjunction with an optional sensing cable.
Figure 109:
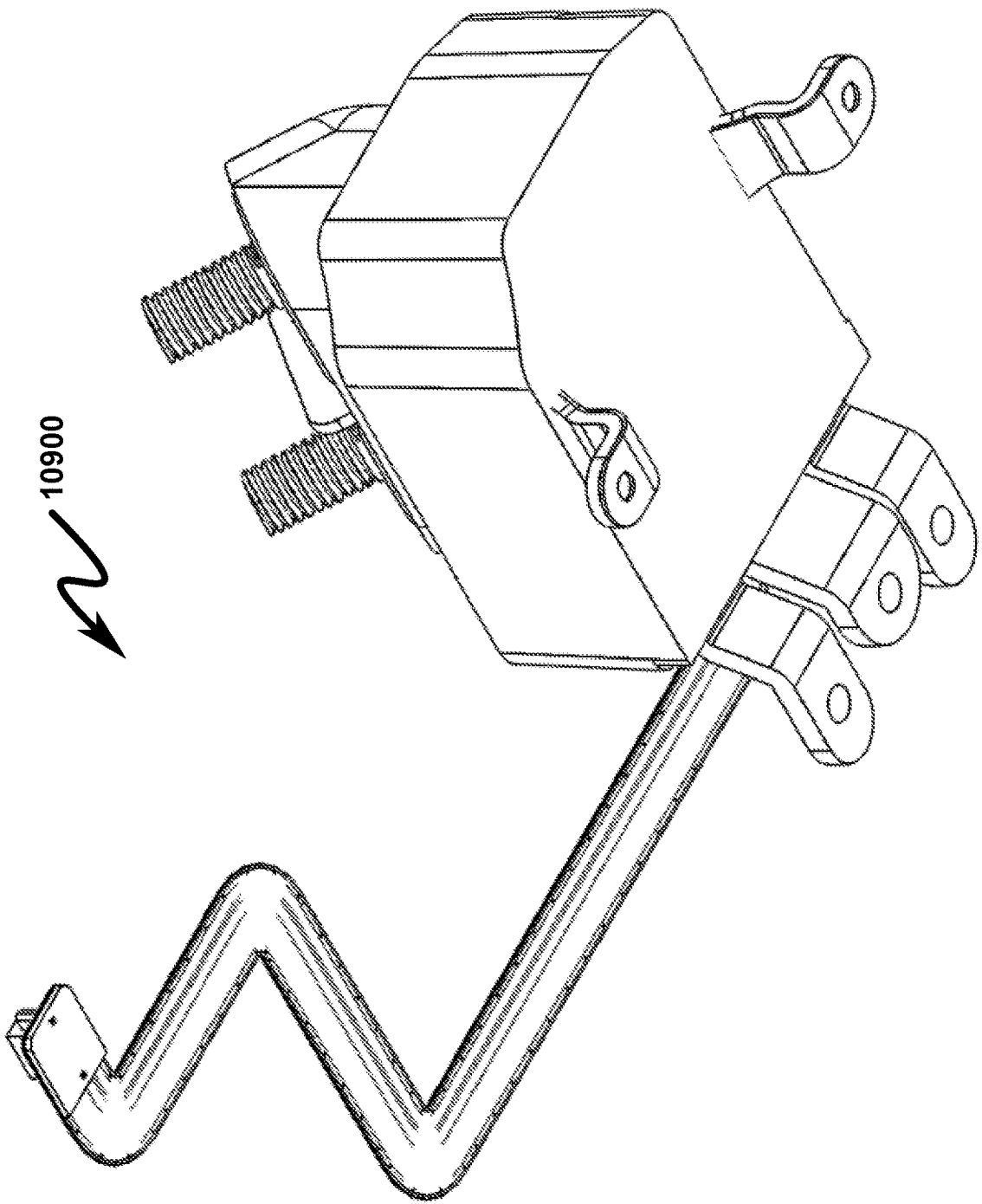
FIG. 109 illustrates a front right bottom perspective view of a preferred exemplary system embodiment of the present invention in conjunction with an optional sensing cable.
Figure 110:
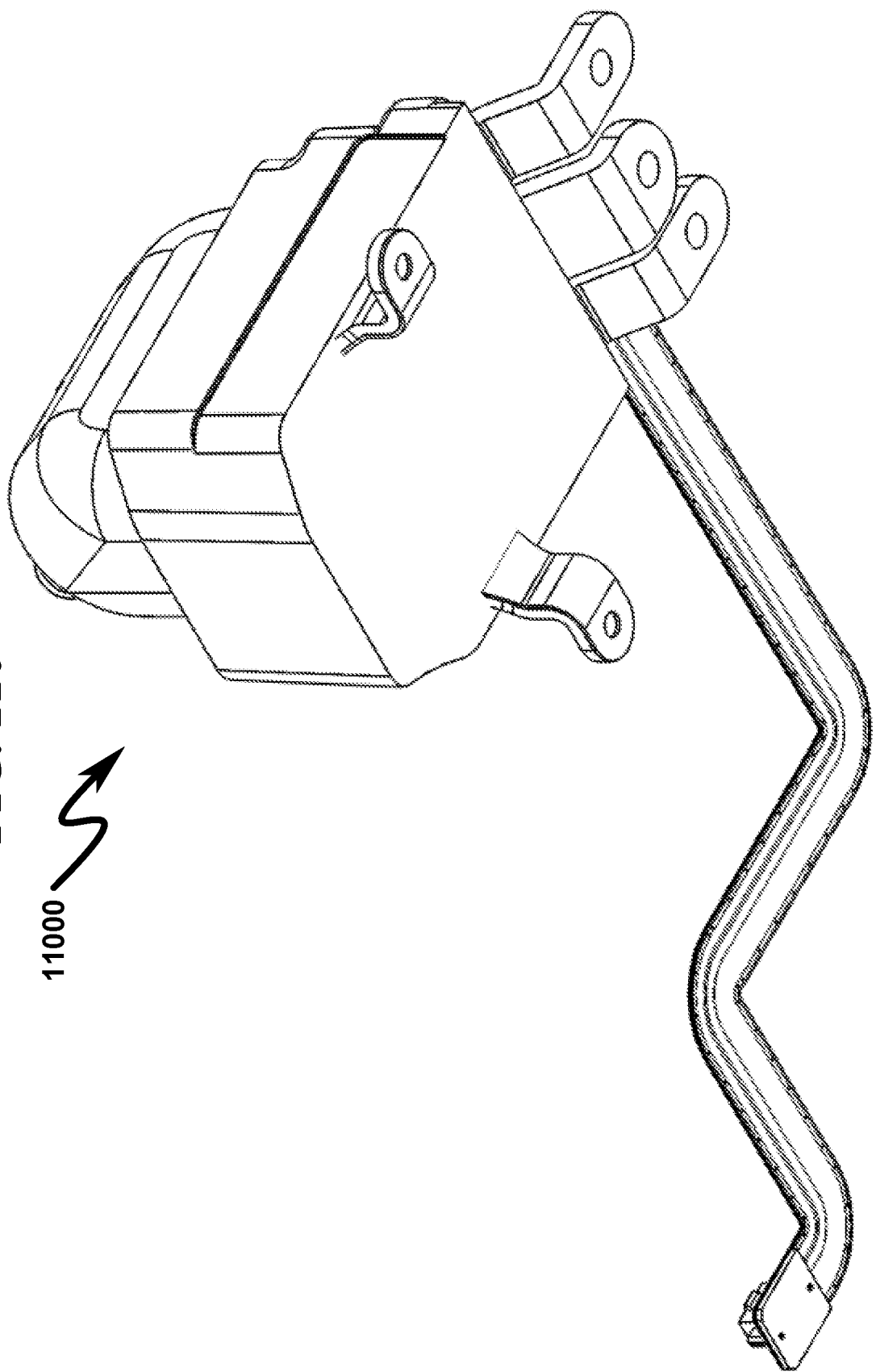
FIG. 110 illustrates a rear right bottom perspective view of a preferred exemplary system embodiment of the present invention in conjunction with an optional sensing cable.
Figure 111:
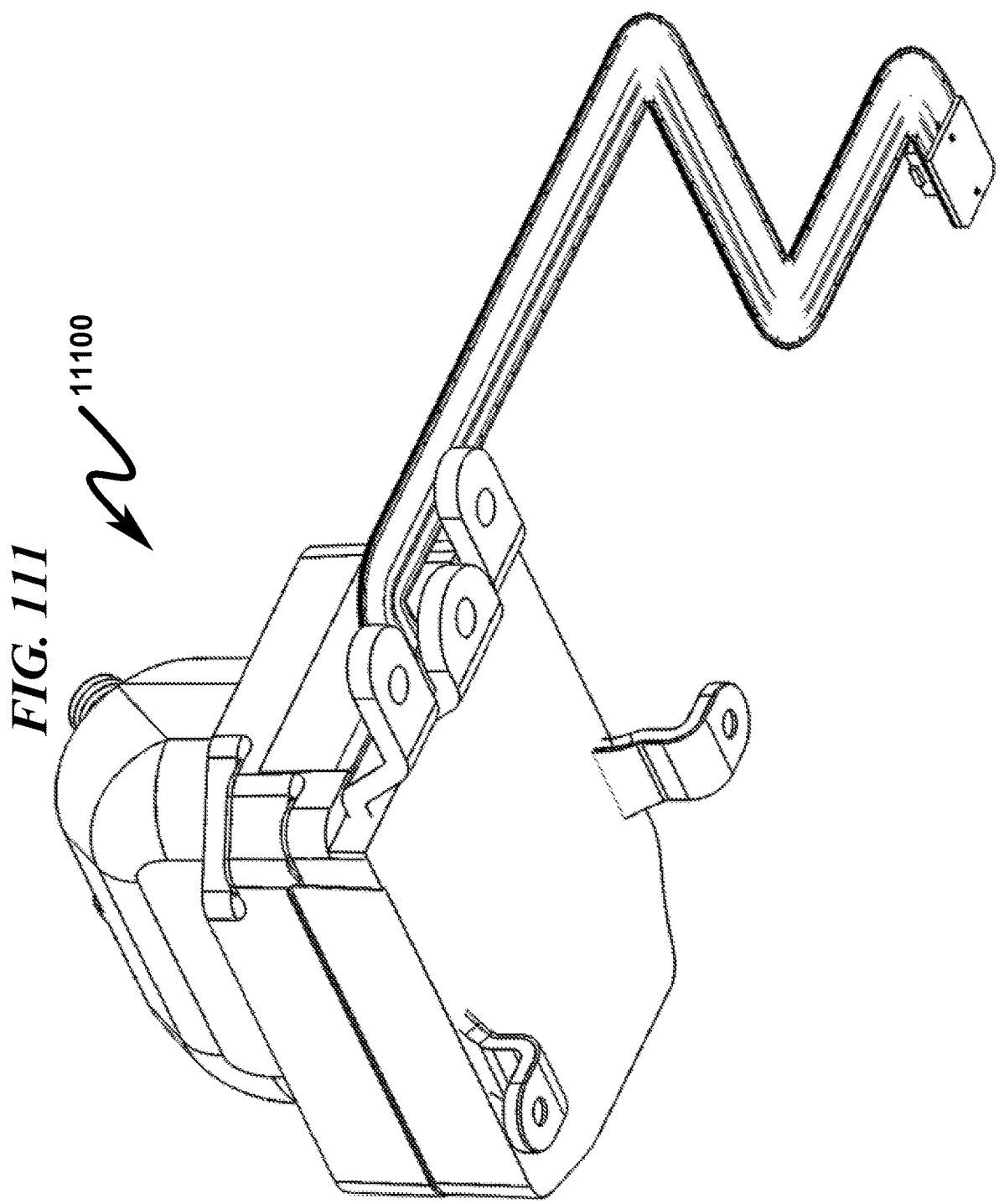
FIG. 111 illustrates a rear left bottom perspective view of a preferred exemplary system embodiment of the present invention in conjunction with an optional sensing cable.
Figure 112:
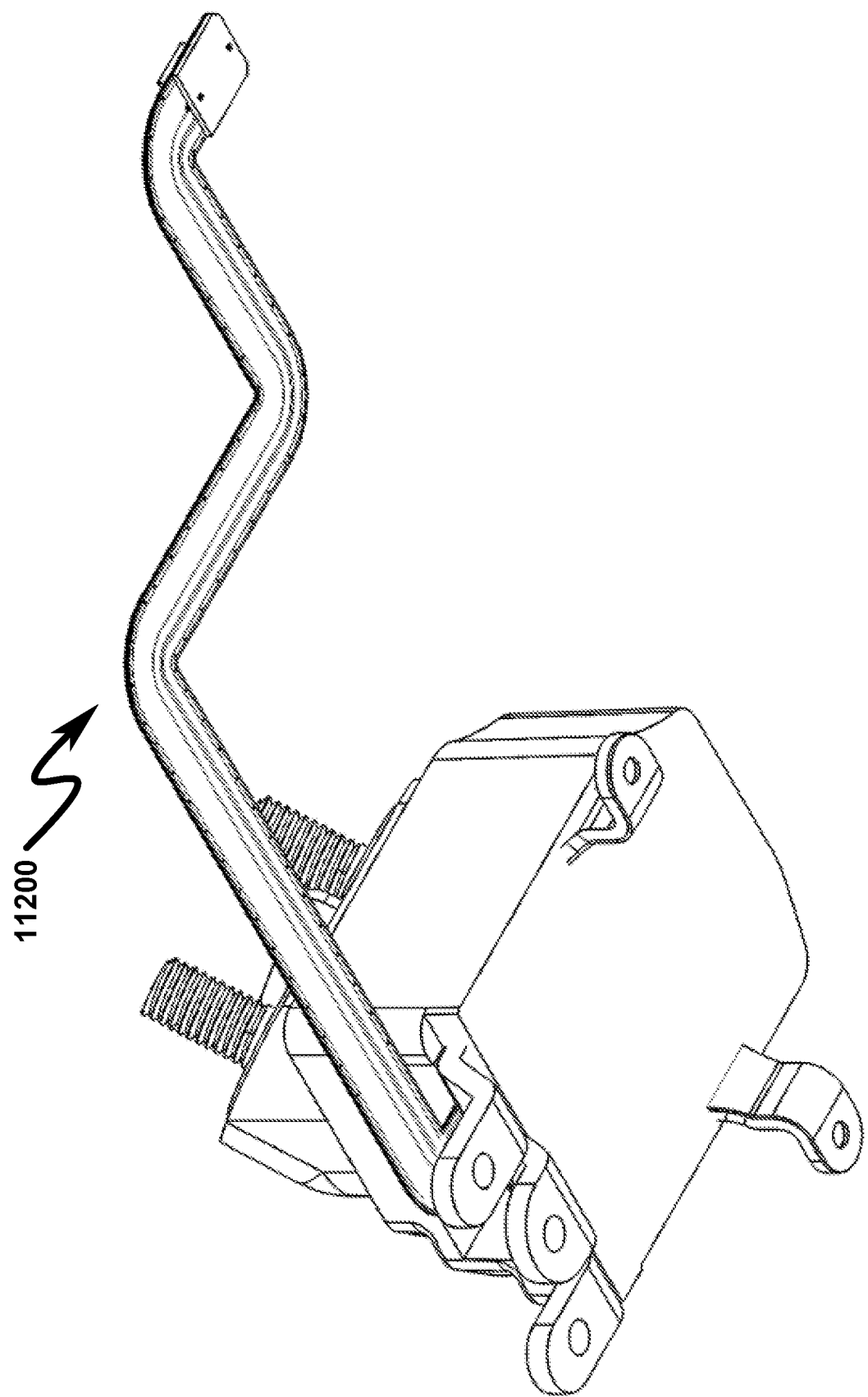
FIG. 112 illustrates a front left bottom perspective view of a preferred exemplary system embodiment of the present invention in conjunction with an optional sensing cable.

An exemplary application context for the present invention is generally depicted in FIG. 97 (9700)-FIG. 112 (11200) wherein a sensor cable assembly (10580) augments the the EIF assembly (10590) to provide for thru-current and/or voltage sensing capabilities of the BUS+/BUS− and/or CON+/CON− connections of the EIF. One skilled in the art will recognize a variety of methodologies are available to monitor thru-current and/or voltage sensing within the BUS+/BUS− and/or CON+/CON− connections of the EIF.

Detailed Assembly Views (11300)-(12800)

Figure 113:
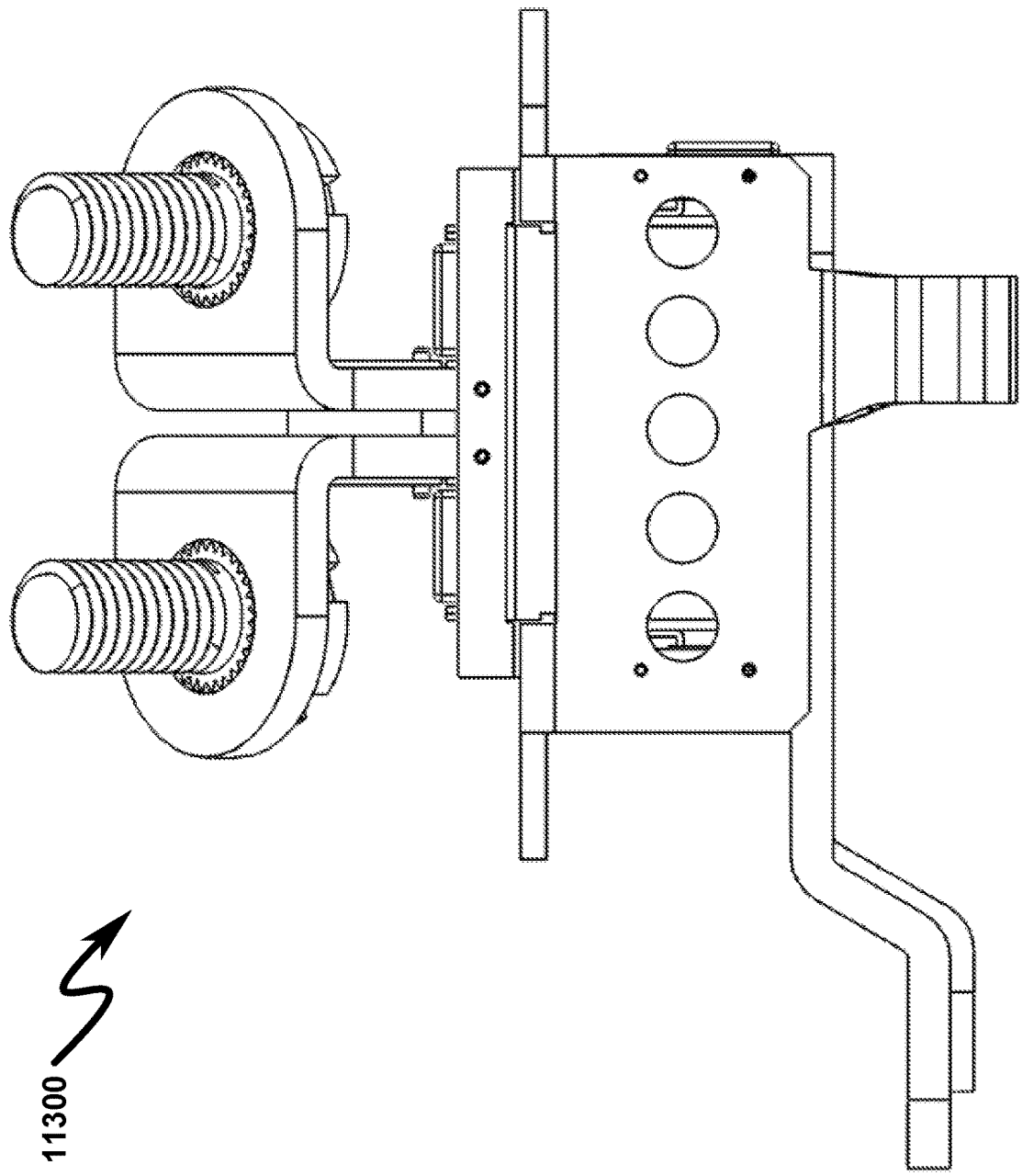
FIG. 113 illustrates a front view of a preferred exemplary system embodiment of the present invention with plastic encapsulating cover (PEC) suppressed.
Figure 114:
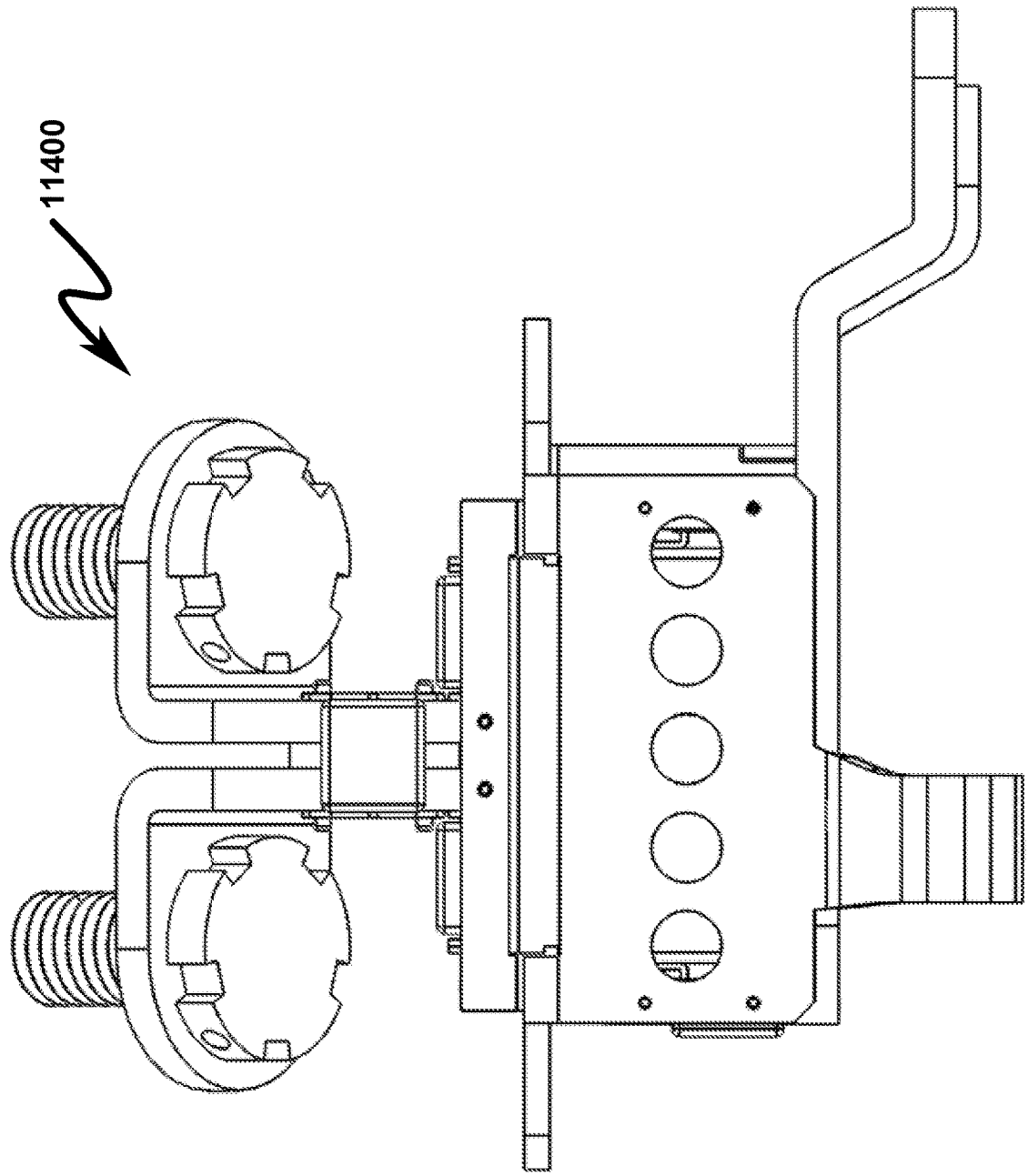
FIG. 114 illustrates a rear view of a preferred exemplary system embodiment of the present invention with plastic encapsulating cover (PEC) suppressed.
Figure 115:
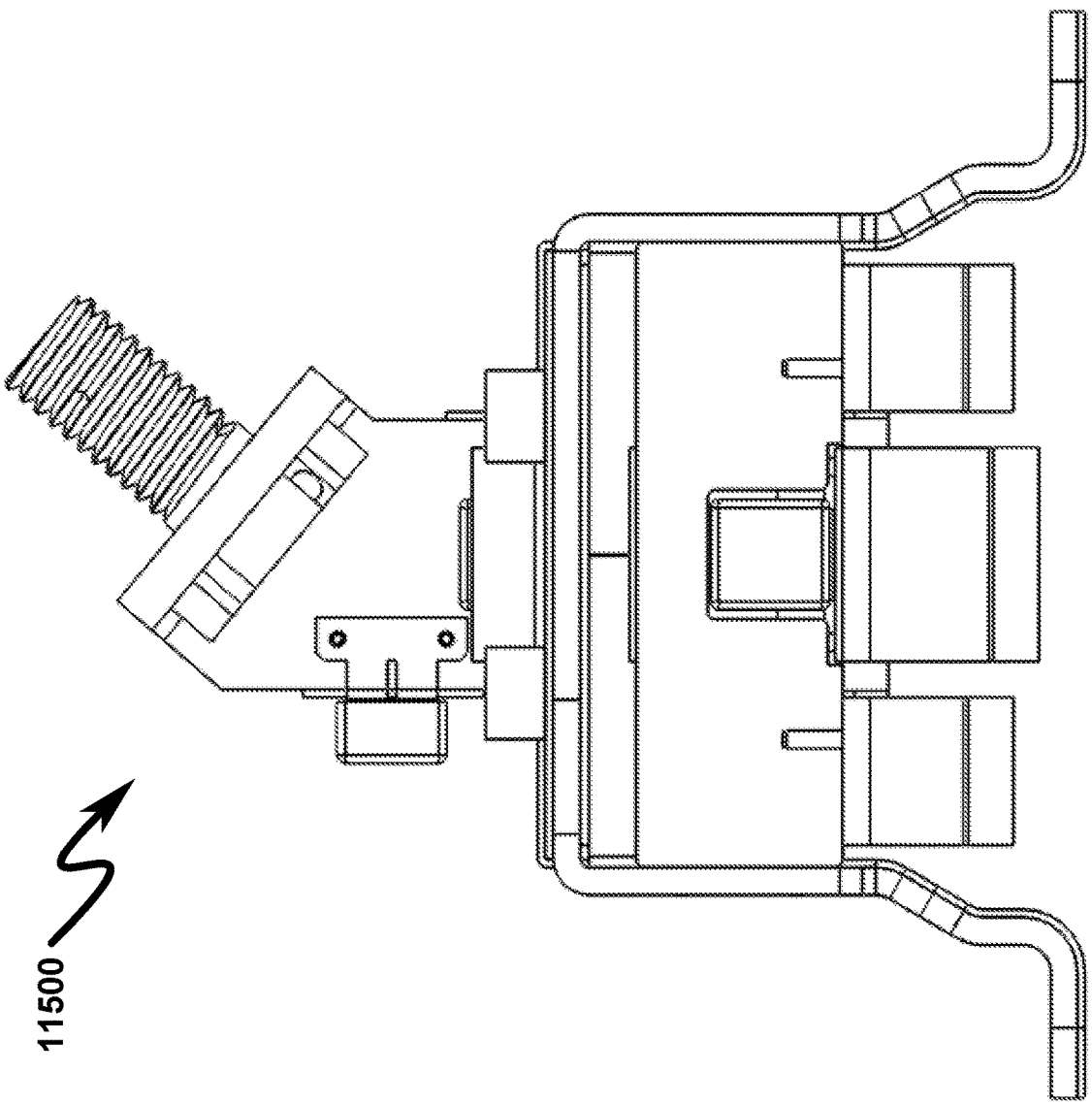
FIG. 115 illustrates a left side view of a preferred exemplary system embodiment of the present invention with plastic encapsulating cover (PEC) suppressed.
Figure 116:
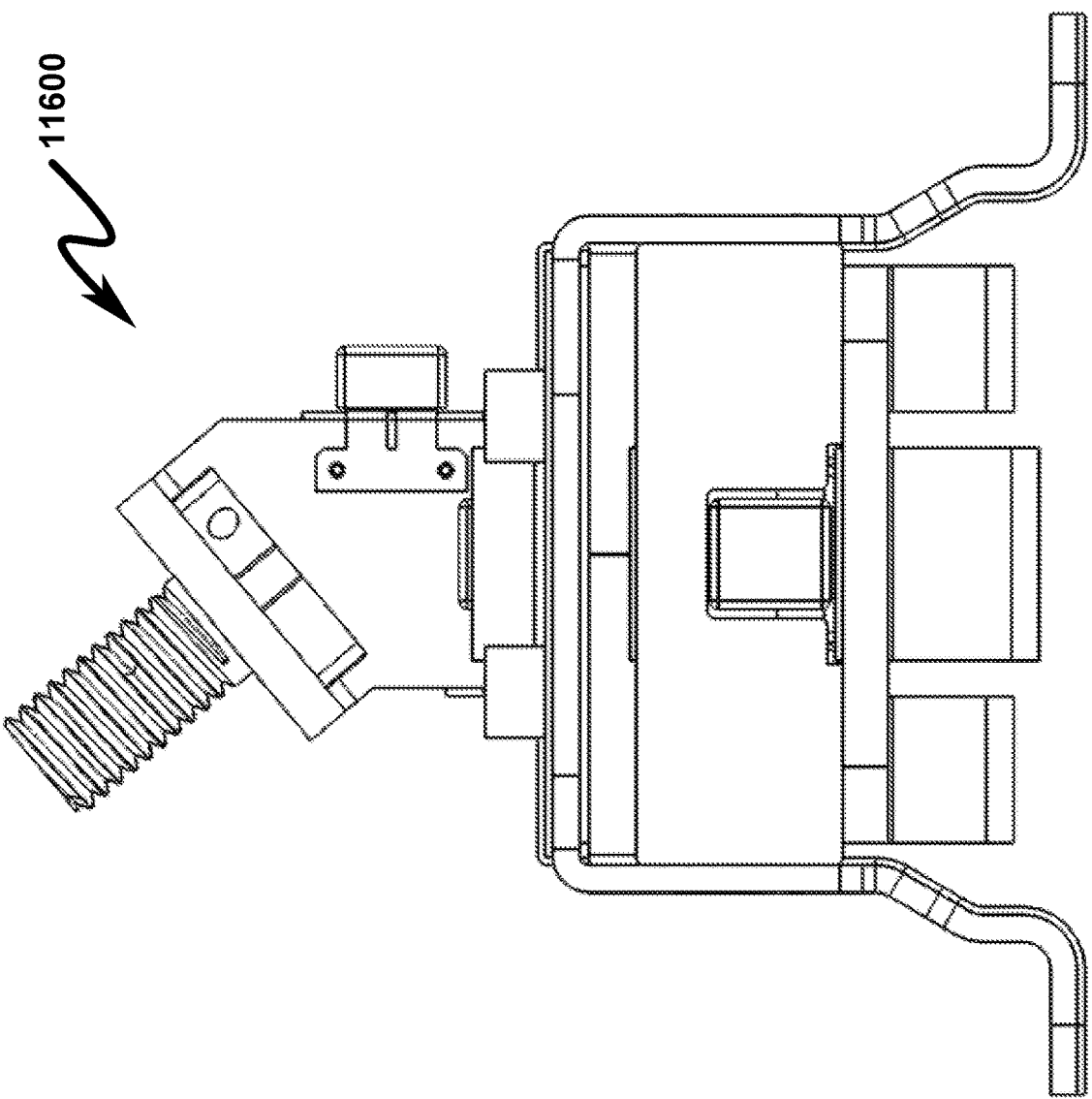
FIG. 116 illustrates a right side view of a preferred exemplary system embodiment of the present invention with plastic encapsulating cover (PEC) suppressed.
Figure 117:
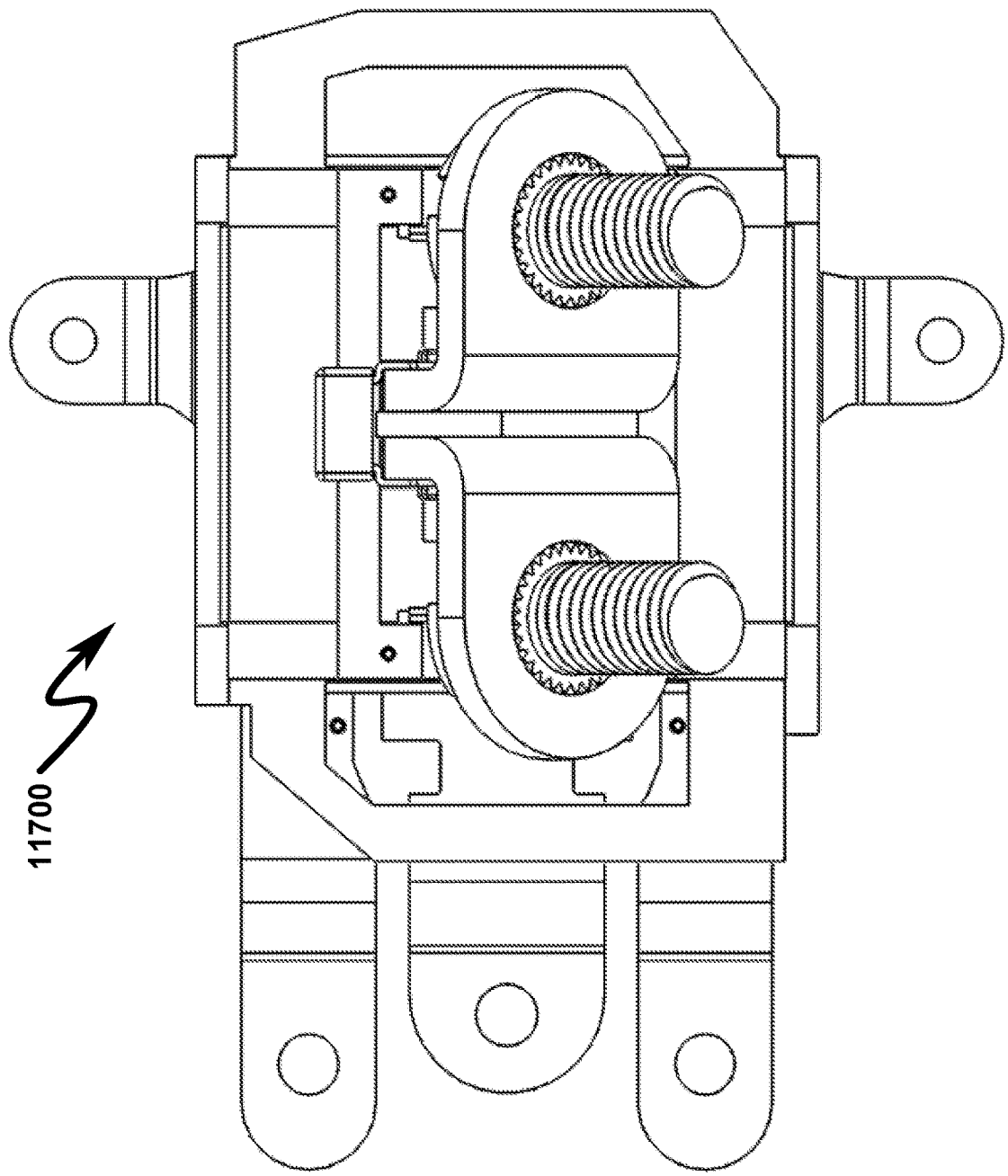
FIG. 117 illustrates a top view of a preferred exemplary system embodiment of the present invention with plastic encapsulating cover (PEC) suppressed.
Figure 118:
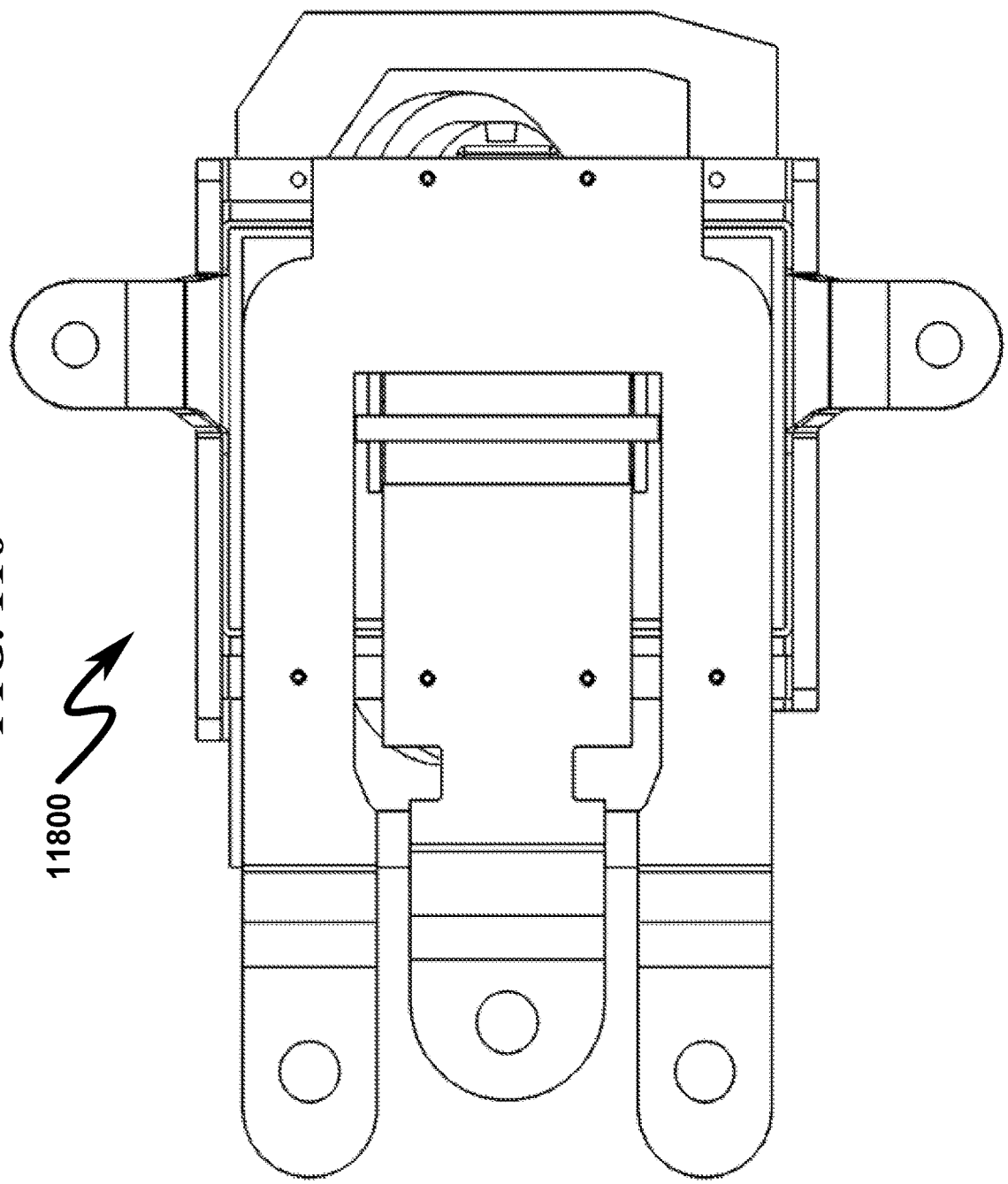
FIG. 118 illustrates a bottom view of a preferred exemplary system embodiment of the present invention with plastic encapsulating cover (PEC) suppressed.
Figure 119:
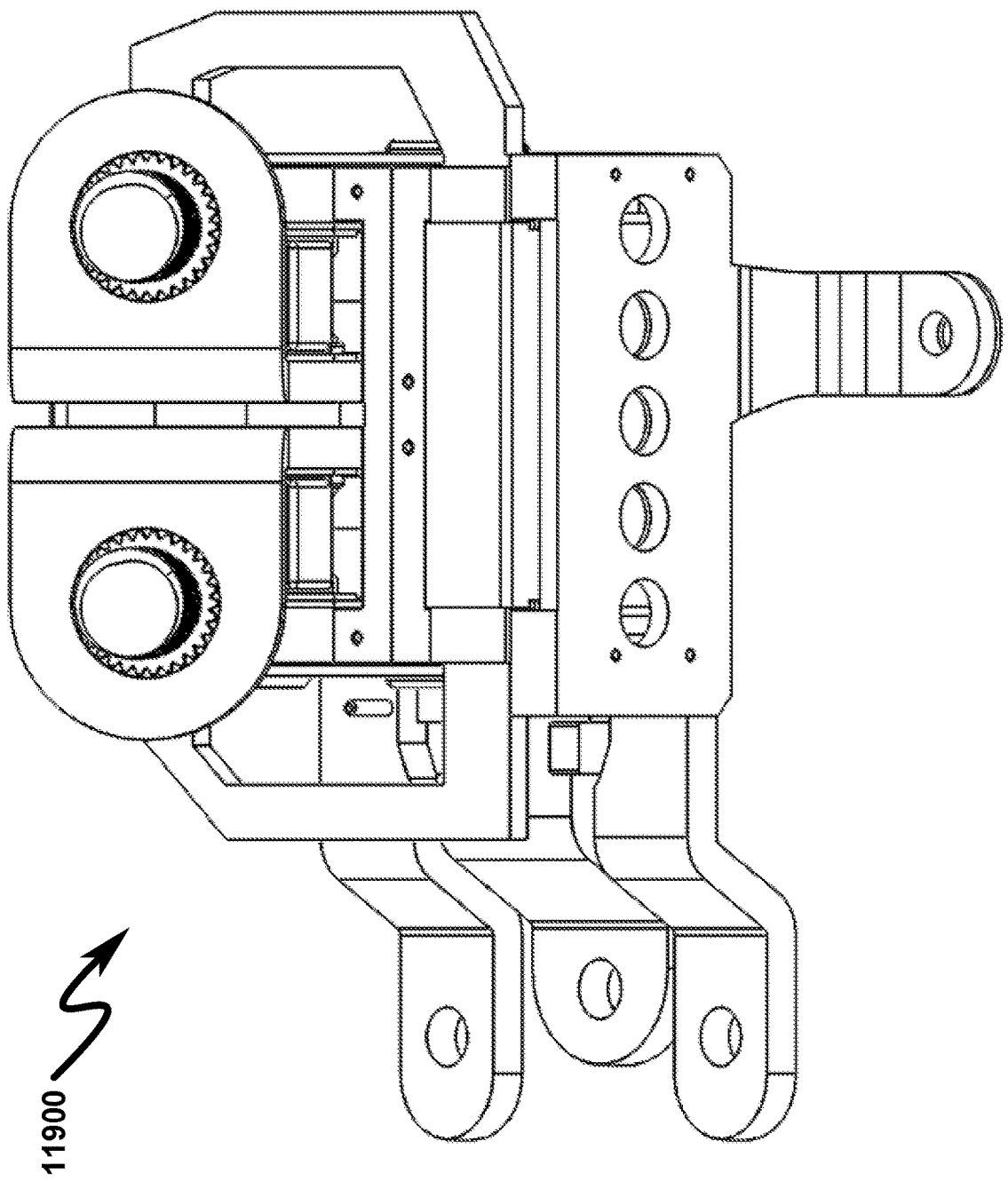
Figure 120:
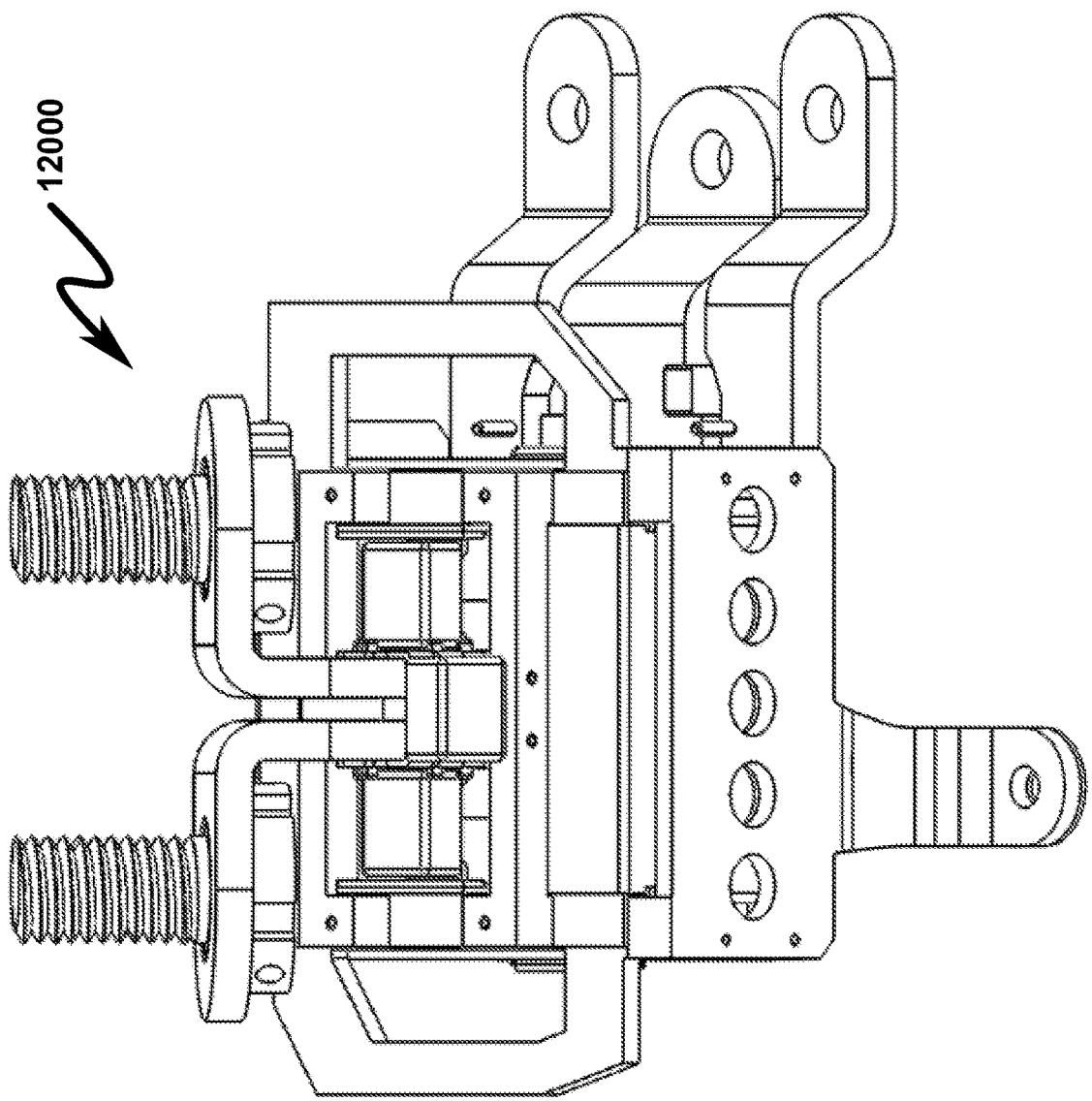
Figure 121:
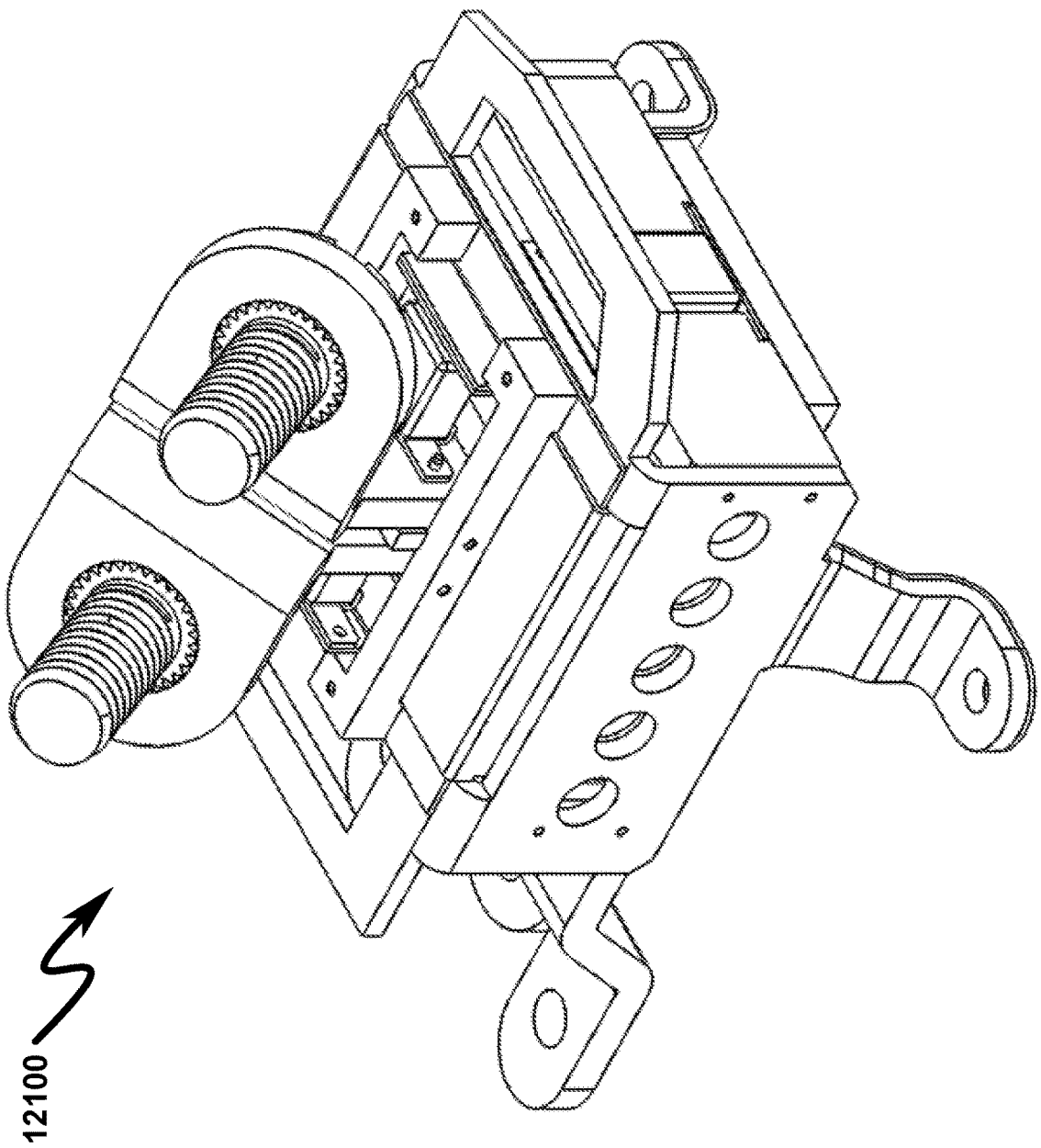
Figure 122:
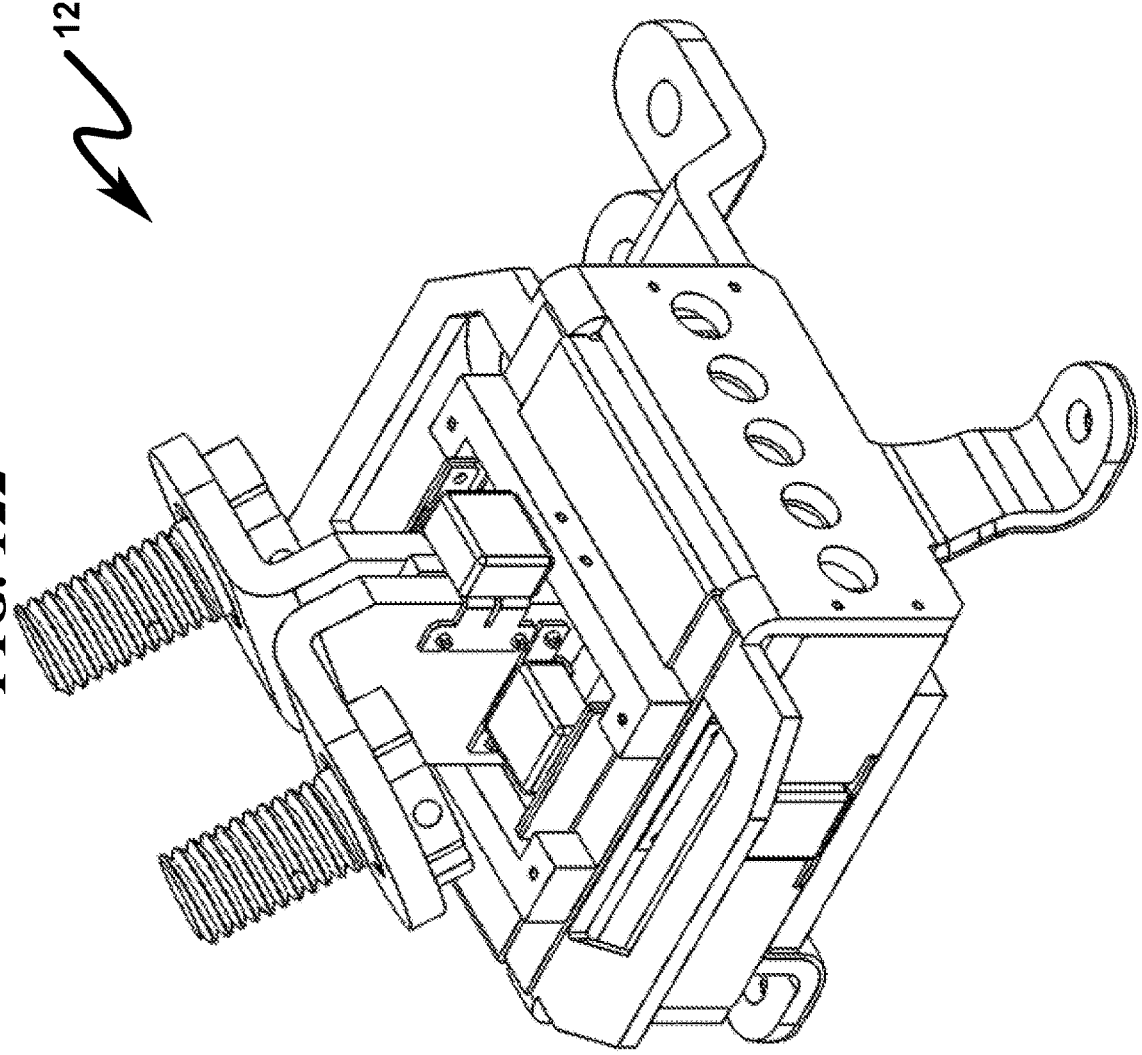
Figure 123:
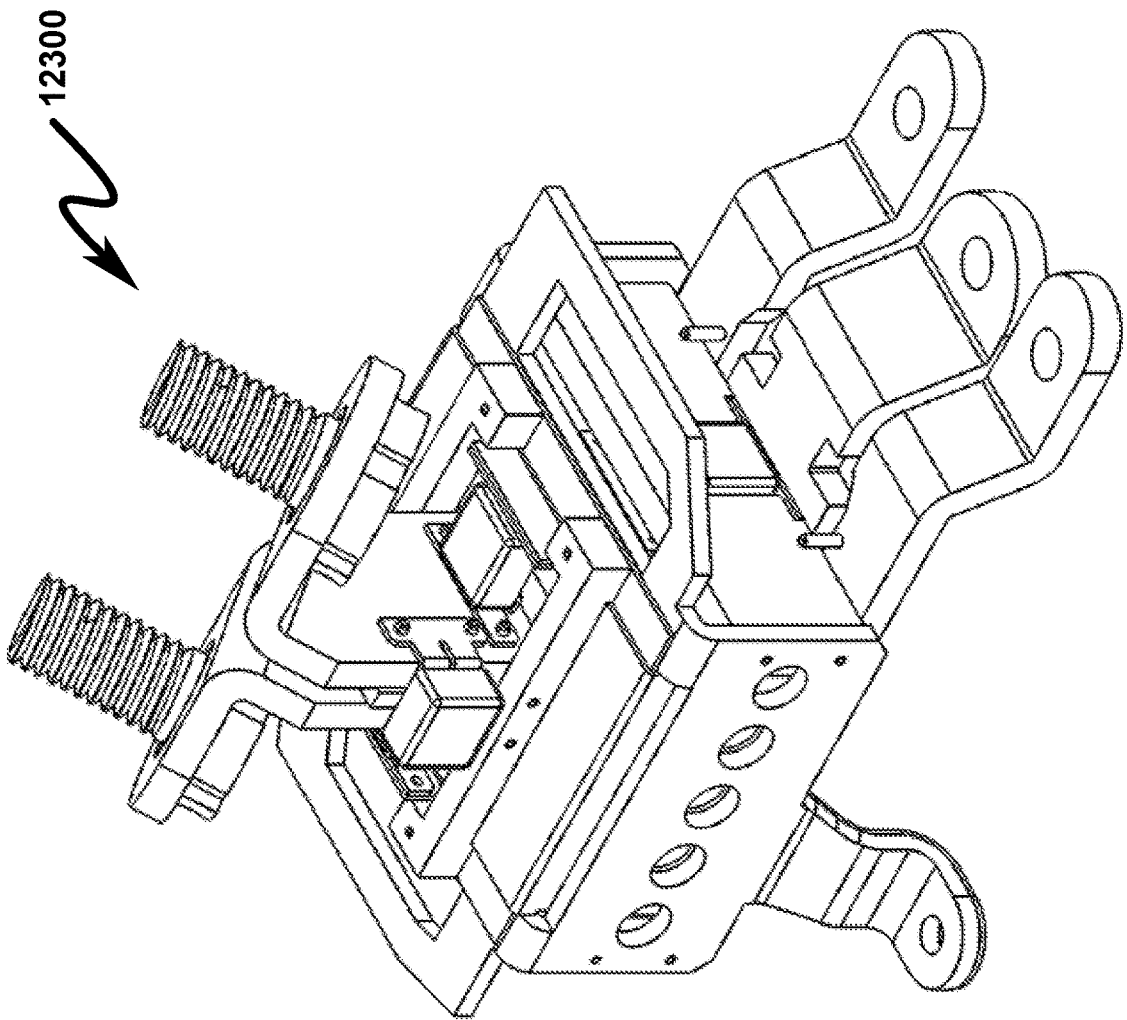
Figure 124:
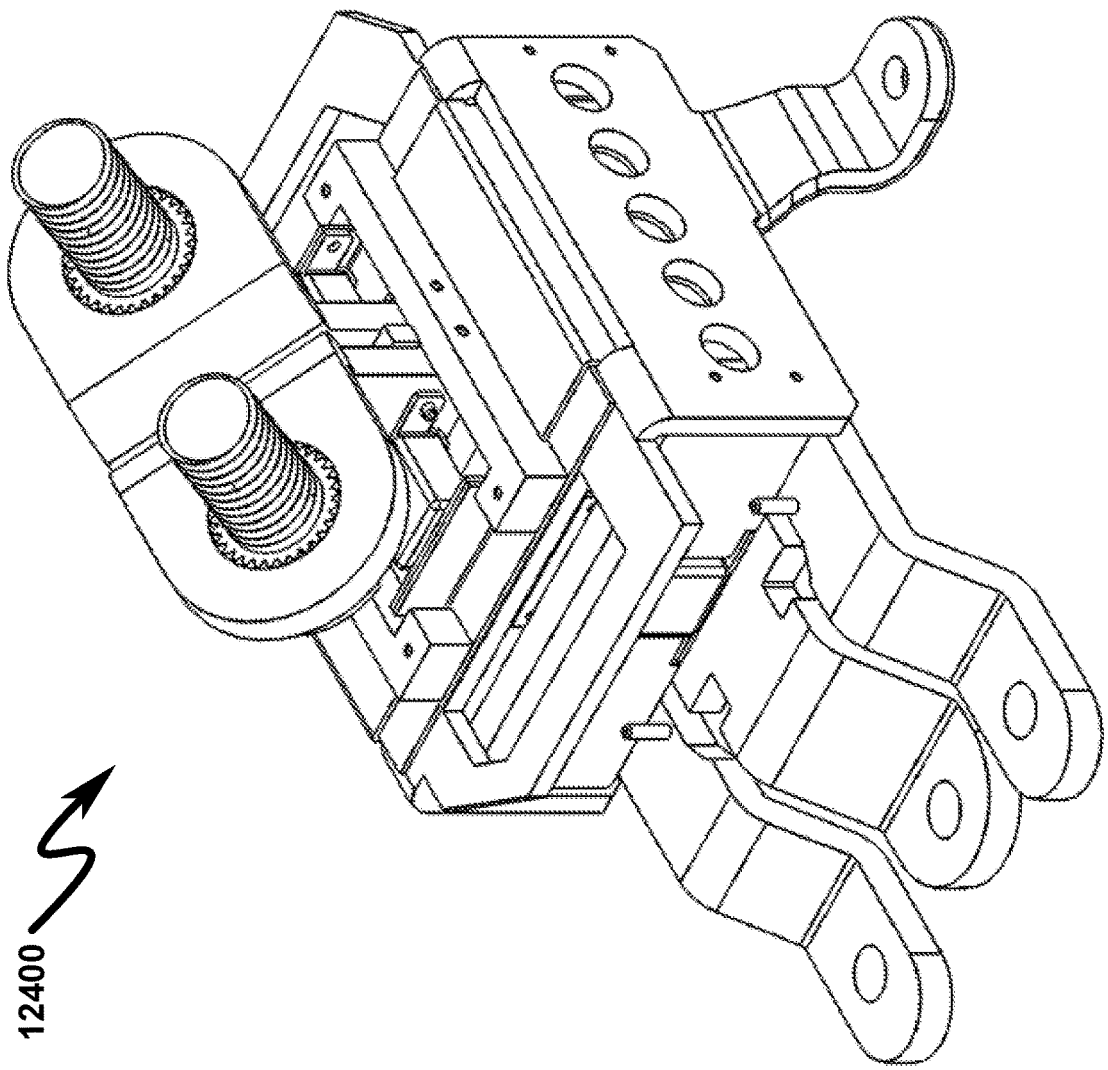
Figure 125:
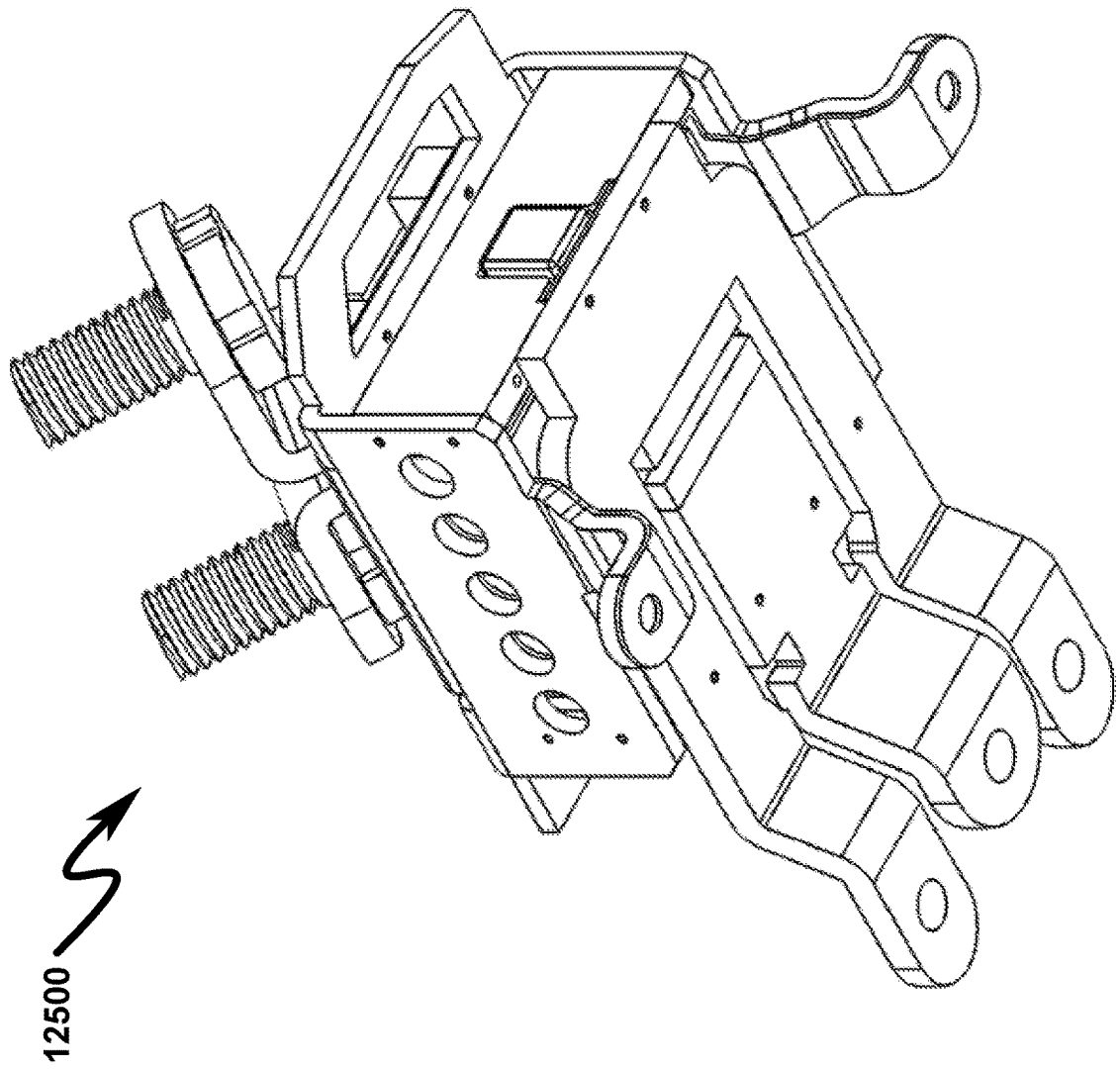
Figure 126:
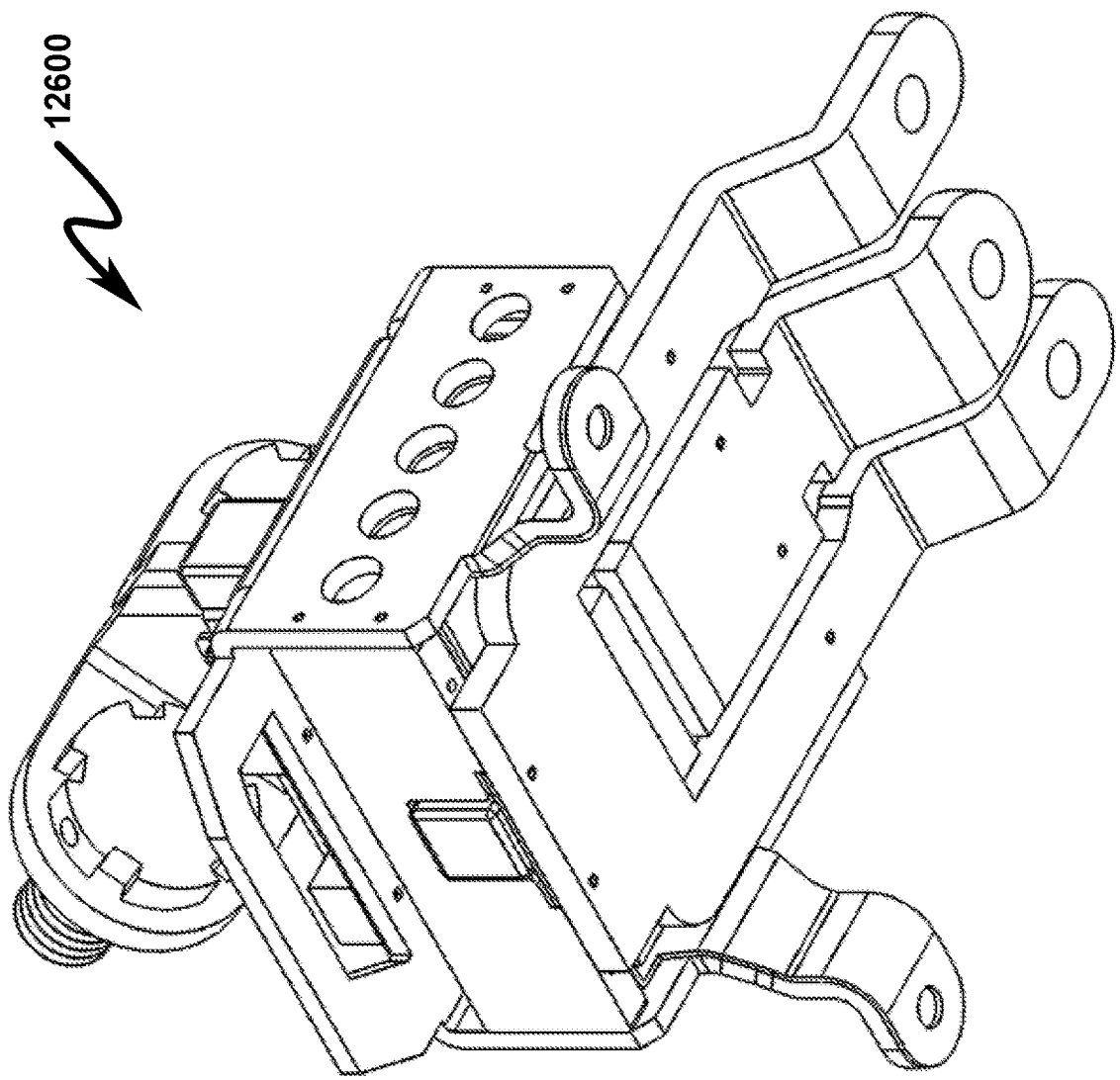
Figure 127:
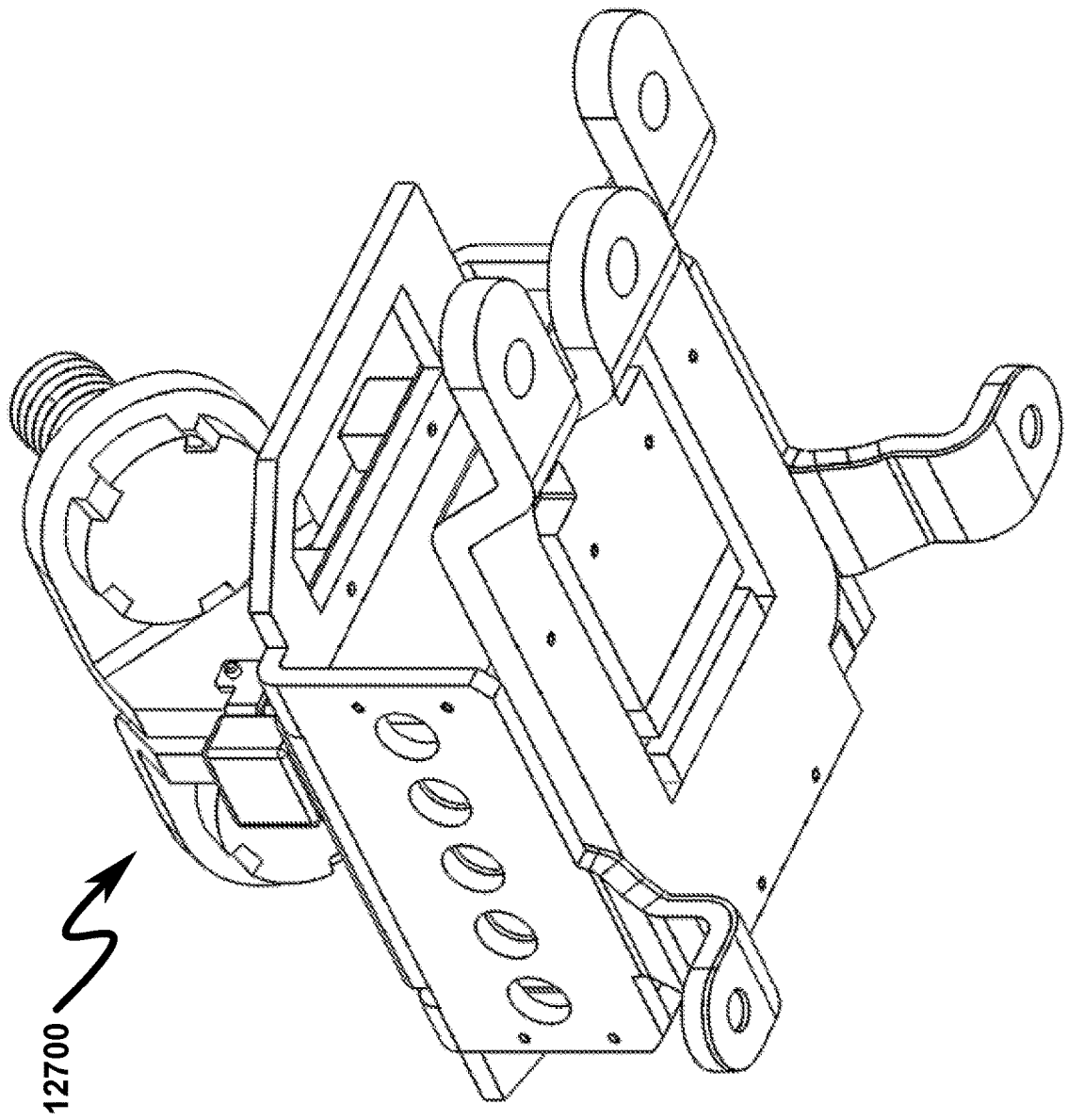
Figure 128:
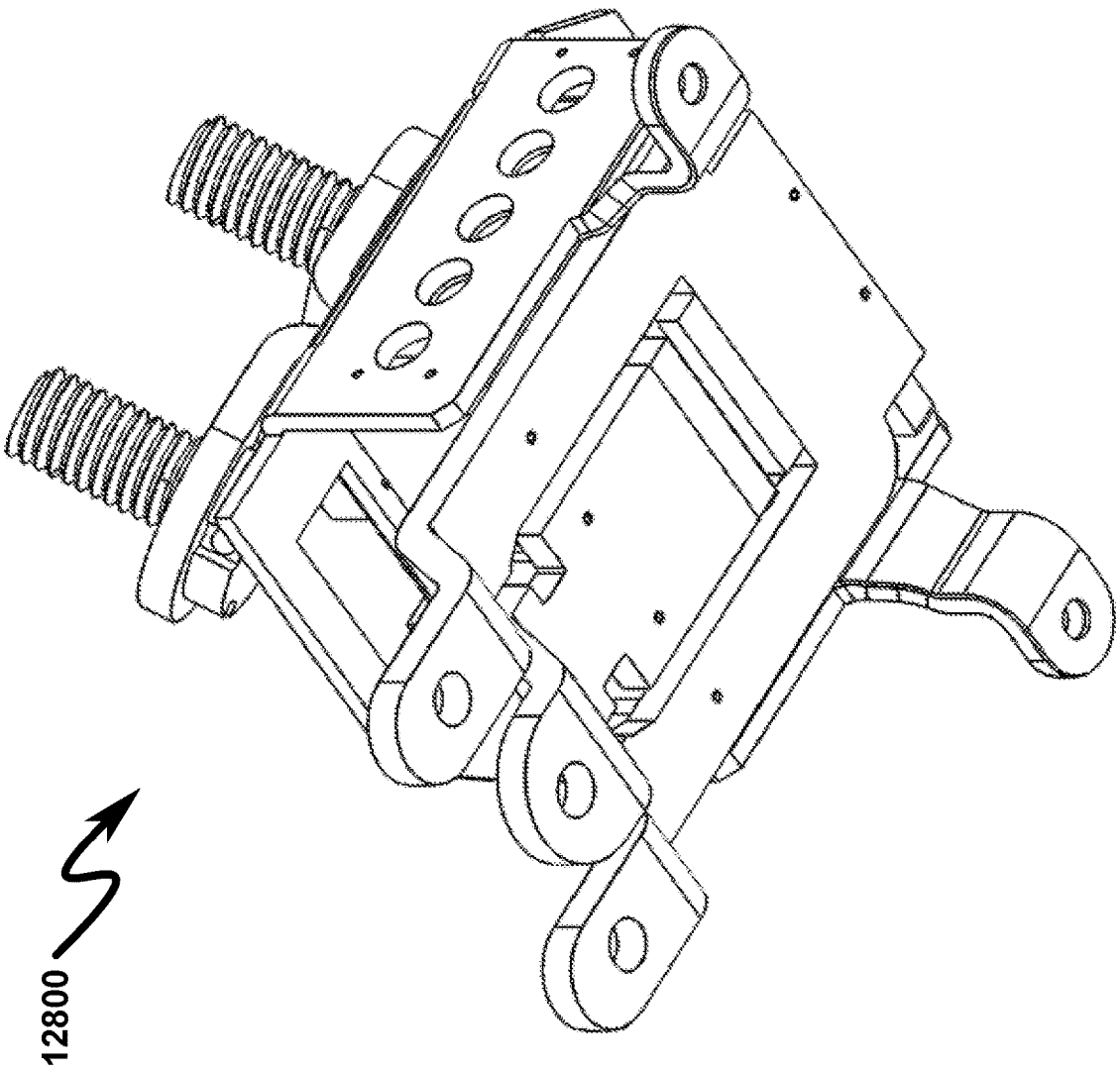

FIG. 113 (11300)-FIG. 128 (12800) provide detailed views of a preferred exemplary invention system embodiment with the PEC removed to illustrate detail within the overall system construction.

System Summary

The present invention system may be broadly generalized as an electromagnetic interference filter (EIF) system comprising:
  (a) BUS+ bus bar (BUS+);
  (b) INC+ inductor conductor (INC+);
  (c) CON+ terminal connection (CON+);
  (d) BUS− bus bar (BUS−);
  (e) INC− inductor conductor (INC−);
  (f) CON− terminal connection (CON−);
  (g) permeable inductor core (PIC);
  (h) BUS+ capacitor (Cy11);
  (i) BUS− capacitor (Cy12);
  (j) CON+ capacitor (Cy21);
  (k) CON− capacitor (Cy22); and
  (l) grounding support assembly (GSA);
  wherein:
  the INC+ electrically couples the BUS+ and the CON+;
  the INC− electrically couples the BUS− and the CON−;
  the Cy11 electrically couples the BUS+ and the GSA;
  the Cy12 electrically couples the BUS− and the GSA;
  the Cy21 electrically couples the CON+ and the GSA;
  the Cy22 electrically couples the CON− and the GSA;
  the BUS+ comprises one or more positive bus bar connections;
  the BUS− comprises one or more negative bus bar connections;
  the PIC comprises a ferromagnetic material having a void through which the INC+ and the INC− traverse; and
  the GSA comprises one or more grounding bus bar connections.

This general system summary may be augmented by the various elements described herein to produce a wide variety of invention embodiments consistent with this overall design description.

Method Summary

The present invention method may be broadly generalized as an electromagnetic interference filter (EIF) method operating on an electromagnetic interference filter system, the system comprising:
  (a) BUS+ bus bar (BUS+);
  (b) INC+ inductor conductor (INC+);
  (c) CON+ terminal connection (CON+);
  (d) BUS− bus bar (BUS−);
  (e) INC− inductor conductor (INC−);
  (f) CON− terminal connection (CON−);
  (g) permeable inductor core (PIC);
  (h) BUS+ capacitor (Cy11);
  (i) BUS− capacitor (Cy12);
  (j) CON+ capacitor (Cy21);
  (k) CON− capacitor (Cy22); and
  (l) grounding support assembly (GSA);
  wherein:
  the INC+ electrically couples the BUS+ and the CON+;
  the INC− electrically couples the BUS− and the CON−;
  the Cy11 electrically couples the BUS+ and the GSA;
  the Cy12 electrically couples the BUS− and the GSA;
  the Cy21 electrically couples the CON+ and the GSA;
  the Cy22 electrically couples the CON− and the GSA;
  the BUS+ comprises one or more positive bus bar connections;
  the BUS− comprises one or more negative bus bar connections;
  the PIC comprises a ferromagnetic material having a void through which the INC+ and the INC− traverse; and
  the GSA comprises one or more grounding bus bar connections;
  wherein the method comprises the steps of:
  (1) inserting the CON+/INC+ and the CON−/INC− thru the permeable inductor core (PIC) (0801);
  (2) welding or otherwise mechanically attaching the INC+/INC− to the BUS+/BUS− bars (0802);
  (3) forming multiple "leadframes" comprising copper to support the Cy11, the Cy12, the Cy21, and the Cy22 (0803);
  (4) forming a support well for the Cy11, the Cy12, the Cy21, and the Cy22 capacitors within the leadframes (0804);
  (5) picking and placing the Cy11, the Cy12, the Cy21, and the Cy22 capacitors in the leadframes (0805);
  (6) reflow soldering the Cy11, the Cy12, the Cy21, and the Cy22 capacitors to the leadframes (0806);
  (7) trimming and forming the leadframes and the Cy11, the Cy12, the Cy21, and the Cy22 capacitor combinations (0807);
  (8) injection molding the Cy11, the Cy12, the Cy21, and the Cy22 capacitors within the confines of the leadframes (0807);
  (9) attaching the Cy11, the Cy12, the Cy21, and the Cy22 capacitor leadframe combinations to the BUS+/BUS−, the INC+/INC−, and the CON+/CON− and the ground support assembly (GSA) (0809); and
  (10) injection molding and/or encapsulating the INC+, the INC−, the Cy11, the Cy12, the Cy21, and the Cy22 capacitor leadframe combinations and the GSA assembly with a plastic encapsulating enclosure (PEC) to form an integrated mechanical assembly (0810).

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

System/Method Variations

The present invention anticipates a wide variety of variations in the basic theme of construction. The examples presented previously do not represent the entire scope of possible usages. They are meant to cite a few of the almost limitless possibilities.

This basic system, method, and product-by-process may be augmented with a variety of ancillary embodiments, including but not limited to:

An embodiment wherein the Cy11, the Cy12, the Cy21, and the Cy22 each further comprises a first leadframe, a second leadframe, and a plastic overmold cover (POC).

An embodiment wherein the Cy11, the Cy12, the Cy21, and the Cy22 each have a capacitance value in the range of 0.10uF to 47.0 uF.

An embodiment further comprising an output filtering capacitor (OFC) Cx41 electrically coupled between the CON+ and the CON−.

An embodiment wherein the PIC comprises a ferrite material comprising 3N5 ferromagnetic material.

An embodiment wherein the PIC comprises a ferromagnetic material configured in the form of a rectangular prism having a rectangular void through which the INC+ and the INC− traverse.

An embodiment wherein the PIC comprises a ferrite material having a complex permittivity greater than 100 within the range of 100 kHz to 100 MHz.

An embodiment further comprising an inductor insulating spacer (IIS) positioned between the INC+ and the INC− that mechanically separates and electrically isolates the INC+ from the INC−.

An embodiment wherein:
the EIF further comprises a plastic encapsulating cover (PEC);
the GSA further comprises a plurality of injection molding perforations (IMP); and
the PEC comprises injection molded plastic encapsulating the INC+, the INC−, the Cy11; the Cy12, the Cy21, the Cy22, and at least a portion of the GSA.

An embodiment wherein the GSA further comprises a steel grounding support bracket (GSB), copper grounding support conductor (GSC) conforming to the profile of the GSB, and non-conductive grounding support insulator (GSI) insulating the GSB from the PIC.

An embodiment wherein:
the INC+ and the CON+ are formed from a continuous piece of conductive material;
the INC+ and the BUS+ are mechanically welded together;
the INC− and the CON− are formed from a continuous piece of conductive material; and
the INC− and the BUS− are mechanically welded together.

An embodiment wherein the CON+ and the CON− each further comprise a threaded screw terminal stud.

One skilled in the art will recognize that other embodiments are possible based on combinations of elements taught within the above invention description.

Conclusion

An electromagnetic interference filter (EIF) system/method configured to maximize filter performance associated with EIF interconnects has been disclosed. The disclosed system eliminates the use of conventional printed circuit board (PCB) interconnects and associated electrical connection terminals by attaching EIF filter capacitors and other components directly to power supply bus bars using a mechanical design and plastic encapsulating cover (PEC) that reduces parasitic inductances between the various EIF components while maximizing series inductance between +BUS/+CON connections and −BUS/−CON connections respectively through a permeable inductor core (PIC). The system/method may be applied to a variety of EIF applications including those associated with electric vehicles and the like.

Claims Interpretation

The following rules apply when interpreting the CLAIMS of the present invention:

The CLAIM PREAMBLE should be considered as limiting the scope of the claimed invention.

"WHEREIN" clauses should be considered as limiting the scope of the claimed invention.

"WHEREBY" clauses should be considered as limiting the scope of the claimed invention.

"ADAPTED TO" clauses should be considered as limiting the scope of the claimed invention.

"ADAPTED FOR" clauses should be considered as limiting the scope of the claimed invention.

The term "MEANS" specifically invokes the means-plus-function claims limitation recited in 35 U.S.C. § 112(f) and such claim shall be construed to cover the corresponding structure, material, or acts described in the specification and equivalents thereof.

The phrase "MEANS FOR" specifically invokes the means-plus-function claims limitation recited in 35 U.S.C. § 112(f) and such claim shall be construed to cover the corresponding structure, material, or acts described in the specification and equivalents thereof.

The phrase "STEP FOR" specifically invokes the step-plus-function claims limitation recited in 35 U.S.C. § 112(f) and such claim shall be construed to cover the corresponding structure, material, or acts described in the specification and equivalents thereof.

The step-plus-function claims limitation recited in 35 U.S.C. § 112(f) shall be construed to cover the corresponding structure, material, or acts described in the specification and equivalents thereof ONLY for such claims including the phrases "MEANS FOR", "MEANS", or "STEP FOR".

The phrase "AND/OR" in the context of an expression "X and/or Y" should be interpreted to define the set of "(X and Y)" in union with the set "(X or Y)" as interpreted by Ex Parte Gross (USPTO Patent Trial and Appeal Board, Appeal 2011-004811, Ser. No. 11/565,411, ("'and/or' covers embodiments having element A alone, B alone, or elements A and B taken together").

The claims presented herein are to be interpreted in light of the specification and drawings presented herein with sufficiently narrow scope such as to not preempt any abstract idea.

The claims presented herein are to be interpreted in light of the specification and drawings presented herein with sufficiently narrow scope such as to not preclude every application of any idea.

The claims presented herein are to be interpreted in light of the specification and drawings presented herein with sufficiently narrow scope such as to preclude any basic mental process that could be performed entirely in the human mind.

The claims presented herein are to be interpreted in light of the specification and drawings presented herein with sufficiently narrow scope such as to preclude any process that could be performed entirely by human manual effort.

Although a preferred embodiment of the present invention has been illustrated in the accompanying drawings and described in the foregoing Detailed Description, it will be understood that the invention is not limited to the embodiments disclosed, but is capable of numerous rearrangements, modifications, and substitutions without departing from the spirit of the invention as set forth and defined by the following claims.

What is claimed is:

1. An electromagnetic interference filter (EIF) system comprising:
   (a) BUS+ bus bar (BUS+);
   (b) INC+ inductor conductor (INC+);
   (c) CON+ terminal connection (CON+);
   (d) BUS− bus bar (BUS−);
   (e) INC− inductor conductor (INC−);
   (f) CON− terminal connection (CON−);
   (g) permeable inductor core (PIC);
   (h) BUS+ capacitor (Cy11);
   (i) BUS− capacitor (Cy12);
   (j) CON+ capacitor (Cy21);
   (k) CON− capacitor (Cy22); and
   (l) grounding support assembly (GSA);
   wherein:
   said INC+ electrically couples said BUS+ and said CON+;
   said INC− electrically couples said BUS− and said CON−;
   said Cy11 electrically couples said BUS+ and said GSA;
   said Cy12 electrically couples said BUS− and said GSA;
   said Cy21 electrically couples said CON+ and said GSA;
   said Cy22 electrically couples said CON− and said GSA;
   said BUS+ comprises one or more positive bus bar connections;
   said BUS− comprises one or more negative bus bar connections;
   said PIC comprises a ferromagnetic material having a void through which said INC+ and said INC− traverse;
   said GSA comprises one or more grounding bus bar connections; and
   said CON+ and said CON− each further comprise a threaded screw terminal stud.

2. An electromagnetic interference filter (EIF) system comprising:
   (a) BUS+ bus bar (BUS+);
   (b) INC+ inductor conductor (INC+);
   (c) CON+ terminal connection (CON+);
   (d) BUS− bus bar (BUS−);
   (e) INC− inductor conductor (INC−);
   (f) CON− terminal connection (CON−);
   (g) permeable inductor core (PIC);
   (h) BUS+ capacitor (Cy11);
   (i) BUS− capacitor (Cy12);
   (j) CON+ capacitor (Cy21);
   (k) CON− capacitor (Cy22); and
   (l) grounding support assembly (GSA);
   wherein:
   said INC+ electrically couples said BUS+ and said CON+;
   said INC− electrically couples said BUS− and said CON−;
   said Cy11 electrically couples said BUS+ and said GSA;
   said Cy12 electrically couples said BUS− and said GSA;
   said Cy21 electrically couples said CON+ and said GSA;
   said Cy22 electrically couples said CON− and said GSA;
   said BUS+ comprises one or more positive bus bar connections;
   said BUS− comprises one or more negative bus bar connections;
   said PIC comprises a ferromagnetic material having a void through which said INC+ and said INC− traverse;
   said GSA comprises one or more grounding bus bar connections; and
   said Cy11, said Cy12, said Cy21, and said Cy22 each further comprises a first leadframe, a second leadframe, and a plastic overmold cover (POC).

3. The electromagnetic interference filter (EIF) system of claim 2 wherein said Cy11, said Cy12, said Cy21, and said Cy22 each have a capacitance value in the range of 0.10uF to 47.0uF.

4. The electromagnetic interference filter (EIF) system of claim 2 further comprising an output filtering capacitor (OFC) Cx41 electrically coupled between said CON+ and said CON−.

5. The electromagnetic interference filter (EIF) system of claim 2 wherein said PIC comprises a ferrite material.

6. The electromagnetic interference filter (EIF) system of claim 2 further comprising an inductor insulating spacer (IIS) positioned between said INC+ and said INC− that mechanically separates and electrically isolates said INC+ from said INC−.

7. An electromagnetic interference filter (EIF) system comprising:
   (a) BUS+ bus bar (BUS+);
   (b) INC+ inductor conductor (INC+);
   (c) CON+ terminal connection (CON+);
   (d) BUS− bus bar (BUS−);
   (e) INC− inductor conductor (INC−);
   (f) CON− terminal connection (CON−);
   (g) permeable inductor core (PIC);
   (h) BUS+ capacitor (Cy11);
   (i) BUS− capacitor (Cy12);
   (j) CON+ capacitor (Cy21);
   (k) CON− capacitor (Cy22); and
   (l) grounding support assembly (GSA);
   wherein:
   said INC+ electrically couples said BUS+ and said CON+;
   said INC− electrically couples said BUS− and said CON−;
   said Cy11 electrically couples said BUS+ and said GSA;
   said Cy12 electrically couples said BUS− and said GSA;
   said Cy21 electrically couples said CON+ and said GSA;
   said Cy22 electrically couples said CON− and said GSA;
   said BUS+ comprises one or more positive bus bar connections;

said BUS− comprises one or more negative bus bar connections;
said PIC comprises a ferromagnetic material having a void through which said INC+ and said INC− traverse;
said GSA comprises one or more grounding bus bar connections;
said EIF further comprises a plastic encapsulating cover (PEC);
said GSA further comprises a plurality of injection molding perforations (IMP); and
said PEC comprises injection molded plastic encapsulating said INC+, said INC−, said Cy11; said Cy12, said Cy21, said Cy22, and at least a portion of said GSA.

8. An electromagnetic interference filter (EIF) system comprising:
   (a) BUS+ bus bar (BUS+);
   (b) INC+ inductor conductor (INC+);
   (c) CON+ terminal connection (CON+);
   (d) BUS− bus bar (BUS−);
   (e) INC− inductor conductor (INC−);
   (f) CON− terminal connection (CON−);
   (g) permeable inductor core (PIC);
   (h) BUS+ capacitor (Cy11);
   (i) BUS− capacitor (Cy12);
   (j) CON+ capacitor (Cy21);
   (k) CON− capacitor (Cy22); and
   (l) grounding support assembly (GSA);
wherein:
said INC+ electrically couples said BUS+ and said CON+;
said INC− electrically couples said BUS− and said CON−;
said Cy11 electrically couples said BUS+ and said GSA;
said Cy12 electrically couples said BUS− and said GSA;
said Cy21 electrically couples said CON+ and said GSA;
said Cy22 electrically couples said CON− and said GSA;
said BUS+ comprises one or more positive bus bar connections;
said BUS− comprises one or more negative bus bar connections;
said PIC comprises a ferromagnetic material having a void through which said INC+ and said INC− traverse;
said GSA comprises one or more grounding bus bar connections; and
said GSA further comprises a steel grounding support bracket (GSB), copper grounding support conductor (GSC) conforming to the profile of said GSB, and non-conductive grounding support insulator (GSI) insulating said GSB from said PIC.

9. An electromagnetic interference filter (EIF) system comprising:
   (a) BUS+ bus bar (BUS+);
   (b) INC+ inductor conductor (INC+);
   (c) CON+ terminal connection (CON+);
   (d) BUS− bus bar (BUS−);
   (e) INC− inductor conductor (INC−);
   (f) CON− terminal connection (CON−);
   (g) permeable inductor core (PIC);
   (h) BUS+ capacitor (Cy11);
   (i) BUS− capacitor (Cy12);
   (j) CON+ capacitor (Cy21);
   (k) CON− capacitor (Cy22); and
   (l) grounding support assembly (GSA);
wherein:
said INC+ electrically couples said BUS+ and said CON+;
said INC− electrically couples said BUS− and said CON−;
said Cy11 electrically couples said BUS+ and said GSA;
said Cy12 electrically couples said BUS− and said GSA;
said Cy21 electrically couples said CON+ and said GSA;
said Cy22 electrically couples said CON− and said GSA;
said BUS+ comprises one or more positive bus bar connections;
said BUS− comprises one or more negative bus bar connections;
said PIC comprises a ferromagnetic material having a void through which said INC+ and said INC− traverse;
said GSA comprises one or more grounding bus bar connections;
said INC+ and said CON+ are formed from a continuous piece of conductive material;
said INC+ and said BUS+ are mechanically welded together;
said INC− and said CON− are formed from a continuous piece of conductive material; and
said INC− and said BUS− are mechanically welded together.

10. An electromagnetic interference filter (EIF) method operating on an electromagnetic interference filter system, said system comprising:
   (a) BUS+ bus bar (BUS+);
   (b) INC+ inductor conductor (INC+);
   (c) CON+ terminal connection (CON+);
   (d) BUS− bus bar (BUS−);
   (e) INC− inductor conductor (INC−);
   (f) CON− terminal connection (CON−);
   (g) permeable inductor core (PIC);
   (h) BUS+ capacitor (Cy11);
   (i) BUS− capacitor (Cy12);
   (j) CON+ capacitor (Cy21);
   (k) CON− capacitor (Cy22); and
   (l) grounding support assembly (GSA);
wherein:
said INC+ electrically couples said BUS+ and said CON+;
said INC− electrically couples said BUS− and said CON−;
said Cy11 electrically couples said BUS+ and said GSA;
said Cy12 electrically couples said BUS− and said GSA;
said Cy21 electrically couples said CON+ and said GSA;
said Cy22 electrically couples said CON− and said GSA;
said BUS+ comprises one or more positive bus bar connections;
said BUS− comprises one or more negative bus bar connections;
said PIC comprises a ferromagnetic material having a void through which said INC+ and said INC− traverse; and
said GSA comprises one or more grounding bus bar connections;
wherein said method comprises the steps of:
   (1) inserting said CON+/INC+ and said CON−/INC− thru said permeable inductor core (PIC) (0801);
   (2) welding or otherwise mechanically attaching said INC+/INC− to said BUS+/BUS− bars (0802);
   (3) forming multiple "leadframes" comprising copper to support said Cy11, said Cy12, said Cy21, and said Cy22 (0803);
   (4) forming a support well for said Cy11, said Cy12, said Cy21, and said Cy22 capacitors within said leadframes (0804);

(5) picking and placing said Cy11, said Cy12, said Cy21, and said Cy22 capacitors in said leadframes (0805);

(6) reflow soldering said Cy11, said Cy12, said Cy21, and said Cy22 capacitors to said leadframes (0806);

(7) trimming and forming said leadframes and said Cy11, said Cy12, said Cy21, and said Cy22 capacitor combinations (0807);

(8) injection molding said Cy11, said Cy12, said Cy21, and said Cy22 capacitors within the confines of said leadframes (0807);

(9) attaching said Cy11, said Cy12, said Cy21, and said Cy22 capacitor leadframe combinations to said BUS+/BUS−, said INC+/INC−, and said CON+/CON− and said ground support assembly (GSA) (0809); and

(10) injection molding and/or encapsulating said INC+, said INC−, said Cy11, said Cy12, said Cy21, and said Cy22 capacitor leadframe combinations and said GSA assembly with a plastic encapsulating enclosure (PEC) to form an integrated mechanical assembly (0810).

11. The electromagnetic interference filter (EIF) method of claim 10 wherein said Cy11, said Cy12, said Cy21, and said Cy22 each further comprises a first leadframe, a second leadframe, and a plastic overmold cover (POC).

12. The electromagnetic interference filter (EIF) method of claim 10 wherein said Cy11, said Cy12, said Cy21, and said Cy22 each have a capacitance value in the range of 0.10uF to 47.0uF.

13. The electromagnetic interference filter (EIF) method of claim 10 further comprising an output filtering capacitor (OFC) Cx41 electrically coupled between said CON+ and said CON−.

14. The electromagnetic interference filter (EIF) method of claim 10 wherein said PIC comprises a ferrite material.

15. The electromagnetic interference filter (EIF) method of claim 10 further comprising an inductor insulating spacer (IIS) positioned between said INC+ and said INC− that mechanically separates and electrically isolates said INC+ from said INC−.

16. The electromagnetic interference filter (EIF) method of claim 10 wherein:
said EIF further comprises a plastic encapsulating cover (PEC);
said GSA further comprises a plurality of injection molding perforations (IMP); and
said PEC comprises injection molded plastic encapsulating said INC+, said INC−, said Cy11; said Cy12, said Cy21, said Cy22, and at least a portion of said GSA.

17. The electromagnetic interference filter (EIF) method of claim 10 wherein said GSA further comprises a steel grounding support bracket (GSB), copper grounding support conductor (GSC) conforming to the profile of said GSB, and non-conductive grounding support insulator (GSI) insulating said GSB from said PIC.

18. The electromagnetic interference filter (EIF) method of claim 10 wherein:
said INC+ and said CON+ are formed from a continuous piece of conductive material;
said INC+ and said BUS+ are mechanically welded together;
said INC− and said CON− are formed from a continuous piece of conductive material; and
said INC− and said BUS− are mechanically welded together.

19. The electromagnetic interference filter (EIF) method of claim 10 wherein said CON+ and said CON− each further comprise a threaded screw terminal stud.

\* \* \* \* \*